(12) United States Patent
Lin et al.

(10) Patent No.: US 12,295,191 B2
(45) Date of Patent: May 6, 2025

(54) DISPLAY DEVICE

(71) Applicant: Visionlabs Corporation, Taipei (TW)

(72) Inventors: Hung-Cheng Lin, New Tapei (TW); Hung-Kuang Hsu, Taipei (TW); Hua-Chen Hsu, Zhubei (TW)

(73) Assignee: VISIONLABS CORPORATION, Taipei (TW)

( * ) Notice: Subject to any disclaimer, the term of this patent is extended or adjusted under 35 U.S.C. 154(b) by 551 days.

(21) Appl. No.: 17/477,357

(22) Filed: Sep. 16, 2021

(65) Prior Publication Data

US 2022/0093834 A1 Mar. 24, 2022

(30) Foreign Application Priority Data

Sep. 18, 2020 (TW) ................................. 109132327

(51) Int. Cl.
| | | |
|---|---|---|
| H01L 33/60 | (2010.01) | |
| H01L 25/075 | (2006.01) | |
| H01L 33/50 | (2010.01) | |
| H10H 20/851 | (2025.01) | |
| H10H 20/856 | (2025.01) | |

(52) U.S. Cl.
CPC ....... *H10H 20/856* (2025.01); *H01L 25/0753* (2013.01); *H10H 20/851* (2025.01)

(58) Field of Classification Search
CPC .... H01L 25/0753; H01L 33/50; H01L 25/167
See application file for complete search history.

(56) References Cited

U.S. PATENT DOCUMENTS

| | | | | |
|---|---|---|---|---|
| 7,897,977 | B2 * | 3/2011 | Borner ................. | H10H 20/855 257/98 |
| 8,604,678 | B2 | 12/2013 | Dai et al. | |
| 9,472,734 | B1 * | 10/2016 | Chen ...................... | H01L 33/502 |
| 10,516,081 | B1 * | 12/2019 | Xin ......................... | H01L 33/24 |
| 11,038,086 | B2 * | 6/2021 | Jeon ......................... | A23B 2/40 |
| 11,133,434 | B2 * | 9/2021 | Iguchi ..................... | H01L 33/46 |
| 11,296,254 | B2 * | 4/2022 | Lin ......................... | H01L 33/145 |
| 11,804,578 | B2 | 10/2023 | Hsu et al. | |
| 2010/0317132 | A1 | 12/2010 | Rogers et al. | |
| 2013/0126918 | A1 * | 5/2013 | Hsieh ................. | H10H 20/8514 257/89 |
| 2014/0159064 | A1 * | 6/2014 | Sakariya ............... | H01L 25/167 257/88 |
| 2014/0339495 | A1 * | 11/2014 | Bibl ....................... | H01L 33/502 257/13 |

(Continued)

FOREIGN PATENT DOCUMENTS

| | | | |
|---|---|---|---|
| JP | 2020009913 A | * | 1/2020 |
| TW | 202006973 A | | 2/2020 |

OTHER PUBLICATIONS

TW Office Action dated Mar. 11, 2024 in Taiwan application No. 109132327.

*Primary Examiner* — Jarrett J Stark

(74) *Attorney, Agent, or Firm* — McClure, Qualey & Rodack, LLP

(57) ABSTRACT

A light emitting-diode (LED) display device is provided. The display device comprises plural pixels arranged in array and each pixel includes at least one LED chip. The LED chip is disposed at a cavity of a black matrix (BM) layer and electrical connected to a transistor of a circuit substrate, wherein the transistor is below the BM layer.

10 Claims, 132 Drawing Sheets

(56) References Cited

U.S. PATENT DOCUMENTS

| | | | |
|---|---|---|---|
| 2015/0331285 A1* | 11/2015 | Bibl | G09F 9/00 362/84 |
| 2016/0181476 A1* | 6/2016 | Chang | H01L 33/06 257/13 |
| 2016/0197232 A1* | 7/2016 | Bour | H01L 33/06 257/13 |
| 2017/0170360 A1* | 6/2017 | Bour | H01L 33/145 |
| 2017/0236866 A1* | 8/2017 | Lee | H05B 47/19 257/89 |
| 2017/0269749 A1* | 9/2017 | Bok | H01L 27/156 |
| 2018/0219123 A1* | 8/2018 | Wang | H01L 27/15 |
| 2018/0219144 A1* | 8/2018 | Perkins | H01L 33/60 |
| 2019/0252576 A1* | 8/2019 | Lee | G09G 3/32 |
| 2020/0292149 A1* | 9/2020 | Shen | H01L 33/60 |
| 2021/0005583 A1* | 1/2021 | Iguchi | H10K 59/90 |
| 2021/0033790 A1* | 2/2021 | Ward | B81B 3/0083 |
| 2021/0057291 A1* | 2/2021 | Chang | H01L 25/50 |
| 2021/0408103 A1* | 12/2021 | Dai | H01L 27/156 |
| 2022/0238494 A1* | 7/2022 | Xu | H01L 27/1214 |

\* cited by examiner

B-B'

A-A'

B-B'

B-B'

A-A'

B-B'

A-A'

B-B'

DISPLAY DEVICE

CROSS-REFERENCE TO RELATED APPLICATION

The application is based on, and claims priority from, Taiwan Application Serial Number 109132327, filed on Sep. 18, 2020, the disclosure of which is hereby incorporated by reference herein in its entirety.

TECHNICAL FIELD

The disclosure relates to a display device.

BACKGROUND

Micro-LED displays have advantages such as high contrast ratio, fast response speed, wide color gamut, low power consumption and long lifespan in comparison with traditional display technique, liquid crystal display (LCD) and organic LED (OLED).

SUMMARY

According to an embodiment, a display device is provided. The display device includes a plurality of pixels arranged in a matrix, wherein at least one of the pixels comprising: a circuit substrate including at least one transistor; at least one light emitting element on the circuit substrate and electrical connects to the at least one transistor, the at least one light emitting element is provided to emit a first light with a first wavelength; a frame layer on the circuit substrate and includes a wall and at least one cavity surrounded by the wall, wherein the at least one light emitting element is in the at least one groove; and a light transmissive layer in the at least one cavity and in an illuminated area by the at least one light emitting element, the light transmissive layer includes a wavelength conversion material to emit a second light with a second wavelength, wherein the first wavelength is different from the second wavelength, and the at least one transistor is below the wall.

According to an embodiment, the at least one light emitting element includes a first semiconductor layer, a second semiconductor layer, an active layer between the first semiconductor layer and the second semiconductor layer, wherein the active layer includes a light emitting layer.

According to an embodiment, the display device further comprising: a light reflector above the light emitting layer, a first width of the light reflector is smaller than a second width of the active layer.

According to an embodiment, the light transmissive layer is a multi-layer structure and includes a first light transmissive layer between the at least one light emitting element and the wall and a second light transmissive layer covering the first light transmissive layer.

According to an embodiment, the light transmissive layer further comprising a third light transmissive layer covering the second light transmissive layer, and a refractive index of the third light transmissive layer is equal to or greater than a refractive index of the second light transmissive layer.

According to an embodiment, the one of the pixels includes plural light emitting elements and plural groove, a first wall between two adjacent of the light-emitting elements has a first height, a second wall between two adjacent of the pixels has a second height, the second height is equal to or higher than the first height.

According to an embodiment, a surface of the at least one light emitting element includes plural microstructures.

According to an embodiment, a shape of at least one of the first semiconductor layer and the second semiconductor layer is polygon, for example, hexagon.

BRIEF DESCRIPTION OF THE DRAWINGS

FIG. 100 schematically illustrates a cross-sectional view of a traditional light emitting diode along line B-B'.

FIG. 11P, FIG. 11S-1, FIG. 11S-2, and FIG. 11W schematically illustrate the results of conductivity measurement by conductive atomic force microscope.

FIG. 18-1 schematically illustrates a semiconductor structure.

FIG. 18-2 schematically illustrates forming a mask and defining current limiting area by ion implantation.

FIG. 18-3 schematically illustrates the removal of mask.

FIG. 18-4 schematically illustrates the formation of transparent electrode, metal electrode and extension part of the metal electrode.

FIG. 18-5 schematically illustrates the formation of recesses.

FIG. 18-6 schematically illustrates connecting the light emitting diode to a test substrate by a sacrificing layer.

FIG. 18-7 schematically illustrates the removal of growth substrate.

FIG. 18-8 schematically illustrates forming a metal electrode on the first type semiconductor layer.

FIG. 18-9 schematically illustrates performing electroluminescence (EL) detection of light emitting diode by test substrate and photoelectric sensor.

FIG. 18-10 schematically illustrates optionally removing defected component to a collecting substrate.

FIG. 18-11 schematically illustrates mass transfer of array of light emitting components on a permanent substrate.

FIG. 18-12 schematically illustrates transferring light emitting components on the permanent substrate to fill the vacancy.

FIG. 18-13 schematically illustrates finishing the transfer of the light emitting component on the permanent substrate.

FIG. 18-14 schematically illustrates forming walls and transparent adhesive on the permanent substrate.

FIG. 18-15 schematically illustrates forming walls and phosphor with adhesive on the permanent substrate.

FIG. 18-16 schematically illustrates forming walls, transparent adhesive and phosphor with adhesive on the permanent substrate.

FIG. 19-1 schematically illustrates a semiconductor structure.

FIG. 19-2 schematically illustrates the formation of recesses.

FIG. 19-3 schematically illustrates the removal of mask.

FIG. 19-4 schematically illustrates forming a current blocking area by dielectric material.

FIG. 19-5 schematically illustrates the formation of transparent electrode, metal electrode and extension part of the metal electrode.

FIG. 19-6 schematically illustrates connecting the light emitting diode to a test substrate by a sacrificing layer.

FIG. 19-7 schematically illustrates the removal of growth substrate.

FIG. 19-8 schematically illustrates forming a metal electrode on the first type semiconductor layer.

FIG. 19-9 schematically illustrates performing electroluminescence (EL) detection of light emitting diode by test substrate and photoelectric sensor.

FIG. 19-10 schematically illustrates optionally removing defected component to a collecting substrate.

FIG. 19-11 schematically illustrates mass transfer of array of light emitting components on a permanent substrate.

FIG. 19-12 schematically illustrates transferring light emitting components on the permanent substrate to fill the vacancy.

FIG. 19-13 schematically illustrates finishing the transfer of the light emitting component on the permanent substrate.

FIG. 19-14 schematically illustrates forming walls and transparent adhesive on the permanent substrate.

FIG. 19-15 schematically illustrates forming walls and phosphor with adhesive on the permanent substrate.

FIG. 19-16 schematically illustrates forming walls, transparent adhesive and phosphor with adhesive on the permanent substrate.

FIG. 20-1 schematically illustrates a top view of the micro light emitting diode according to the invention, which shows rectangular shape.

FIG. 20-2 schematically illustrates a top view of the micro light emitting diode according to the invention, which shows circular shape.

FIG. 20-3 schematically illustrates a top view of the micro light emitting diode according to the invention, which shows triangular shape.

FIG. 37-1 schematically illustrates epitaxial growth of semiconductor structures on a growth substrate.

FIG. 37-2 schematically illustrates forming a mask and defining current limiting area by ion implantation.

FIG. 37-3 schematically illustrates the removal of mask.

FIG. 37-4 schematically illustrates the formation of recesses and etching areas.

FIG. 37-5 schematically illustrates the formation of transparent electrodes and electrodes.

FIG. 37-6 schematically illustrates connecting the light emitting diode to a test substrate by a sacrificing layer.

FIG. 37-7 schematically illustrates removing the growth substrate by laser.

FIG. 37-8 is the schematic diagram after the growth substrate is removed.

FIG. 37-9 schematically illustrates performing electroluminescence (EL) detection of light emitting diode by test substrate and photoelectric sensor.

FIG. 37-10 schematically illustrates transferring to a transfer substrate.

FIG. 37-11 schematically illustrates optionally removing defected component to a collecting substrate.

FIG. 37-12 schematically illustrates mass transfer of array of light emitting components on a permanent substrate.

FIG. 37-13 schematically illustrates transferring light emitting components on the permanent substrate to fill the vacancy.

FIG. 37-14 schematically illustrates finishing the transfer of the light emitting component on the permanent substrate.

FIG. 37-15 schematically illustrates forming walls and transparent adhesive on the permanent substrate.

FIG. 37-16 schematically illustrates forming walls and phosphor with adhesive on the permanent substrate.

FIG. 37-17 schematically illustrates forming walls, transparent adhesive and phosphor with adhesive on the permanent substrate.

FIG. 37-18 schematically illustrates a circuit block diagram of the flexible display.

Figure 1:
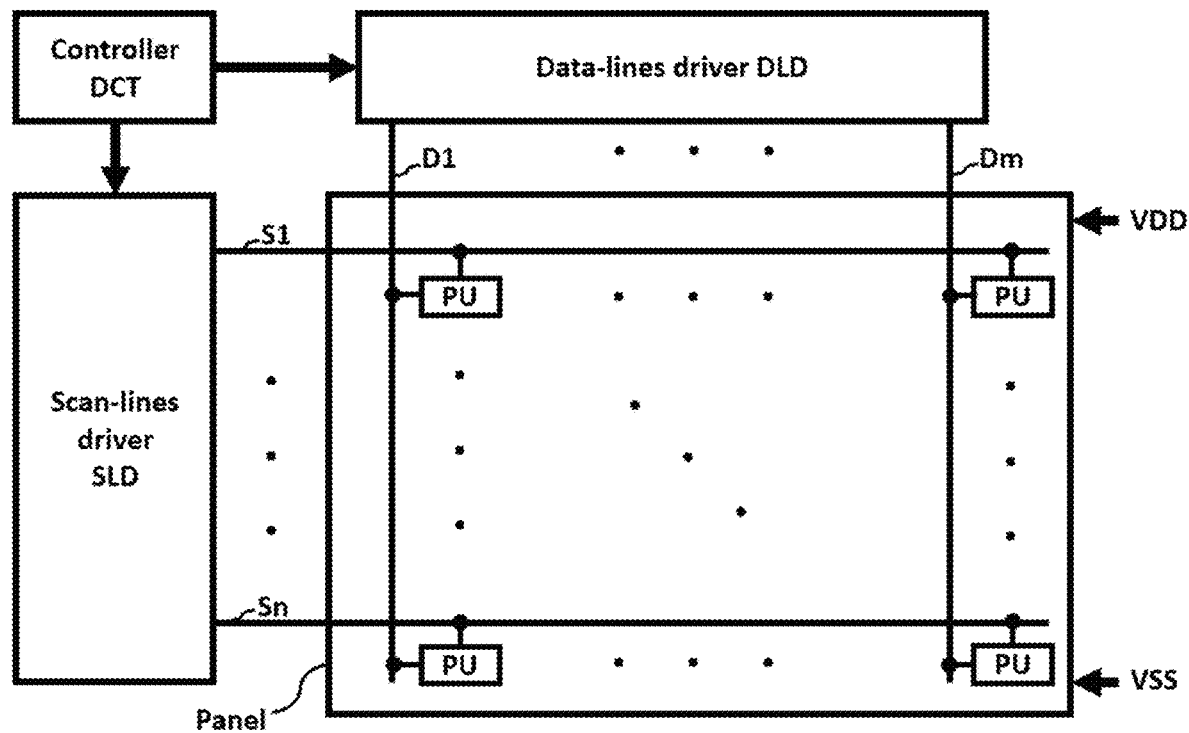
FIG. 1 schematically shows a block diagram of a display device according to an exemplary embodiment.
Figures 1, 42:
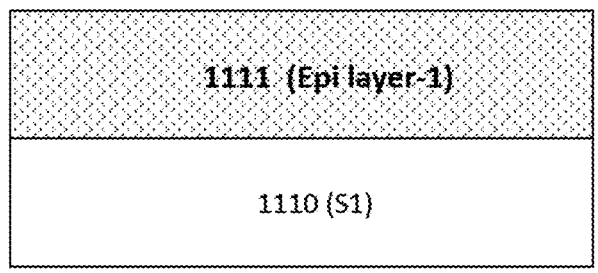
Figures 2, 42:
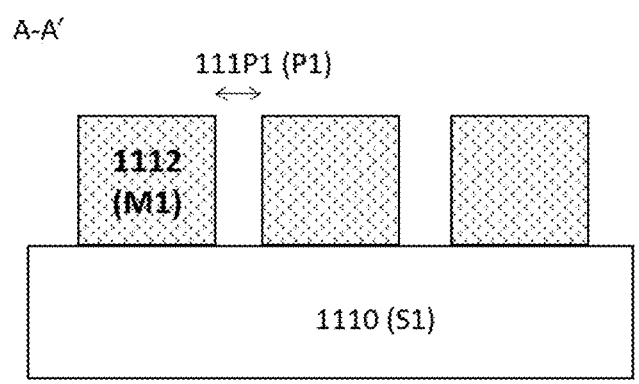
Figures 3, 42:
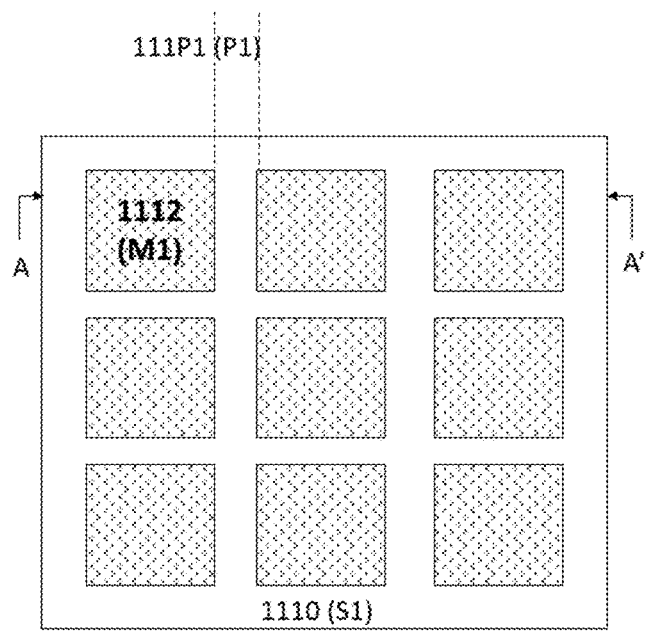

FIG. 42-1 schematically illustrates forming a first epitaxial layer structure on a first epitaxial substrate.

Figure 2:
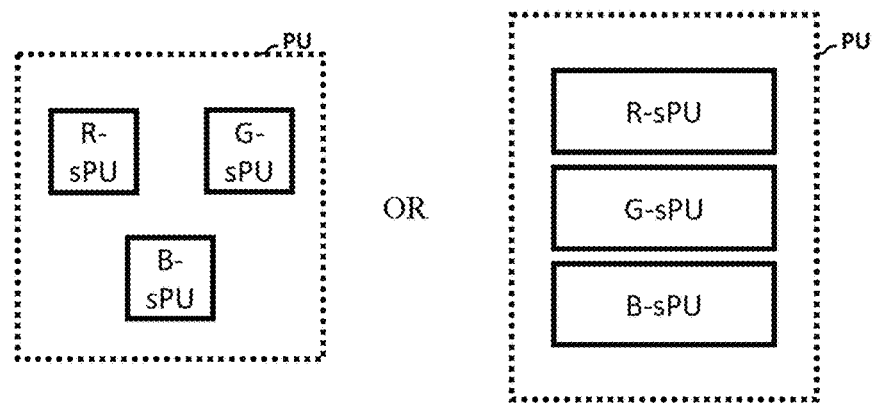
FIG. 2 schematically shows two kinds of sub-pixel distributions in a pixel unit according to an exemplary embodiment.

FIG. 42-2 schematically illustrates a horizontal cross-sectional view along line A-A' of first micro light emitting diodes formed through photolithography and etching process, and the pitch between the first micro light emitting diodes is P1.

Figure 3:
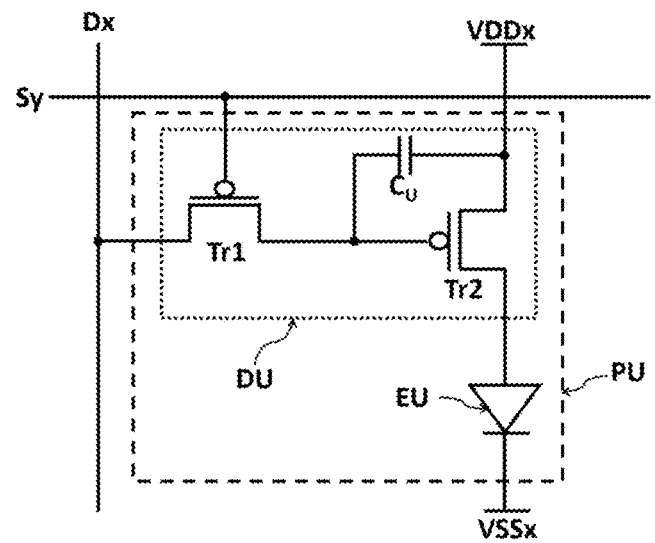
FIG. 3 is a schematic diagram of a control circuit of a pixel unit PU according to an embodiment.

FIG. 42-3 schematically illustrates a top view of FIG. 42-2.

Figures 1, 43:
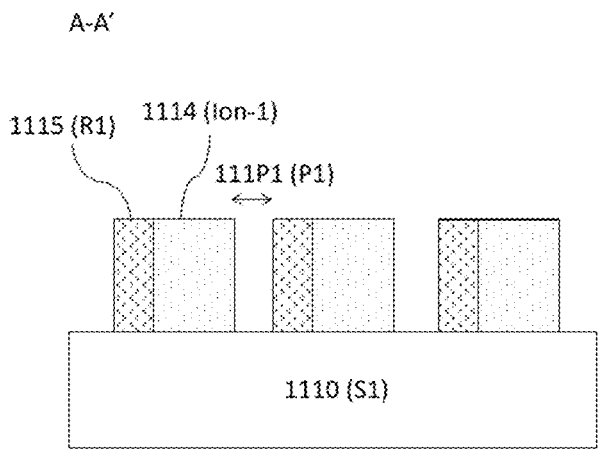
Figures 2, 43:
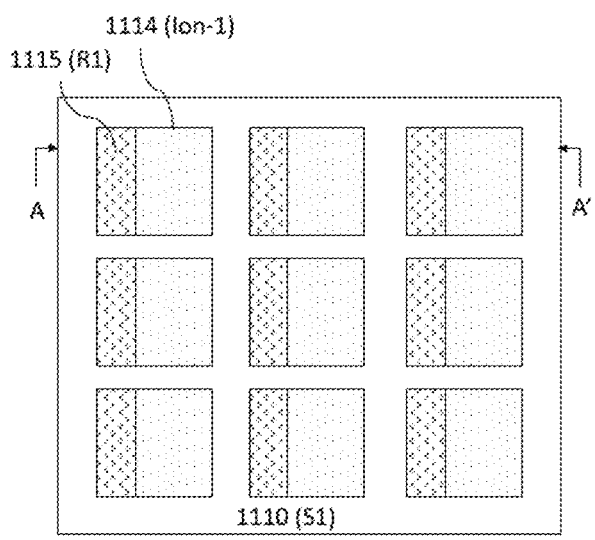

FIG. 43-1 schematically illustrates a horizontal cross-sectional view along line A-A', wherein the first ion implantation area and the first sub-pixel area are defined by ion implantation.

FIG. 43-2 schematically illustrates a top view of FIG. 43-1.

Figures 1, 44:
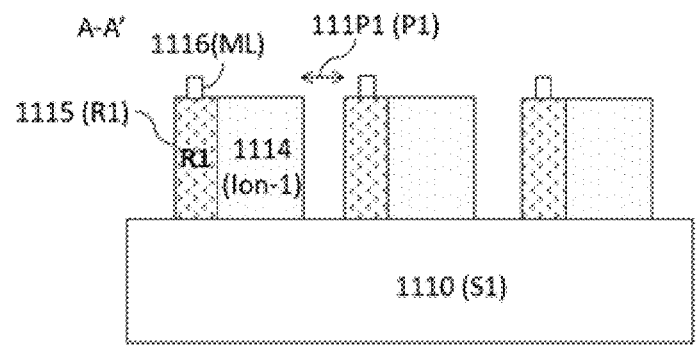
Figures 2, 44:
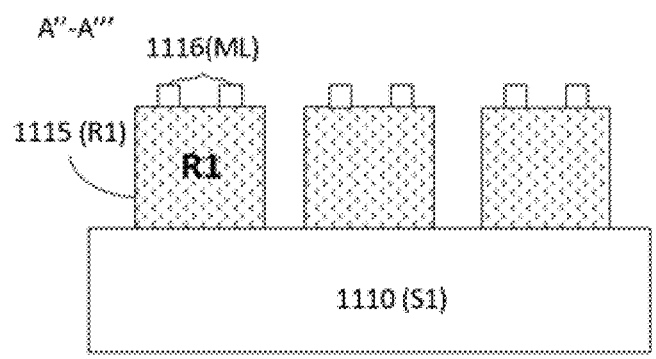
Figures 3, 44:
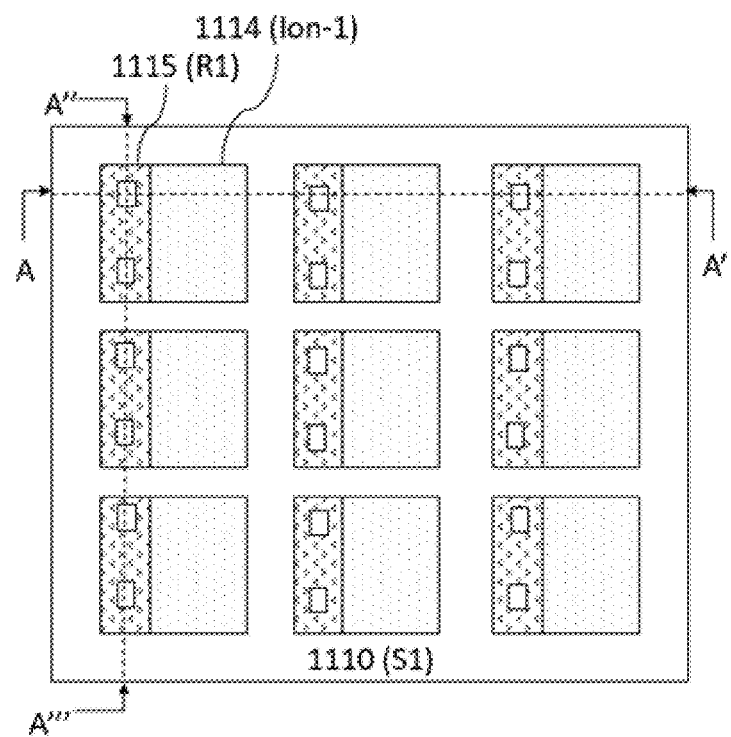

FIG. 44-1 schematically illustrates a horizontal cross-sectional view along line A-A', wherein a conductive layer is formed on the first sub-pixel area.

FIG. 44-2 schematically illustrates a horizontal cross-sectional view along line A"-A", wherein the conductive layer is formed on the first sub-pixel area.

FIG. 44-3 schematically illustrates a top view of FIG. 44-2.

Figures 1, 45:
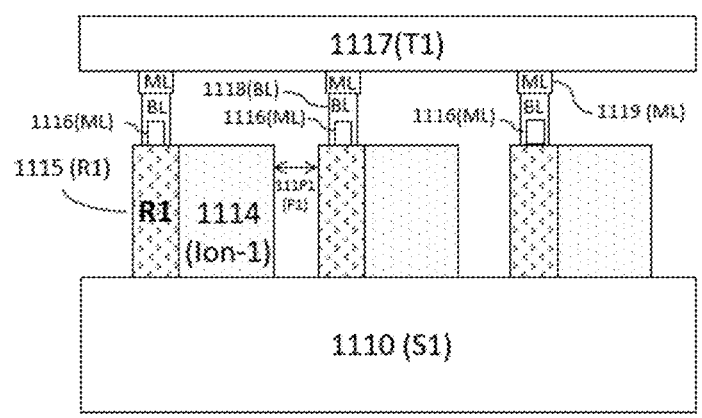
Figures 2, 45:
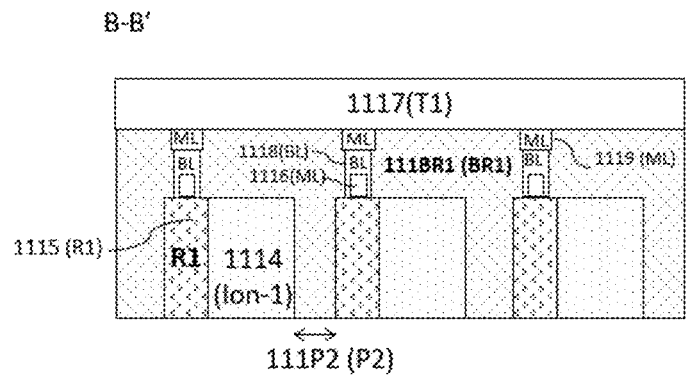
Figures 3, 45:
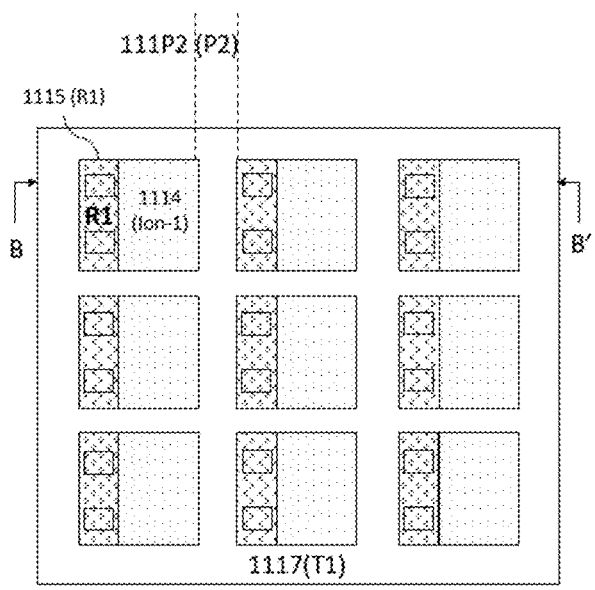

FIG. 45-1 schematically illustrates electrically connecting the first sub-pixel area including conductive layer and the first transparent substrate through bonding pads.

FIG. 45-2 schematically illustrates removing the first epitaxial substrate, and filling a first light-transmissive intermediate layer between the first transparent substrate and the first sub-pixel area.

FIG. 45-3 schematically illustrates a top view of FIG. 45-2.

Figures 1, 46:
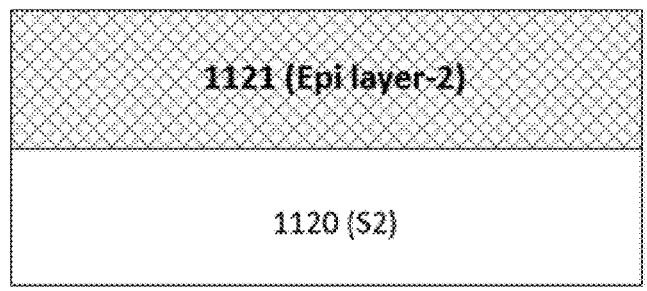
Figures 2, 46:
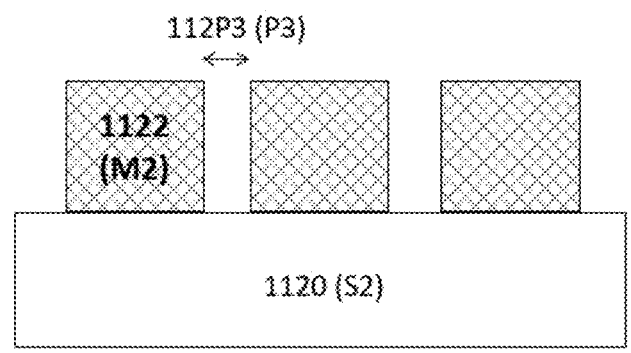
Figures 3, 46:
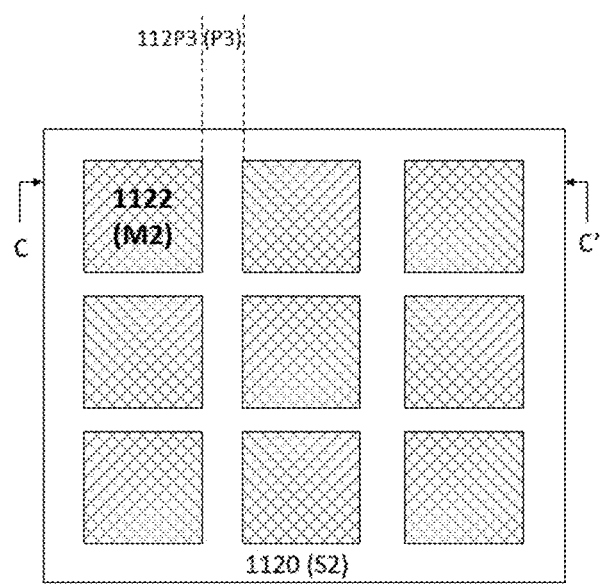

FIG. 46-1 schematically illustrates forming a second epitaxial layer structure on a second epitaxial substrate.

FIG. 46-2 schematically illustrates a horizontal cross-sectional view along line C-C' of second micro light emitting diodes formed through photolithography and etching process, and the pitch between the second micro light emitting diodes is P3.

FIG. 46-3 schematically illustrates a top view of FIG. 46-2.

Figures 1, 47:
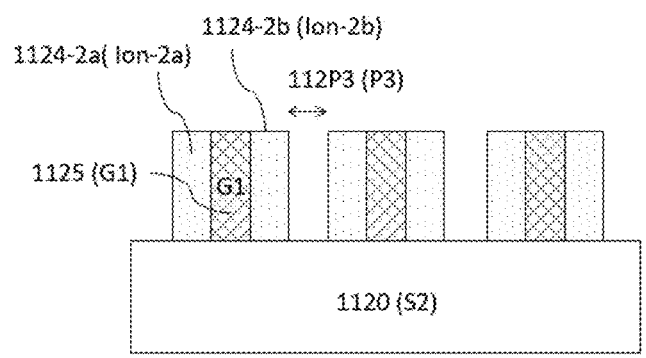
Figures 2, 47:
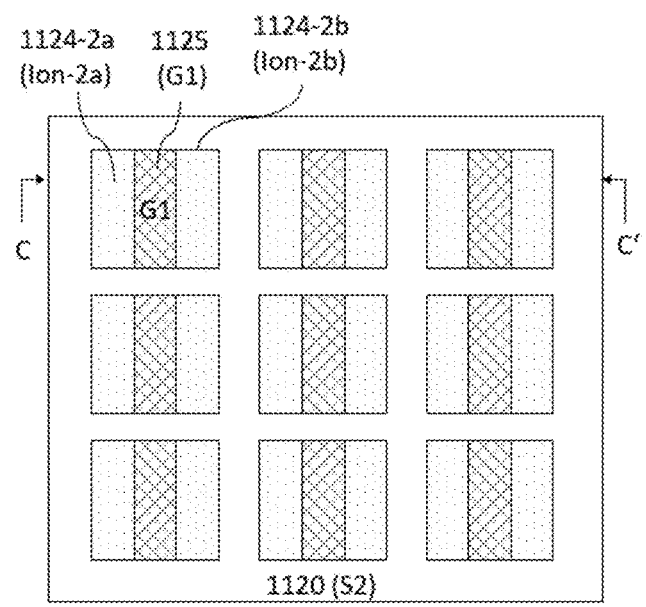

FIG. 47-1 schematically illustrates a horizontal cross-sectional view along line C-C', wherein a first region of a second ion implantation area, a second region of the second ion implantation area, and a second sub-pixel area of the second micro light emitting diode are defined by ion implantation.

FIG. 47-2 schematically illustrates a top view of FIG. 47-1.

Figures 1, 48:
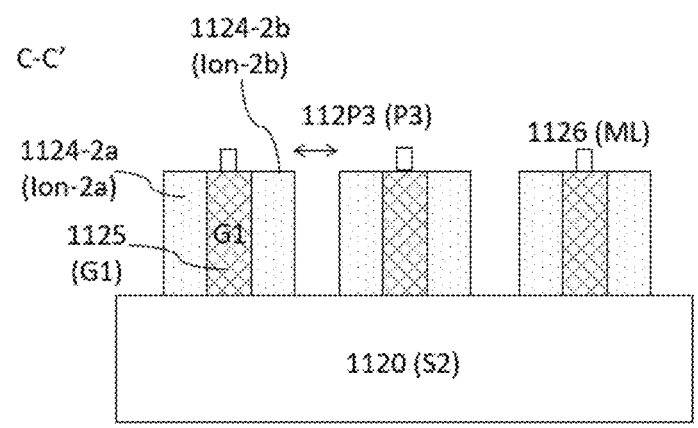
Figures 2, 48:
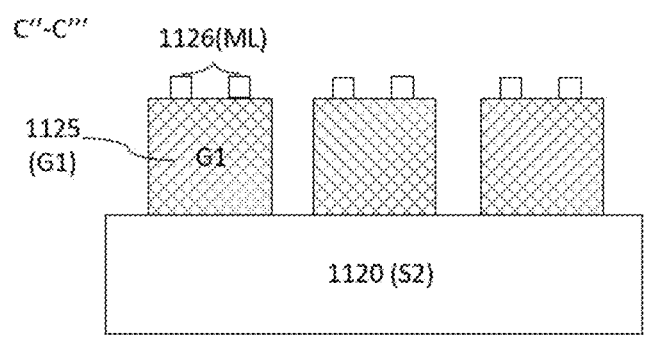
Figures 3, 48:
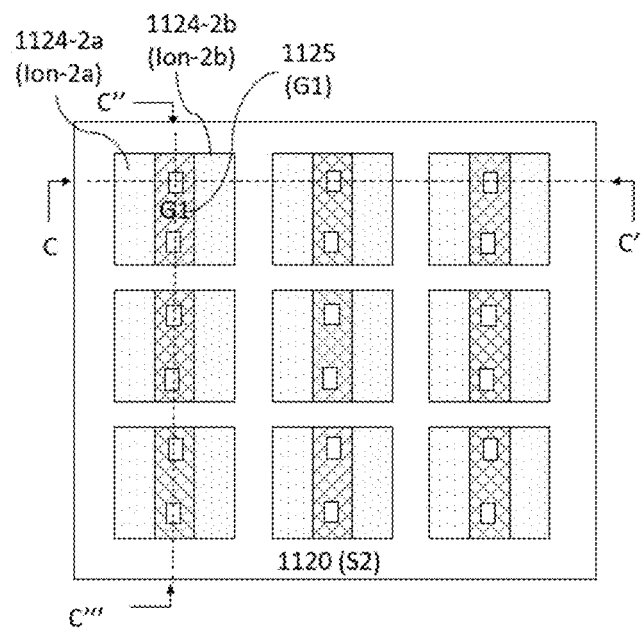

FIG. 48-1 schematically illustrates a horizontal cross-sectional view along line C-C', wherein a conductive layer is formed on the second sub-pixel area.

FIG. 48-2 schematically illustrates a horizontal cross-sectional view along line C"-C'", wherein a conductive layer is formed on the second sub-pixel area.

FIG. 48-3 schematically illustrates a top view of FIG. 48-1.

Figures 1, 49:
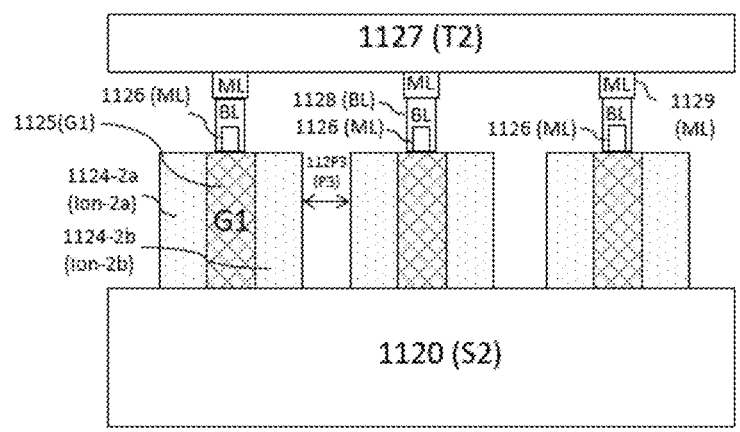
Figures 2, 49:
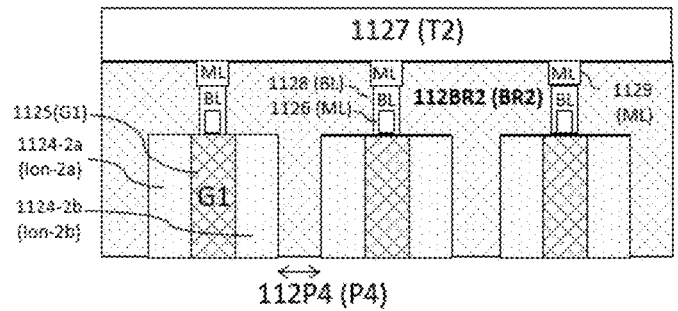
Figures 3, 49:
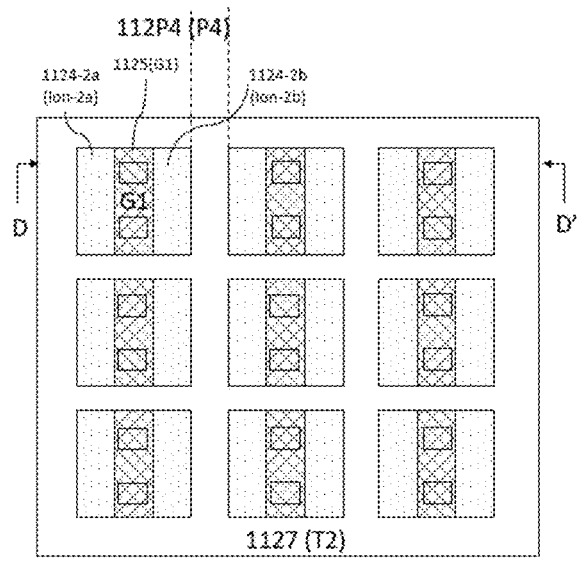

FIG. 49-1 schematically illustrates electrically connecting the second sub-pixel area including conductive layer structure and a second transparent substrate through bonding pads.

FIG. 49-2 schematically illustrates removing the second epitaxial substrate, and filling a second light-transmissive intermediate layer between the second transparent substrate and the second sub-pixel area.

FIG. 49-3 schematically illustrates a top view of FIG. 49-1.

Figures 1, 50:
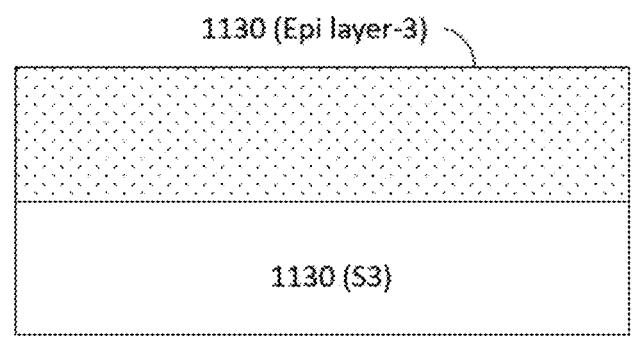
Figures 2, 50:
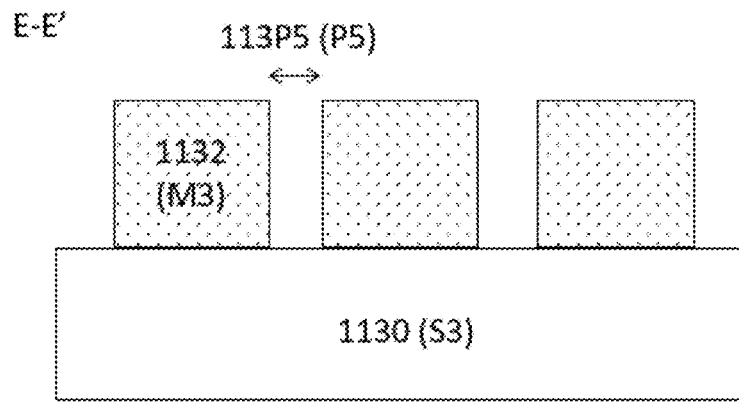
Figures 3, 50:
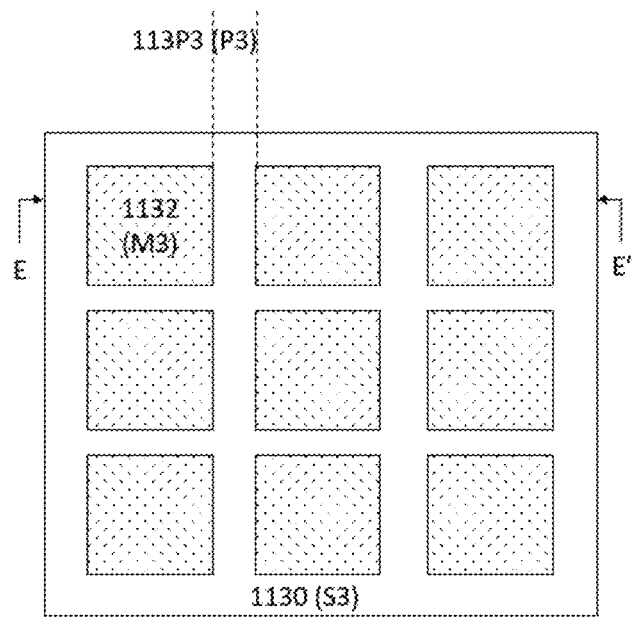

FIG. 50-1 schematically illustrates forming a third epitaxial layer structure on a third epitaxial substrate.

FIG. 50-2 schematically illustrates a horizontal cross-sectional view along line E-E', wherein a third ion implantation area and a third sub-pixel area are defined by ion implantation.

FIG. 50-3 schematically illustrates a top view of FIG. 50-2.

Figures 1, 51:
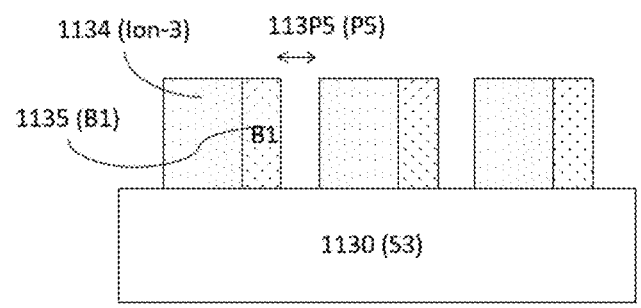
Figures 2, 51:
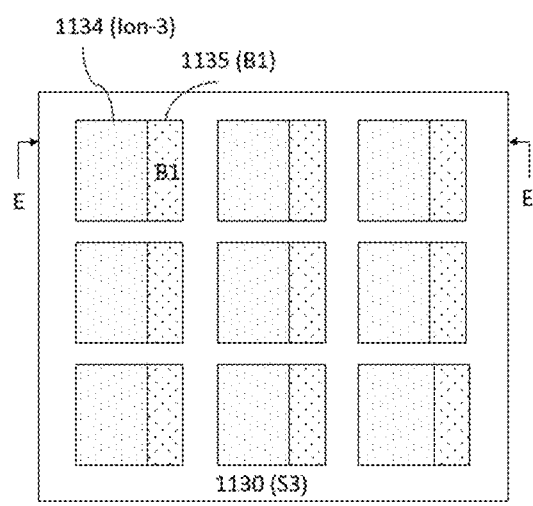

FIG. 51-1 schematically illustrates a horizontal cross-sectional view of a third micro light emitting diode along line C-C', wherein a third ion implantation area and a third sub-pixel area are defined by ion implantation.

FIG. 51-2 schematically illustrates a top view of FIG. 51-1.

Figures 1, 52:
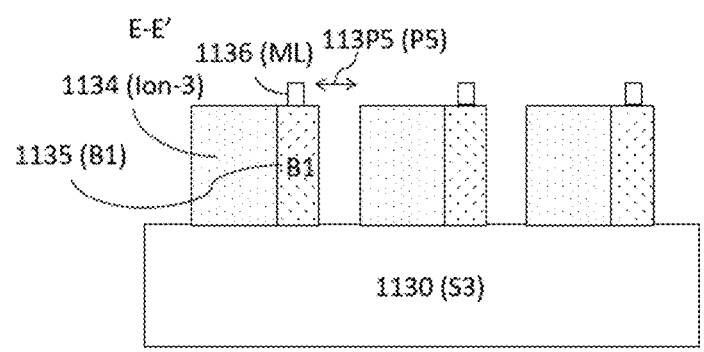
Figures 2, 52:
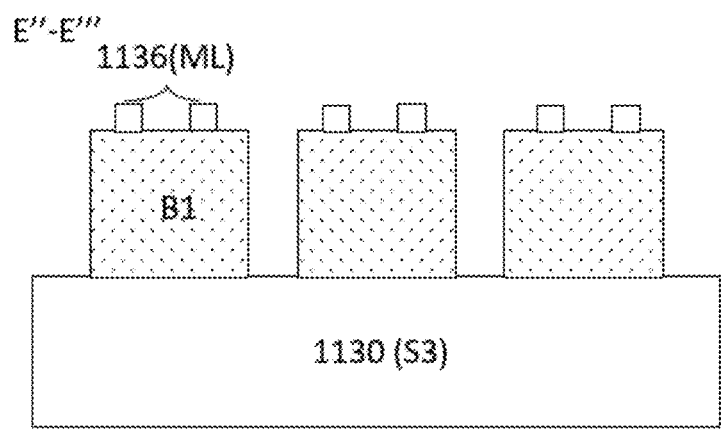
Figures 3, 52:
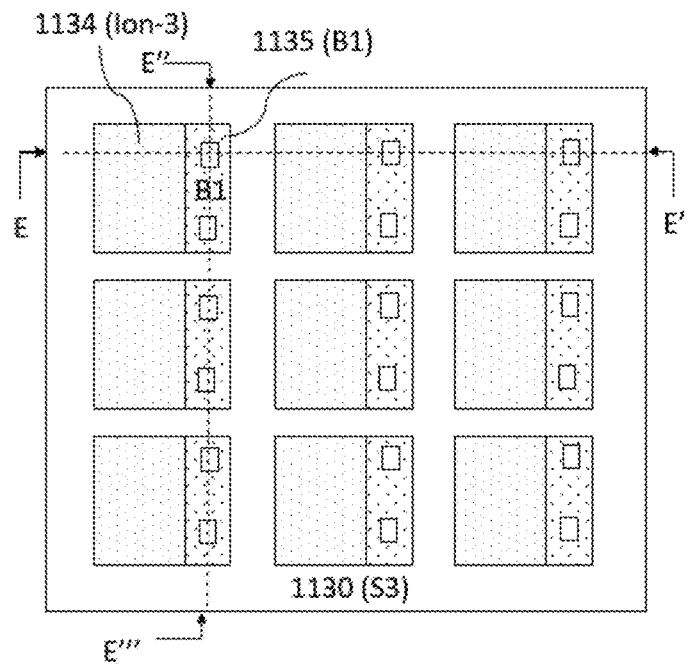

FIG. 52-1 schematically illustrates a horizontal cross-sectional view along line E-E', wherein a conductive layer is formed on the third sub-pixel area.

FIG. 52-2 schematically illustrates a horizontal cross-sectional view along line E"-E'".

FIG. 52-3 schematically illustrates a top view of FIG. 52-1.

Figures 1, 53:
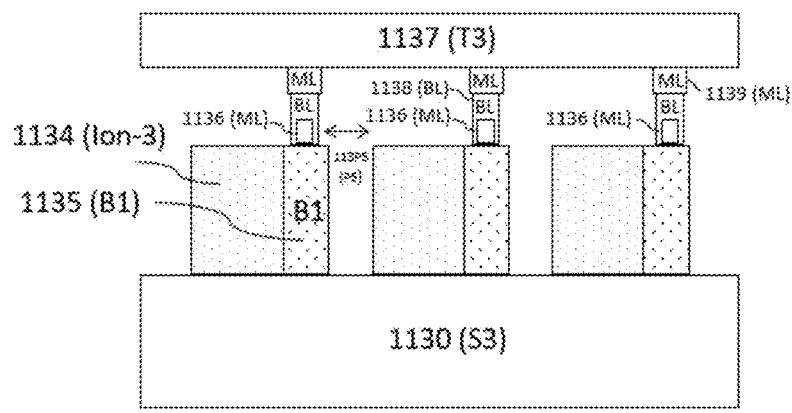
Figures 2, 53:
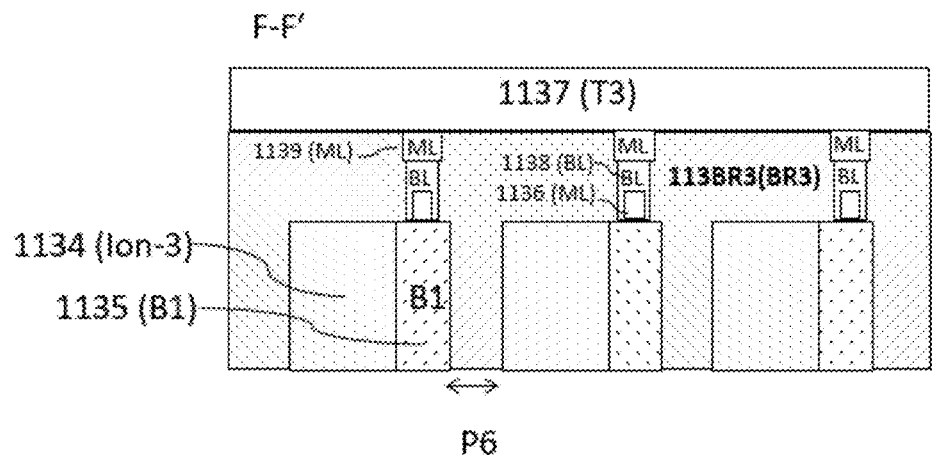
Figures 3, 53:
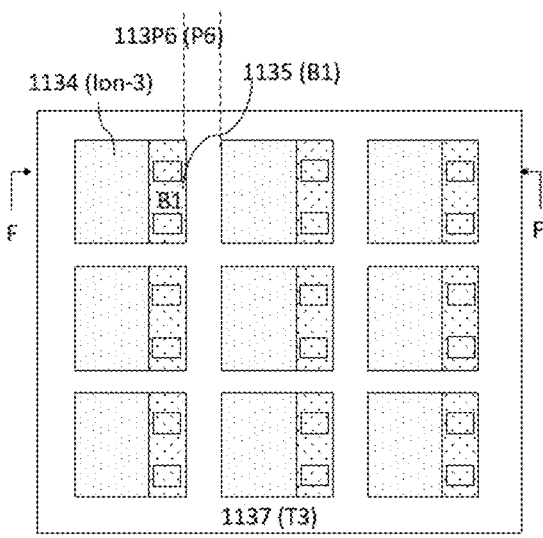

FIG. 53-1 schematically illustrates electrically connecting the third sub-pixel area including conductive layer structure and a third transparent substrate through bonding pads.

FIG. 53-2 schematically illustrates removing the third epitaxial substrate, and filling a third light-transmissive intermediate layer between the third transparent substrate and the third sub-pixel area.

FIG. 53-3 schematically illustrates a top view of FIG. 53-1.

Figures 1, 54:
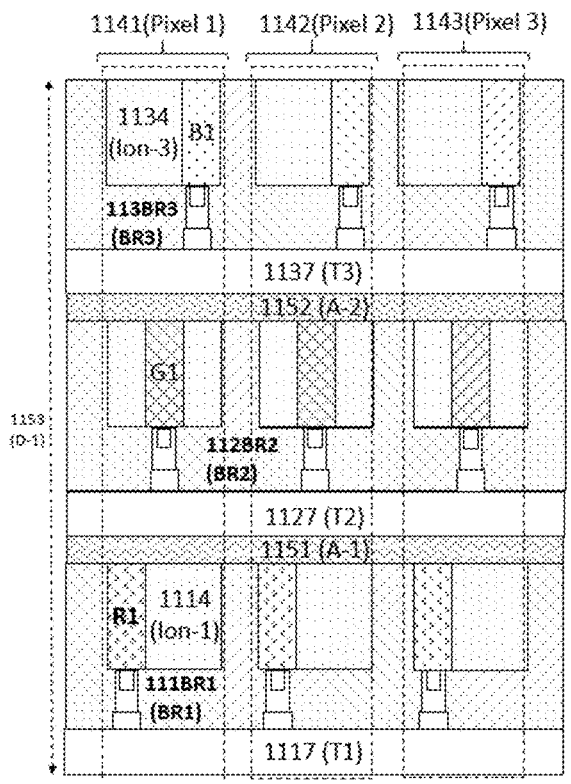
Figures 2, 54:
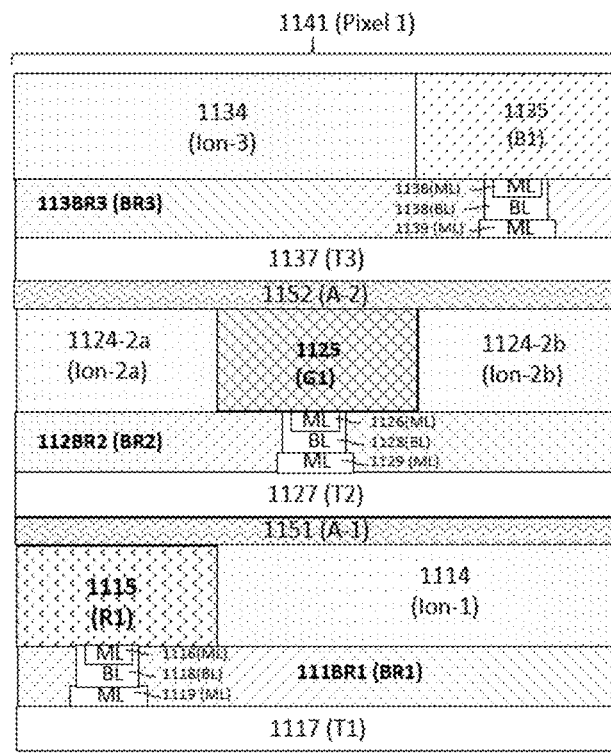
Figures 3, 54:
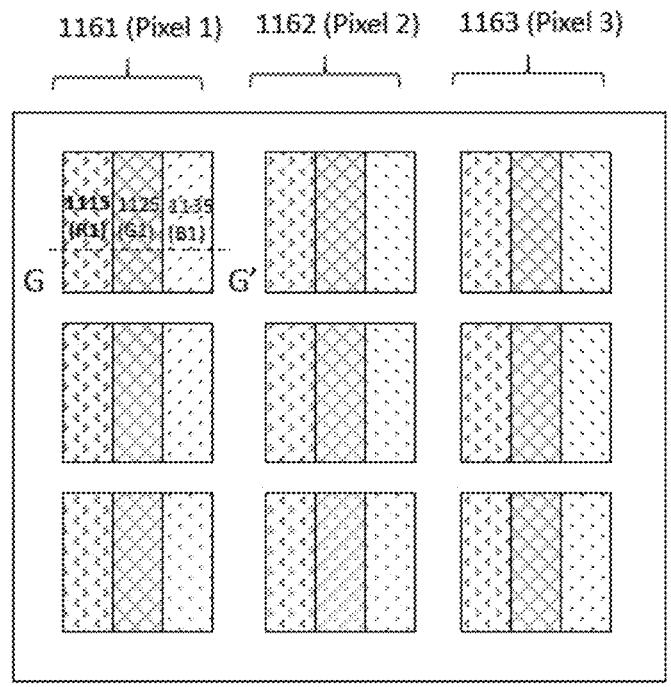

FIG. 54-1 schematically illustrates stacking a first sub-pixel structure, a second sub-pixel structure, and a third sub-pixel structure by light light-transmissive adhesive layers (A-1 and A-2) to form a three-dimensional stack of RGB pixels array, thereby achieving the micro light emitting diode.

FIG. 54-2 schematically illustrates an enlargement horizontal cross-sectional view of a first pixel along line G-G'.

FIG. 54-3 schematically illustrates a top view of FIG. 54-2.

Figures 1, 55:
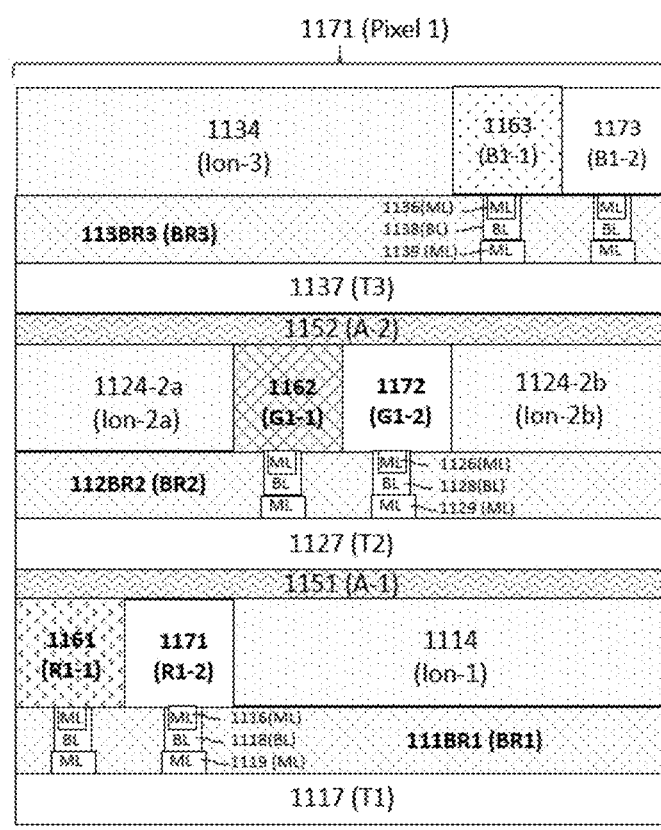
Figures 2, 55:
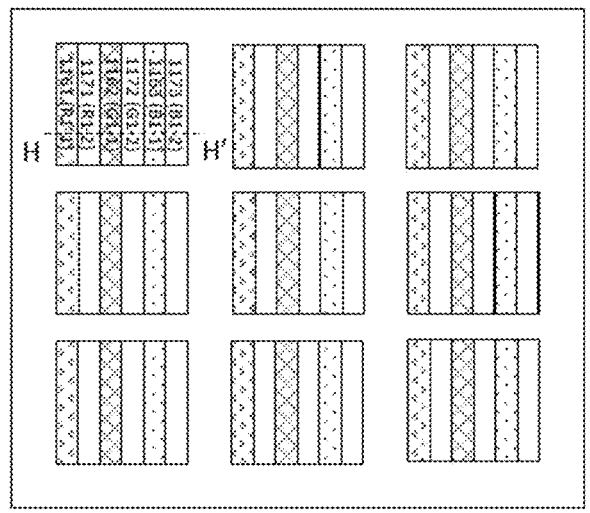

FIG. 55-1 schematically illustrates a horizontal cross-sectional view along line H-H' according to another embodiment of the invention, wherein R1-1 is the first sub-pixel, R1-2 is the first redundancy sub-pixel, G1-1 is the second sub-pixel, G1-2 is the second redundancy sub-pixel, B1-1 is the third sub-pixel, and B1-2 is the third redundancy sub-pixel.

FIG. 55-2 schematically illustrates a top view of FIG. 55-1.

Figures 1, 56:
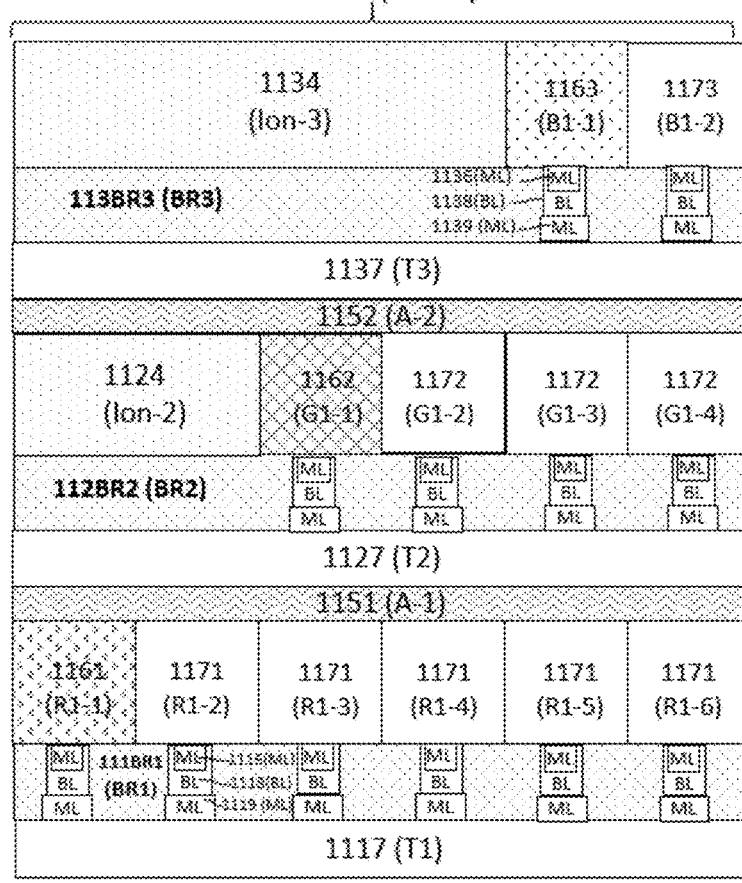
Figures 2, 56:
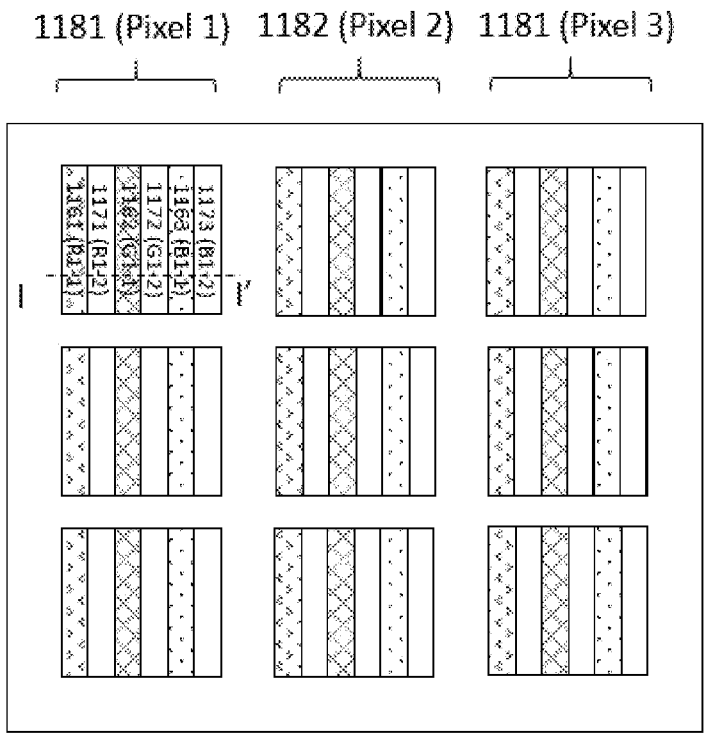

FIG. 56-1 schematically illustrates a horizontal cross-sectional view along line I-I' according to another embodiment of the invention, wherein R1-1 is first sub-pixel, R1-2, R1-3, R1-4, R1-5 and R1-6 are first redundancy sub-pixels, G1-1 is second sub-pixel, G1-2, G1-3 and G1-4 are second redundancy sub-pixels, B1-1 is third sub-pixel, and B1-2 is third redundancy sub-pixel.

FIG. 56-2 schematically illustrates a top view of FIG. 56-1.

Figures 1, 57:
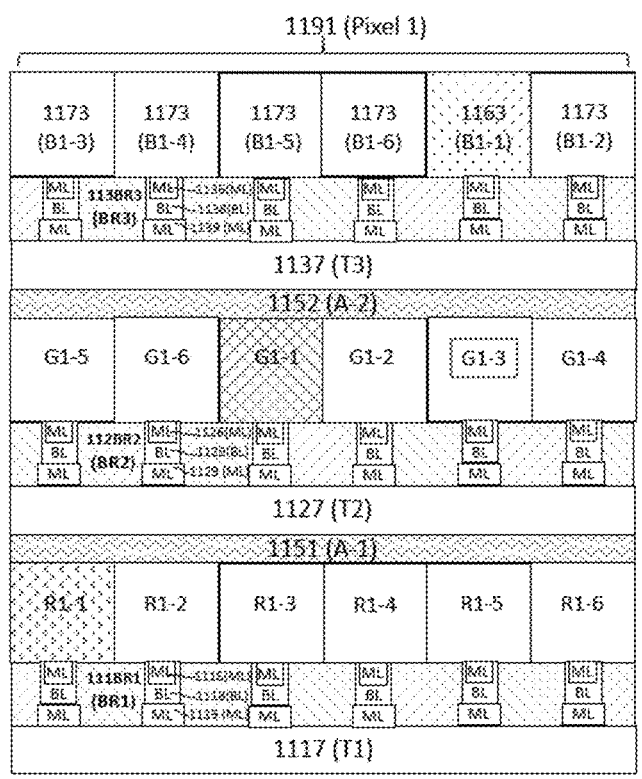
Figures 2, 57:
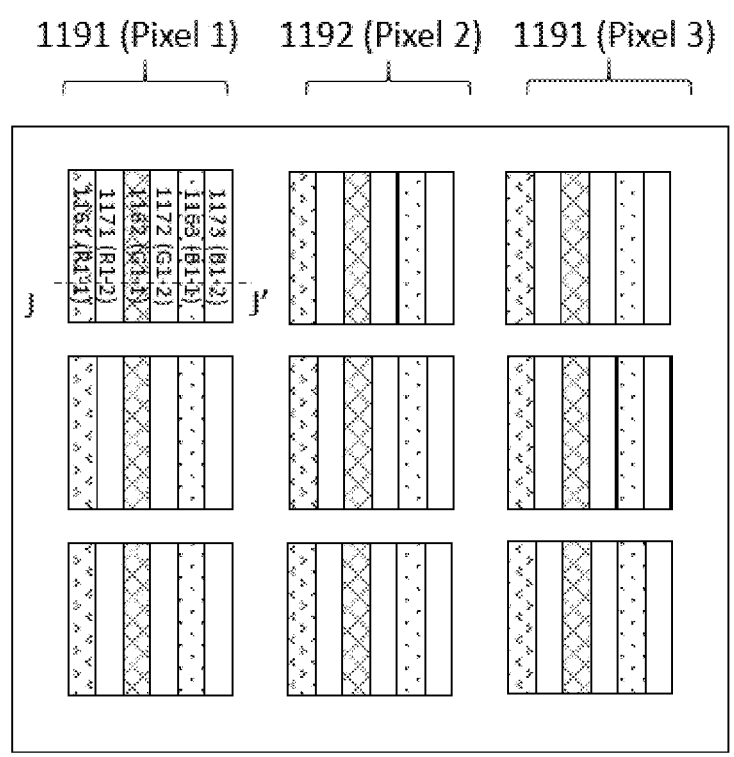

FIG. 57-1 schematically illustrates a horizontal cross-sectional view along line J-J' according to another embodiment of the invention, wherein R1-1 is first sub-pixel, R1-2, R1-3, R1-4, R1-5 and R1-6 are first redundancy sub-pixels, G1-1 is second sub-pixel, G1-2, G1-3, G1-4, G1-5 and G1-6 are second redundancy sub-pixels, B1-1 is third sub-pixel, and B1-2, B1-3, B1-4, B1-5 and B1-6 are third redundancy sub-pixels.

FIG. 57-2 schematically illustrates a top view of FIG. 57-1.

Figures 1, 58:
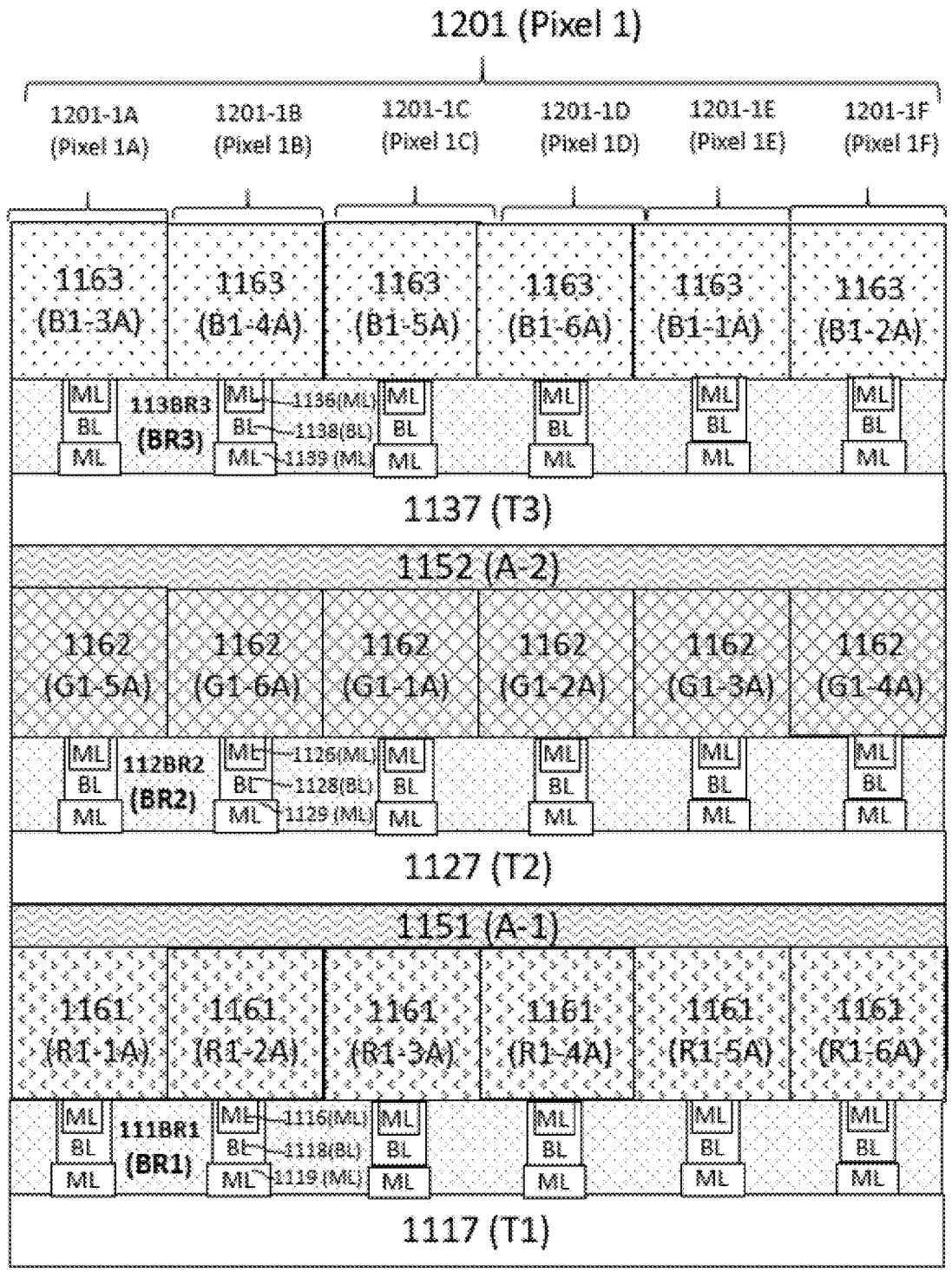
Figures 2, 58:
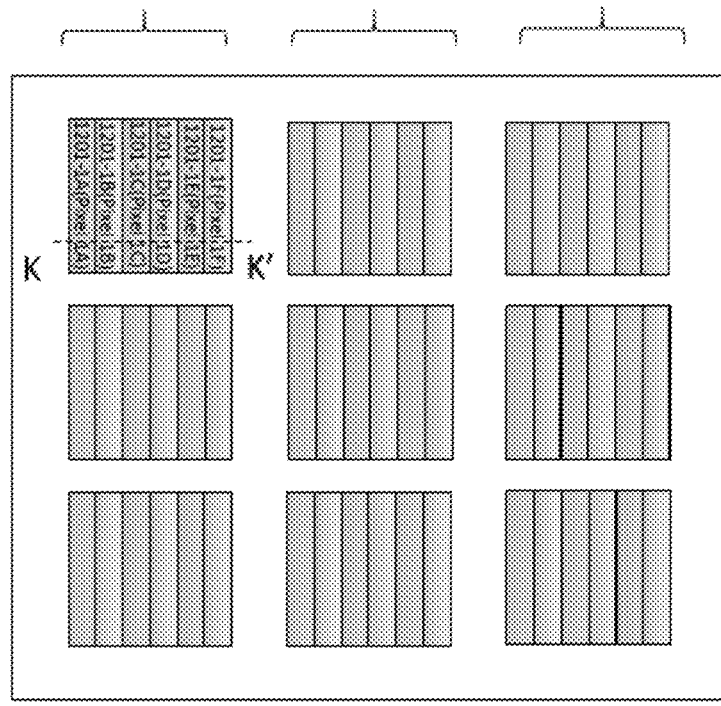

FIG. 58-1 schematically illustrates a horizontal cross-sectional view along line K-K' according to another embodiment of the invention, wherein R1-1, R1-2, R1-3, R1-4, R1-5 and R1-6 are first sub-pixels, G1-1, G1-2, G1-3, G1-4, G1-5 and G1-6 are second sub-pixels, and B1-1, B1-2, B1-3, B1-4, B1-5 and B1-6 are third sub-pixels.

FIG. 58-2 schematically illustrates a top view of FIG. 58-1.

Figure 59:
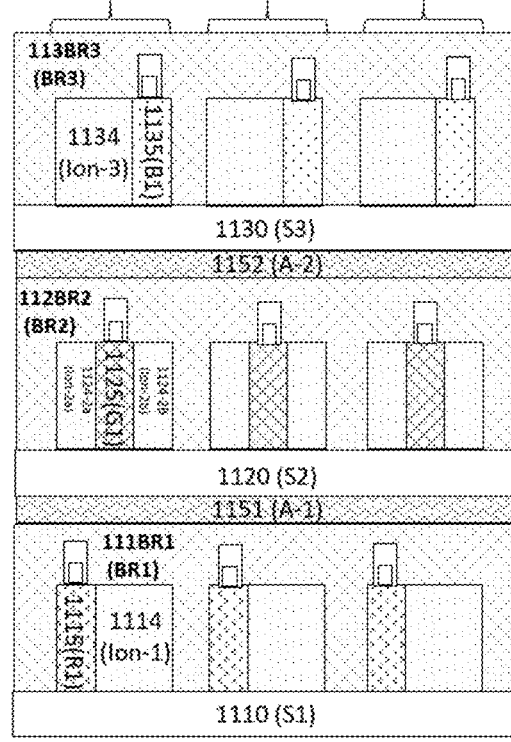

FIG. 59 schematically illustrates another embodiment of the invention, wherein the epitaxial substrates (S1, S2 and S3) are transparent substrates, and the RGB micro light emitting diode may be directly stacked in 3D without transferring to a transparent substrate, thereby simplifying the process.

Figure 60:
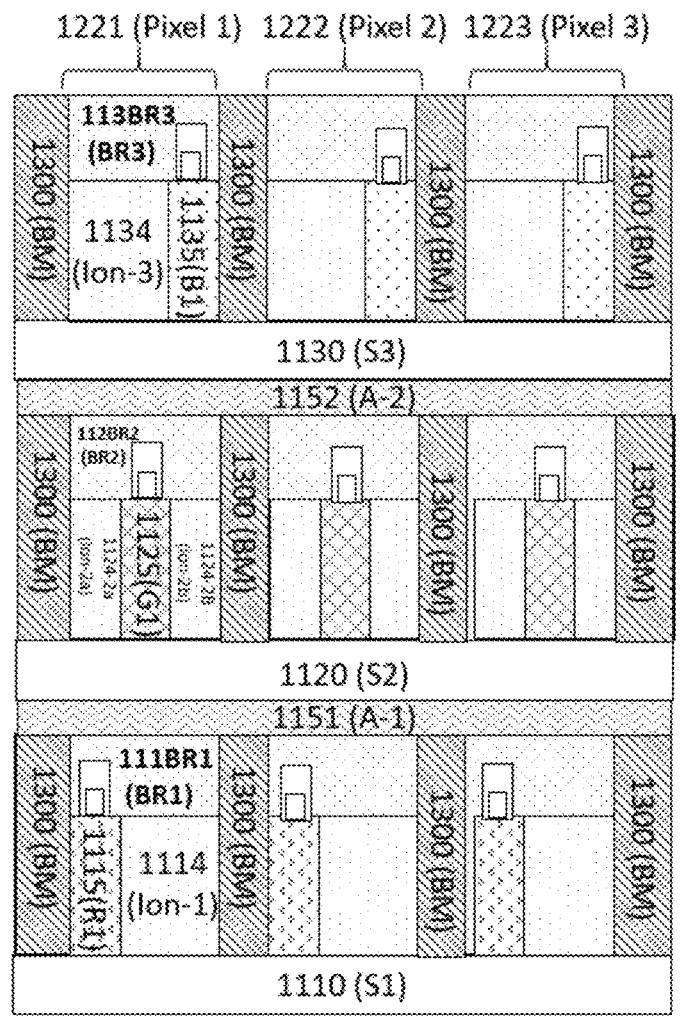

FIG. 60 schematically illustrates another embodiment of the invention further including a black matrix layer to increase the contrast of pixels.

Figure 61:
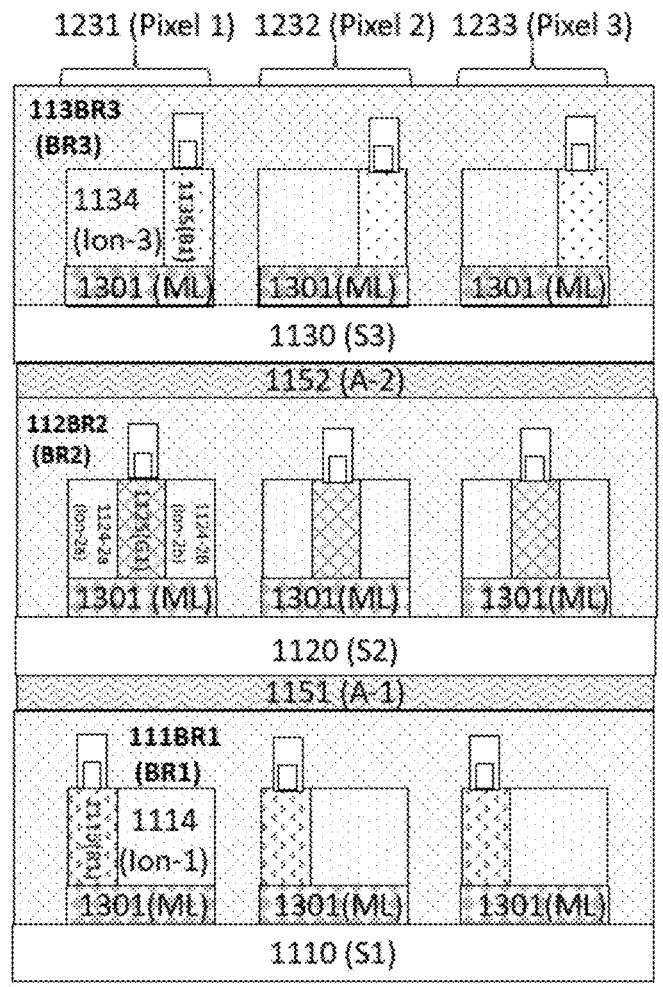

FIG. 61 schematically illustrates another embodiment of the invention further including a magnetic layer in each of the micro light emitting diodes to increase precision of 3D stacking.

Figure 62:
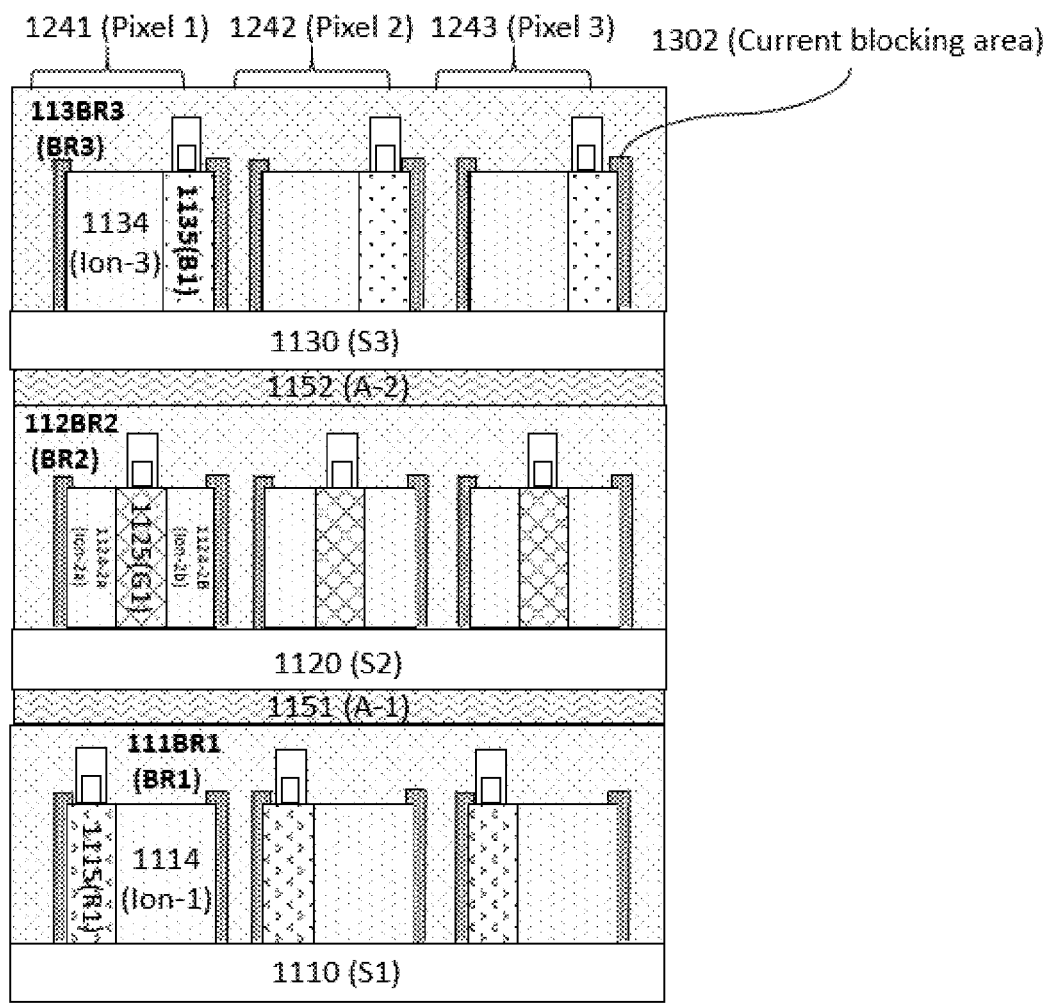

FIG. 62 schematically illustrates another embodiment of the invention further including a current blocking area located at surface and side area of the micro light emitting diode in each of the micro light emitting diodes.

Figure 63:
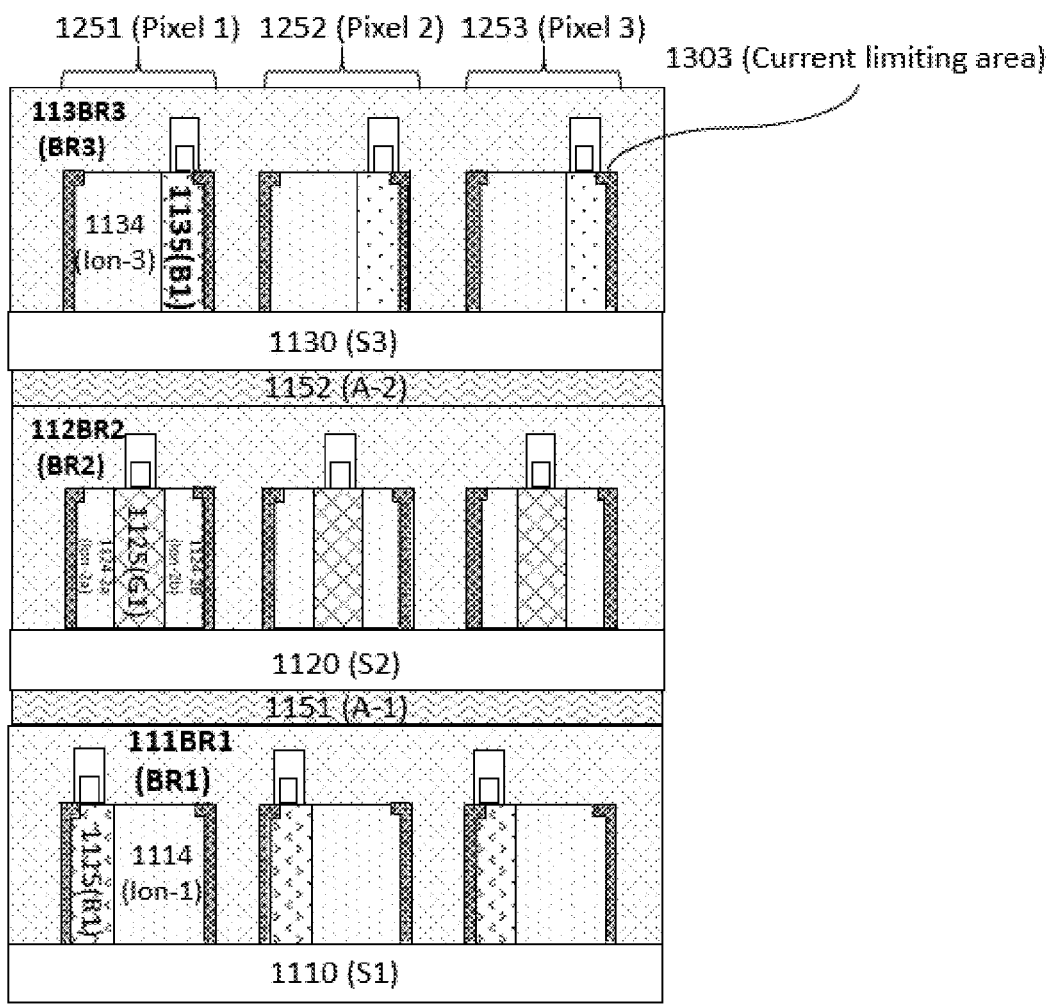

FIG. 63 schematically illustrates another embodiment of the invention further including a current limiting area located at surface and side area of the micro light emitting diode in each of the micro light emitting diodes.

Figures 1, 64:
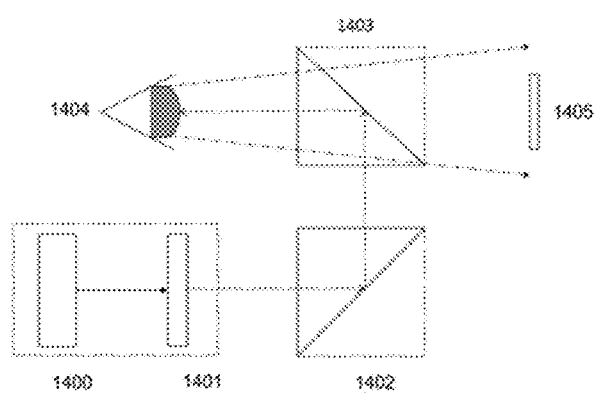
Figures 2, 64:
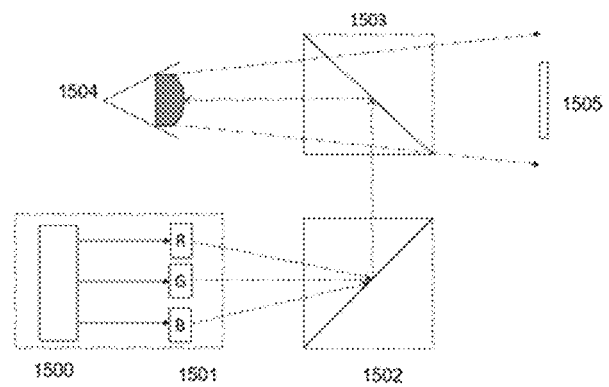
Figures 3, 64:
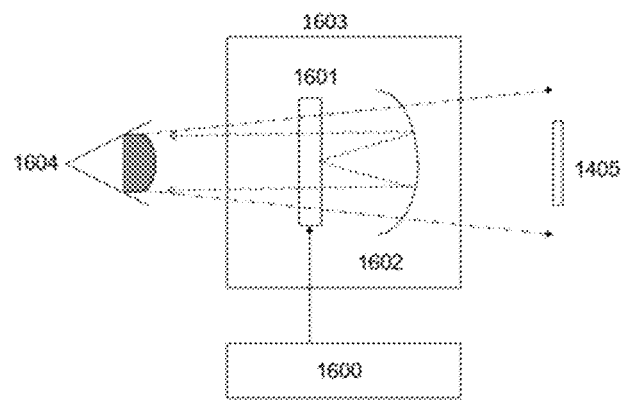
Figures 4, 64:
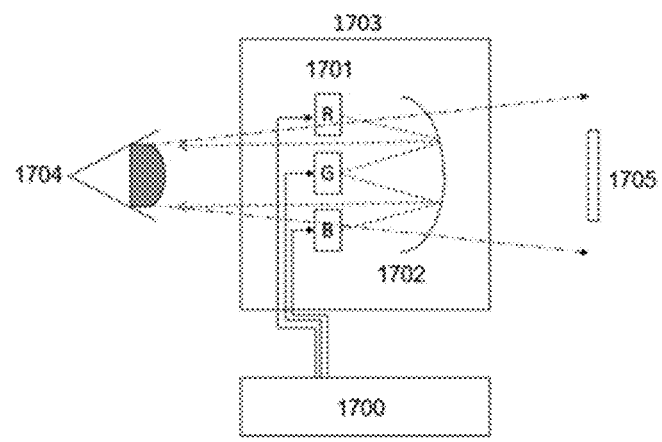
Figures 5, 64:
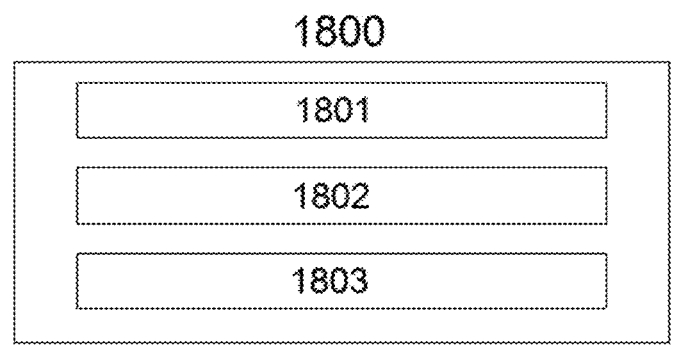

FIG. 64-1 schematically illustrates another embodiment of the application which can be applied to augmented reality (AR).

FIG. 64-2 schematically illustrates another embodiment of the application which can be applied to augmented reality (AR).

FIG. 64-3 schematically illustrates another embodiment of the application which can be applied to augmented reality (AR).

Figure 4:
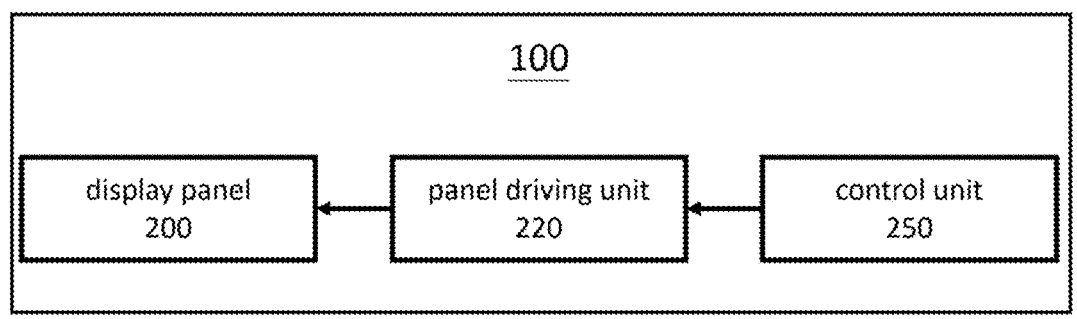
FIG. 4 is an exemplary block diagram of a display according to an embodiment.

FIG. 64-4 schematically illustrates another embodiment of the application which can be applied to augmented reality (AR).

Figures 1, 18:
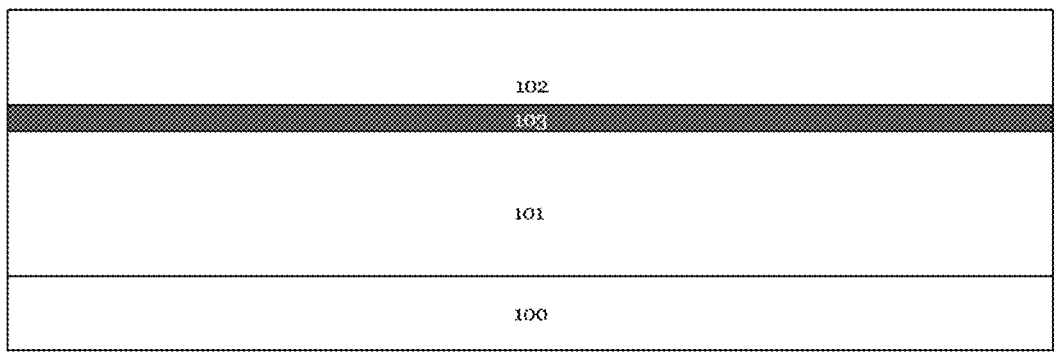
Figures 2, 18:
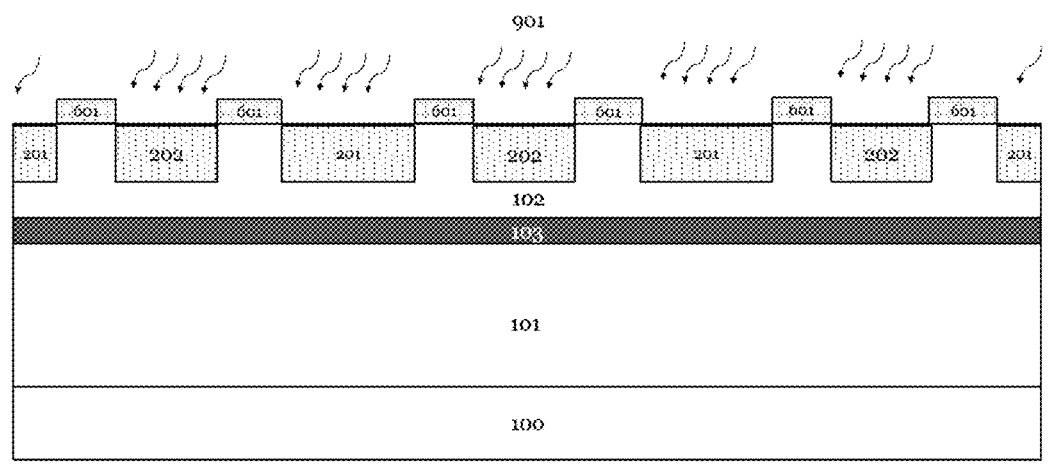
Figures 3, 18:
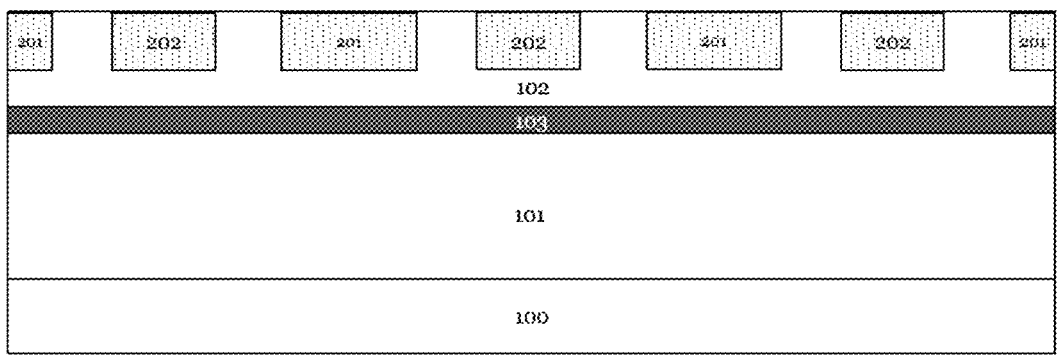
Figures 4, 18:
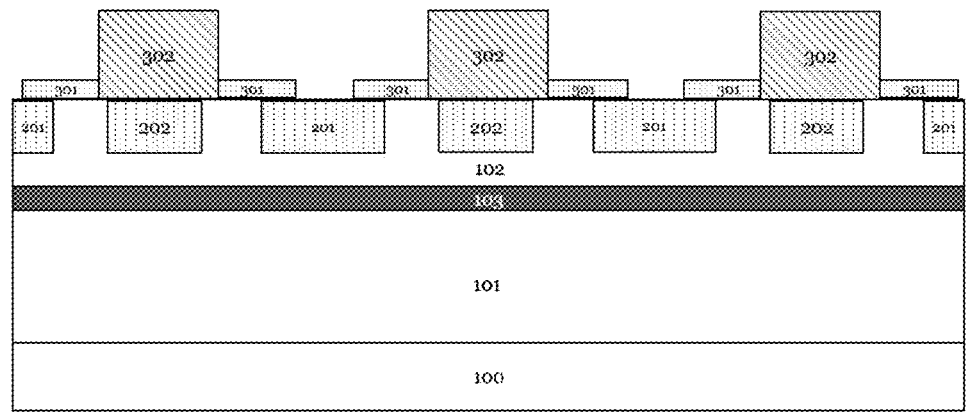
Figures 5, 18:
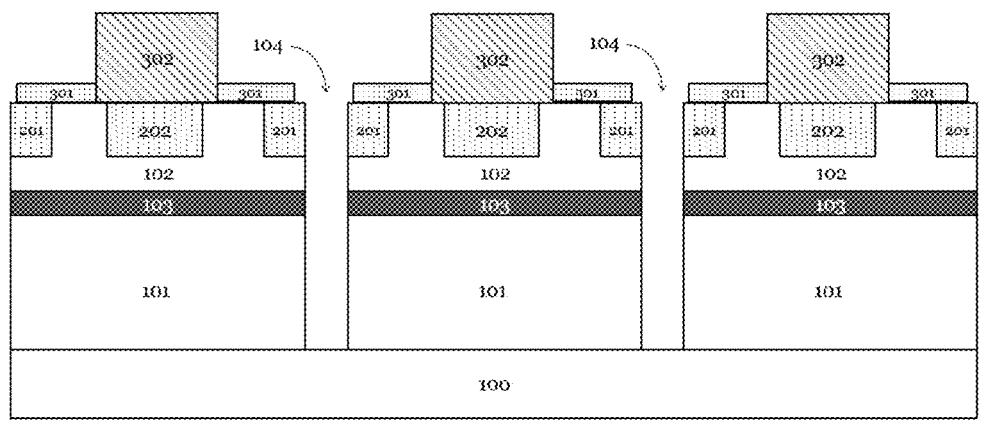

FIG. 64-5 schematically illustrates an integrated control system.

Figures 1, 65:
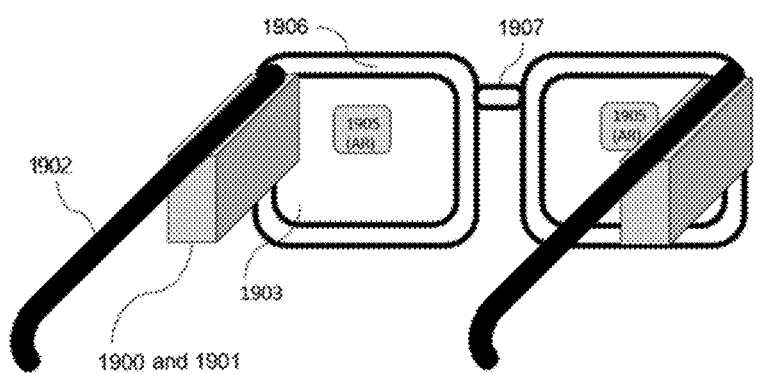
Figures 2, 65:
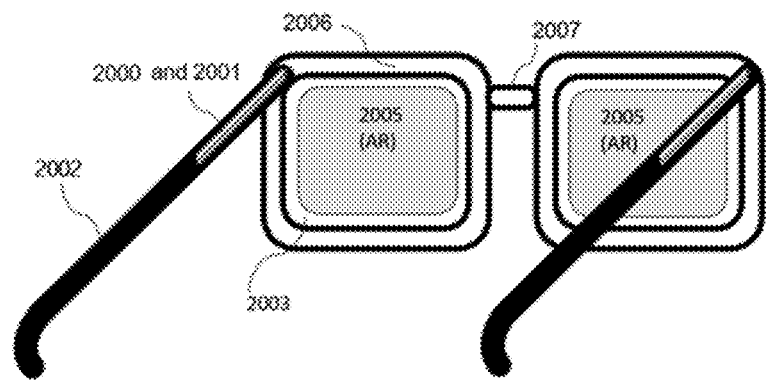
Figures 3, 65:
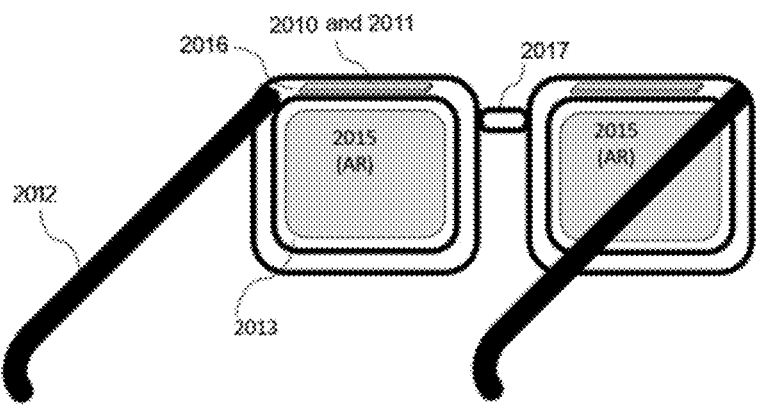
Figures 4, 65:
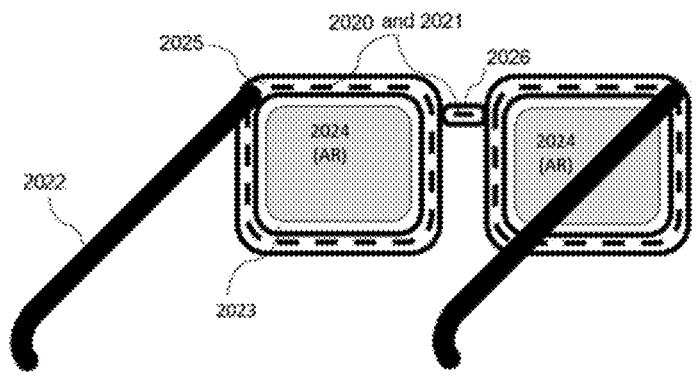
Figures 5, 65:
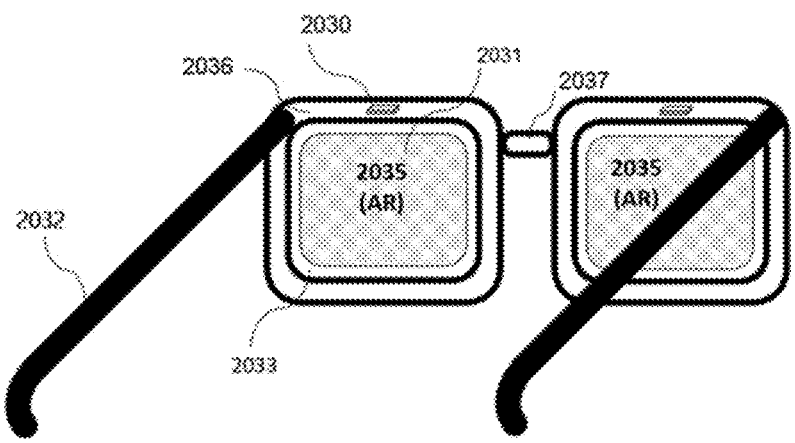

FIG. 65-1 schematically illustrates a smart glass structure.

FIG. 65-2 schematically illustrates an embodiment of the invention which is applied to the smart glass structure.

FIG. 65-3 schematically illustrates an embodiment of the invention which is applied to the smart glass structure.

FIG. 65-4 schematically illustrates an embodiment of the invention which is applied to the smart glass structure.

FIG. 65-5 schematically illustrates an embodiment of the invention which is applied to the smart glass structure.

Figures 1, 66:
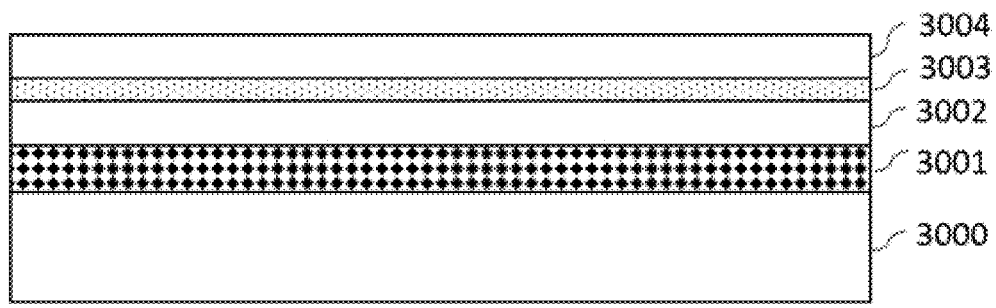
Figures 2, 66:
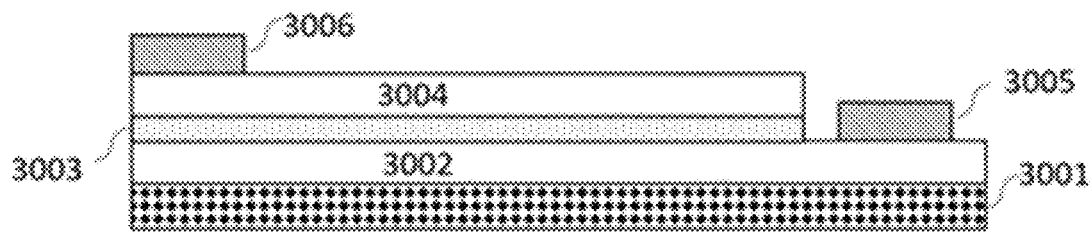
Figures 3, 66:
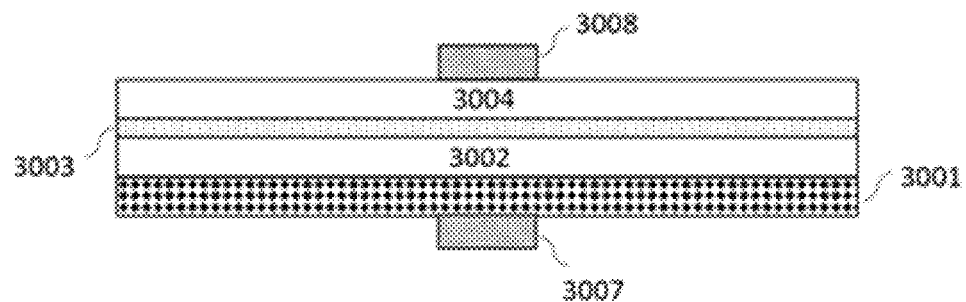
Figures 4, 66:
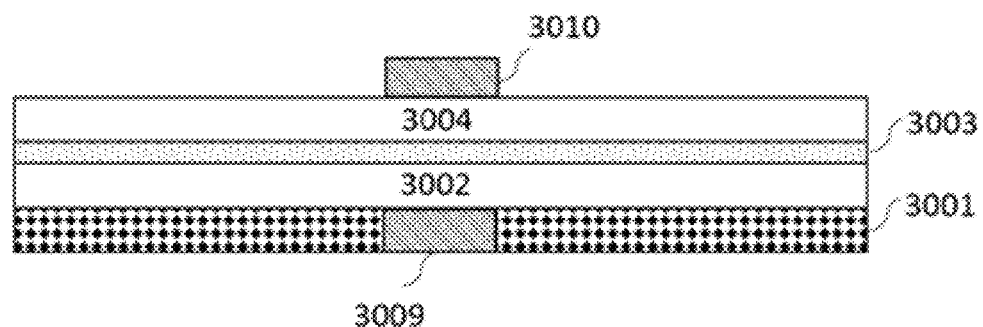
Figures 5, 66:
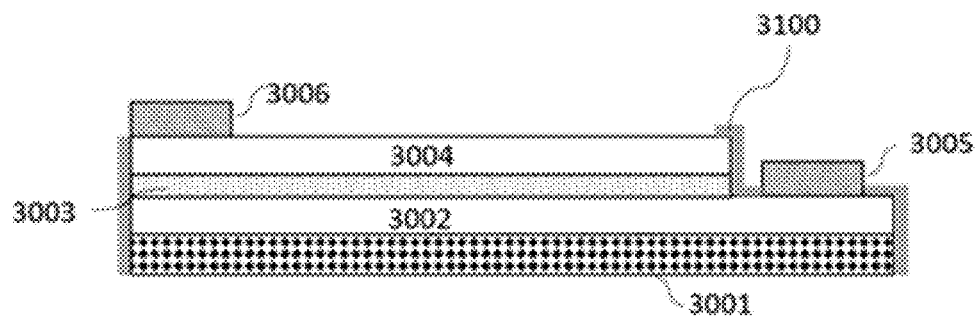
Figures 6, 66:
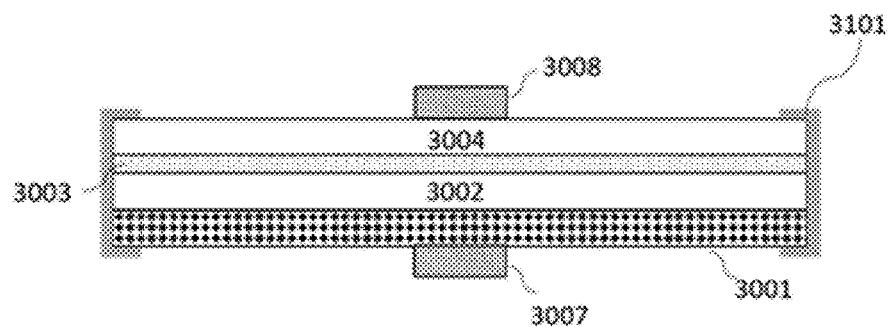
Figures 7, 66:
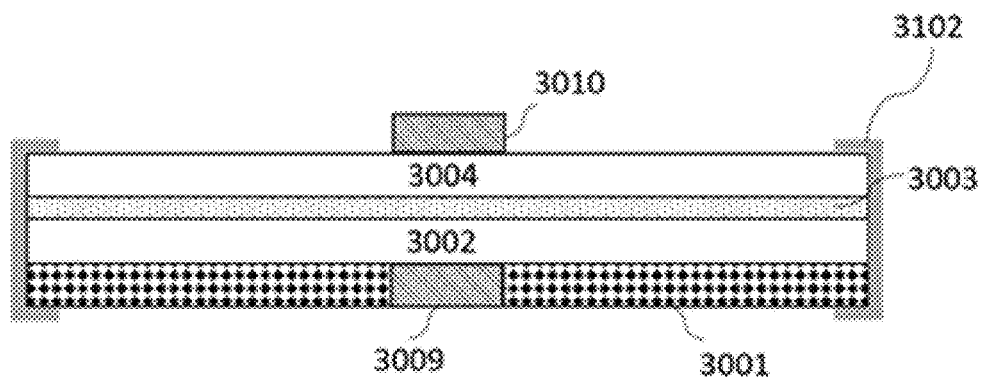
Figures 8, 66:
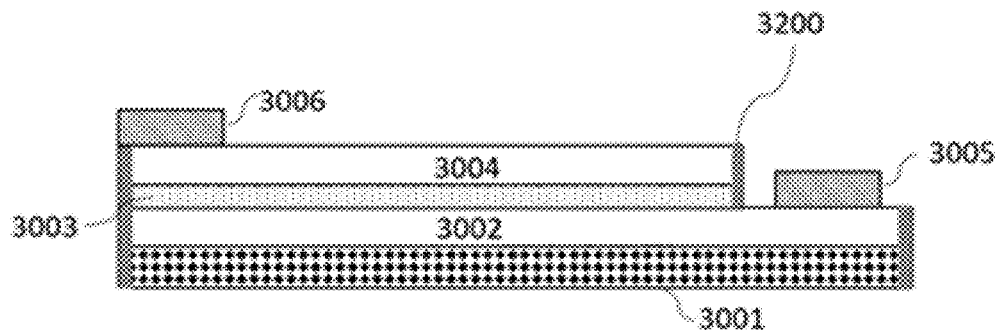
Figures 9, 66:
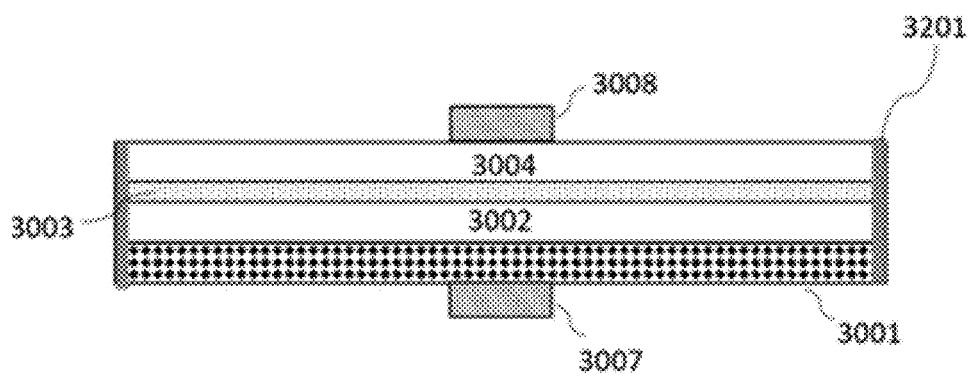
Figures 10, 66:
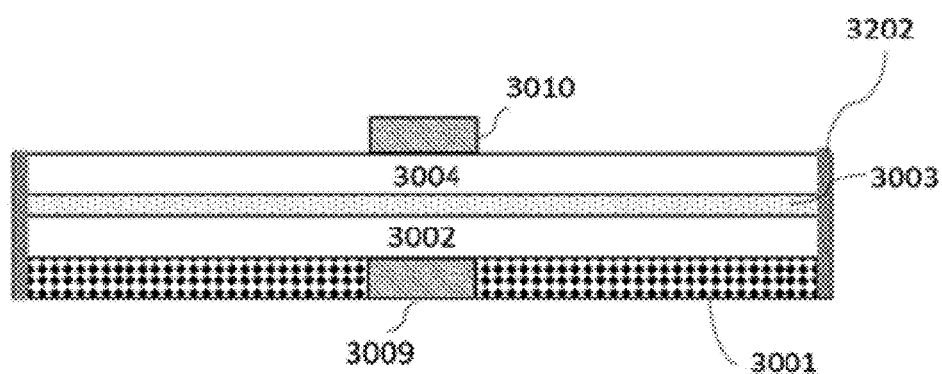
Figures 11, 66:
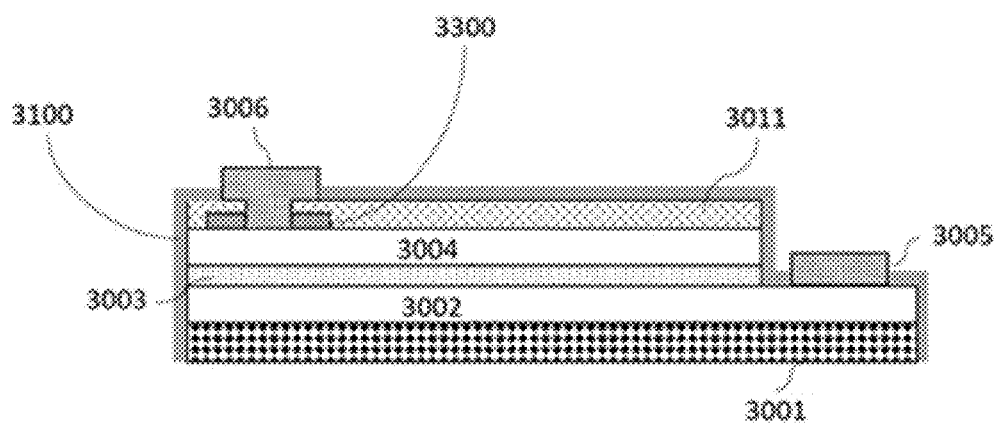
Figures 12, 66:
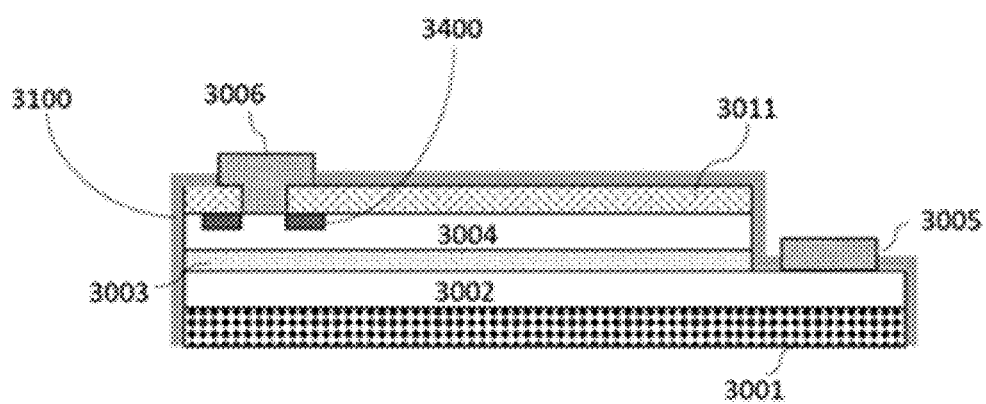
Figures 13, 66:
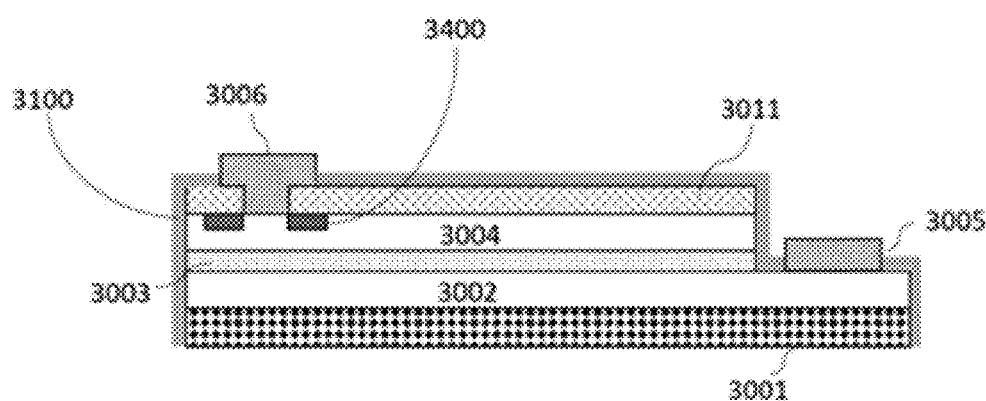
Figures 14, 66:
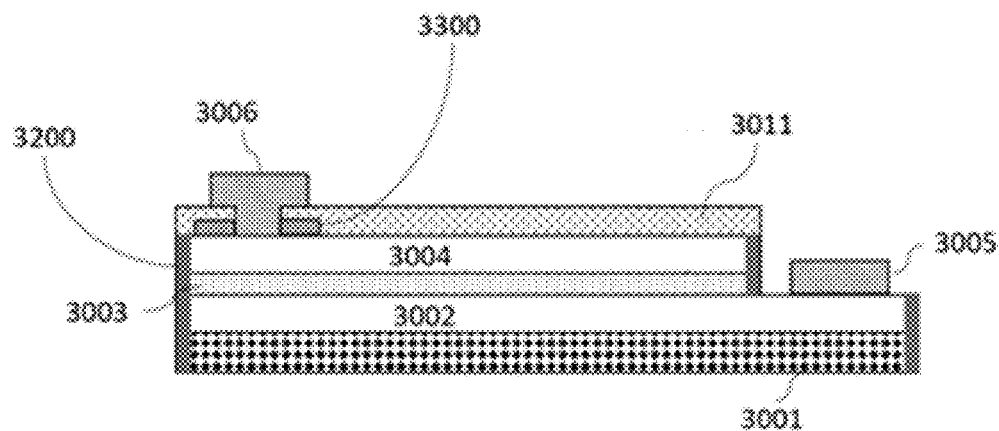
Figures 15, 66:
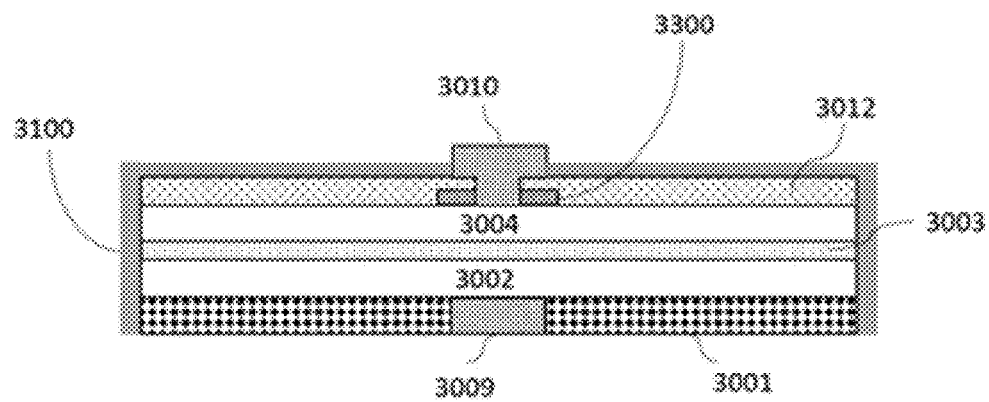
Figures 16, 66:
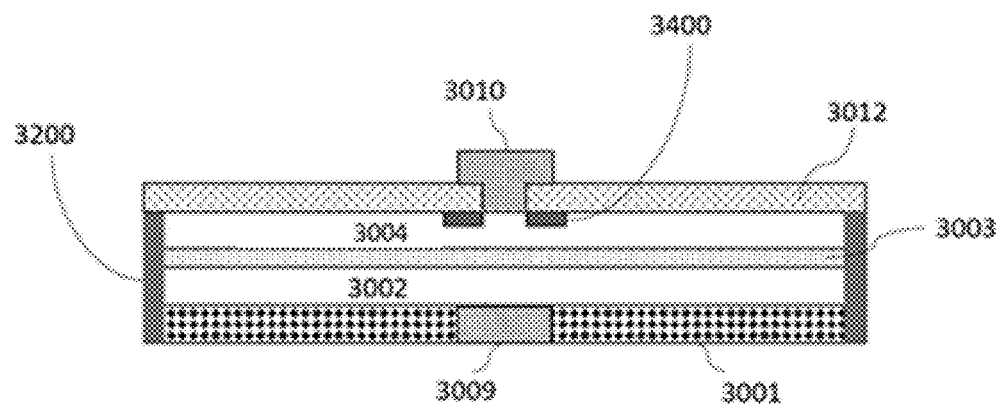
Figures 17, 66:
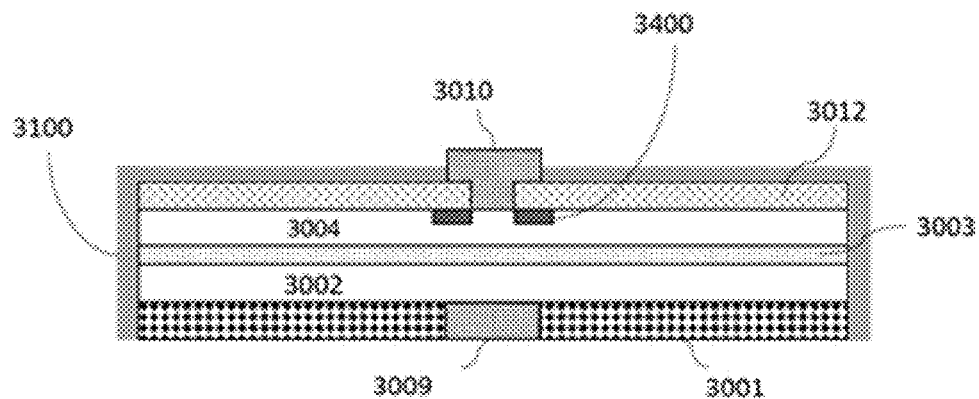
Figures 18, 66:
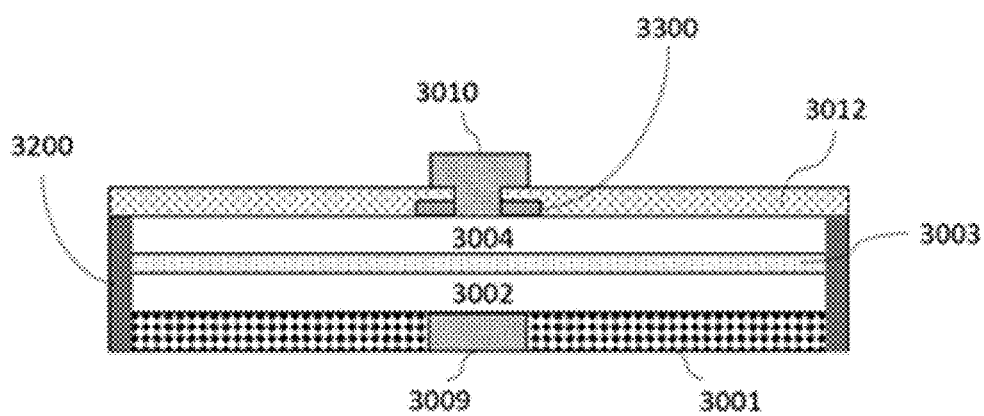
Figures 19, 66:
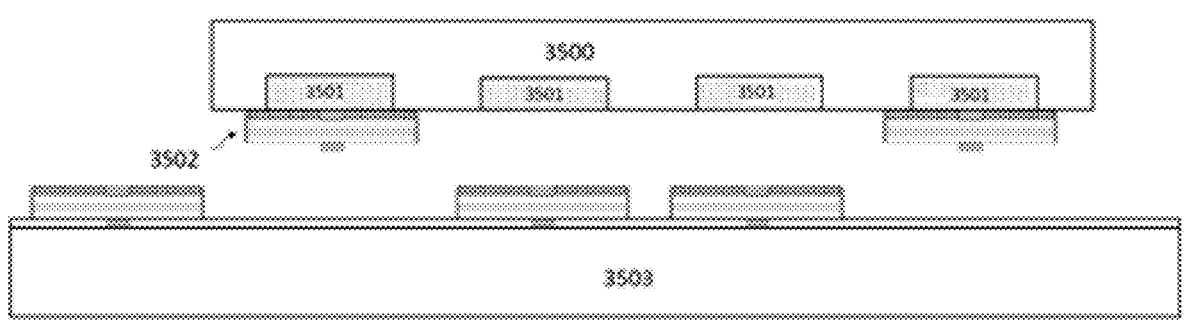
Figures 20, 66:
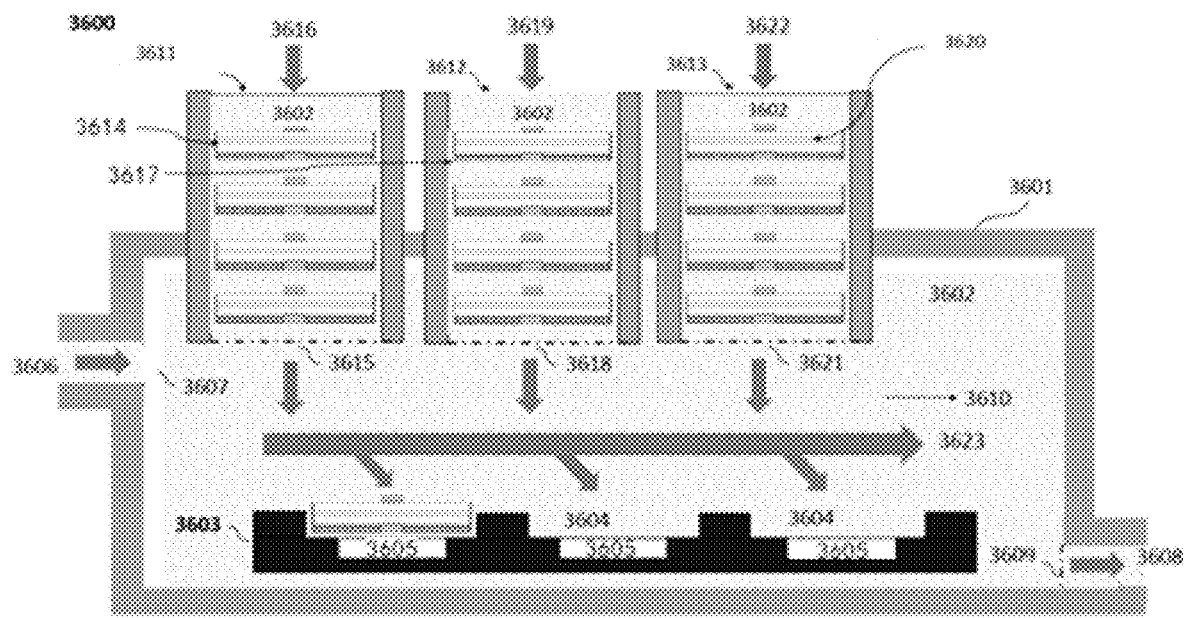
Figures 1, 21, 66:
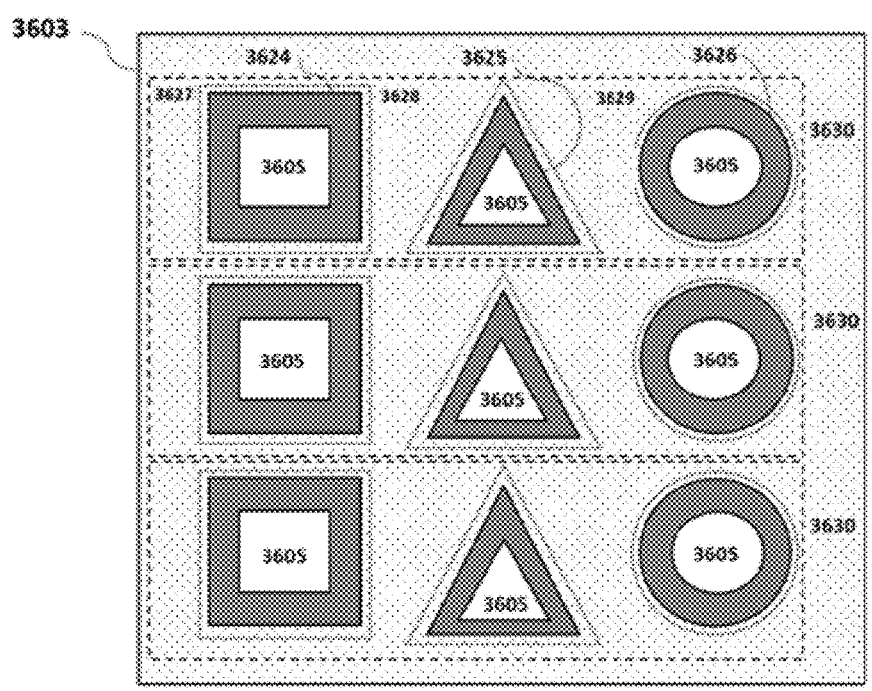
Figures 2, 21, 66:
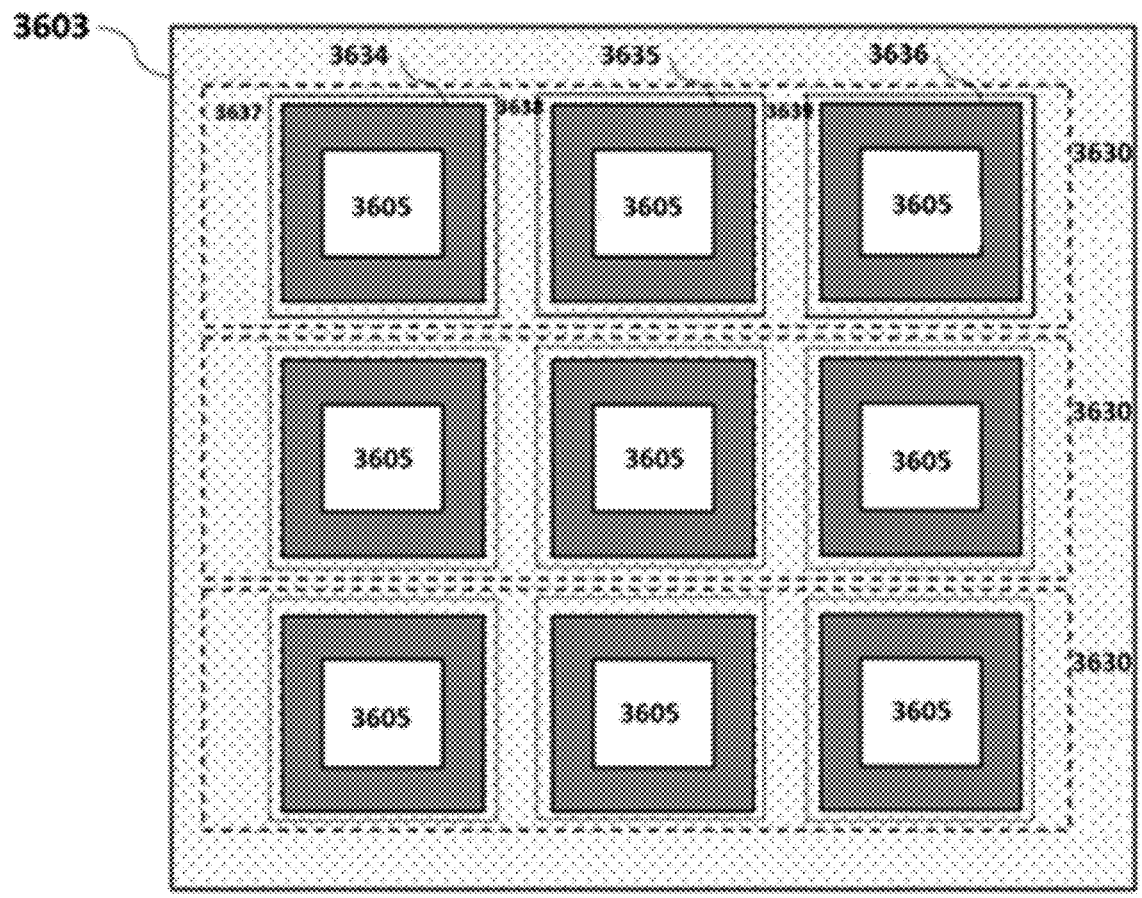
Figures 1, 22, 66:
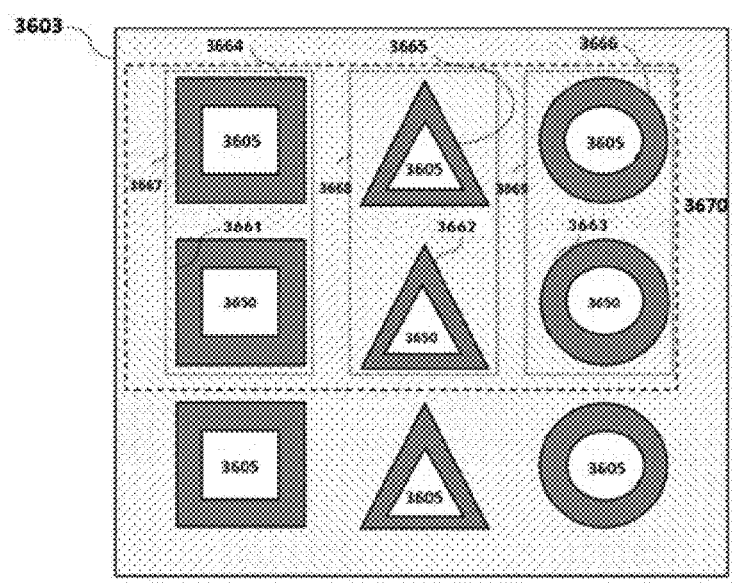
Figures 2, 22, 66:
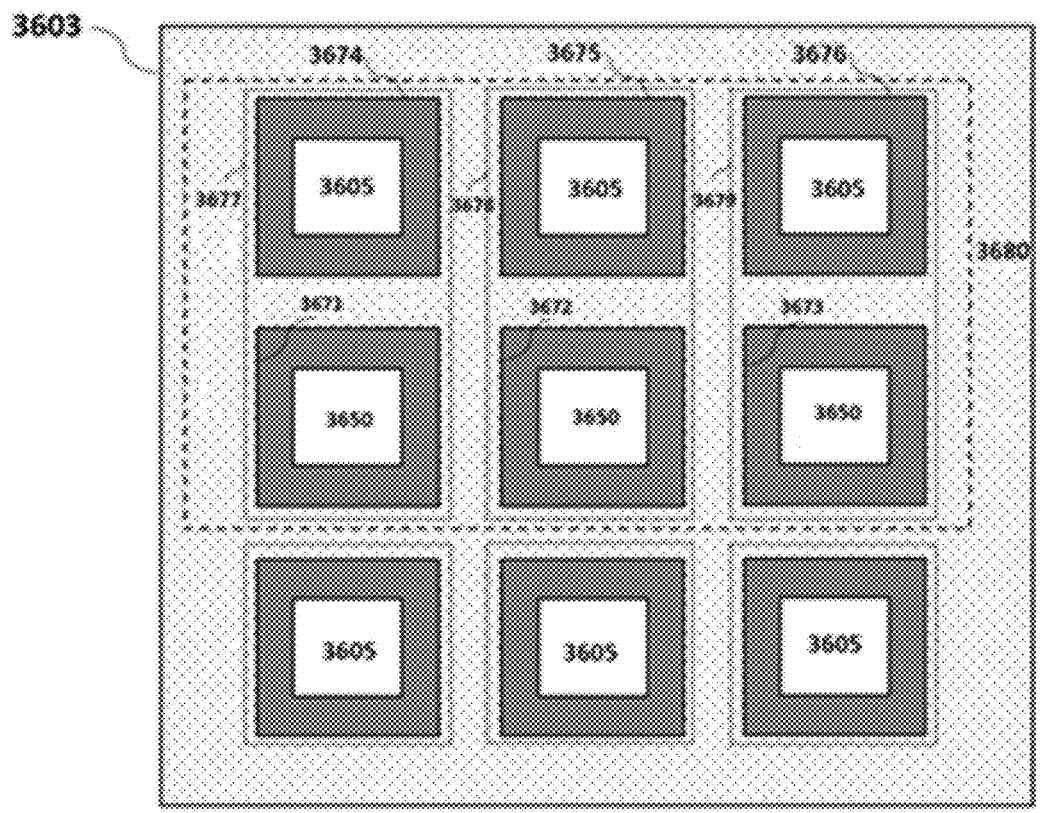
Figures 23, 66:
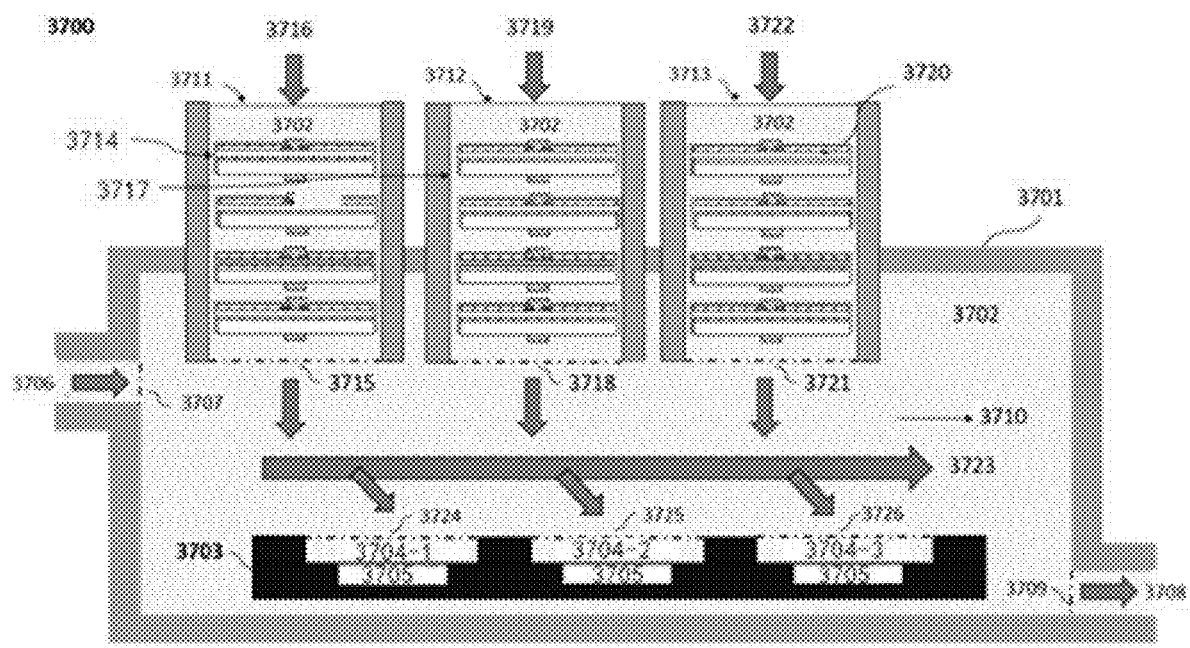
Figures 24, 66:
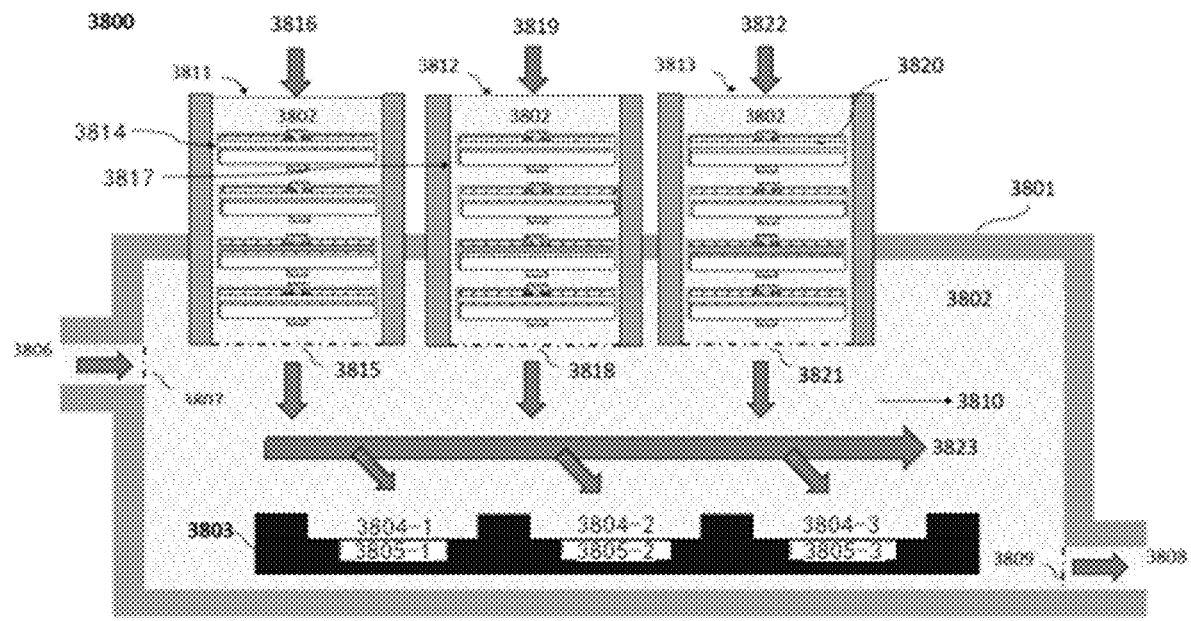

FIG. 66-1 schematically illustrates a micro light emitting diode structure including magnetic layer.

FIG. 66-2 schematically illustrates a lateral magnetic micro light emitting diode structure.

FIG. 66-3 schematically illustrates a vertical magnetic micro light emitting diode structure.

FIG. 66-4 schematically illustrates another vertical magnetic micro light emitting diode structure.

FIG. 66-5 schematically illustrates a lateral magnetic micro light emitting diode structure, further including a first current blocking layer.

Figures 6, 18:
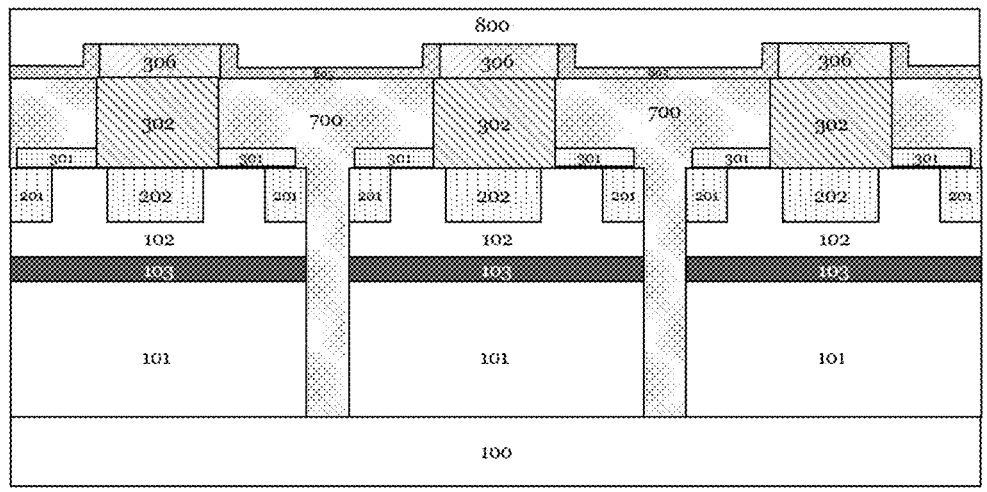

FIG. 66-6 schematically illustrates a vertical magnetic micro light emitting diode structure, further including a first current blocking layer.

Figures 7, 18:
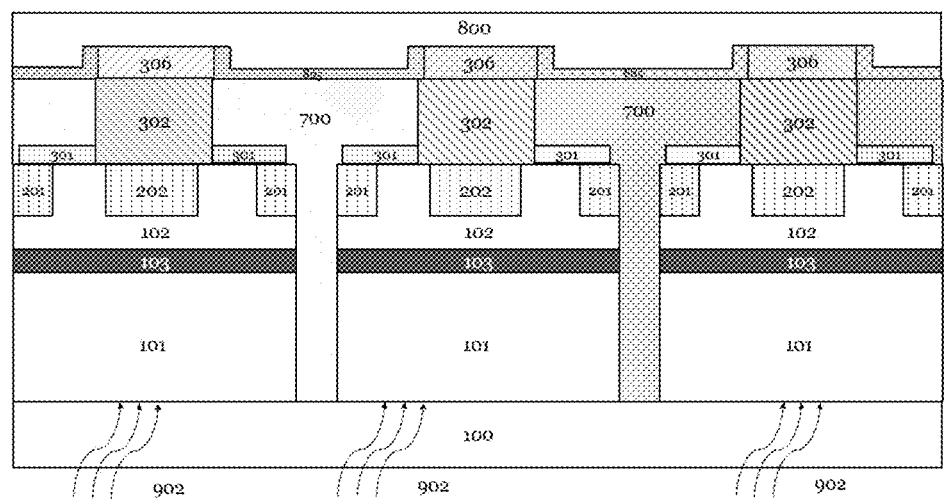
Figures 8, 18:
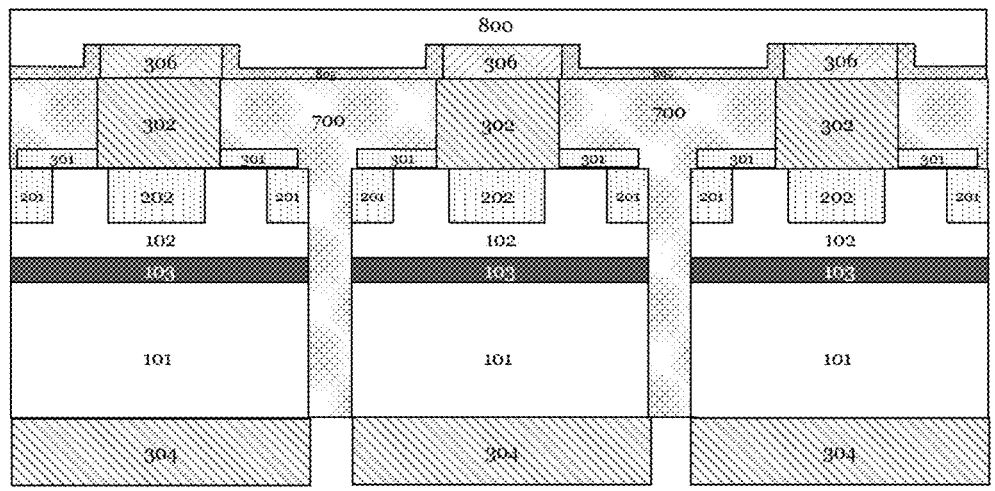
Figures 9, 18:
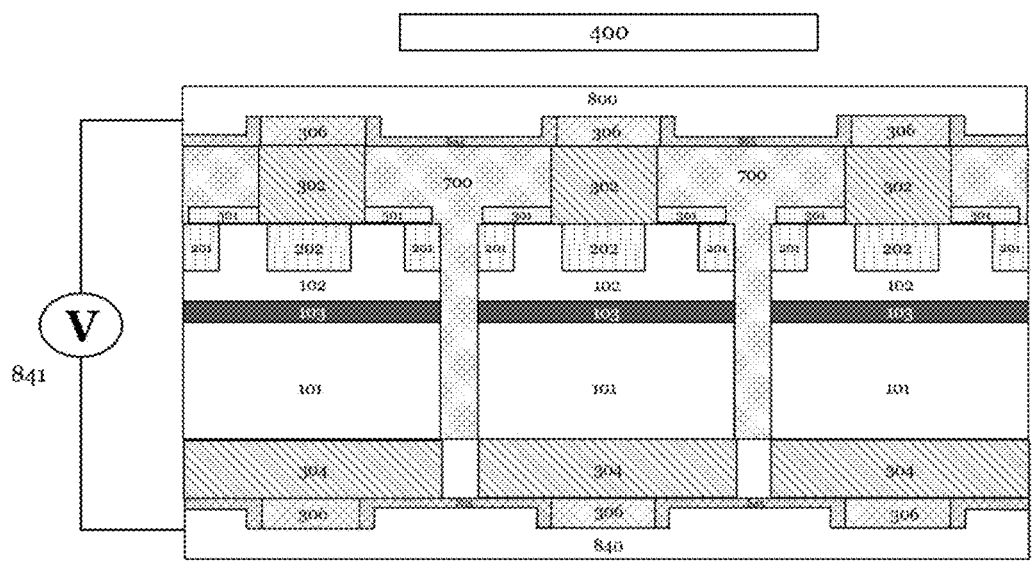

FIG. 66-7 schematically illustrates another vertical magnetic micro light emitting diode structure, further including a first current blocking layer.

Figure 8:
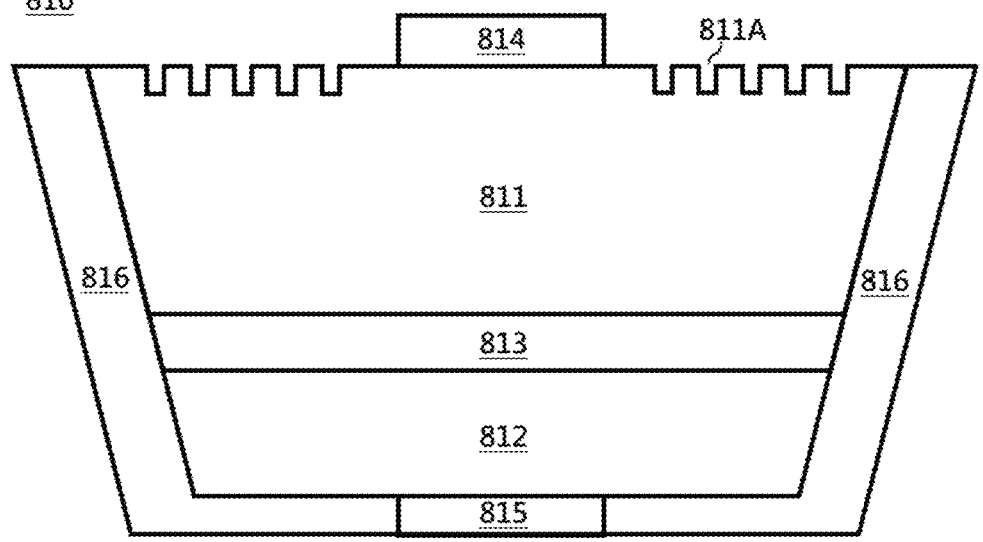
FIG. 8 is a schematic cross-sectional view of a micro light emitting die 810 according to an embodiment.

FIG. 66-8 schematically illustrates a lateral magnetic micro light emitting diode structure, further including a current limiting layer.

Figure 9:
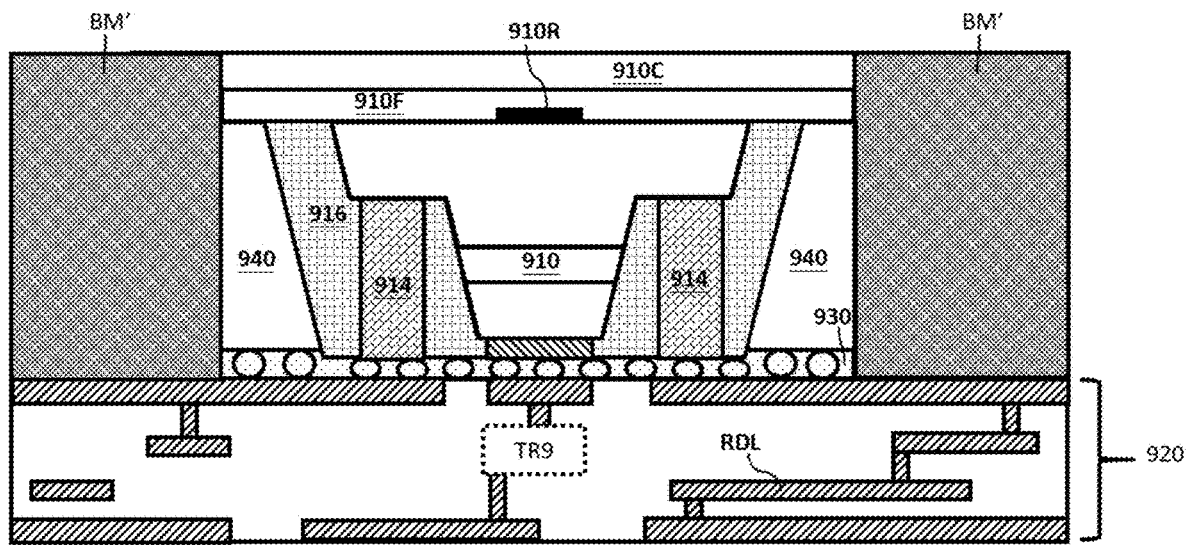
FIG. 9 is a schematic cross-sectional view of a sub-pixel unit according to an embodiment.
Figure 10A:
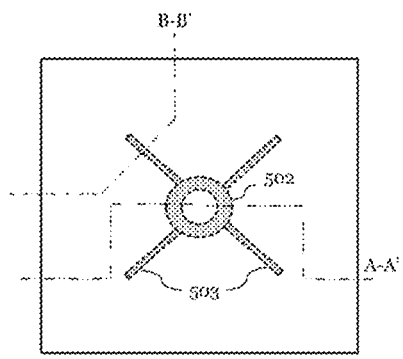
FIG. 10A schematically illustrates a top view of a traditional light emitting diode.
Figure 10B:
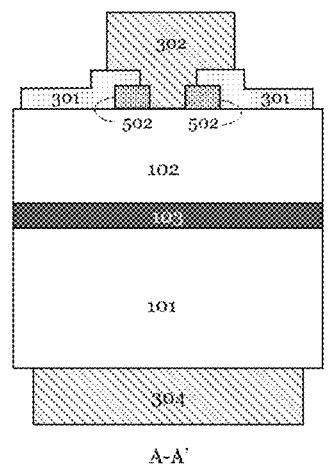
FIG. 10B schematically illustrates a cross-sectional view of a traditional light emitting diode along line A-A'.
Figure 10C:
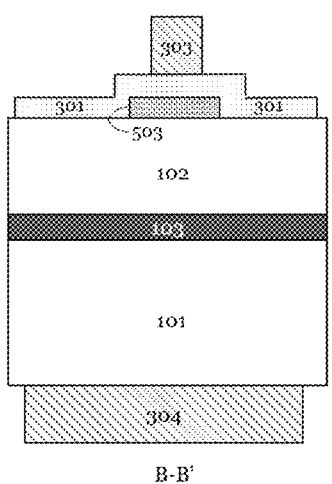

FIG. 66-9 schematically illustrates a vertical magnetic micro light emitting diode structure, further including a current limiting layer.

Figures 10, 18:
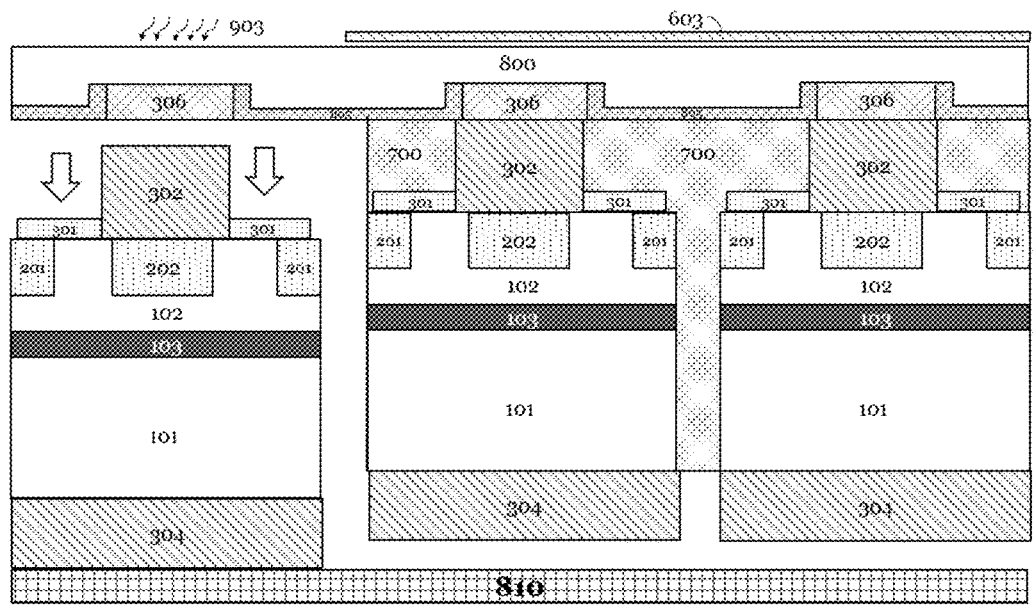

FIG. 66-10 schematically illustrates another vertical magnetic micro light emitting diode structure, further including a current limiting layer.

Figures 11, 18:
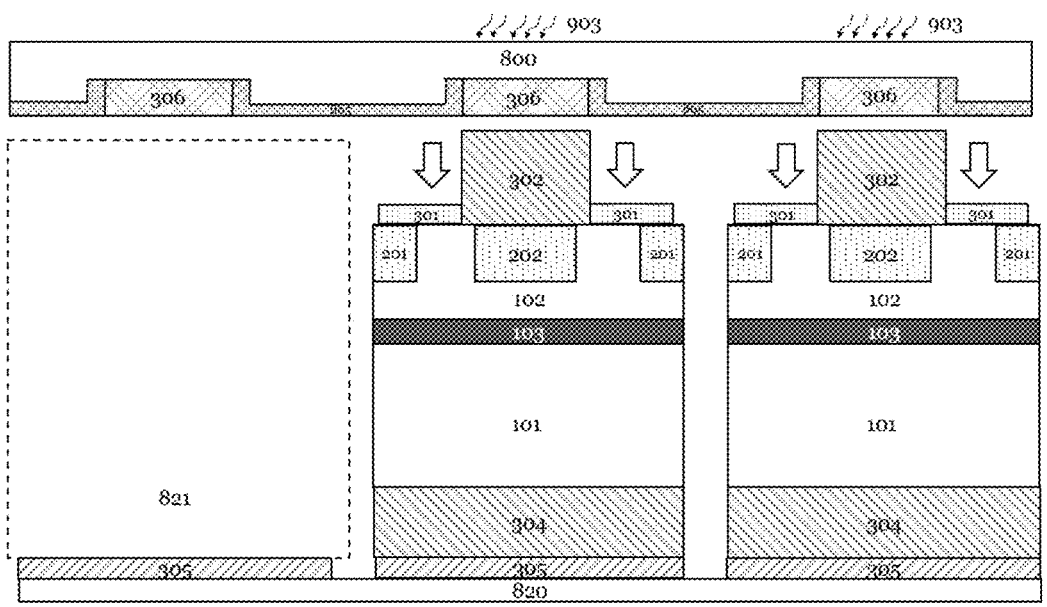

FIG. 66-11 schematically illustrates a lateral magnetic micro light emitting diode.

Figures 12, 18:
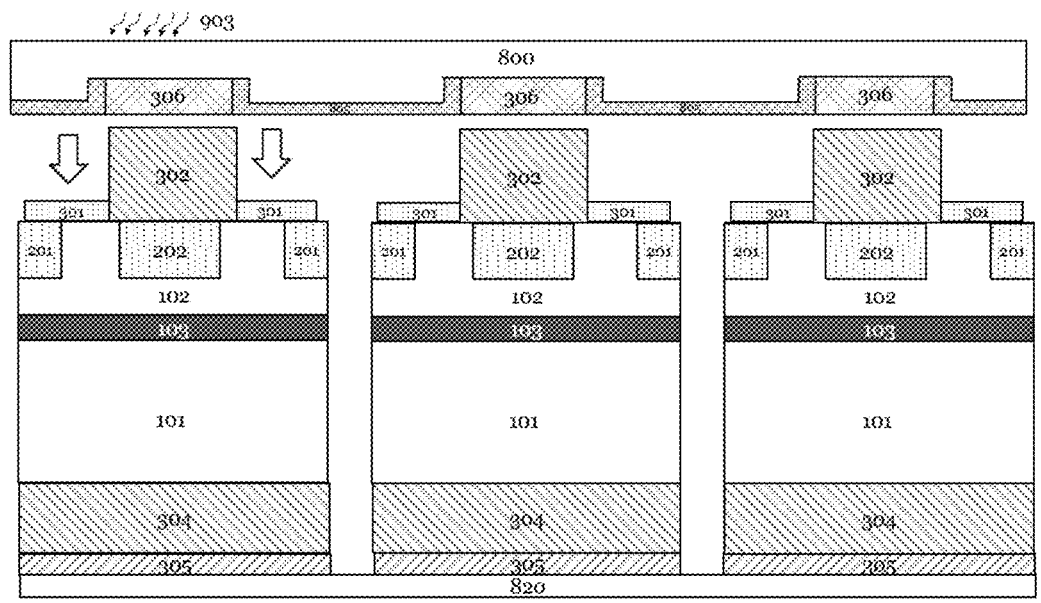

FIG. 66-12 schematically illustrates a lateral magnetic micro light emitting diode.

Figures 13, 18:
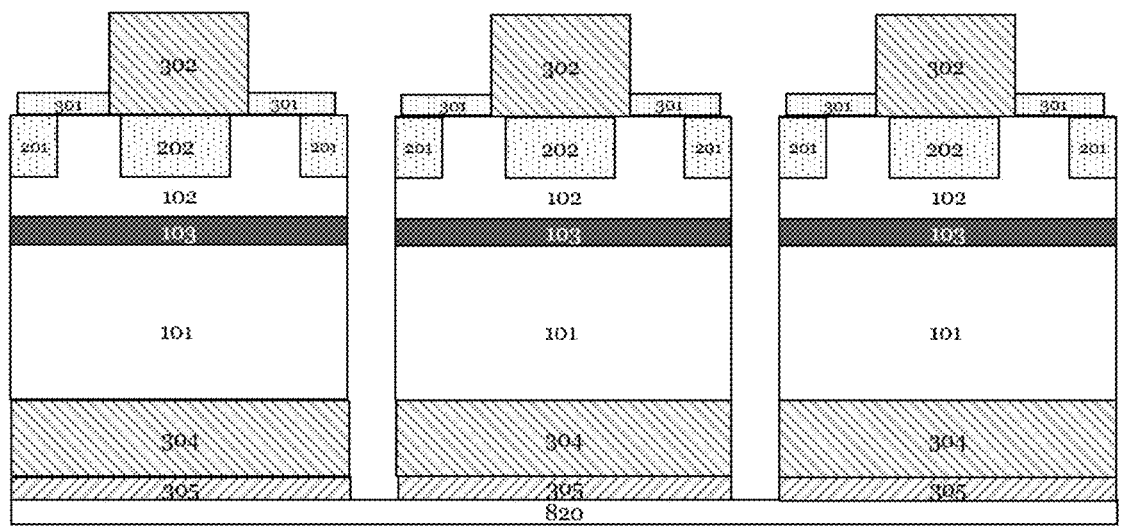

FIG. 66-13 schematically illustrates a lateral magnetic micro light emitting diode.

Figures 14, 18:
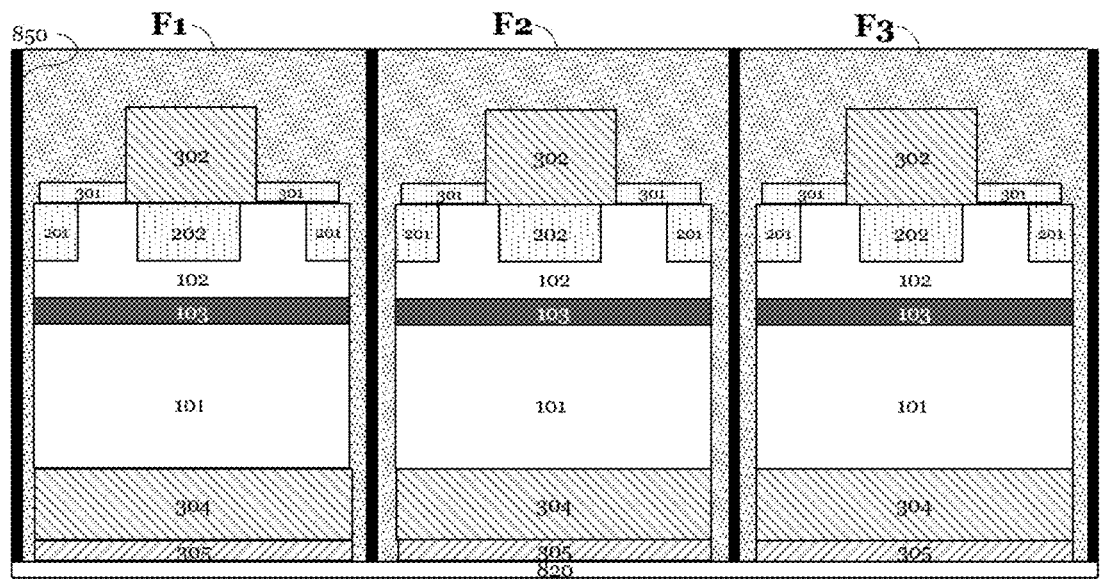

FIG. 66-14 schematically illustrates a lateral magnetic micro light emitting diode.

Figures 15, 18:
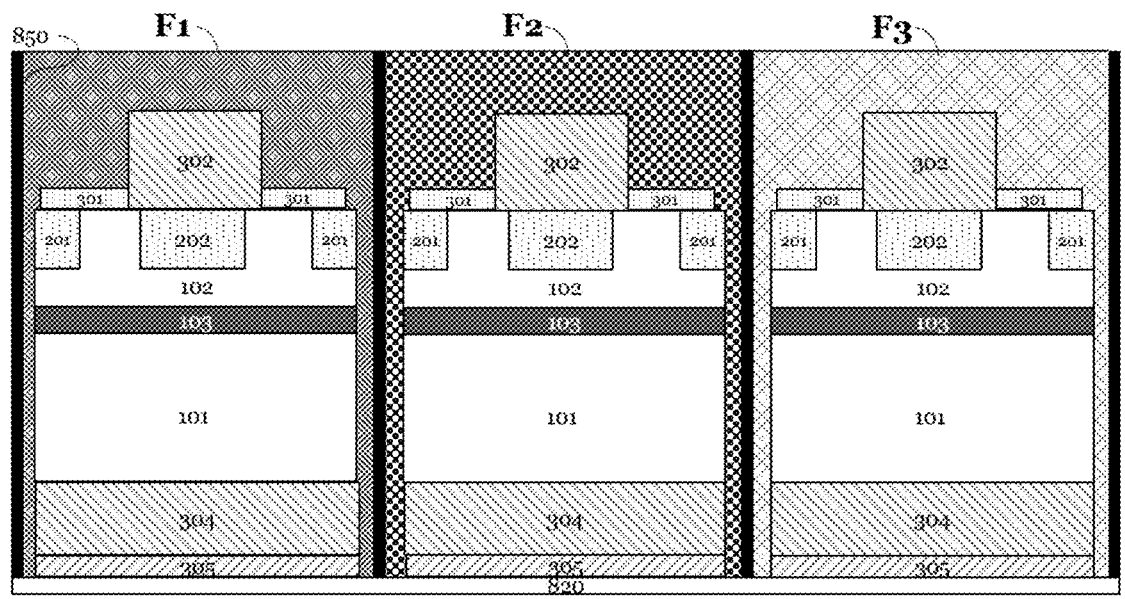

FIG. 66-15 schematically illustrates a vertical magnetic micro light emitting diode.

Figures 16, 18:
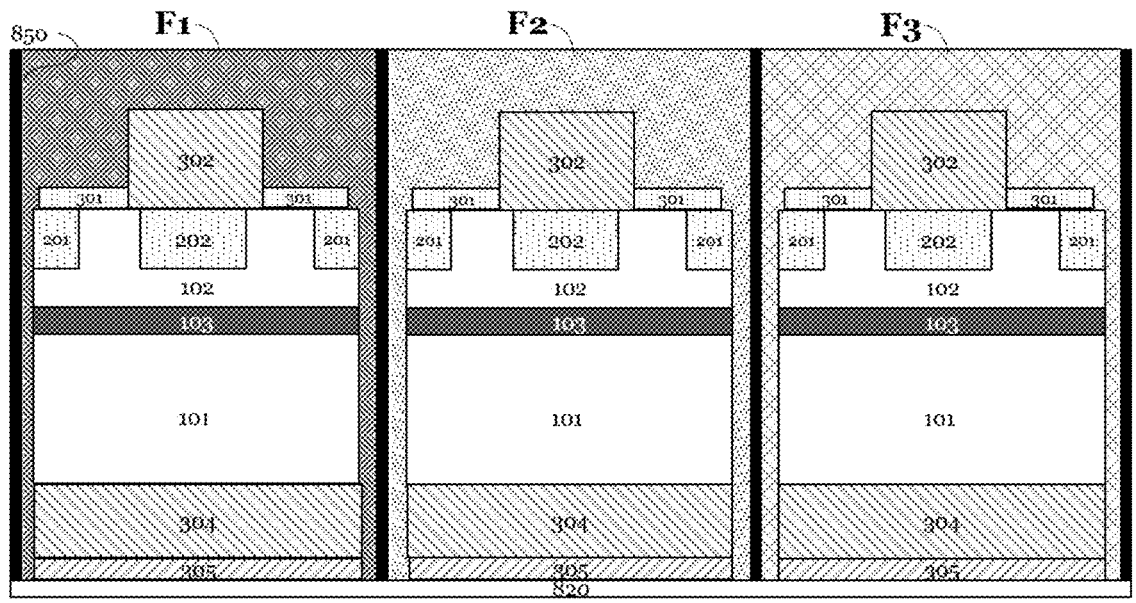

FIG. 66-16 schematically illustrates a vertical magnetic micro light emitting diode.

Figures 1, 37:
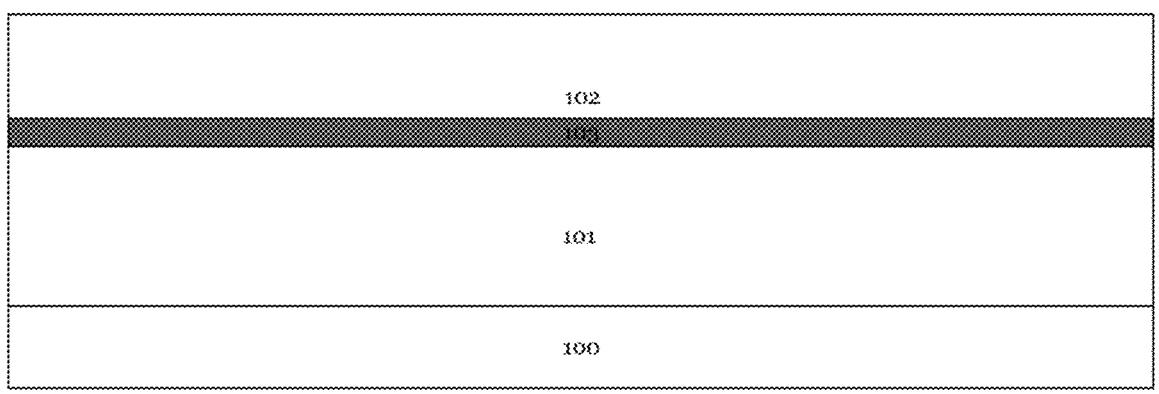
Figures 2, 37:
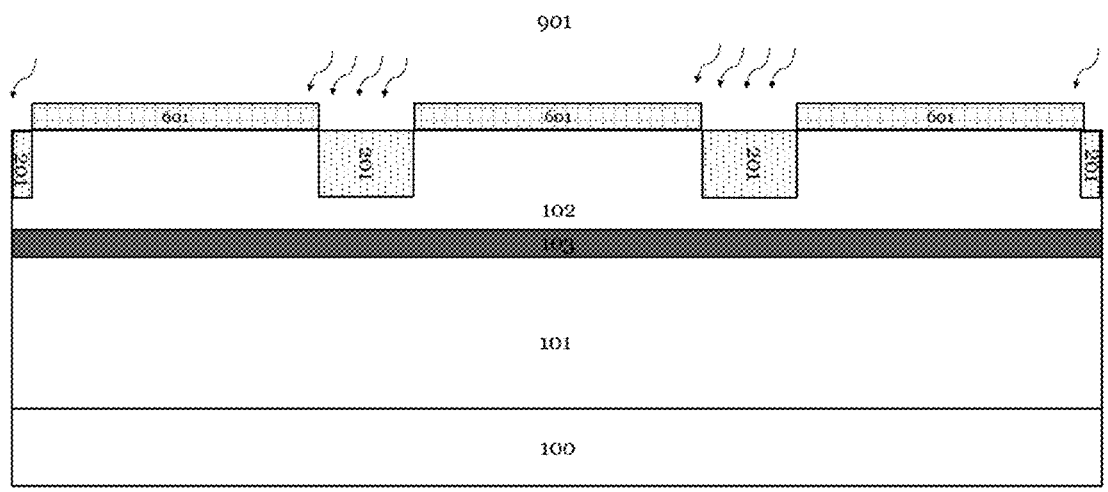
Figures 3, 37:
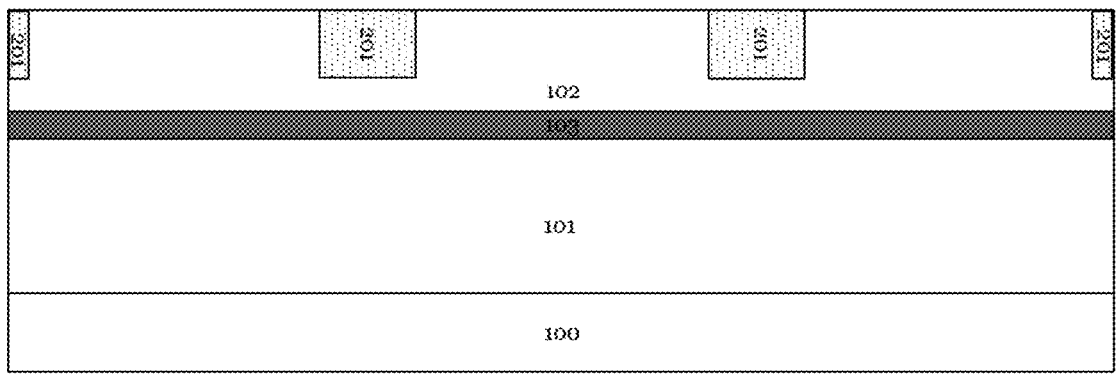
Figures 4, 37:
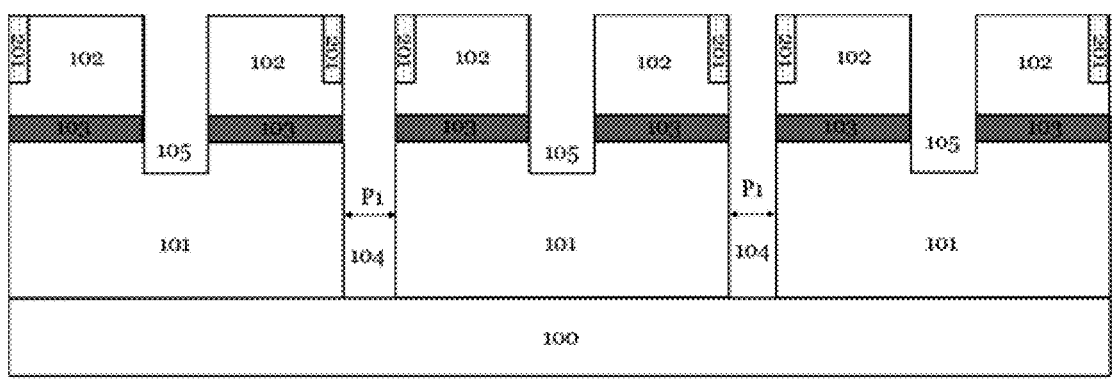
Figures 5, 37:
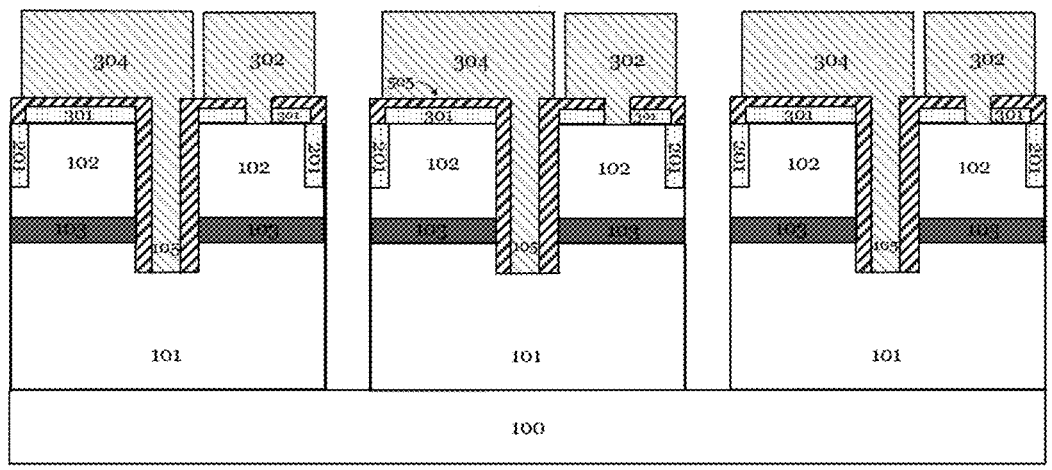
Figures 6, 37:
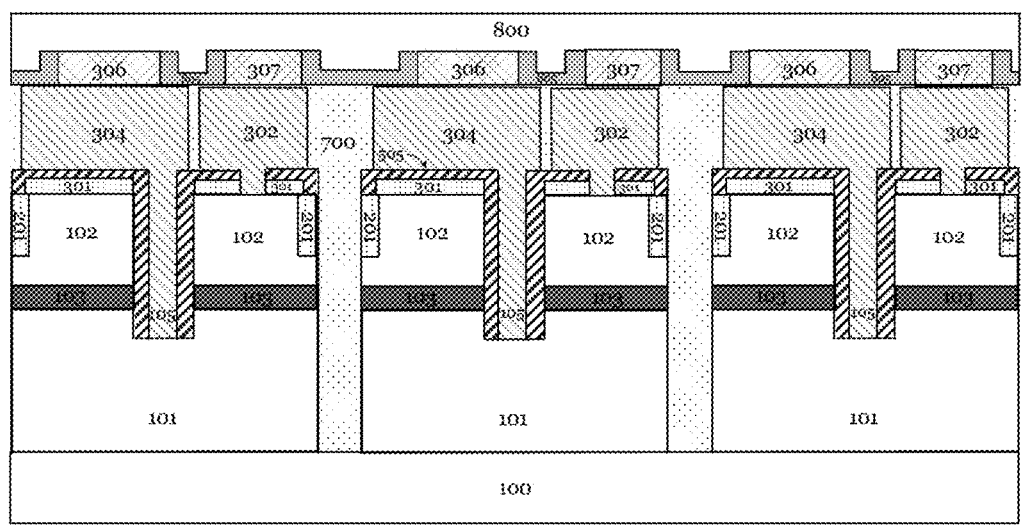
Figures 7, 37:
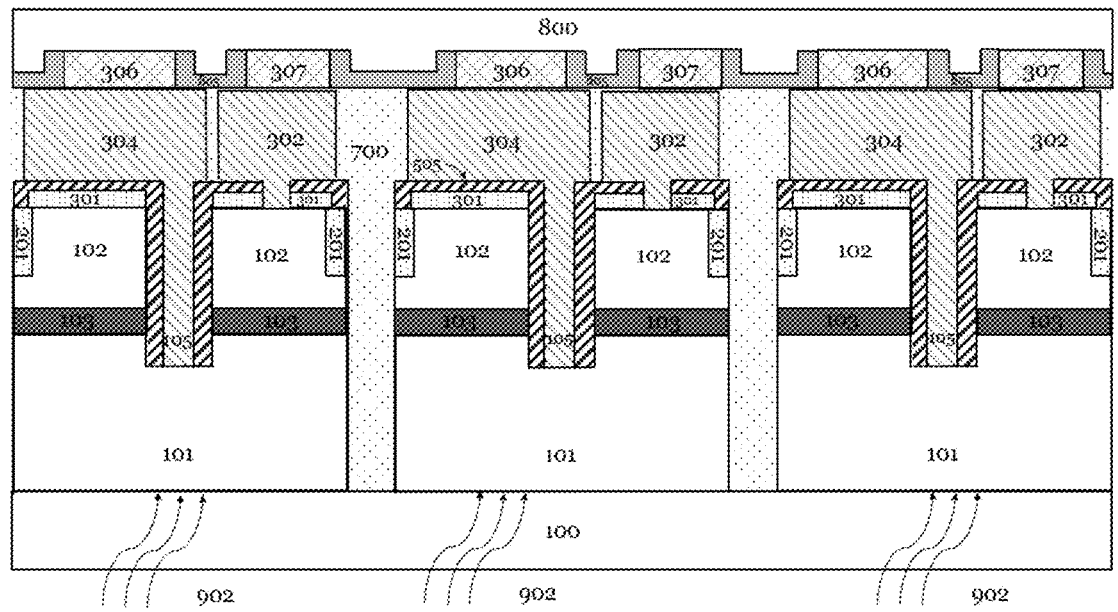
Figures 8, 37:
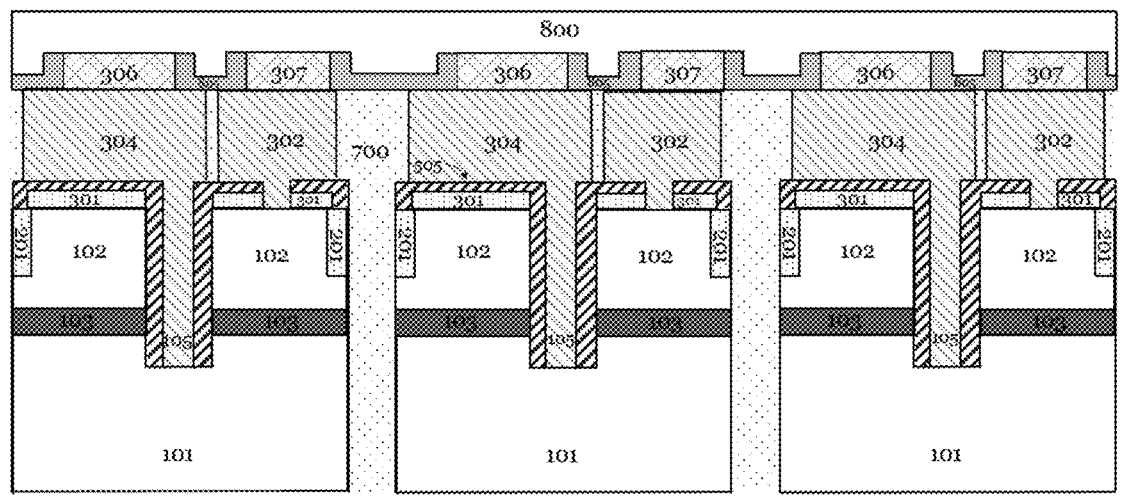
Figures 9, 37:
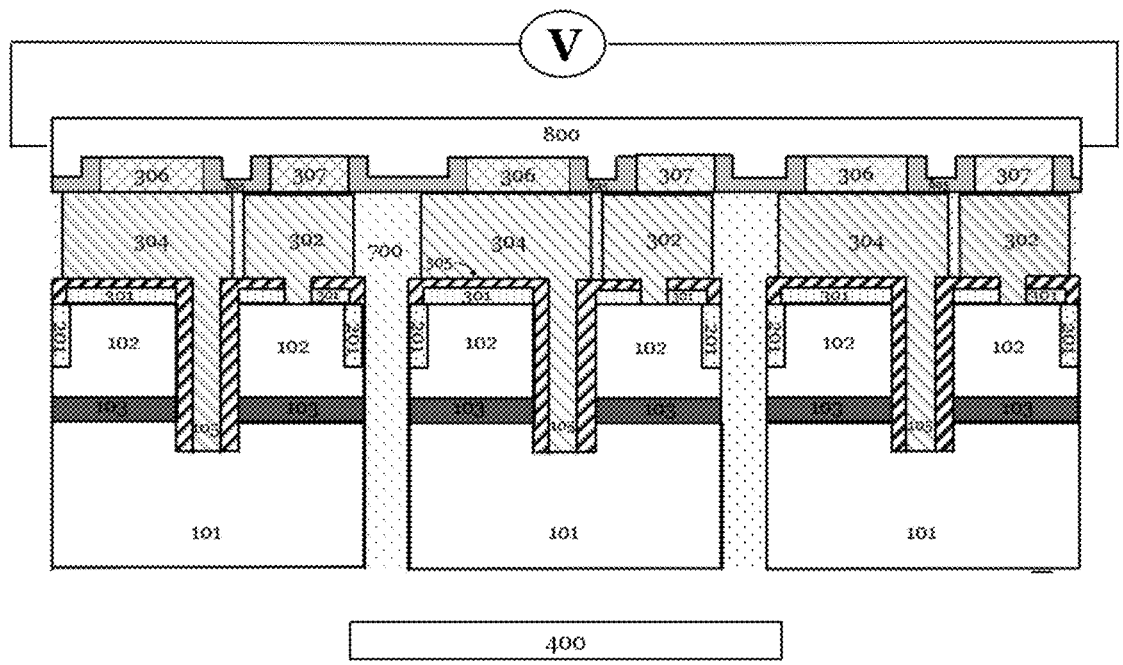
Figures 10, 37:
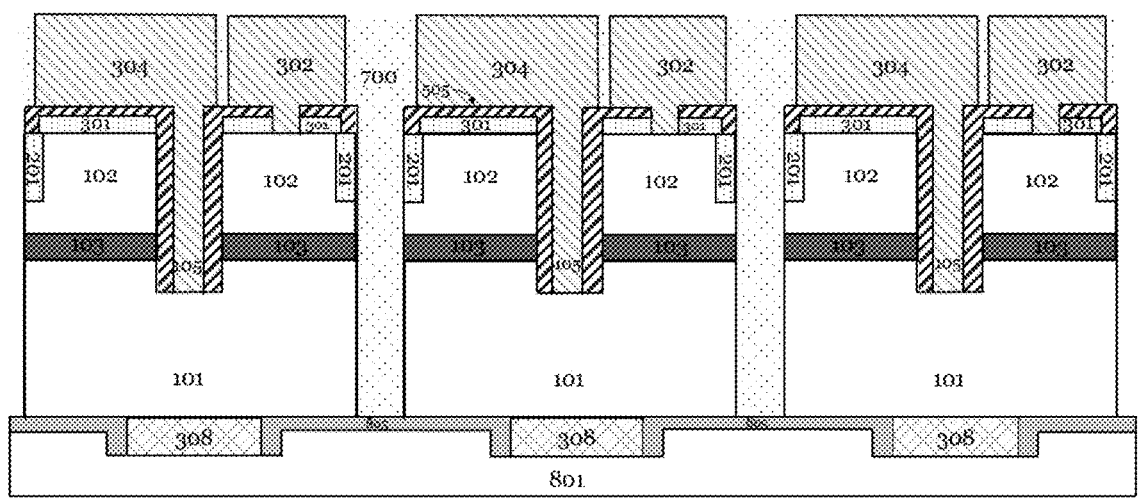
Figures 11, 37:
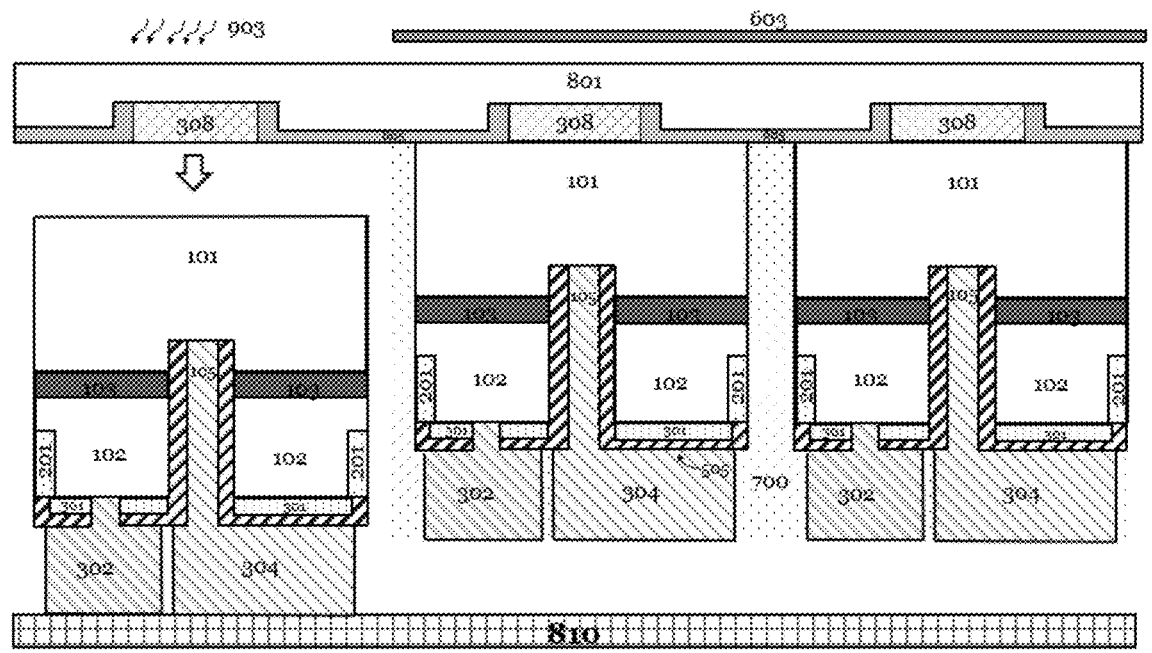
Figures 12, 37:
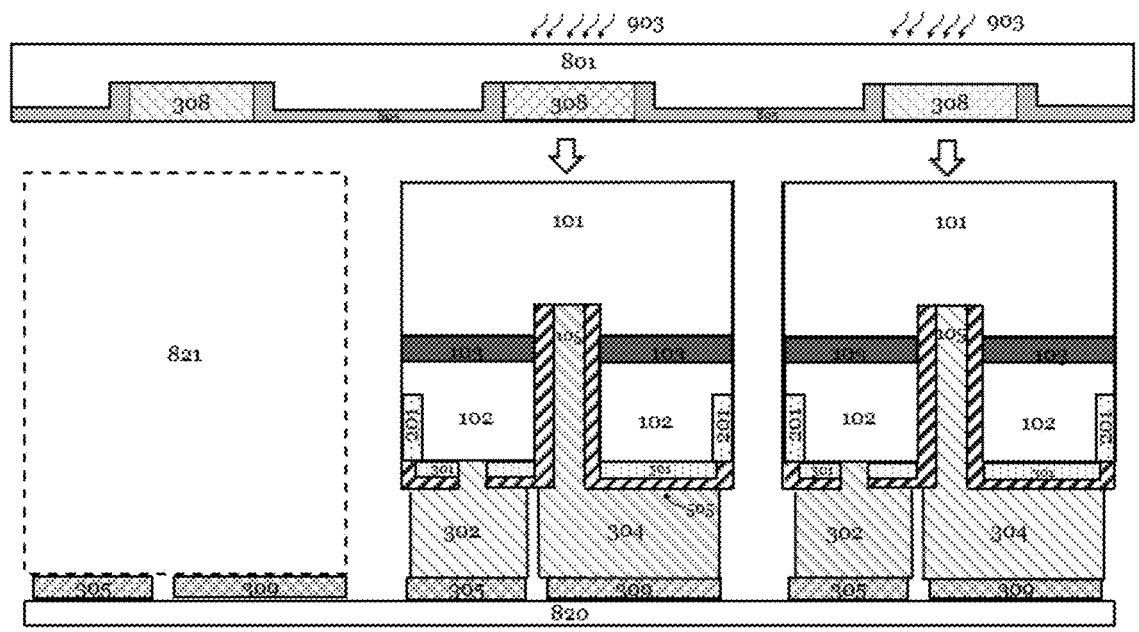
Figures 13, 37:
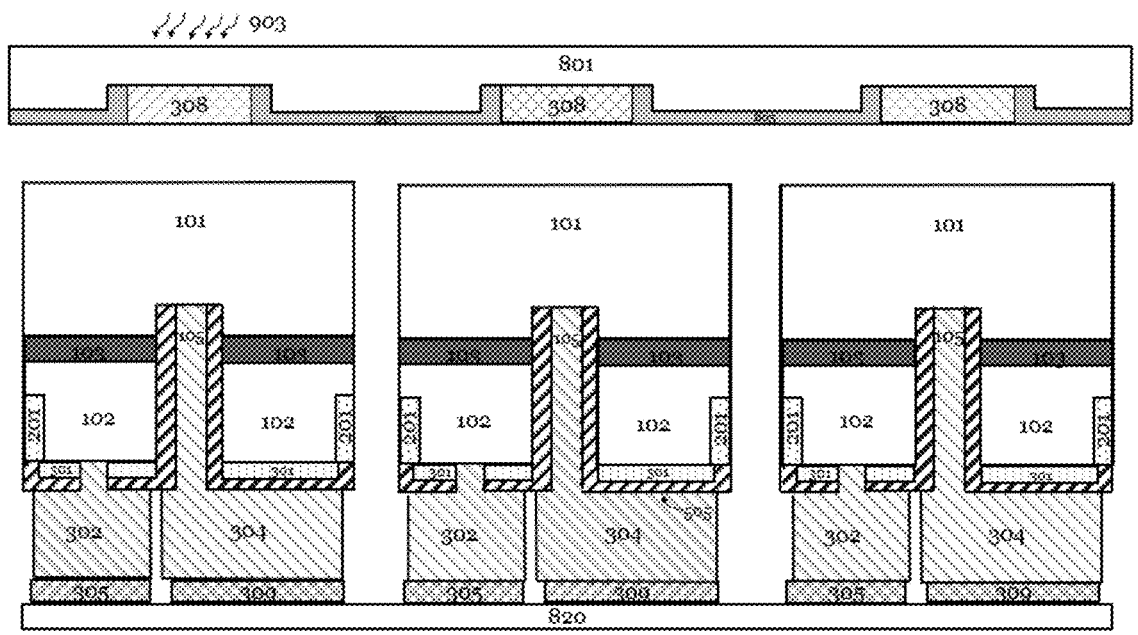
Figures 14, 37:
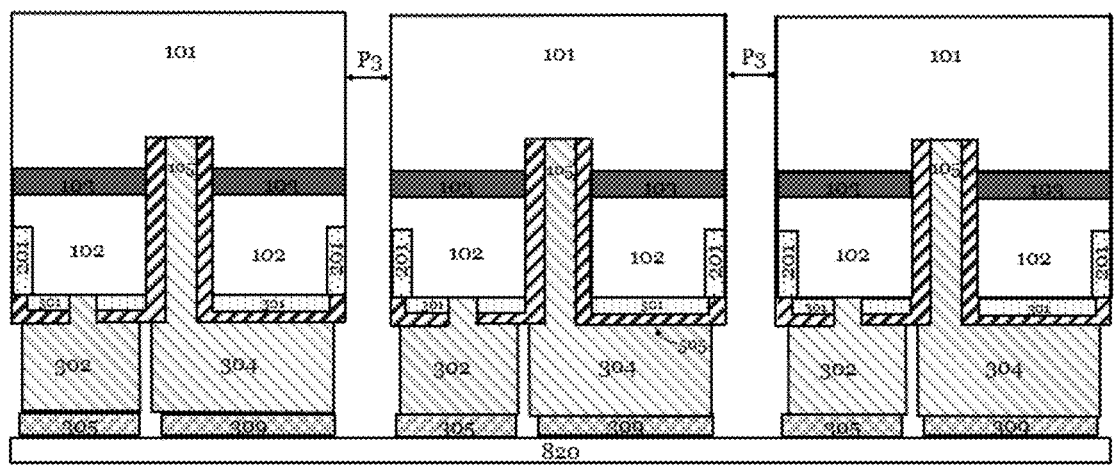
Figures 15, 37:
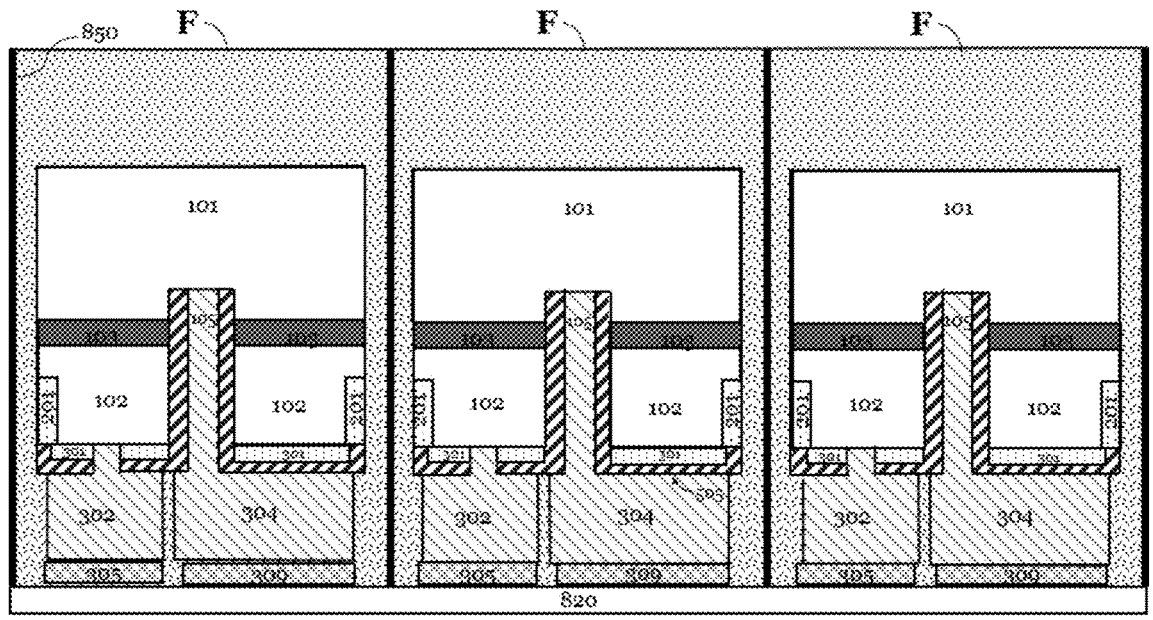
Figures 16, 37:
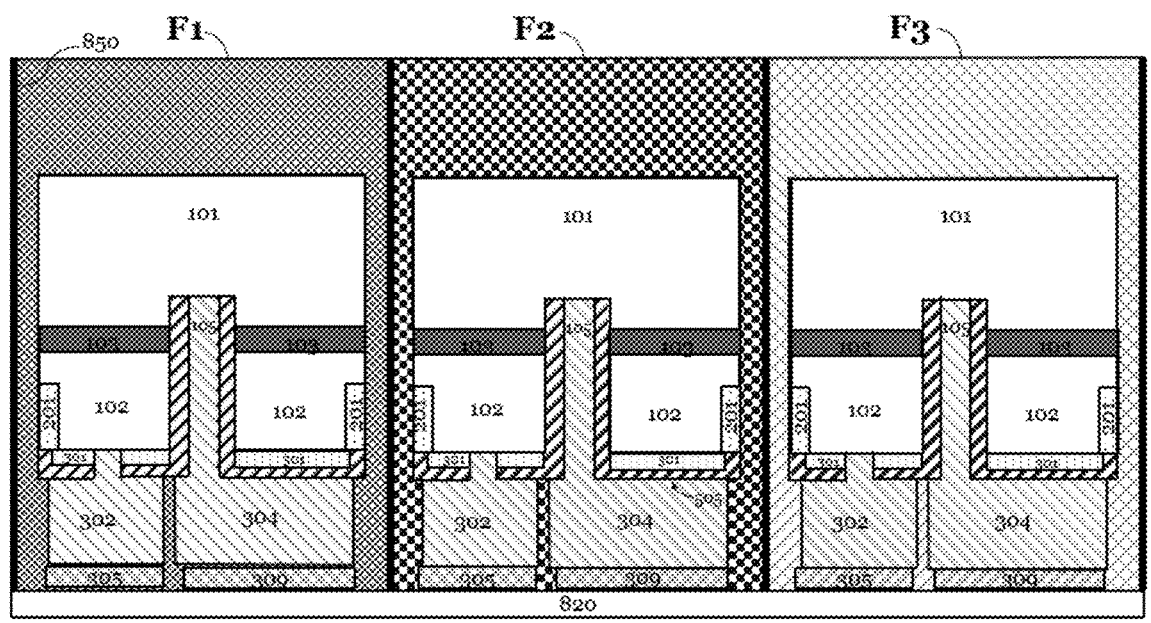
Figures 17, 37:
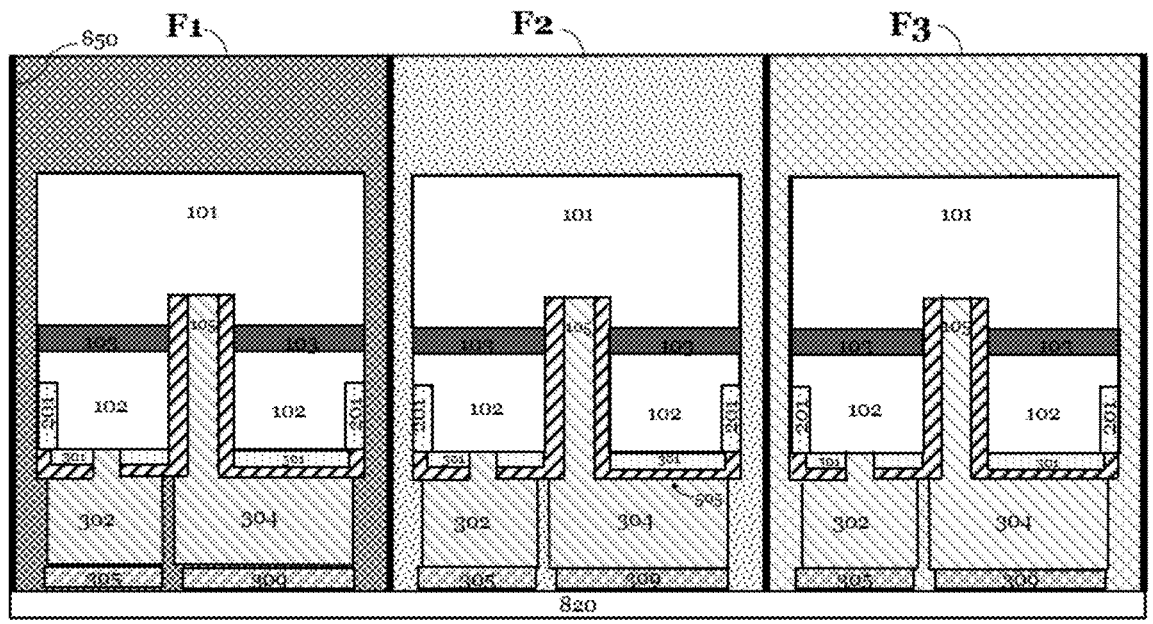
Figures 18, 37:
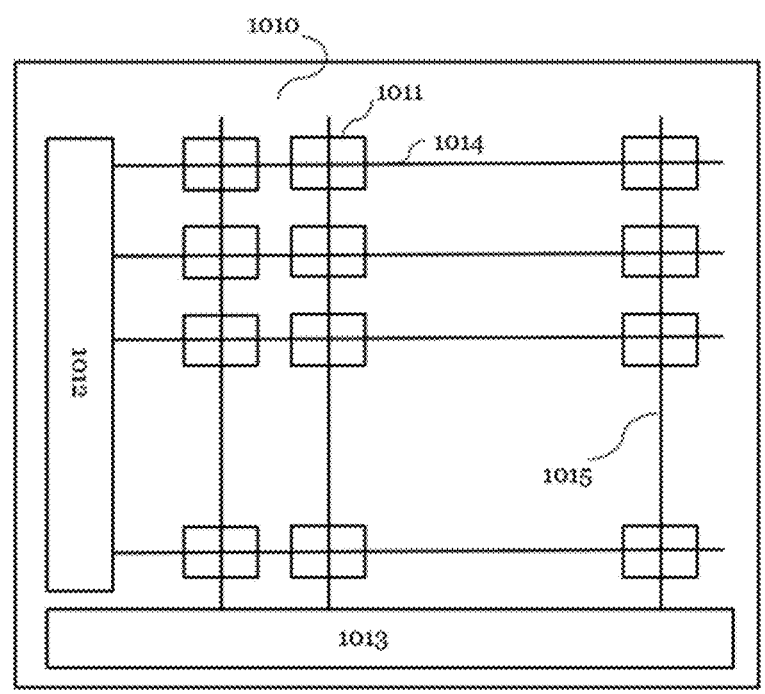

FIG. 66-17 schematically illustrates a vertical magnetic micro light emitting diode.

FIG. 66-18 schematically illustrates a vertical magnetic micro light emitting diode.

Figures 1, 19:
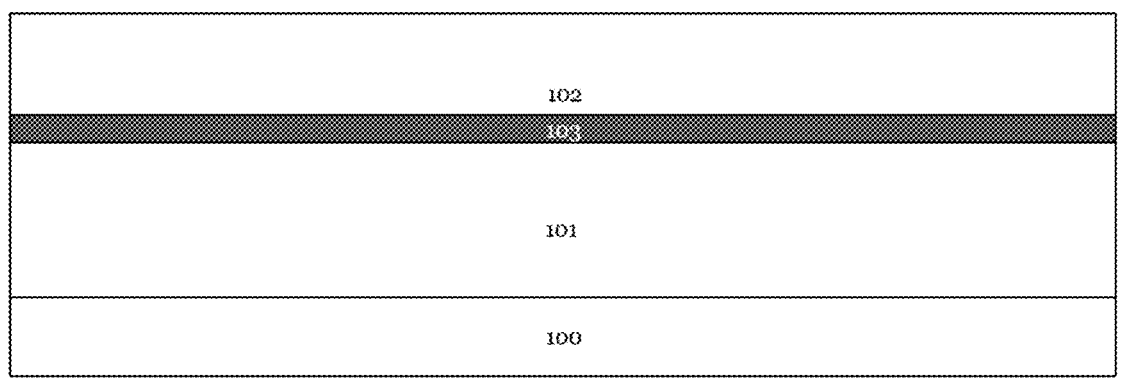
Figures 2, 19:
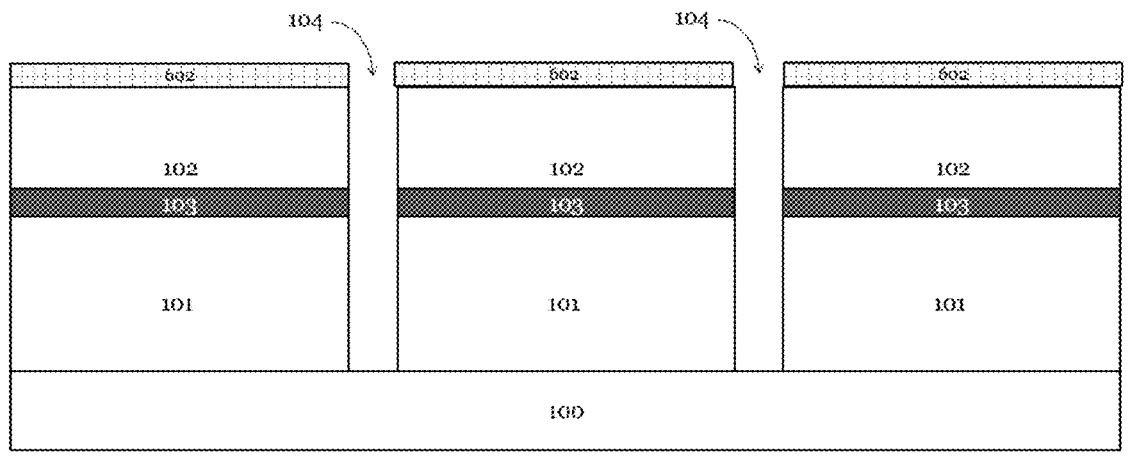
Figures 3, 19:
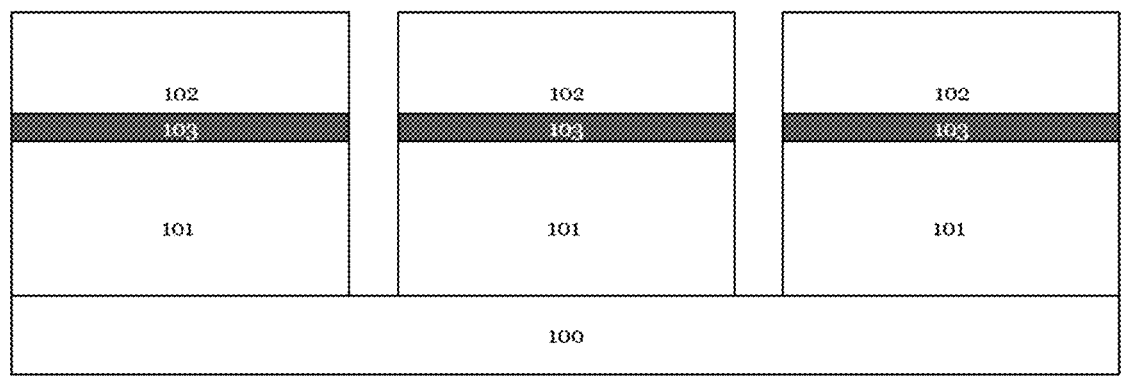
Figures 4, 19:
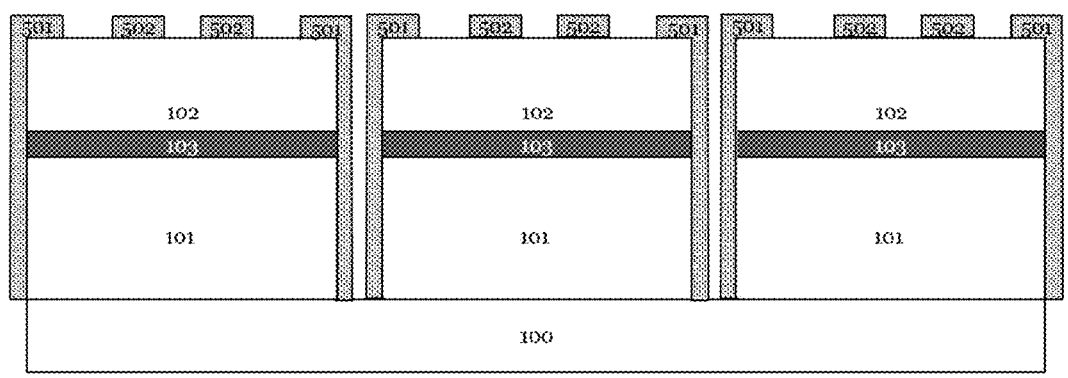
Figures 5, 19:
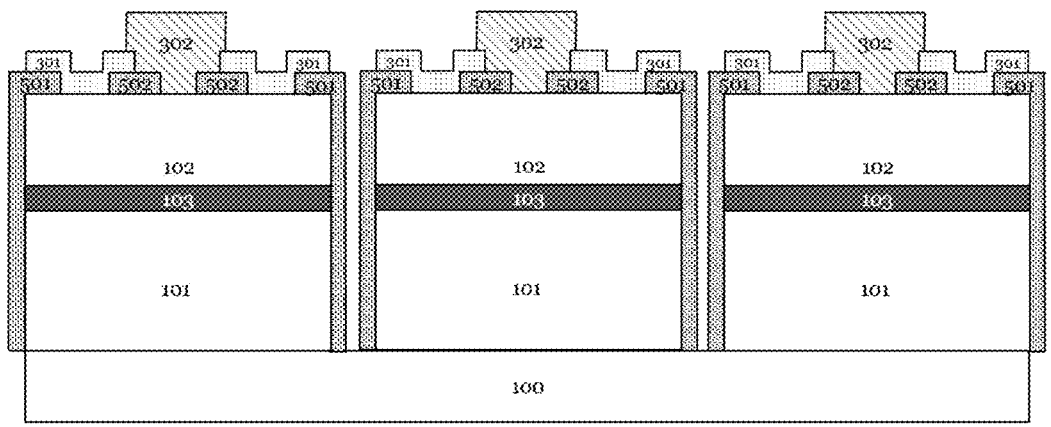
Figures 6, 19:
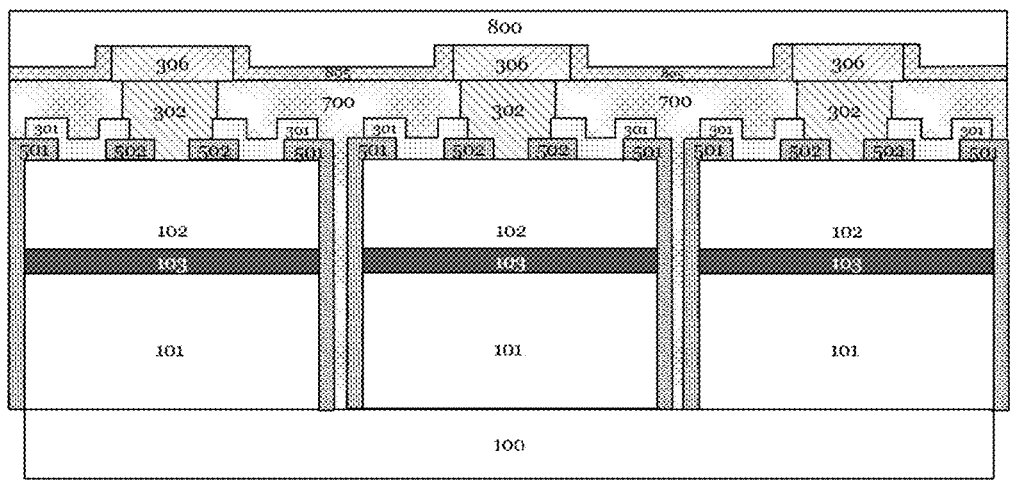
Figures 7, 19:
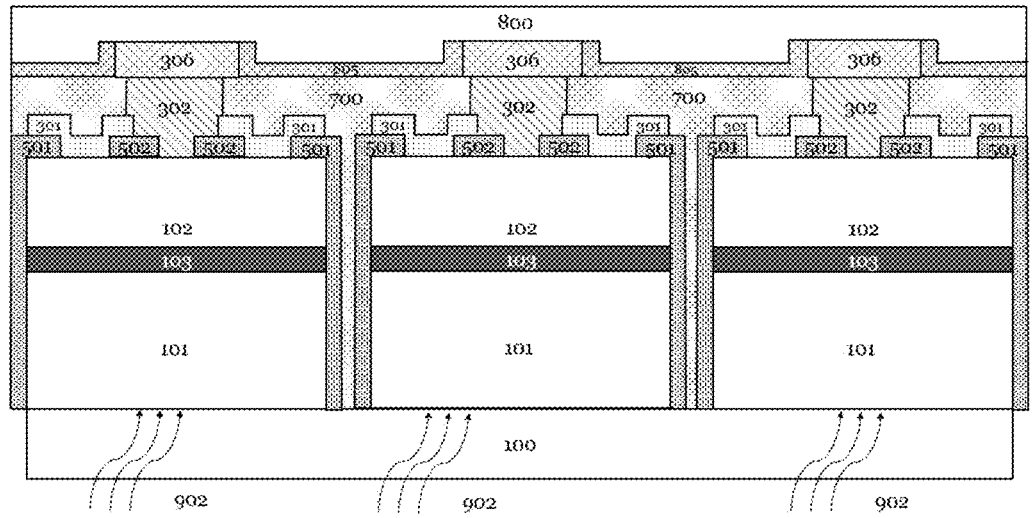
Figures 8, 19:
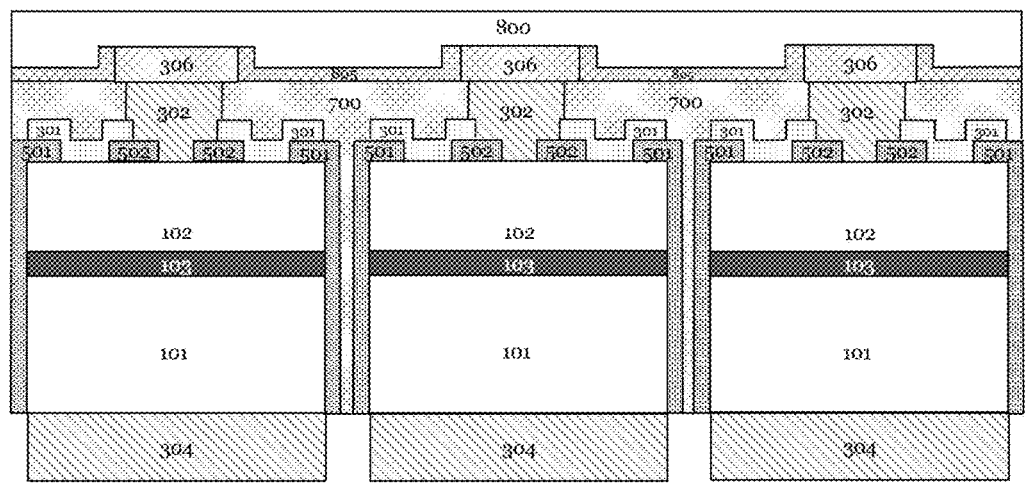
Figures 9, 19:
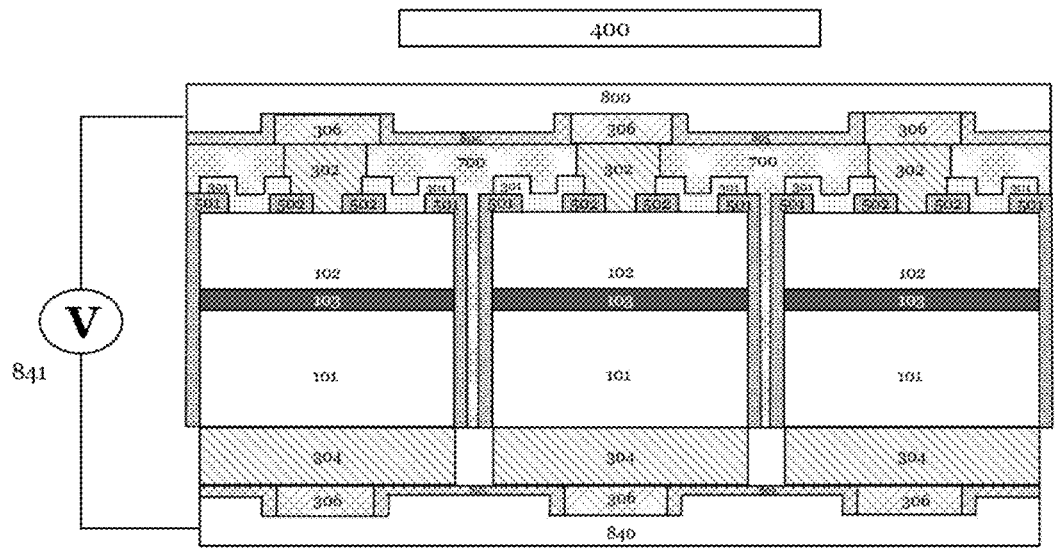
Figures 10, 19:
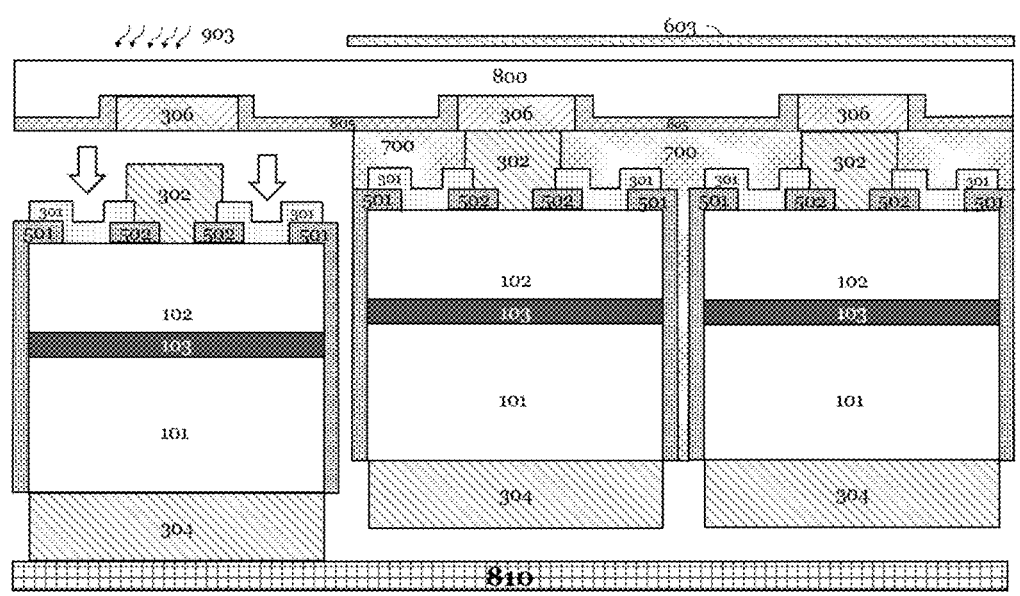
Figures 11, 19:
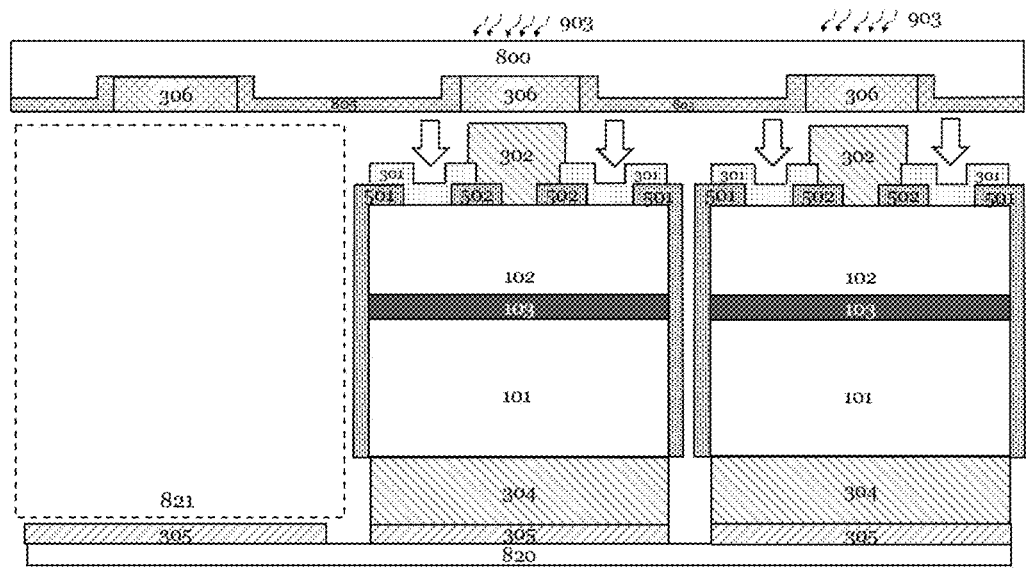
Figures 12, 19:
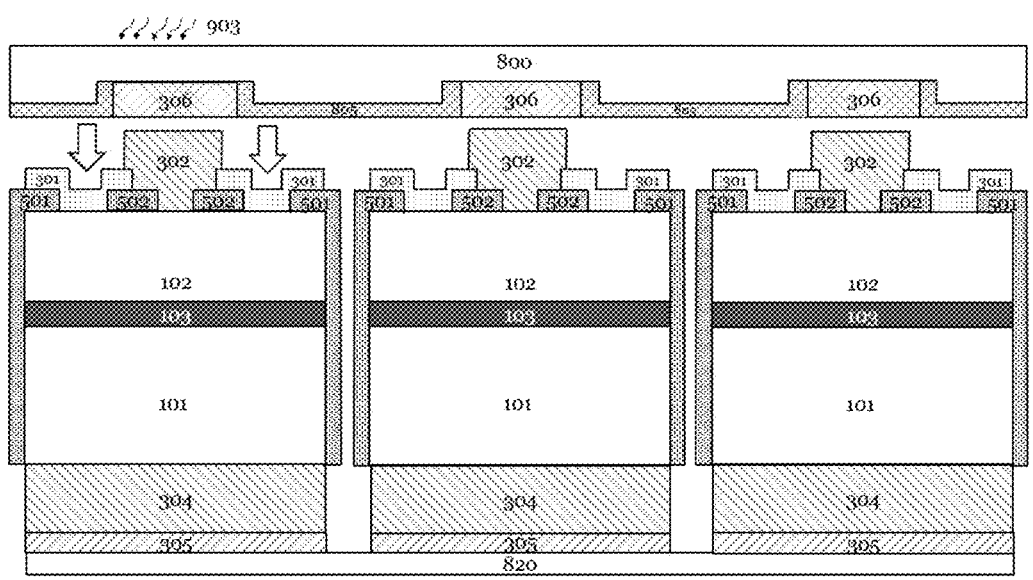
Figures 13, 19:
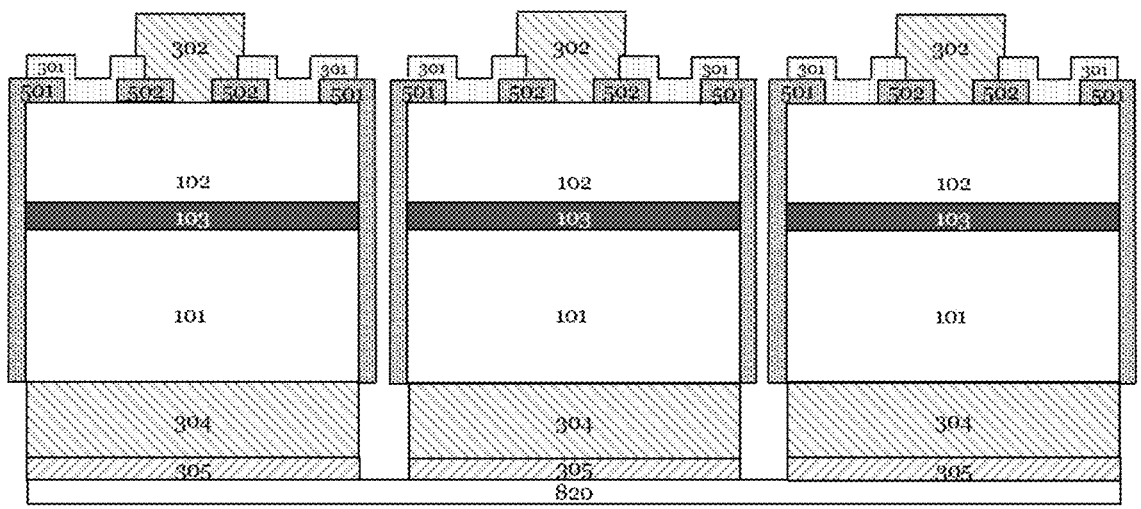
Figures 14, 19:
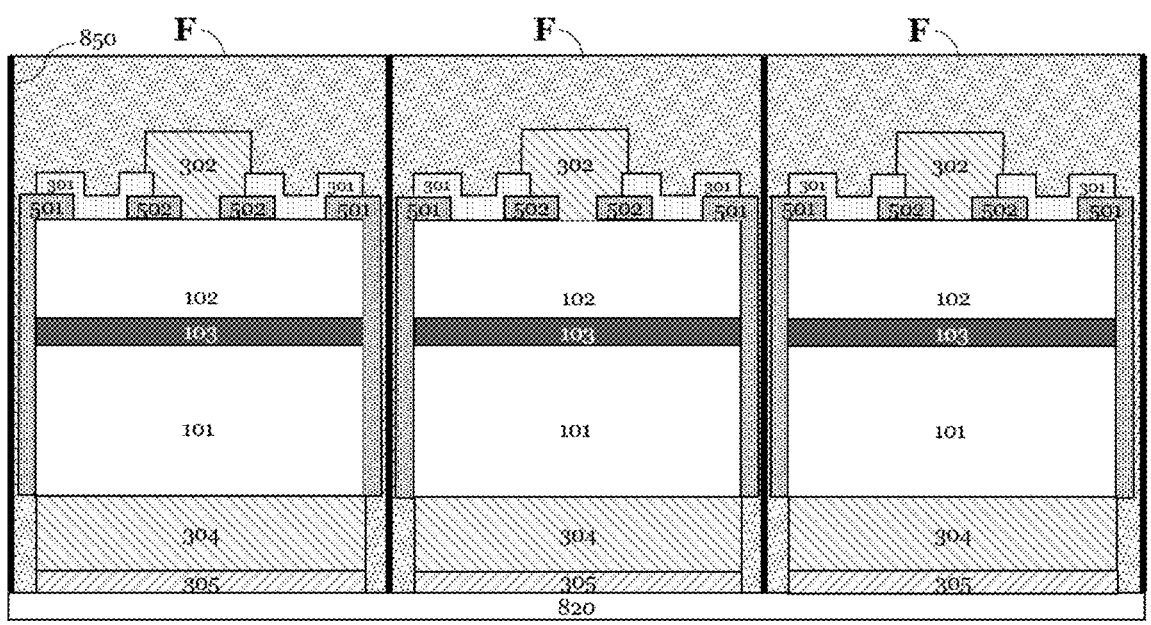
Figures 15, 19:
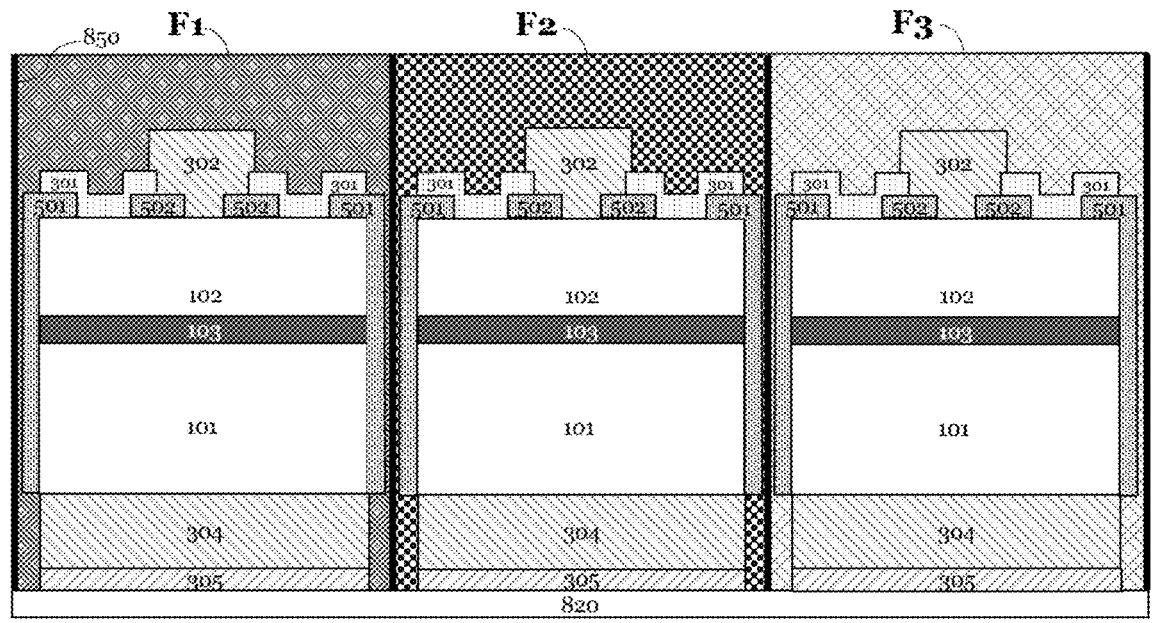
Figures 16, 19:
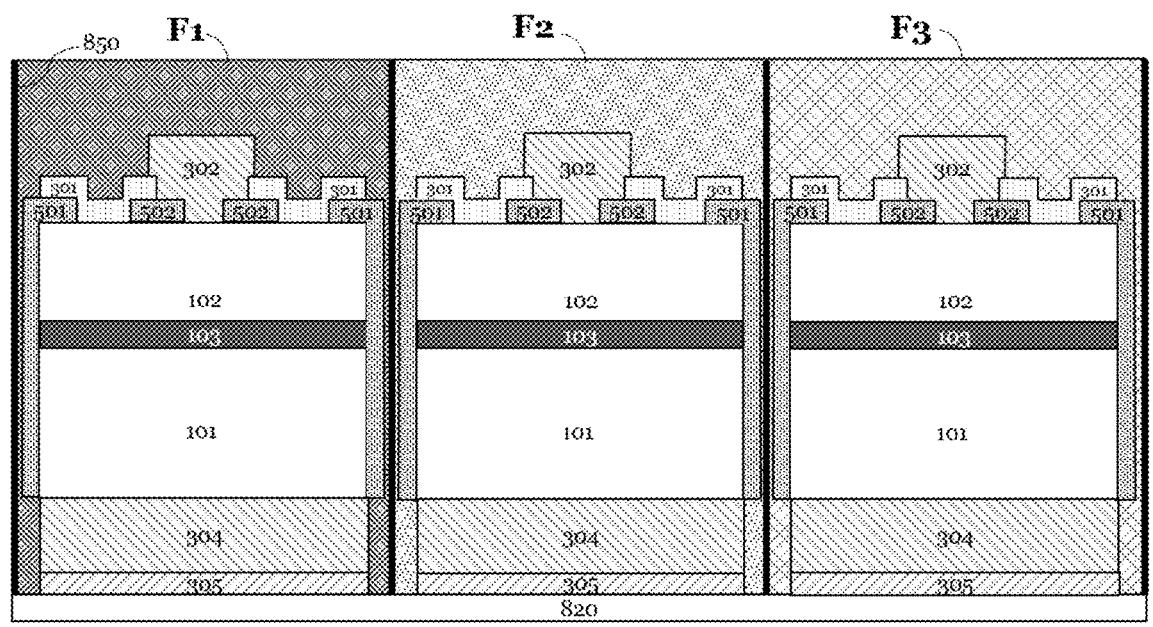

FIG. 66-19 schematically illustrates mass transfer of magnetic micro light emitting diodes to a target substrate by controlling a transferring head which is magnetically attractive and controllable.

Figures 1, 20:
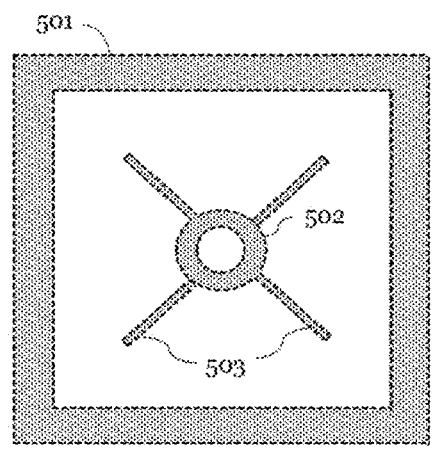
Figures 2, 20:
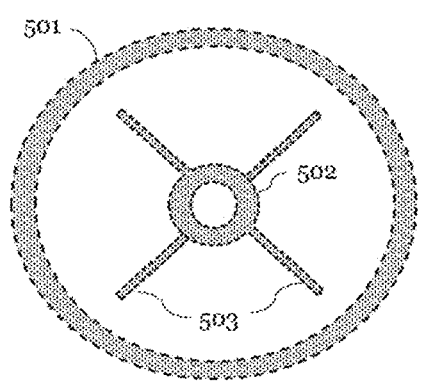
Figures 3, 20:
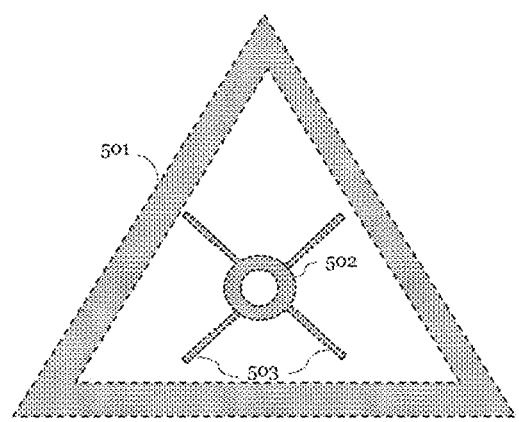

FIG. 66-20 schematically illustrates a fluid transfer system.

Figure 21:
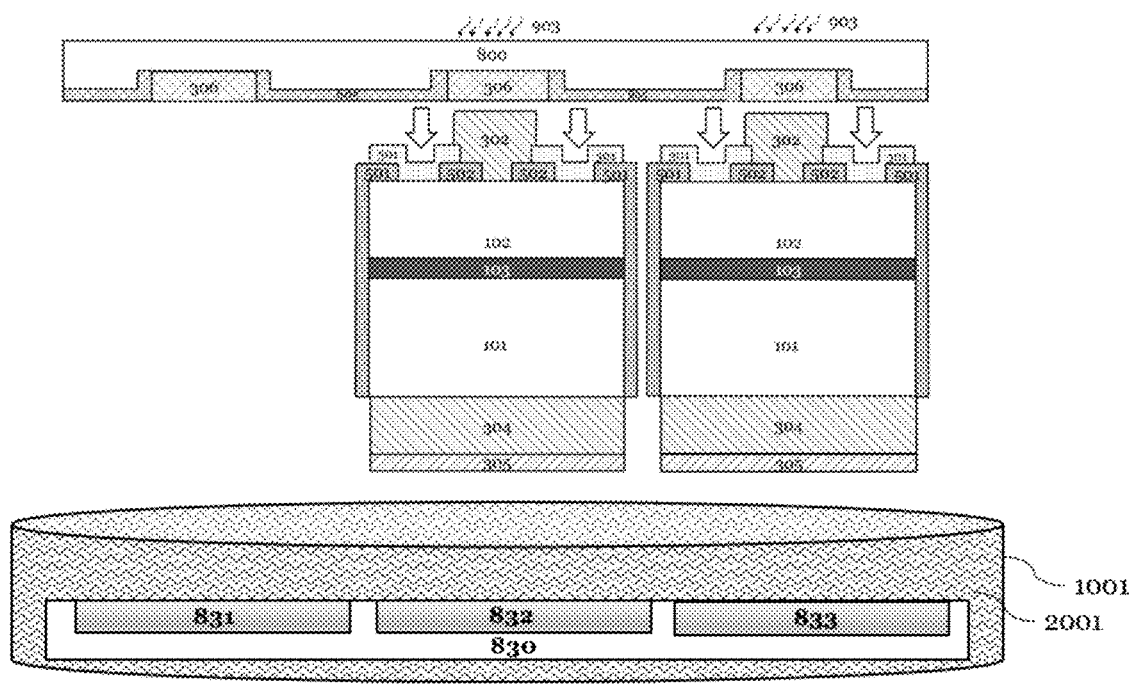
FIG. 21 schematically illustrates performing optional mass transfer of light emitting components after detection to a first container, and performing fluid transfer of the micro light emitting diodes to a receiving substrate through a first solution.

FIG. 66-21-1 schematically illustrates a top view of a substrate of the fluid transfer system.

FIG. 66-21-2 schematically illustrates a top view of a substrate of the fluid transfer system.

Figure 22:
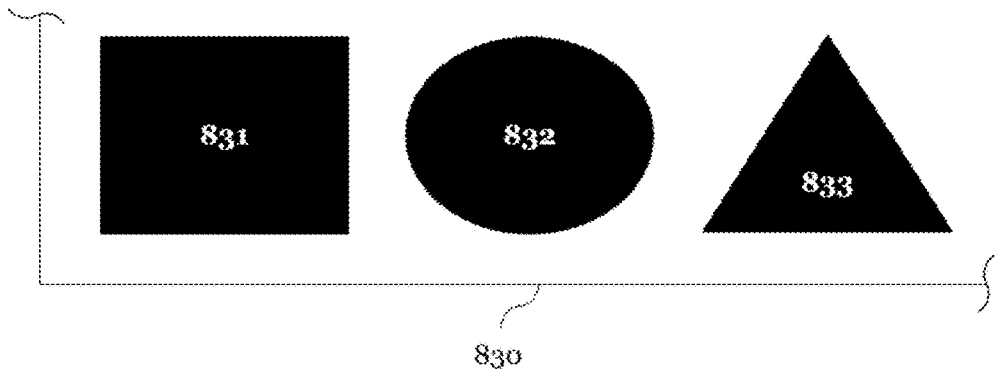
FIG. 22 schematically illustrates a top view of the receiving substrate.

FIG. 66-22-1 schematically illustrates a top view of a substrate of the fluid transfer system.

FIG. 66-22-2 schematically illustrates a top view of a substrate of the fluid transfer system.

Figure 23:
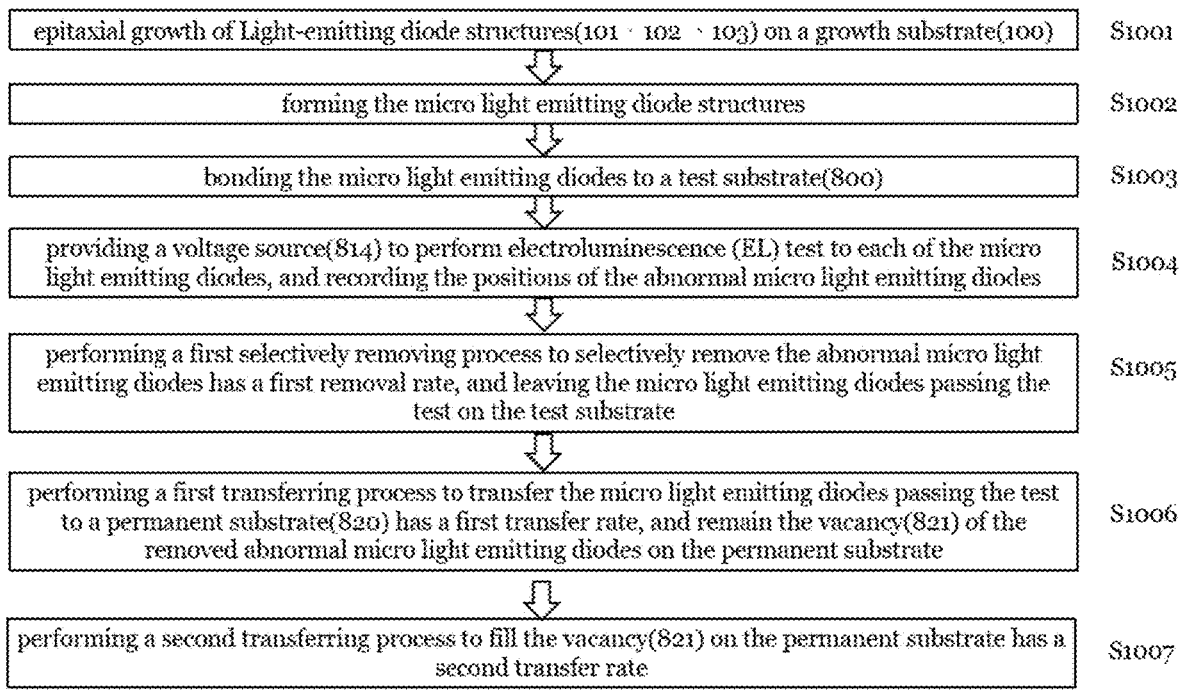
FIG. 23 schematically illustrates a first flow chart according to the invention.

FIG. 66-23 schematically illustrates a fluid transfer system.

Figure 24:
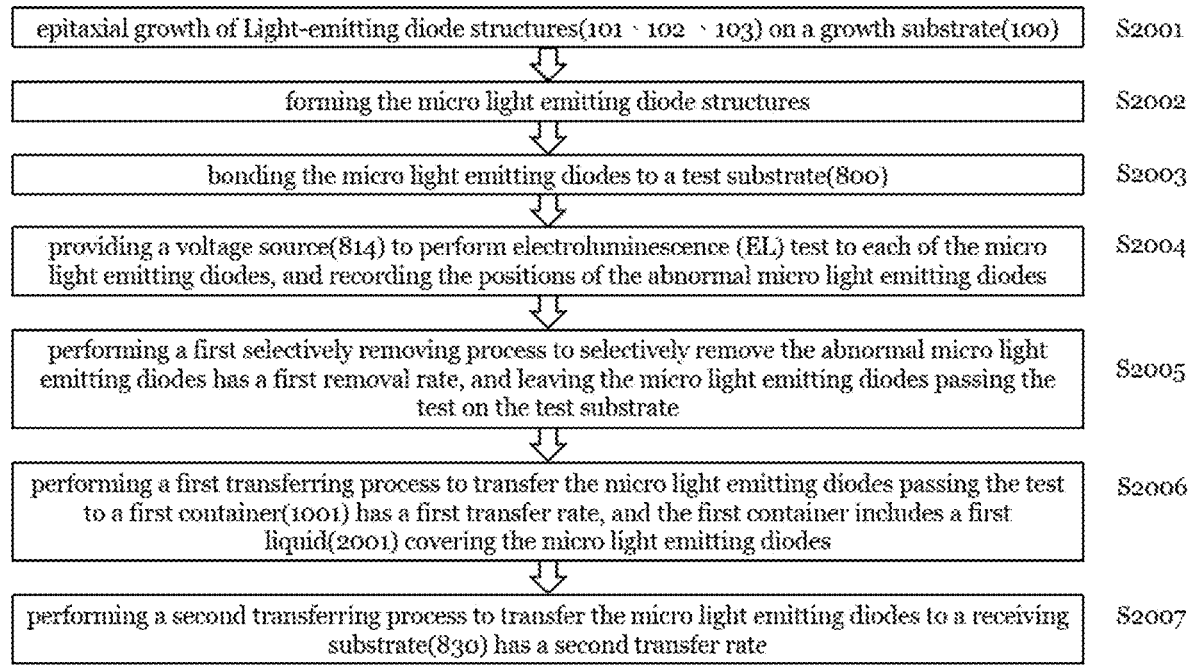
FIG. 24 schematically illustrates a second flow chart according to the invention.
Figure 25A:
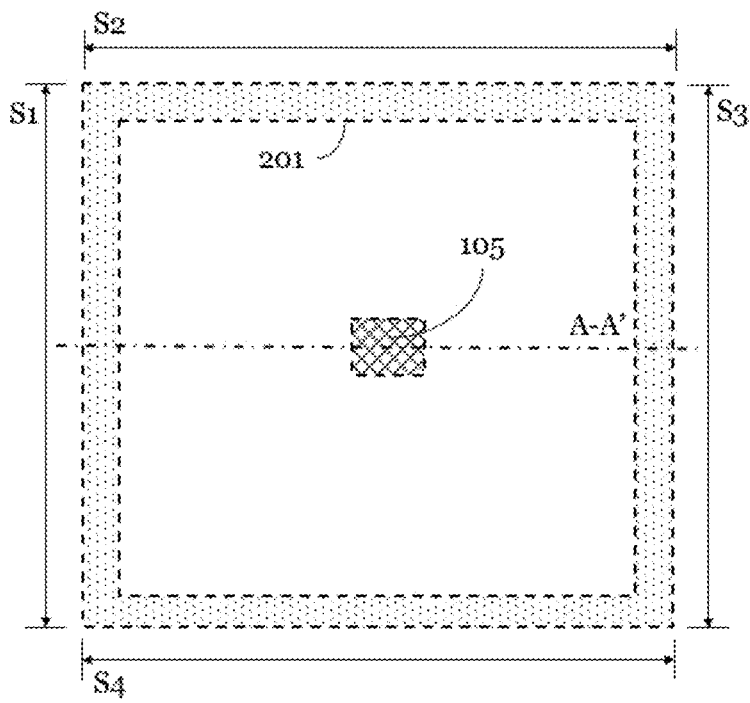
FIG. 25A schematically illustrates a top view according to an embodiment of the invention.
Figure 25B:
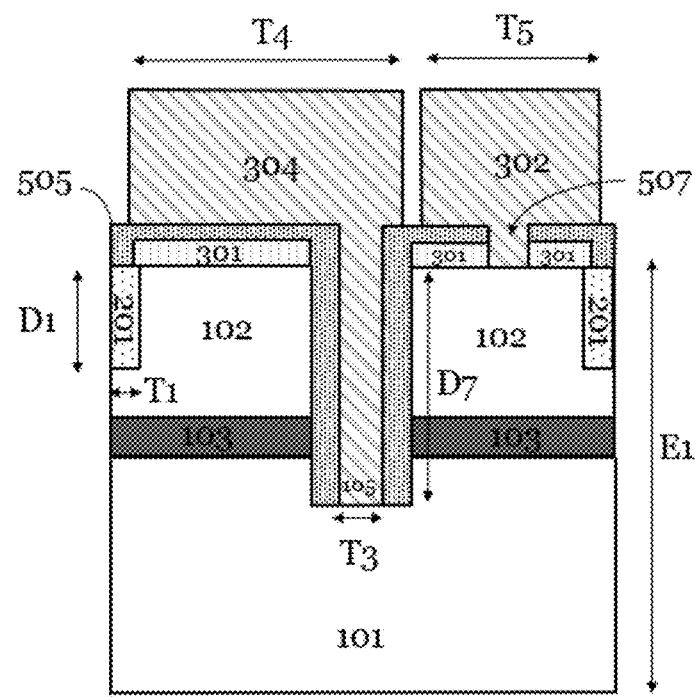
FIG. 25B schematically illustrates a cross-sectional view along line A-A' according to an embodiment of the invention.
Figure 26A:
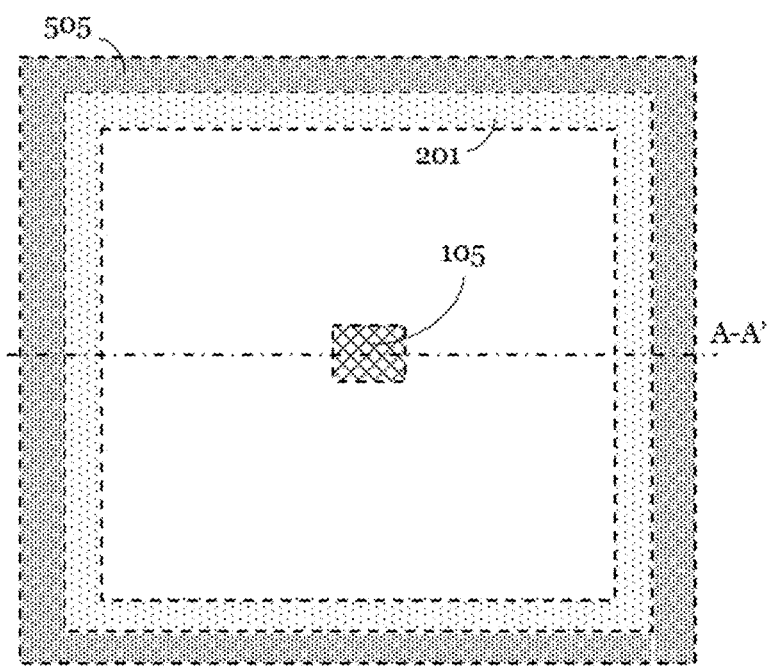
FIG. 26A schematically illustrates a top view according to an embodiment of the invention.
Figure 26B:
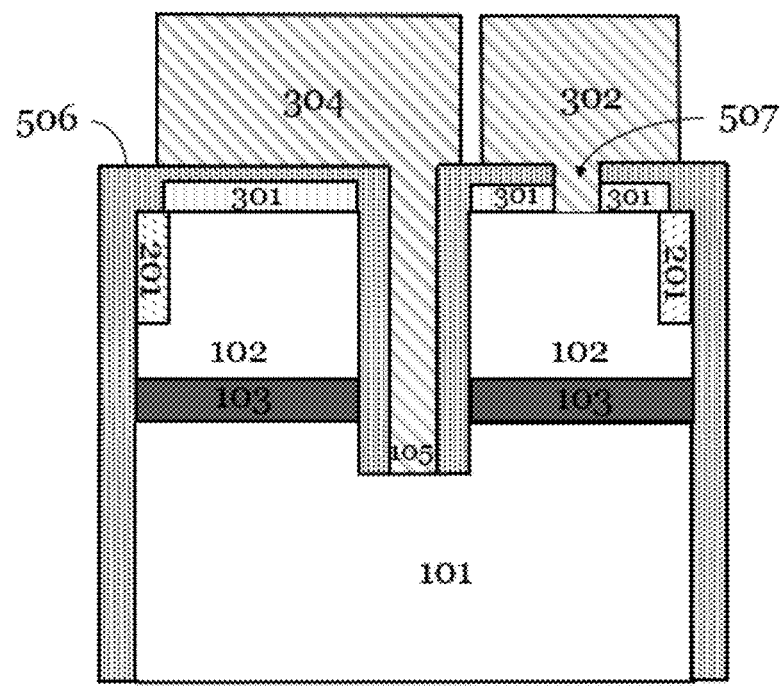
FIG. 26B schematically illustrates a cross-sectional view along line A-A' according to an embodiment of the invention.
Figure 27A:
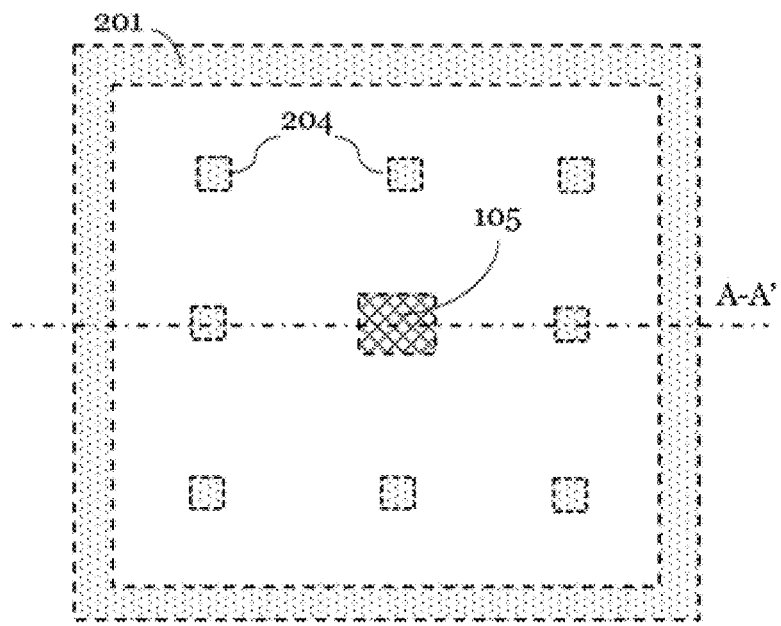
FIG. 27A schematically illustrates a top view according to an embodiment of the invention.
Figure 27B:
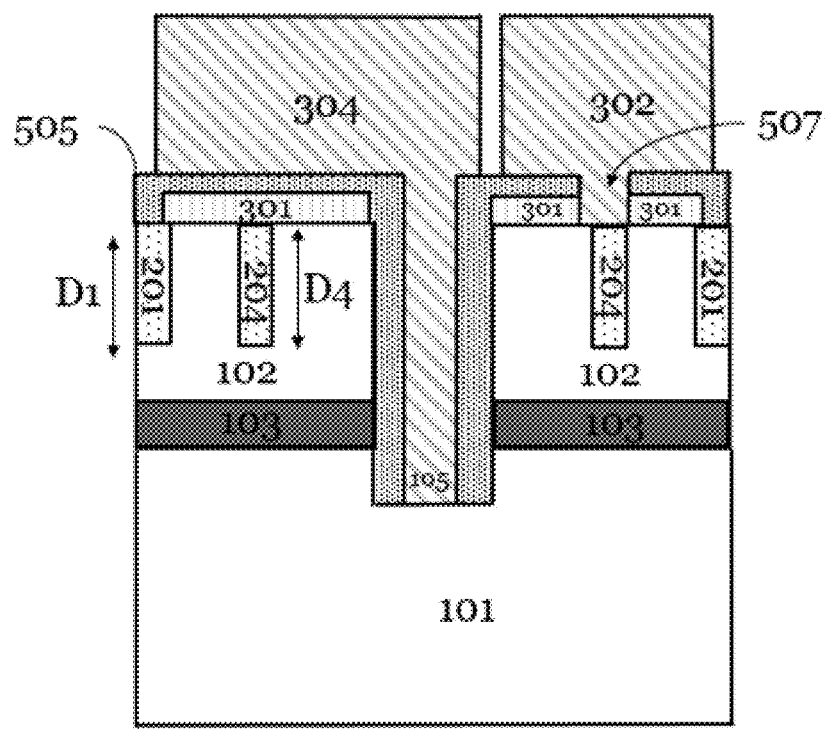
FIG. 27B schematically illustrates a cross-sectional view along line A-A' according to an embodiment of the invention.
Figure 28A:
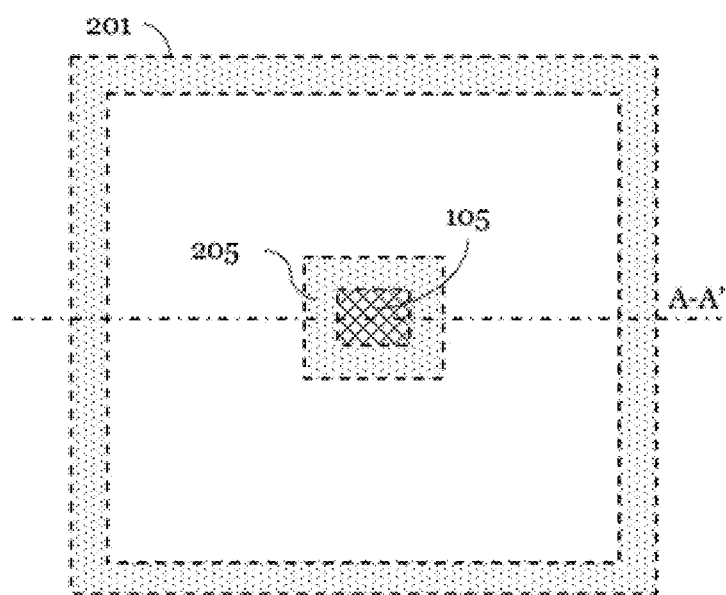
FIG. 28A schematically illustrates a top view according to an embodiment of the invention.
Figure 28B:
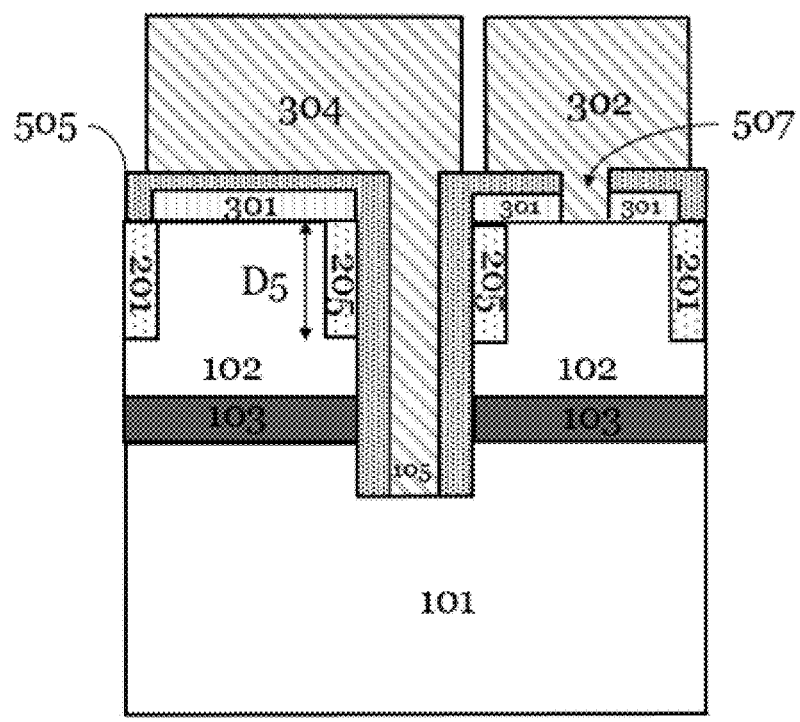
FIG. 28B schematically illustrates a cross-sectional view along line A-A according to an embodiment of the invention.
Figure 29A:
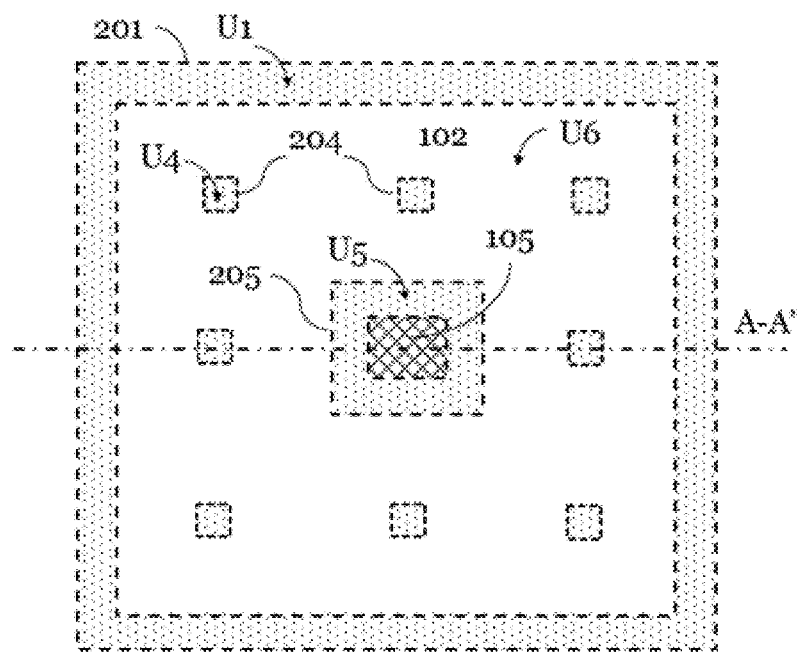
FIG. 29A schematically illustrates a top view according to an embodiment of the invention.
Figure 29B:
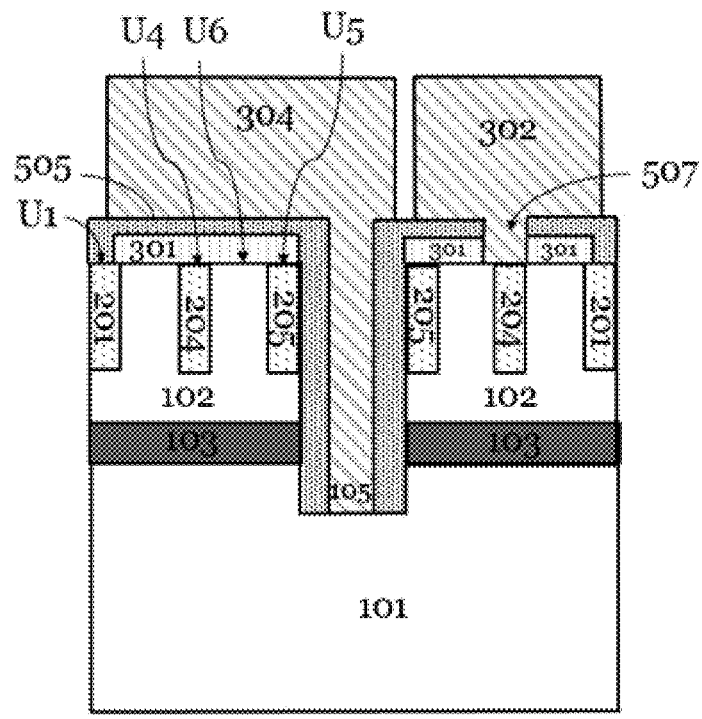
FIG. 29B schematically illustrates a cross-sectional view along line A-A according to an embodiment of the invention.
Figure 30A:
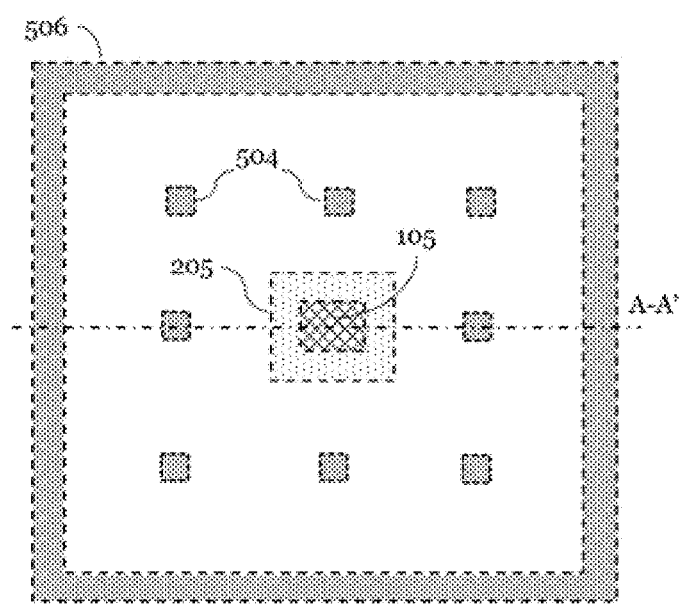
FIG. 30A schematically illustrates a top view according to an embodiment of the invention.
Figure 30B:
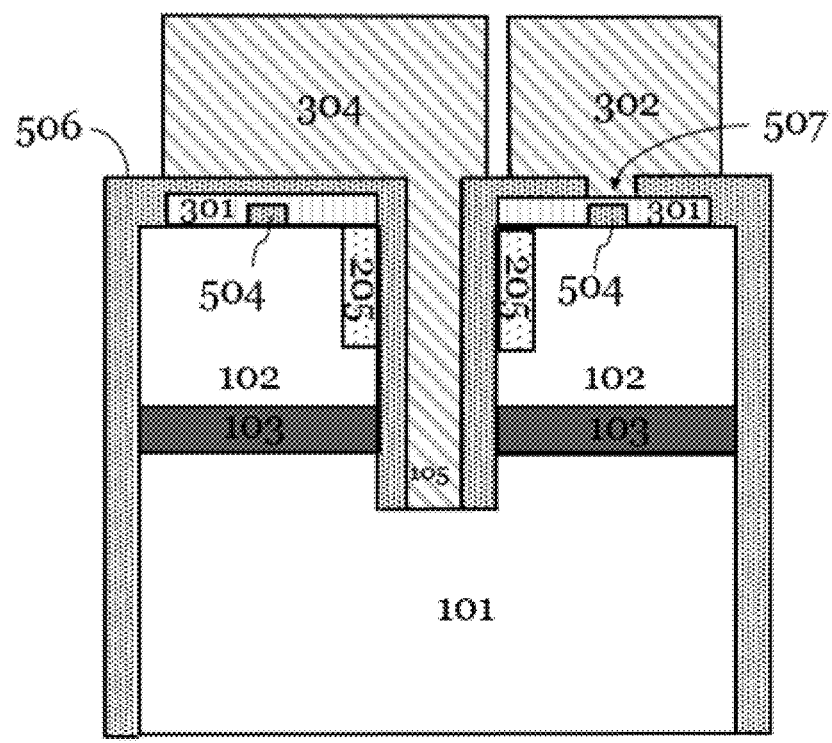
FIG. 30B schematically illustrates a cross-sectional view along line A-A according to an embodiment of the invention.
Figure 31A:
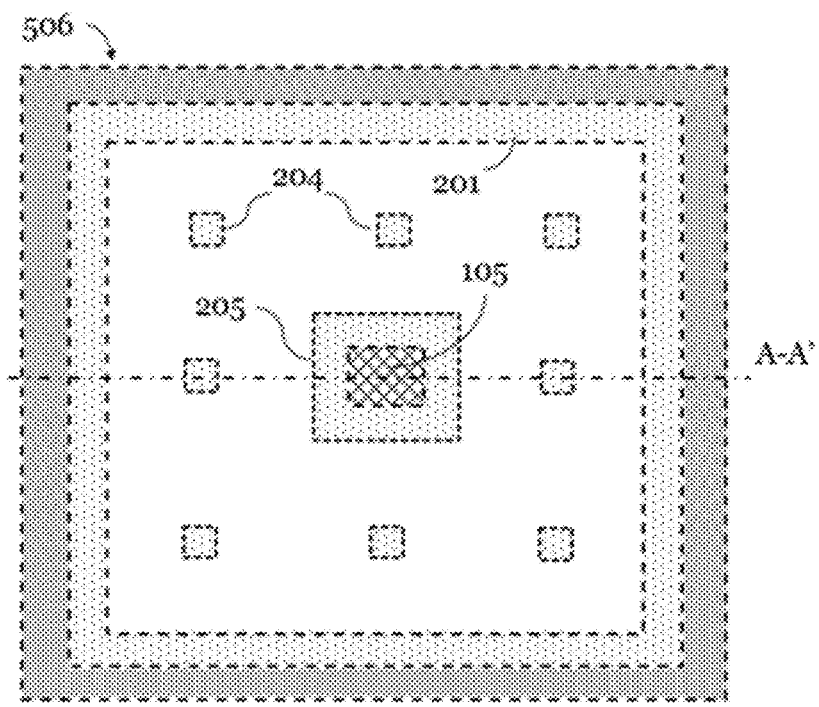
FIG. 31A schematically illustrates a top view according to an embodiment of the invention.
Figure 31B:
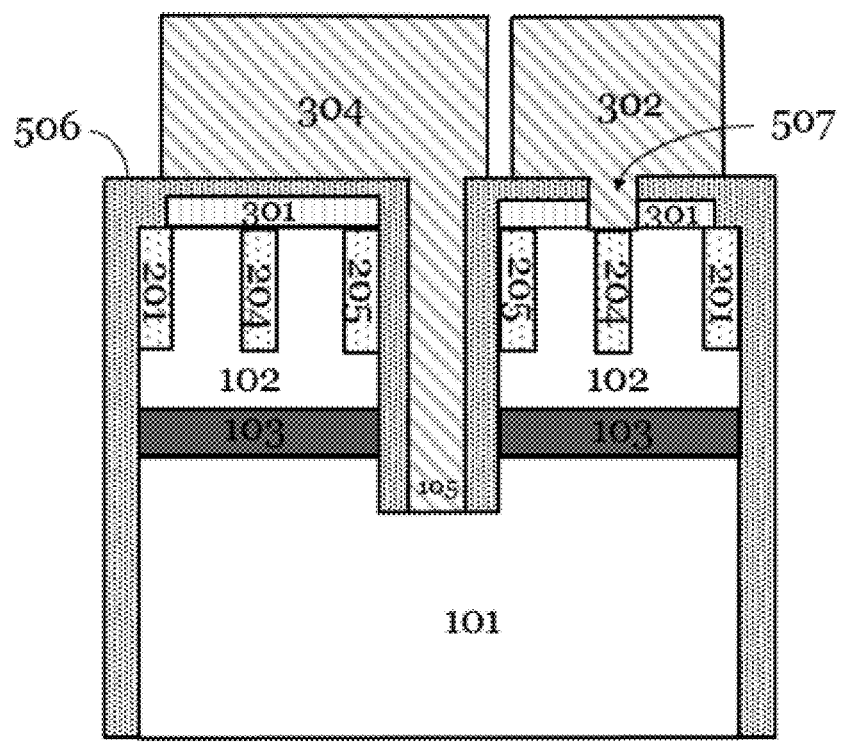
FIG. 31B schematically illustrates a cross-sectional view along line A-A according to an embodiment of the invention.
Figure 32A:
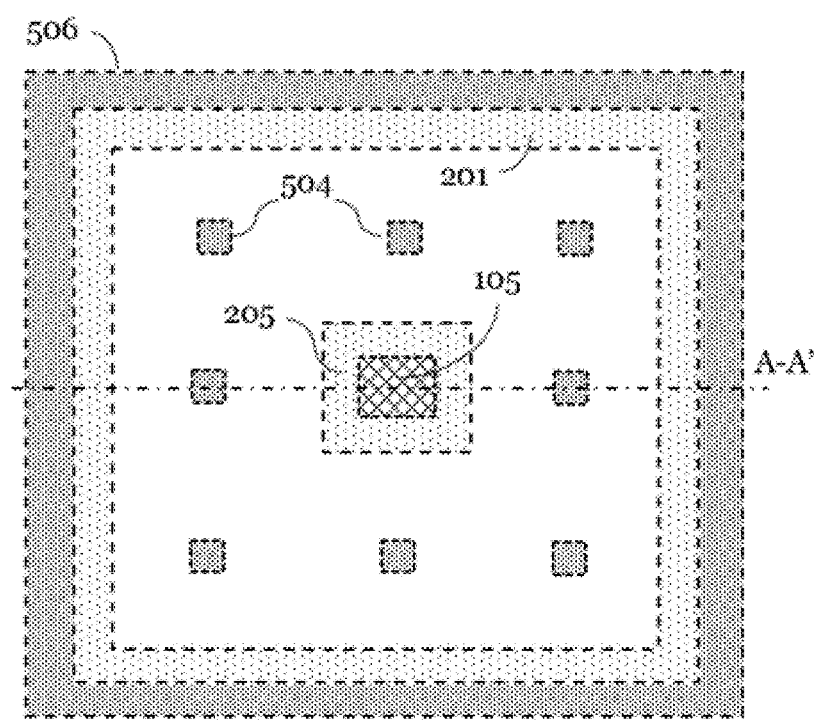
FIG. 32A schematically illustrates a top view according to an embodiment of the invention.
Figure 32B:
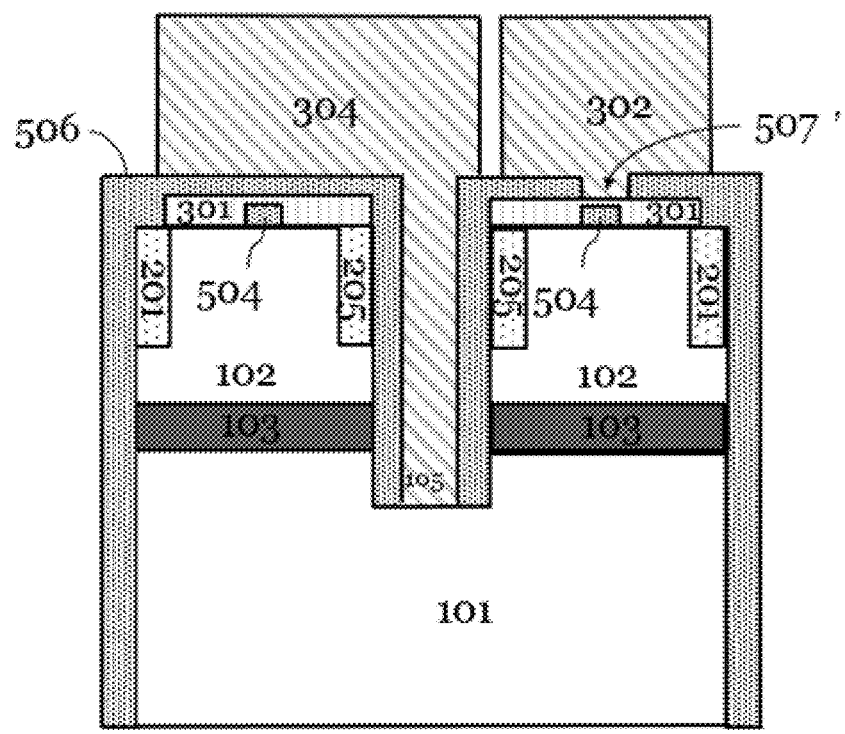
FIG. 32B schematically illustrates a cross-sectional view along line A-A according to an embodiment of the invention.
Figure 33A:
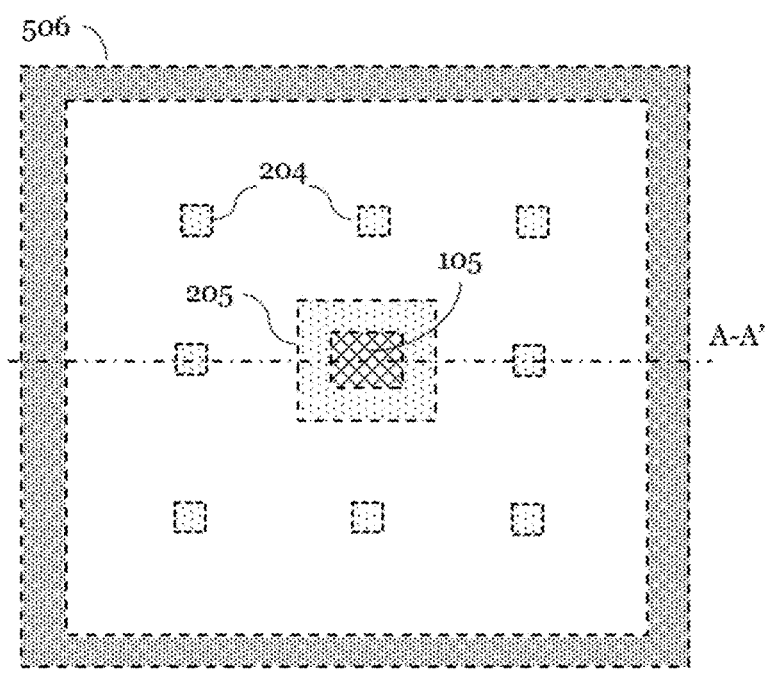
FIG. 33A schematically illustrates a top view according to an embodiment of the invention.
Figure 33B:
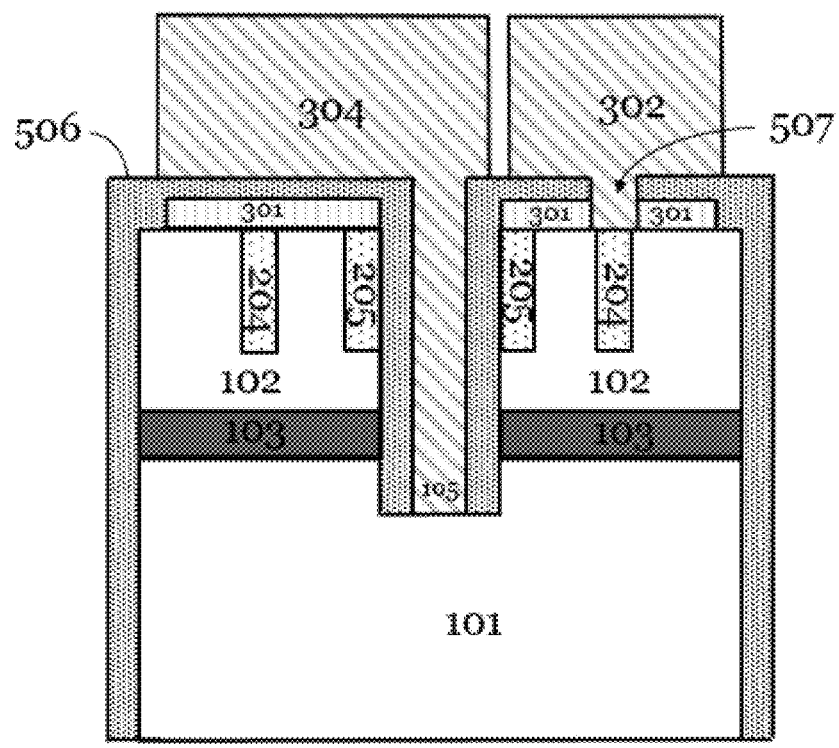
FIG. 33B schematically illustrates a cross-sectional view along line A-A according to an embodiment of the invention.
Figure 34A:
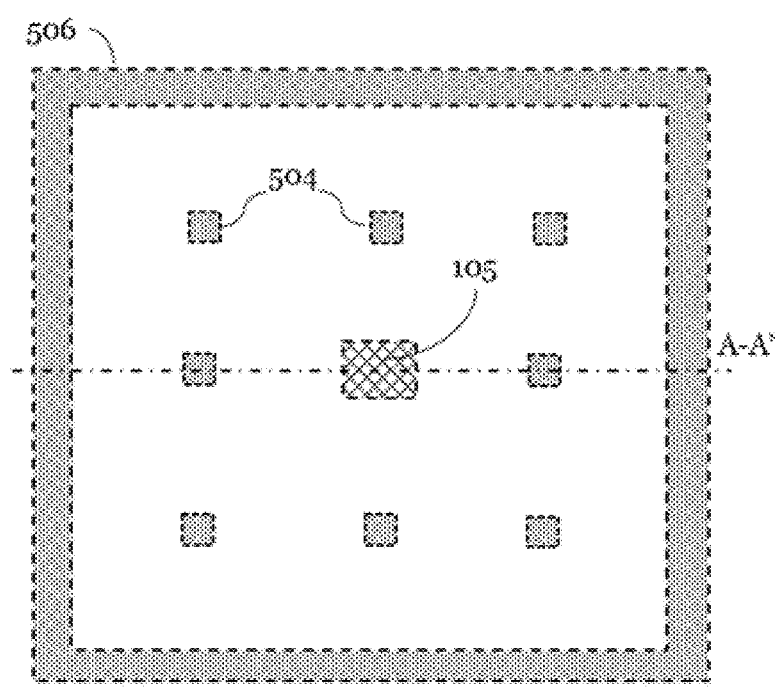
FIG. 34A schematically illustrates a top view according to an embodiment of the invention.
Figure 34B:
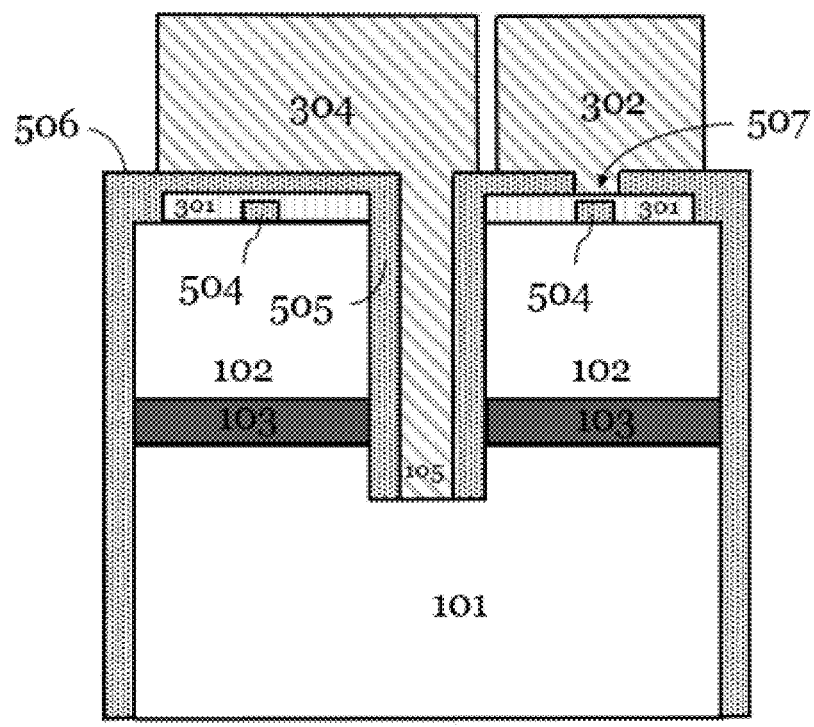
FIG. 34B schematically illustrates a cross-sectional view along line A-A according to an embodiment of the invention.
Figure 35A:
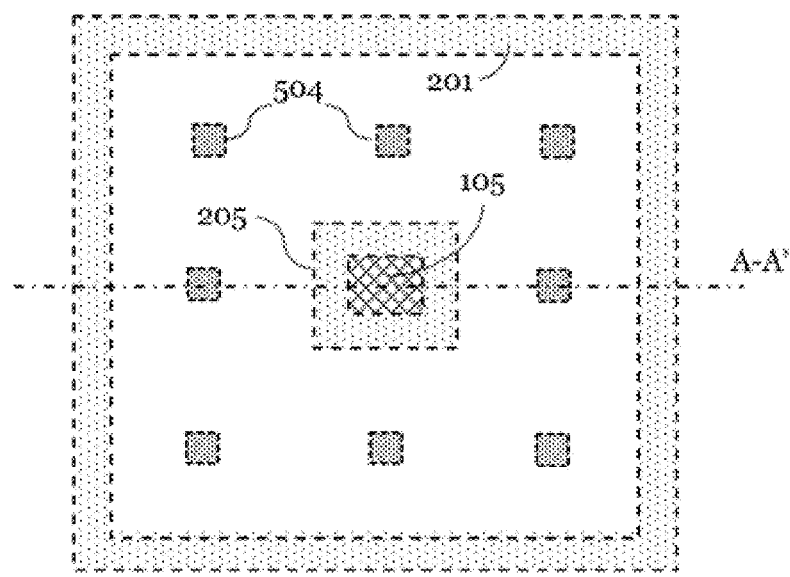
FIG. 35A schematically illustrates a top view according to an embodiment of the invention.
Figure 35B:
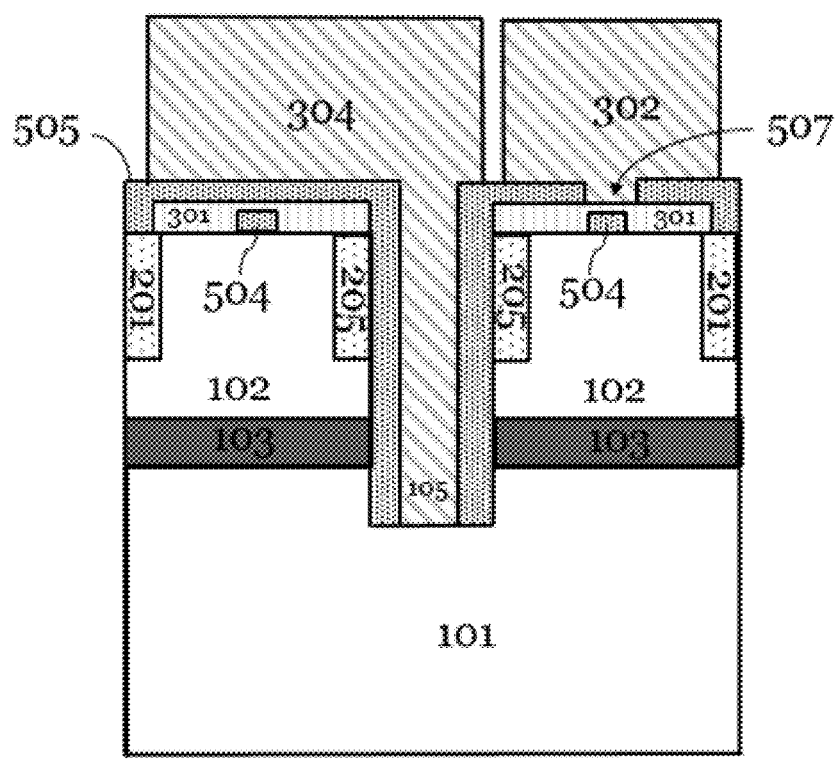
FIG. 35B schematically illustrates a cross-sectional view along line A-A according to an embodiment of the invention.
Figure 36A:
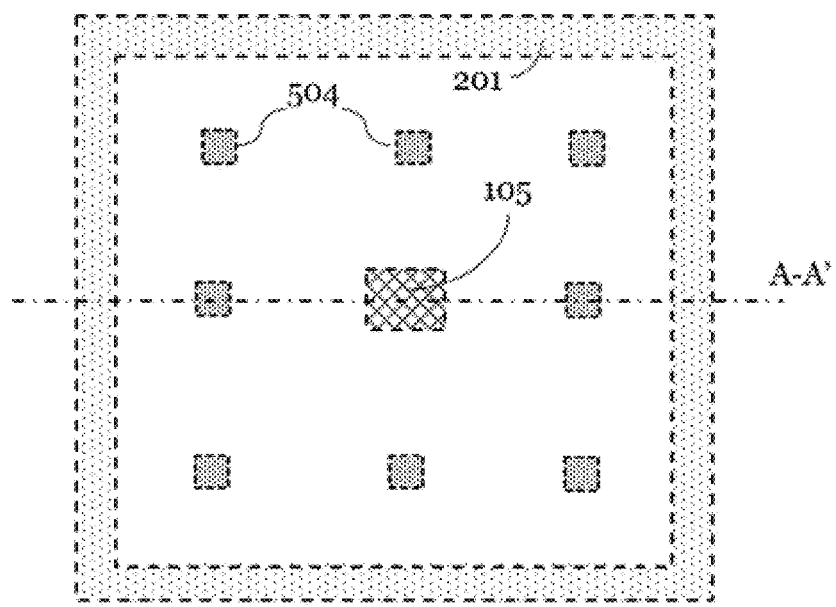
FIG. 36A schematically illustrates a top view according to an embodiment of the invention.
Figure 36B:
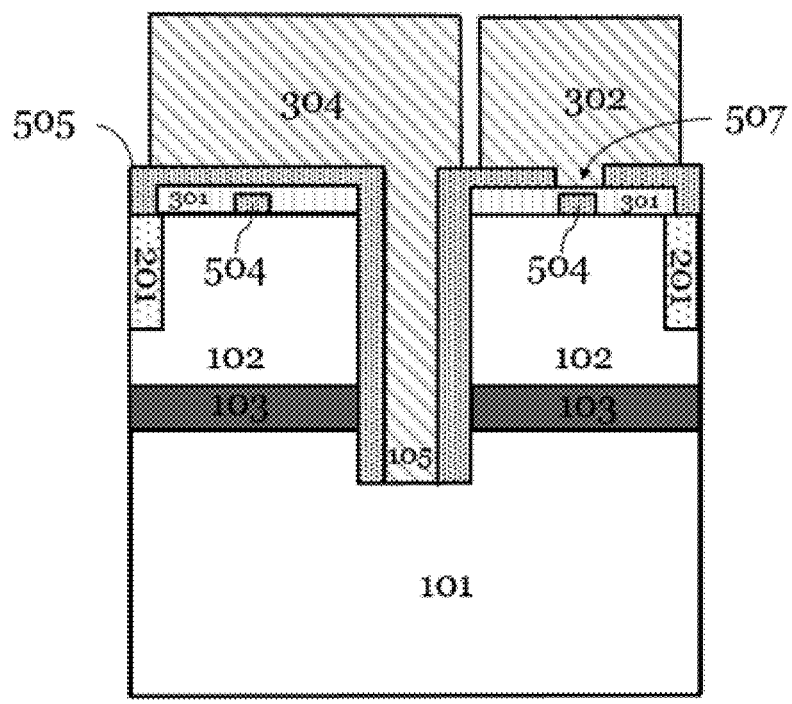
FIG. 36B schematically illustrates a cross-sectional view along line A-A according to an embodiment of the invention.

FIG. 66-24 schematically illustrates a fluid transfer system.

Figures 25, 66:
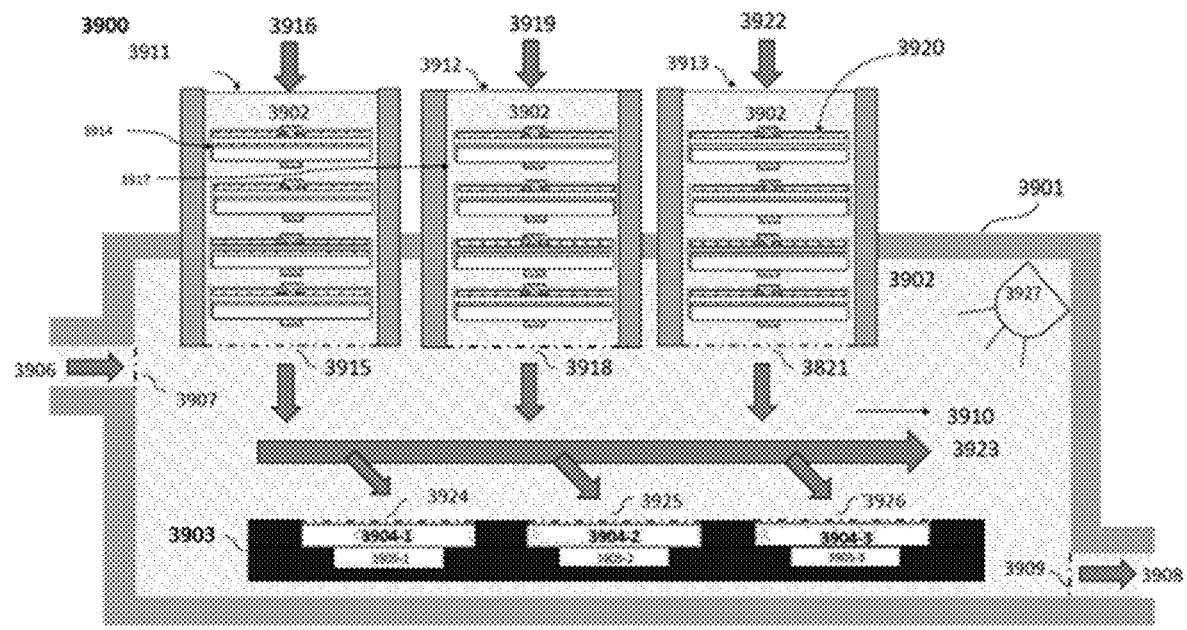

FIG. 66-25 schematically illustrates a fluid transfer system.

Figures 1A, 67:
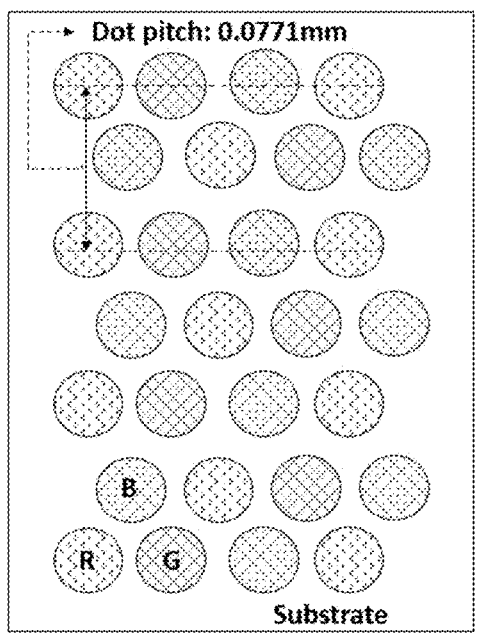

FIG. 67-1A schematically illustrates a traditional display device.

Figures 1B, 67:
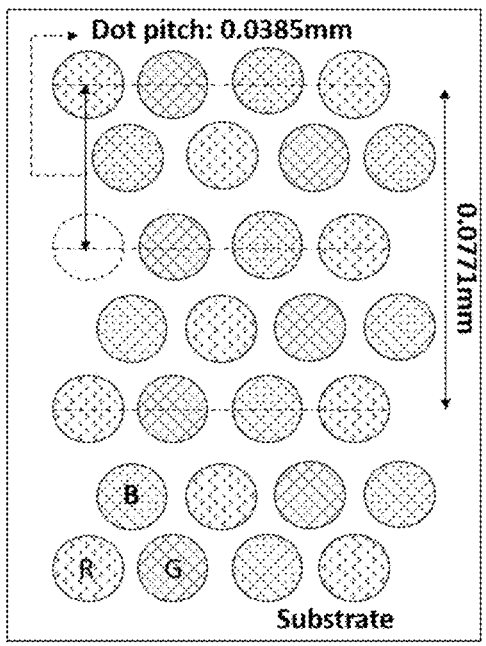
Figures 1C, 67:
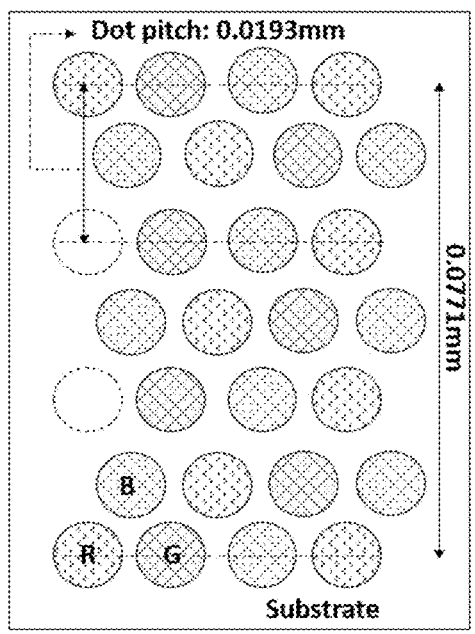
Figures 2A, 67:
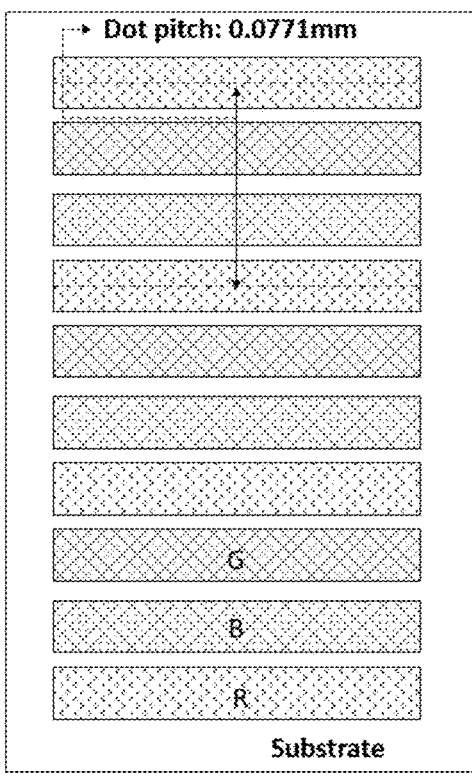

FIG. 67-2A schematically illustrates a traditional display device.

Figures 2B, 67:
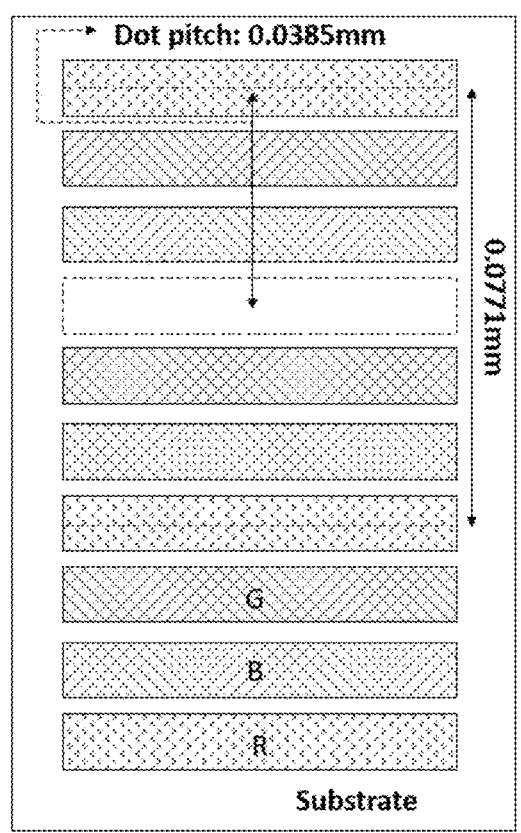
Figures 2C, 67:
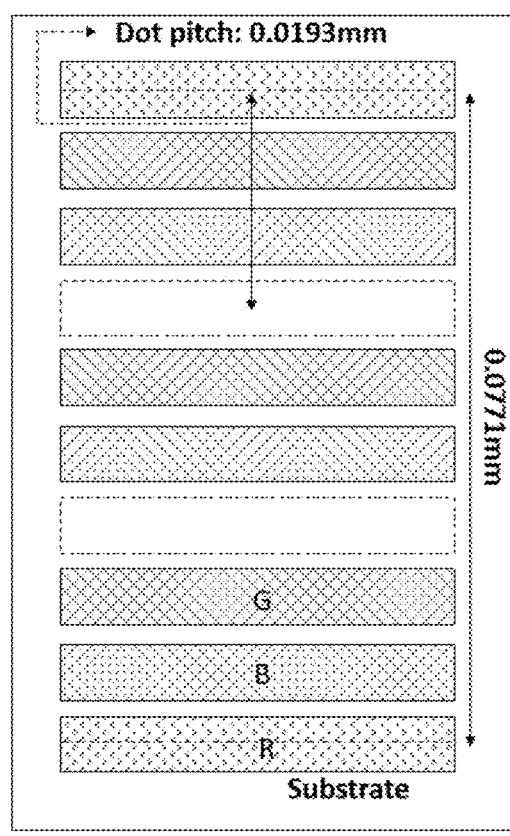
Figures 3A, 67:
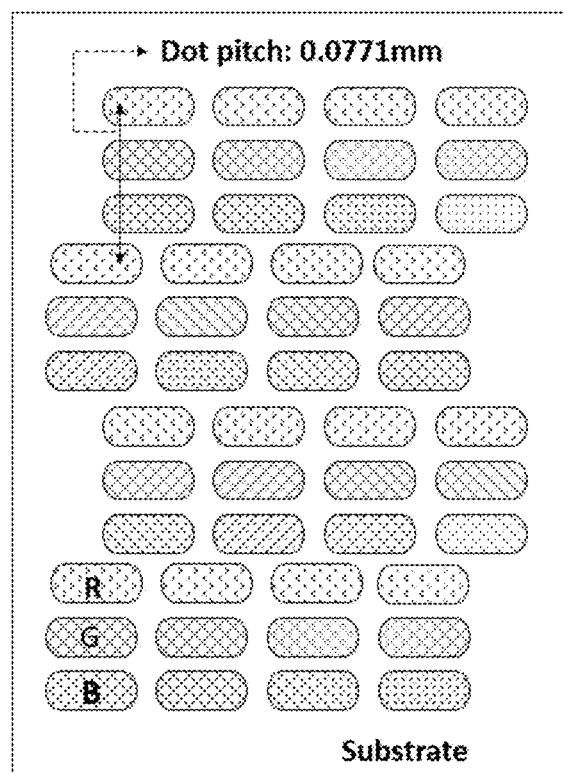

FIG. 67-3A schematically illustrates a traditional display device.

FIG. 67-1B schematically illustrates a high resolution display device.

FIG. 67-2B schematically illustrates a high resolution display device.

Figures 3B, 67:
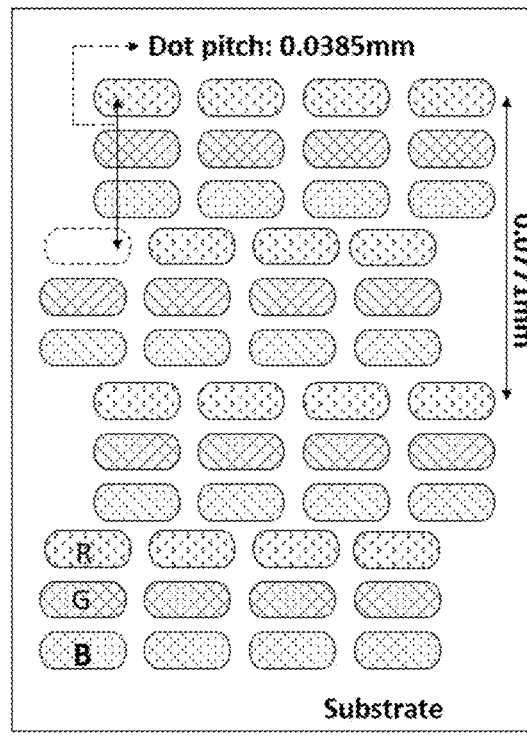

FIG. 67-3B schematically illustrates a high resolution display device.

FIG. 67-1C schematically illustrates a high resolution display device.

FIG. 67-2C schematically illustrates a high resolution display device.

Figures 3C, 67:
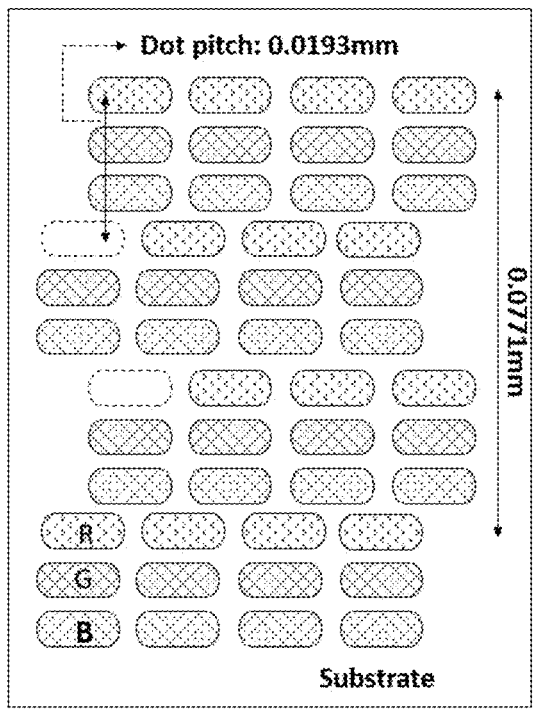

FIG. 67-3C schematically illustrates a high resolution display device.

Figure 68:
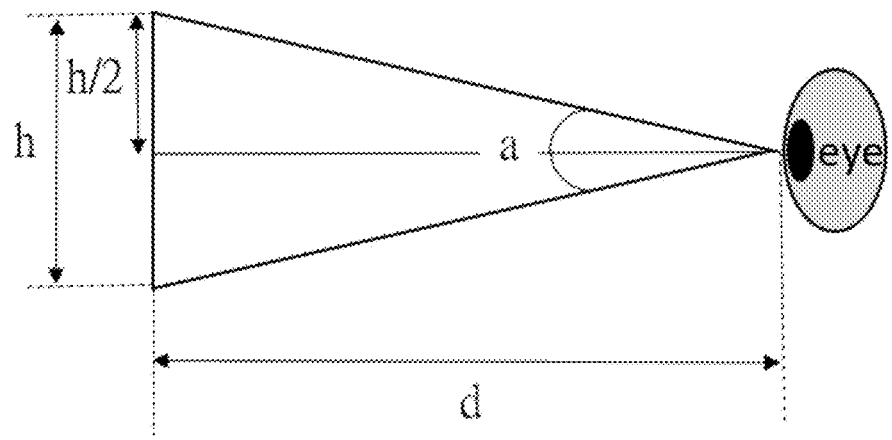

FIG. 68 schematically illustrates the identification requirements of human eye's visual acuity.

Figure 69A:
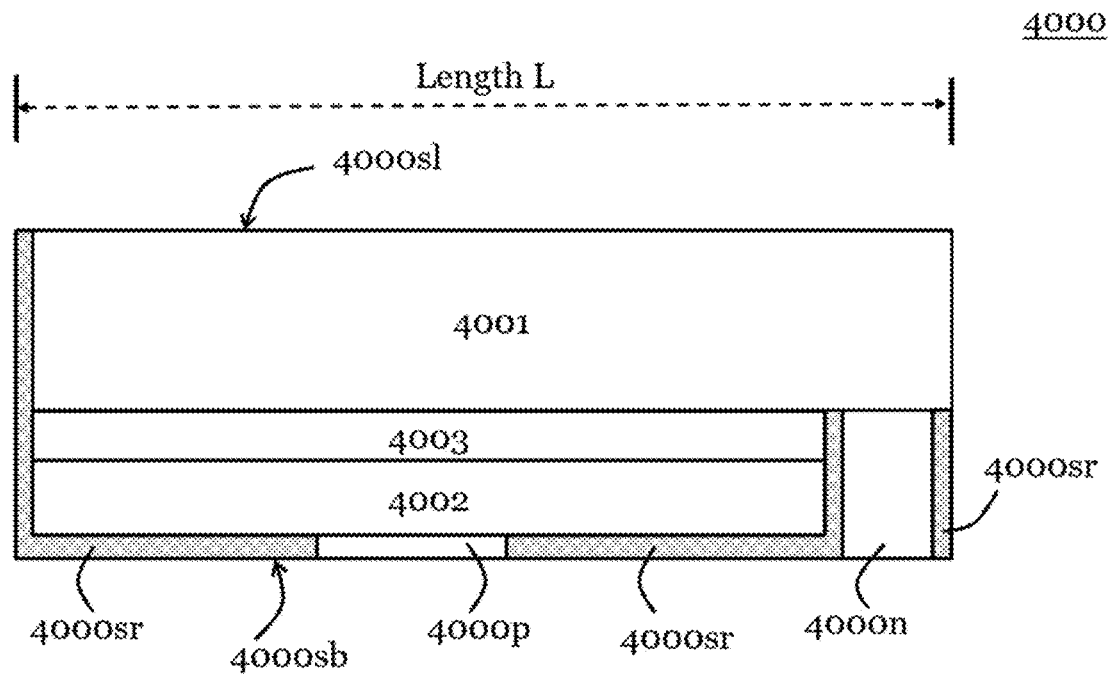

FIG. 69A schematically illustrates a cross-section view of a light emitting diode structure 4000 according to an embodiment.

Figure 69B:
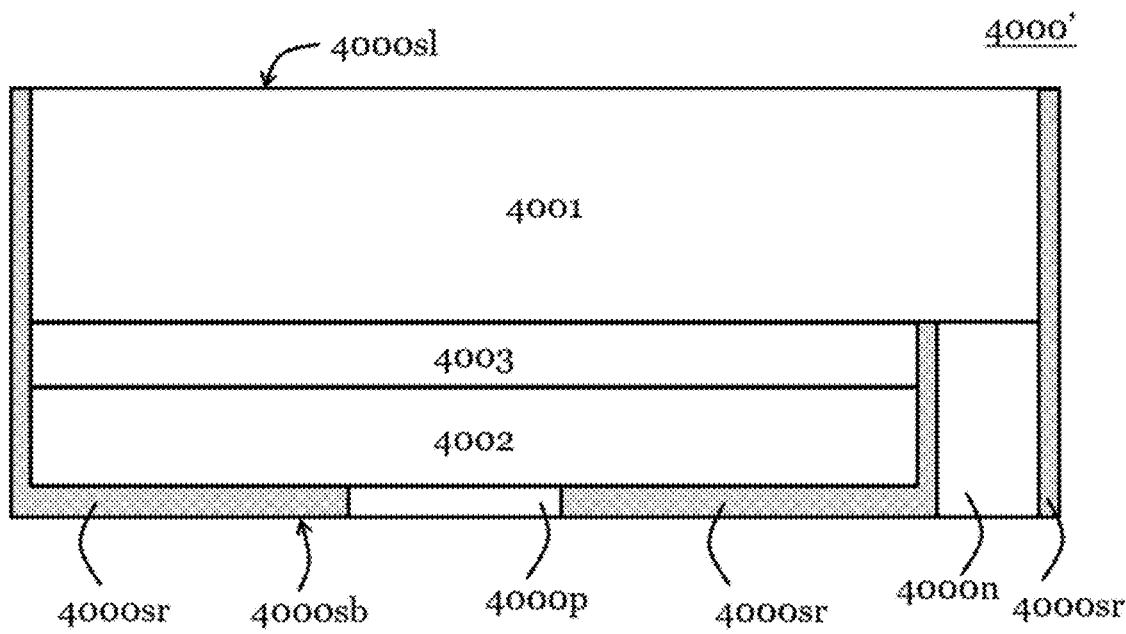

FIG. 69B schematically illustrates a cross-section view of a light emitting diode structure 4000' according to an embodiment.

Figure 69C:
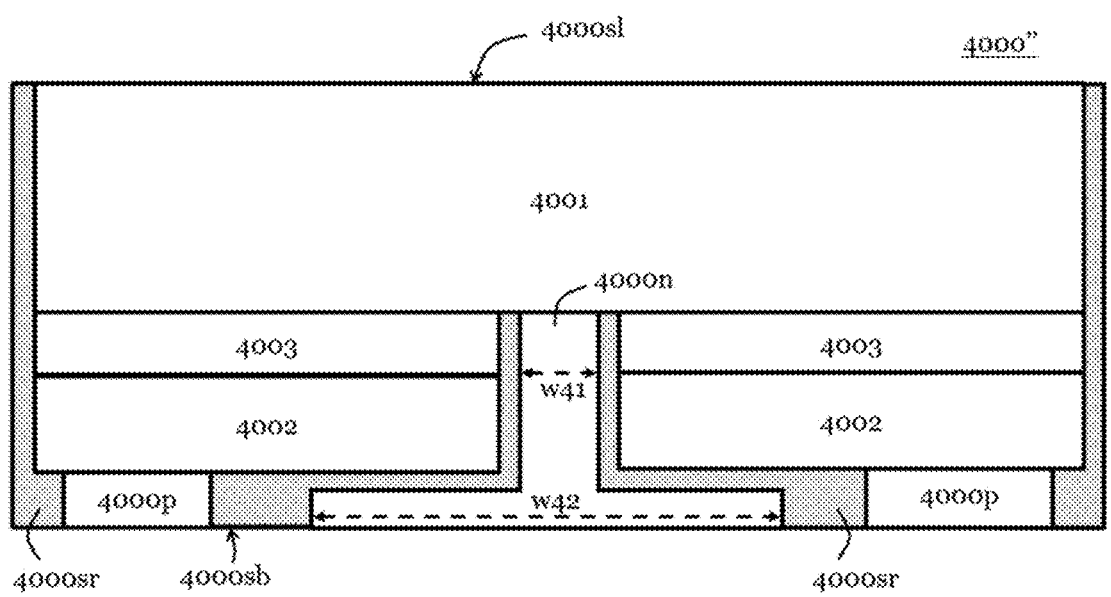

FIG. 69C schematically illustrates a cross-section view of a light emitting diode structure 4000" according to an embodiment.

Figure 69D:
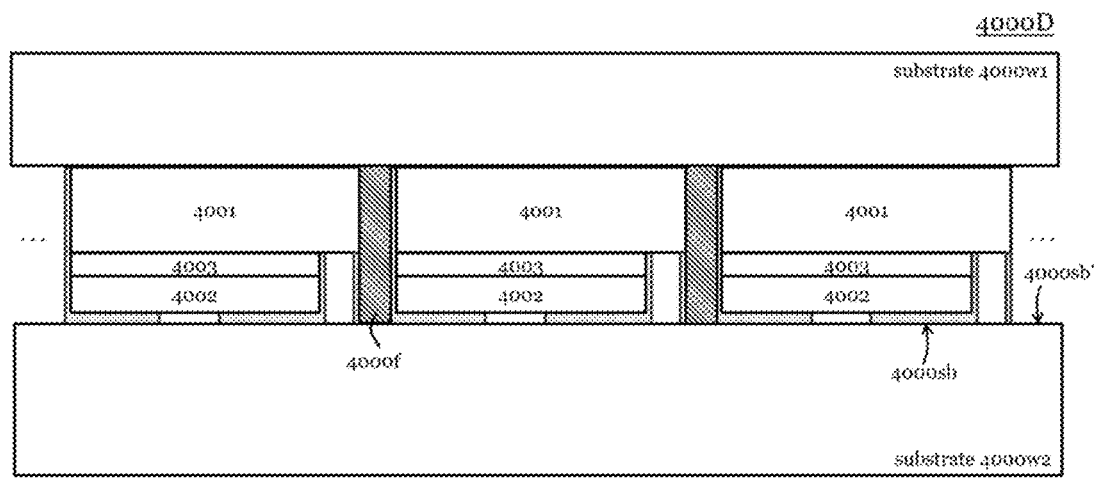

FIG. 69D schematically illustrates a cross-section view of a light emitting device according to an embodiment.

Figures 1, 69E:
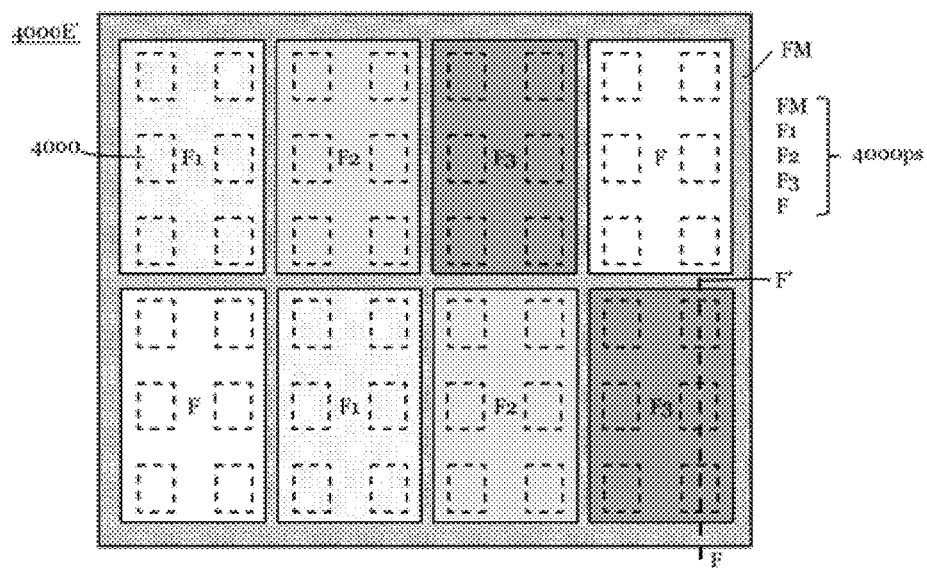
Figures 2, 69E:
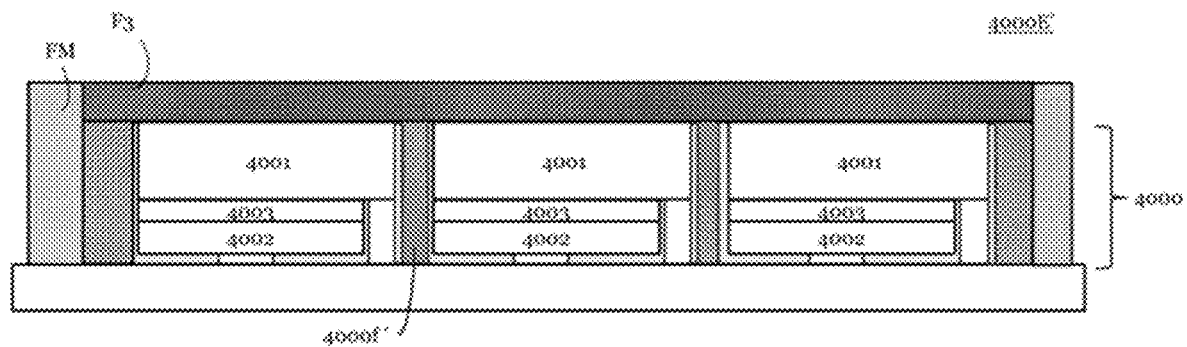
Figures 3, 69E:
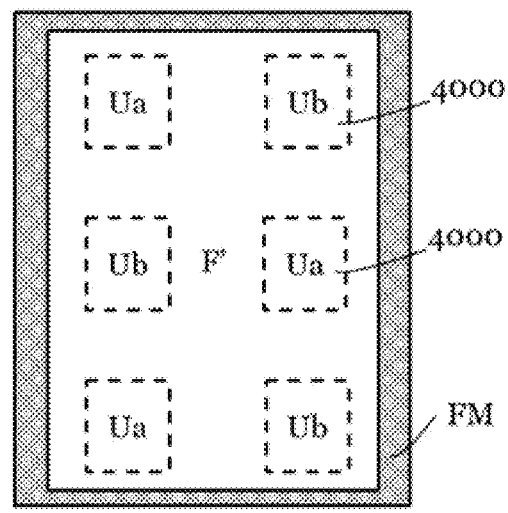

FIG. 69E-1 schematically illustrates a top view of a light emitting device according to an embodiment.

FIG. 69E-2 schematically illustrates a cross-section view along line W-W of a light emitting diode device according to the embodiment of FIG. 60E-1.

FIG. 69E-3 schematically illustrates an enlarged top view of a window region of a light emitting device according to the embodiment of FIG. 60E-1.

Figure 69F:
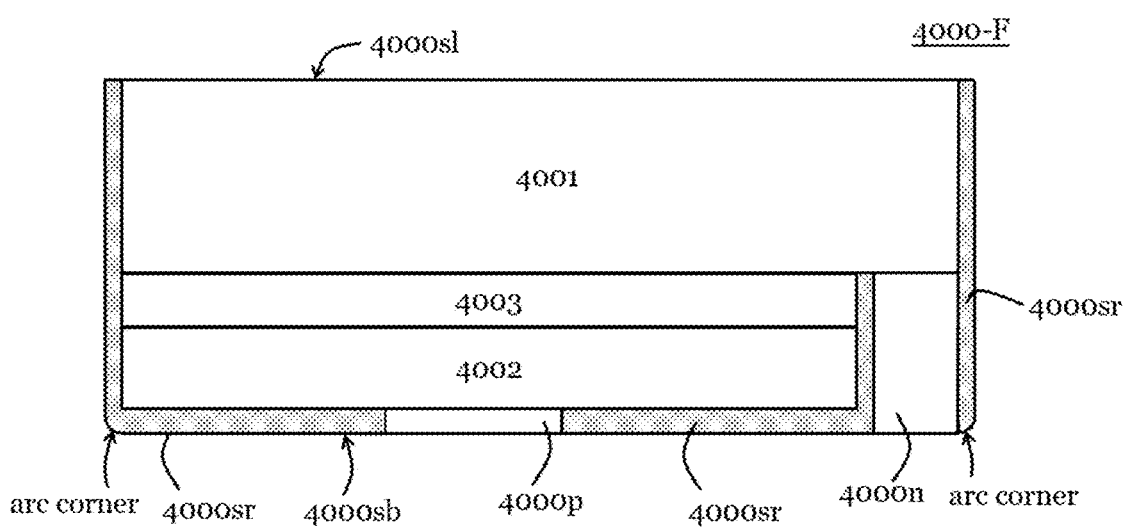

FIG. 69F schematically illustrates cross-section view of a light emitting diode structure 4000-F.

Figure 69G:
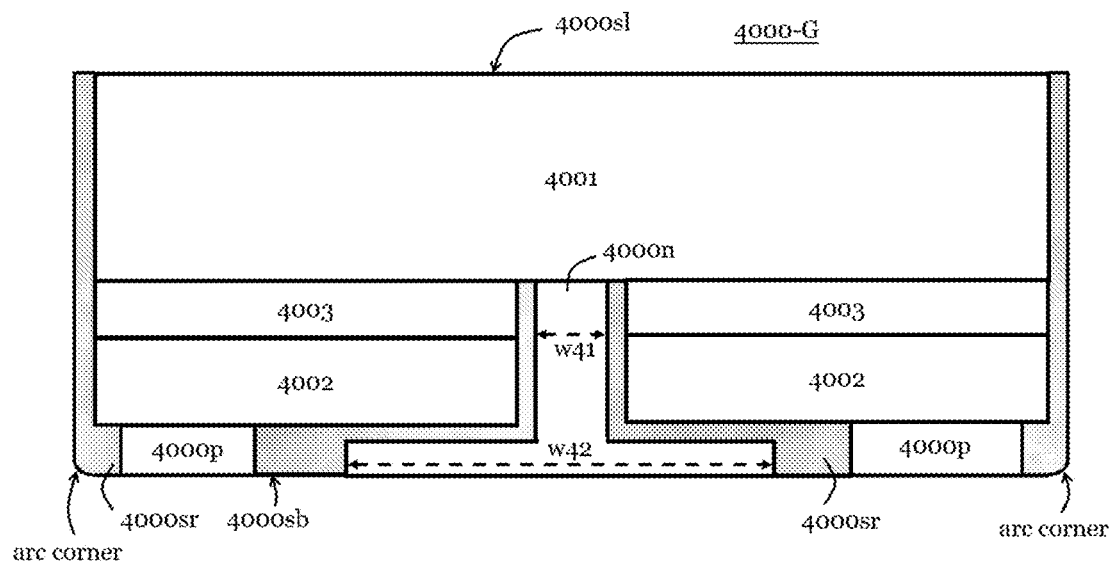

FIG. 69G schematically illustrates cross-section view of a light emitting diode structure 4000-G.

Figure 69H:
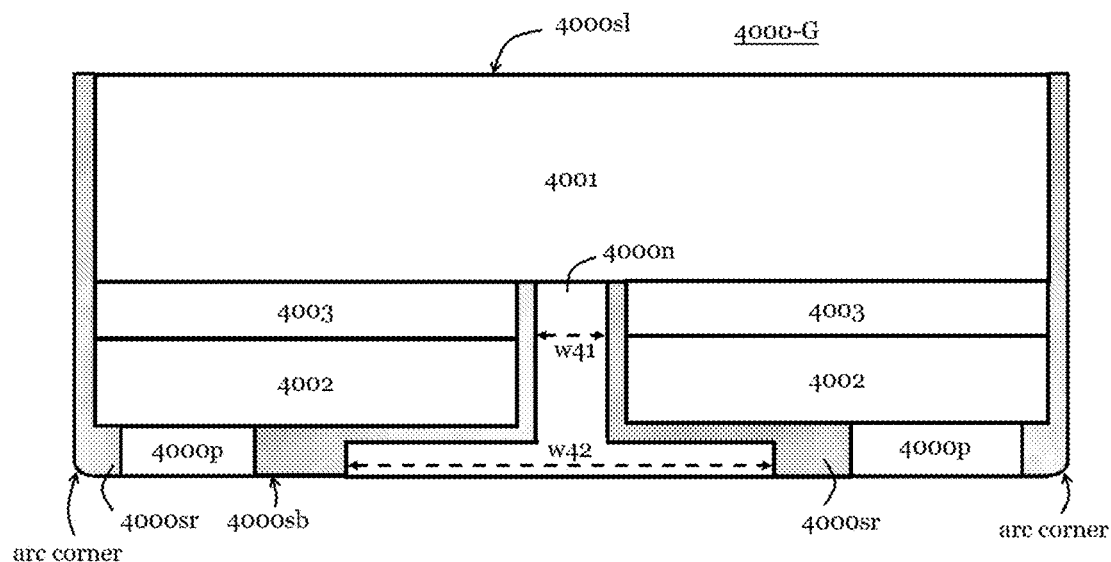

FIG. 69H schematically illustrates a cross-section view of a light emitting diode structure 4000H.

Figure 69I:
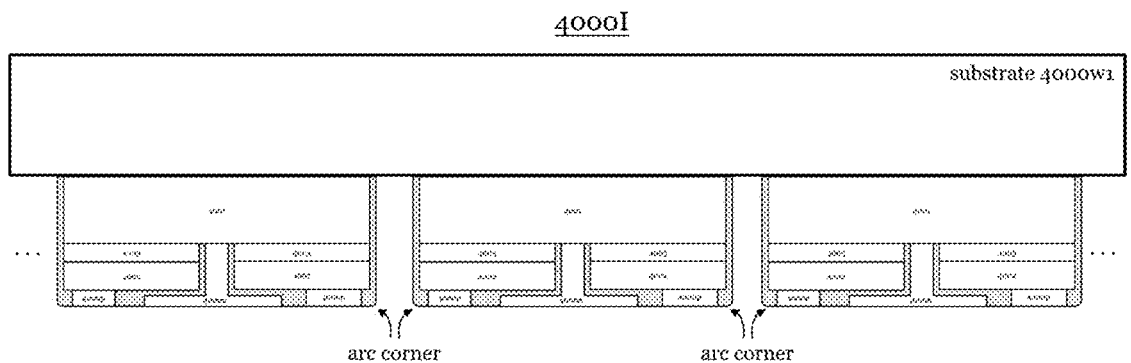

FIG. 69I schematically illustrates a cross-section view of a light emitting diode structure 4000I.

Figure 69J:
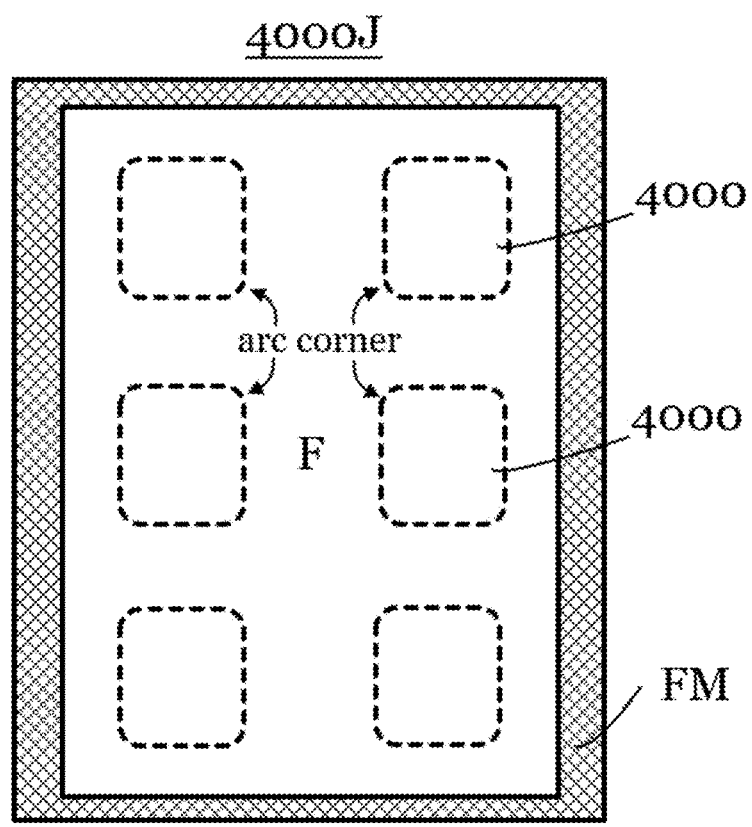

FIG. 69J schematically illustrates a top view of a light emitting device 4000J.

Figure 69K:
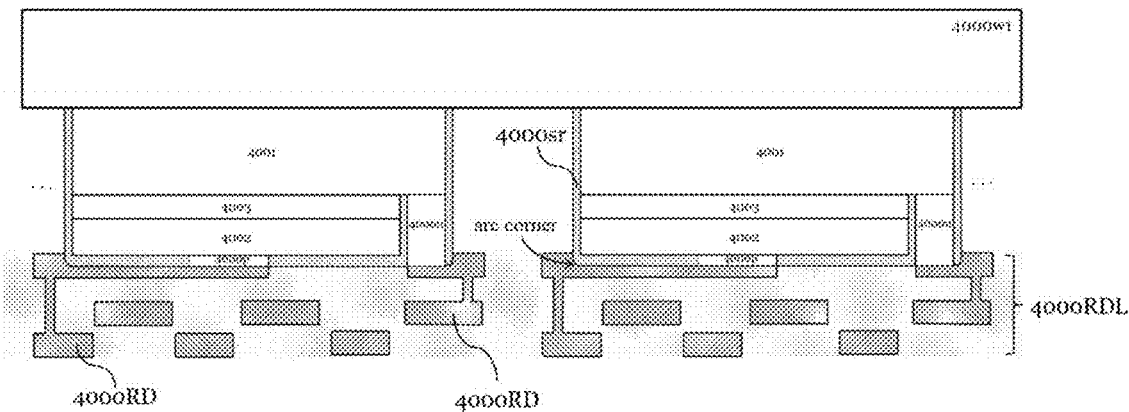

FIG. 69K schematically illustrates a cross-section view of a light emitting diode structure according to an embodiment.

Figure 70A:
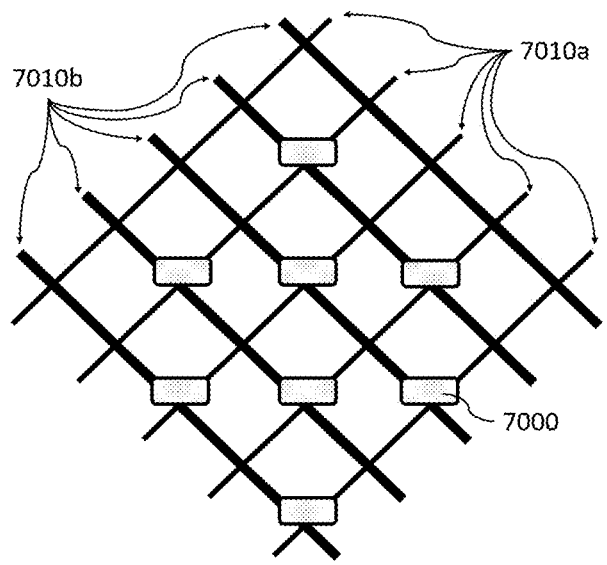
Figure 70B:
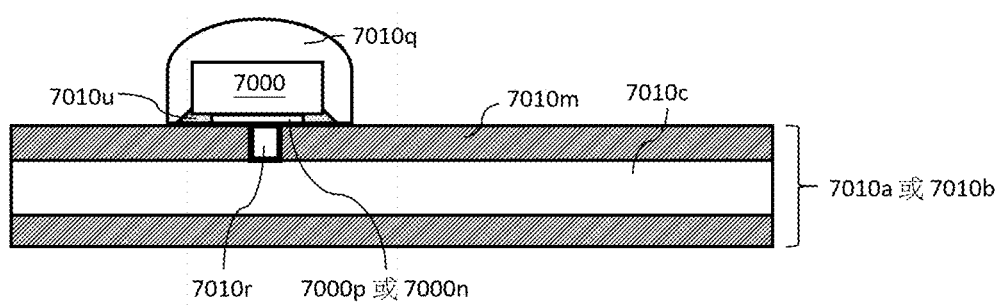

FIGS. 70A to 70B are schematic diagrams of an embodiment in which a micro light emitting diode array is disposed on a fabric substrate.

Wherein, the numerals and symbols used in the drawings are listed as following.

100: growth substrate
101: first type semiconductor layer
102: second type semiconductor layer
103: light emitting layer
104: groove
105: etching groove 101-down: bottom surface of the first type semiconductor layer; second bottom surface
102-up: upper surface of the second type semiconductor layer; second upper surface
201: first current limiting area, sidewall current limiting area
202: second current limiting area
203: third current limiting area
204: fourth current limiting area
205: fifth current limiting area
201-up: upper surface of the sidewall current limiting area, first upper surface
201-down: bottom surface of sidewall current limiting area, first bottom surface
201-out: outer sidewall surface of sidewall current limiting area, first outer surface
201-in: inner sidewall surface of sidewall current limiting area, first inner surface
202-up: upper surface of the second current limiting area
203-up: upper surface of the third current limiting area
301: transparent electrode
302: electrode
303: electrode extension part
304: electrode, back electrode
305: metal layer
306: metal layer, magnetic bonding layer, vacuum adsorption layer, electrostatic adsorption layer, adhesion layer
307: metal layer, magnetic bonding layer, vacuum adsorption layer, electrostatic adsorption layer, adhesion layer
308: metal layer, magnetic bonding layer, vacuum adsorption layer, electrostatic adsorption layer, adhesion layer
309: metal layer
Arc: arc angle
D1: first depth
D2: second depth
D3: third depth
D4: fourth depth
D5: fifth depth
D6: sixth depth
D7: seventh depth
DS: sidewall length
E1: epitaxial thickness
F: light-transmissive adhesive
F1: first phosphor with adhesive
F2: second phosphor with adhesive
F3: third phosphor with adhesive
H1: first thickness
H2: second thickness
H3: third thickness
H4: fourth thickness
iL-1: first low conductivity region
iL-2: second low conductivity region
IH: high conductivity region
iL-up: upper surface low conductivity region
iH-up: upper surface high conductivity region
IL-out: sidewall low conductivity region, outer surface low conductivity region
iH-out: sidewall high conductivity region, outer surface high conductivity region
O1: width of first aperture
O2: width of second aperture
O3: third width
O4: fourth width
O5: fifth width
P1: first pitch
P2: second pitch
P3: third pitch
RS-102-top, RS-201-top, RS-501-top: roughness of upper surface
RS-102-out, RS-201-out, RS-501-out: roughness of outer surface and sidewall
S1: first length
S2: second length
S3: third length
S4: fourth length
T1: first width
T2: width
T3: third width
T4: fourth width
T-up: width of upper surface
T-down: width of bottom surface
T1A: first lateral width
T1B: second lateral width
T1C: third lateral width
U1: first surface
U2: second surface
U3: third surface
U4: fourth surface
U5: fifth surface
U6: sixth surface
400: photoelectric sensor
501: first current blocking area
502: second current blocking area
503: third current blocking area
504: fourth current blocking area
505: fifth current blocking area
506: sixth current blocking area
507: aperture
601: shielding
602: shielding
603: shielding
700: sacrificing layer
800: inspection substrate, test substrate
801: transfer substrate
805: insulating layer
810: collection substrate
820: permanent substrate
821: vacancy
830: receiving substrate
840: inspection substrate, test substrate
841: voltage source
831: first recess
832: second recess
833: third recess
850: wall structure
901: ion implantation
902: laser
903: laser
1001: first container
2001-L: first liquid
$\Theta 1$: first included angle
$\Theta 2$: second included angle
1010: flexible substrate
1011: micro light emitting diode
1012: gate driver
1013: source driver
1014: scan line
1015: data line
1100: bump
1101: ridge area
1102: N-pad
1103: P-pad
1104: P-contact layer
1105: multiple quantum well 1106: N-contact layer
1107: buffer layer
1108: ion implantation area
1109: redundancy micro light emitting diode
1110: first epitaxial substrate (S1)
1111: first epitaxial layer structure (Epi layer-1)
1112: first micro light emitting diode (M1)
111P1: pitch (P1)
111P2: pitch (P2)
1114: first ion implantation area (Ion-1)
1115: first sub-pixel area (R1)
1116: conductive layer (ML)
1117: first transparent substrate (T1)
1118: bonding pad (BL)
1119: conductive layer (ML)
111BR1: first light-transmissive intermediate layer (BR1)
1120: second epitaxial substrate (S2)
1121: second epitaxial layer structure (Epi layer-2)
1122: second micro light emitting diode (M2)
112P3: pitch (P3)
112P4: pitch (P4)
1124: second ion implantation area (ion-2)
1124-2a: first region of the second ion implantation area (ion-2a)
1124-2b: second region of the second ion implantation area (ion-2b)
1125: second sub-pixel area (G1)
1126: conductive layer (ML)
1127: second transparent substrate (T2)
1128: bonding pad (BL)
1129: conductive layer (ML)
1130: third epitaxial substrate (S3)
1131: third epitaxial layer structure (Epi layer-3)
1132: third micro light emitting diode (M3)
113P5: pitch (P5)
113P6: pitch (P6)
1134: third ion implantation area (Ion-3)
1135: third sub-pixel area (B1)
1136: conductive layer (ML)
1137: third transparent substrate (T3)
1138: bonding pad (BL)
1139: conductive layer (ML)
113BR3: third light-transmissive intermediate layer (BR3)
141, 1161, 1171, 1181, 1191, 1201, 1211, 1221, 1231, 1241, 1251: first sub-pixel structure (Pixel 1)
1142, 1162, 1172, 1182, 1192, 1202, 1212, 1222, 1232, 1242, 1252: second sub-pixel structure (Pixel 2)
1143, 1163, 1173, 1183, 1193, 1203, 1213, 1223, 1233, 1243, 1253: third sub-pixel structure (Pixel 3)
1151: first light-transmissive adhesion layer (T1)
1152: second light-transmissive adhesion layer (T2)
1153: thickness (D-1)
1161: first sub-pixel (R1-1, R1-1A, R1-2A, R1-3, R1-4, R1-5, R1-6)
1162: second sub-pixel (G1-1, G1-1A, G1-2A, G1-3A, G1-4A, G1-5A, G1-6A)
1163: third sub-pixel (B1-1, B1-1A, B1-2A, B1-3A, B1-4A, B1-5A, B1-6A)
1171: first redundancy sub-pixel (R1-2, R1-3, R1-4, R1-5, R1-6)
1172: second redundancy sub-pixel (G1-2, G1-3, G1-4, G1-5, G1-6)
1173: third redundancy sub-pixel (B1-2, B1-3, B1-4, B1-5, B1-6)
1300: black matrix layer
1301: magnetic layer (ML)
1302: current blocking area
1303: current limiting area
1400: integrated control system
1401: micro-LED display
1402: lens system
1403: optical component
1404: eye
1405: augmented reality (AR)
1500: integrated control system
1501: RGB micro-LED display
1502: lens system
1503: optical component
1504: eye
1505: augmented reality (AR)
1600: integrated control system
1601: micro-LED display
1602: lens system
1603: optical component
1604: eye
1605: augmented reality (AR)
1700: integrated control system
1701: RGB micro-LED display
1702: lens system
1703: optical component
1704: eye
1705: augmented reality (AR)
1800: integrated control system
1801: multi-function sensor
1802: microchip processors
1803: network interface
1900: integrated control system
1901: display
1902: frame
1903: optical component
1904: eye
1905: augmented reality (AR)
1906: rims
1907: bridge
2000, 2010, 2020, 2030: integrated control system
2001, 2011, 2021, 2031: micro-LED display
2002, 2012, 2022, 2032: frame
2003, 2013, 2023, 2033: optical component
2004, 2014, 2024, 2034: eye
2005, 2015, 2025, 2035: augmented reality (AR)
2006, 2016, 2026, 2036: rims
2007, 2017, 2027, 2037: bridge
3000: epitaxial substrate
3001: magnetic layer (ML)
3002: first type semiconductor layer
3003: light emitting layer
3004: second type semiconductor layer
3005, 3006, 3007, 3008, 3009, 3010: metal layer
3011, 3012: transparent conductive layer
3100, 3101, 3102: first current blocking layer
3200, 3201, 3202: first current limiting layer
3300: second current blocking layer
3400: second current limiting layer
3500: controllable transferring head
3501: electromagnetic layer
3502: magnetic micro light emitting diode
3503: substrate
3600: fluid transfer system
3601: main chamber
3602: solution
3603: substrate
3604: recess
3605: magnetic layer 3606: input end
3607: input valve
3608: output end
3609: output valve
3610: flow rate (F)
3611: first sub chamber
3612: second sub chamber
3613: third sub chamber
3614: magnetic micro light emitting diode with the first color
3615: first valve
3616: first input port
3617: magnetic micro light emitting diode with the second color
3618: second valve
3619: second input port
3620: magnetic micro light emitting diode with the third color
3621: third valve
3622: third input port
3623: fluid
3624: first recess with the first shape
3625: second recess with the second shape
3626: third recess with the third shape
3627: first sub-pixel area
3628: second sub-pixel area
3629: third sub-pixel area
3630: pixel area
3634: first recess
3635: second recess
3636: third recess
3637: first sub-pixel area
3638: second sub-pixel area
3639: third sub-pixel area
3640: pixel area
3650: redundancy magnetic layer
3651, 3661, 3671: first redundancy recess
3652, 3662, 3672: second redundancy recess
3653, 3663, 3673: third redundancy recess
3654, 3664, 3674: first recess
3655, 3665, 3675: second recess
3656, 3666, 3676: third recess
3657, 3667, 3677: first sub-pixel area
3658, 3668, 3678: second sub-pixel area
3659, 3669, 3679: third sub-pixel area
3660, 3670, 3680: pixel area
3700: fluid transfer system
3701: main chamber
3702: solution
3703: substrate
3704-1: first recess
3704-2: second recess
3704-3: third recess
3705: attraction layer
3706: input end
3707: input valve
3708: output end
3709: output valve
3710: flow rate (F)
3711: first sub chamber
3712: second sub chamber
3713: third sub chamber
3714: micro light emitting diode with the first color
3715: first valve
3716: first input port
3717: micro light emitting diode with the second color
3718: second valve
3719: second input port
3720: micro light emitting diode with the third color
3721: third valve
3722: third input port
3723: fluid
3724: first valve of substrate
3725: second valve of substrate
3726: third valve of substrate
3800: fluid transfer system
3801: main chamber
3802: solution
3803: substrate
3804-1: first recess
3804-2: second recess
3804-3: third recess
3805-1: first attraction layer
3805-2: second attraction layer
3805-3: third attraction layer
3806: input end
3807: input valve
3808: output end
3809: output valve
3810: flow rate (F)
3811: first sub chamber
3812: second sub chamber
3813: third sub chamber
3814: micro light emitting diode with the first color
3815: first valve
3816: first input port
3817: micro light emitting diode with the second color
3818: second valve
3819: second input port
3820: micro light emitting diode with the third color
3821: third valve
3822: third input port
3823: fluid
3900: fluid transfer system
3901: main chamber
3902: solution
3903: substrate
3904-1: first filling layer
3904-2: second filling layer
3904-3: third filling layer
3905-1: first attraction layer
3905-2: second attraction layer
3905-3: third attraction layer
3906: input end
3907: input valve
3908: output end
3909: output valve
3910: flow rate (F)
3911: first sub chamber
3912: second sub chamber
3913: third sub chamber
3914: micro light emitting diode with the first color
3915: first valve
3916: first input port
3917: micro light emitting diode with the second color
3918: second valve
3919: second input port
3920: micro light emitting diode with the third color
3921: third valve
3922: third input port
3923: fluid
3924: first valve of substrate
3925: second valve of substrate
3926: third valve of substrate
3927: light source

DETAILED DESCRIPTION OF DISCLOSED EMBODIMENTS

The exemplary embodiments of the invention will be described in the following by taking in conjunction with drawings, wherein various details included in the embodiments for better understanding are merely exemplary. Terms such as "in one embodiment" in this specification are not limited to specific or identical embodiments, a person having ordinary skills in the art should realize that various modifications, combinations or changes can be made to the embodiments described herein without departing from the scope and spirit of the invention. Also, for clarity and conciseness, descriptions of well-known functions and structures are omitted in the following description.

The terms (such as 'first', 'second', 'third' . . . ) used in the specification are provided to mark and/or describe the features of each corresponding embodiment, and those terms (such as 'first', 'second', 'third' . . . ) do not necessarily have any meanings regarding order, hierarchy or sequence (for example, special sequence, time sequence, step sequence, etc.).

FIG. 1 schematically shows a block diagram of a display device according to an exemplary embodiment. In the embodiment of FIG. 1, the display device at least comprises a display panel, a display controller, a data-lines driver and a scan-lines driver. The display device can be display adapted to plural kinds of electronic apparatus (such as TV, Digital Signage, Smart Phone, Tablet, PC, Smart wearable device, Head-mount display, etc.), but the invention is not limited thereto.

In the embodiment of FIG. 1, the display panel includes plural pixel units (Pixel Units, PUs) which are constituted of plural micro light emitting units (Micro-LEUs). In a mono-display or a single-color display, a pixel unit PU can be constituted of one or more Micro-LEUs. Typically, a chip width or a die width of a Micro-LEU can be less than 100 micrometers (μm), sometimes less than 50 μm or 30 μm, or more specifically as small as to 5 μm, 3 μm, or 2 μm, but the invention is not limited thereto. In the application of color displays, each pixel unit PU may include sub-pixel units (sPU) of three primary colors that each pixel unit PU includes at least one red (R) light emitting unit, at least one green (G) light emitting unit and at least one blue (B) light emitting unit, for example, as the two embodiments of the schematic diagrams of the sub-pixel distribution in a pixel unit shown in FIG. 2.

In an embodiment, the pixel unit PU can be constituted of non-primary color lights, but the invention is not limited thereto. In an embodiment, a display pixel being constituted of light-emitting units of multiple-color lights may, for example, directly be realized by micro-light-emitting chips/dies of multiple-color lights. In one embodiment, a light-emitting diode chip/die as an excitation light source can be used with wavelength conversion materials to form a multi-color light emitting unit, for example, the light-emitting chip as an excitation light source can be a blue light-emitting diode chip or an ultraviolet light and the wavelength conversion material can be, for example, phosphors.

The phosphors may include cerium-activated yttrium aluminum garnet-based phosphors (Y3Al5O12:Ce, YAG), cerium-activated lutetium aluminum garnet-based phosphors (LAG:Ce), europium-activated and/or chromium-activated nitrogen-containing calcium aluminosilicate-based phosphors (for example, CaO-Al2O3-SiO2:Eu), europium-activated silicate-based phosphors (for example, (Sr,Ba)2SiO4:Eu), nitride-based phosphors, such as β-SiAlON phosphors, CASN-based phosphors (CaAlSiN3:Eu), SCASN-based phosphors (Sr,Ca)AlSiN3:Eu), KSF-based phosphors (for example, K2SiF6:Mn), sulfide-base phosphors, and/or quantum dot phosphors, but the invention is not limited thereto. In an embodiment, through combining these phosphors with a blue or ultraviolet light emitting element, various colors of light (e.g., a white light emitting device) can be produced by the light emitting device.

The phosphors, for example, may include a blue phosphor, a green phosphor, a yellow phosphor, a red phosphor, or quantum dots (QDs). For example, blue phosphors may include BAM-based, halo-phosphate-based, or aluminate-based phosphors, and may include, for example, BaMgAl10O17:Mn2+, BaMgAl12O19:Mn2+ or (Sr,Ca,Ba)PO4Cl:Eu2+.

Green or yellow phosphors may include LuAG(Lu3(Al,Gd)5O12:Ce3+), YAG(Y3(Al,Gd)5O12:Ce3+), Ga-LuAG (Lu,Ga)3(Al,Gd)5O12:Ce3+), Ga-YAG((Ga,Y)3(Al,Gd)5O12:Ce3+), LuYAG(Lu,Y)3(Al,Gd)5O12:Ce3+), ((Sr,Ba,Ca,Mg)2SiO4:Eu2+), ((Ba,Sr,Ca)Si2O2N2:Eu2+) or thio-gallate (SrGa2S4:Eu2+).

Red phosphors may include nitride, sulfide, fluoride, or oxynitride, and more specifically, CASN(CaAlSiN3:Eu2+), (Ba,Sr,Ca)2Si5N8:Eu2+, (Ca,Sr) S2:Eu2+) or (Sr,Ca)2SiS4:Eu2+.

Quantum dots (QDs) may include Si, Ge, GaN, GaP, GaAs, GaSb, AlN, AlP, AlAs, AlSb, InN, InP, InAs, InSb, SnS, SnSe, SnTe, PbS, PbSe, PbTe, CdO, CdS, CdSe, CdTe, ZnO, ZnS, ZnSe, ZnTe, HgS, HgSe, HgTe, MgSe, MgS, SiC, SiGe, GaNP, GaNAs, GaNSb, GaPAs, GaPSb, AlNP, AlNAs, AlNSb, AlPAs, AlPSb, InNP, InNAs, InNSb, InPAs, InPSb, SnSeS, SnSeTe, SnSTe, PbSeS, PbSeTe, PbSTe, SnPbS, SnPbSe, SnPbTe, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, CdZnSeS, CdZnSeTe, CdZnSTe, CdHgSeS, CdHgSeTe, CdHgSTe, HgZnSeS, HgZnSeTe, HgZnSTe, SnPbSSe, SnPbSeTe, SnPbSTe, Graphene quantum dots (GQDs) and/or mixtures thereof. For example, a spectrum distribution of a light transferred from the quantum dots may having a full width at half maximum (FWHM) from 10 nm to 60 nm in a wavelength band of green light. For example, a spectrum distribution of a light transferred from the quantum dots may having a full width at half maximum (FWHM) from 30 nm to 80 nm in a wavelength band of red light. For example, a spectrum distribution of a light transferred from the quantum dots may having a full width at half maximum (FWHM) lower than 60 nm for wide color gamut application.

As the embodiment shown in FIG. 1, the display panel may further include a circuit substrate, and the circuit substrate has a plurality of electrical signal lines and power supply lines. The electrical signal lines, for example, include a plurality of data lines D1 to Dm and a plurality of scan lines S1 to Sn, wherein the data lines and the scan lines are respectively electrically connected to corresponding pixel units or sub-pixel units. The power supply lines, for example, include voltage source wirings electrically connected to the corresponding pixel units or sub-pixel units for providing power VDD and VSS to the corresponding pixel units or sub-pixel units.

As the embodiment shown in FIG. 1, the data lines D1 to Dm of the display panel can be extended alone a first direction L1 and side-by-side distributed alone a second direction L2. In an embodiment, the circuit substrate including a plurality of data lines D1 to Dm and a plurality of scan lines S1 to Sn can be a multilayer circuit substrate, wherein wirings of the data lines D1 to Dm can be distributed in a first layer of the multilayer circuit substrate, wirings of the scan lines S1 to Sn can be distributed in a second layer of the multilayer circuit substrate. The first layer and the second layer can be different layers so as to reduce the complexity for laying out all the wirings of the data lines D1 to Dm and the scan lines S1 to Sn in a single circuit layer. Preferably, wirings of the data line wiring in the first layer can be orthogonal to wirings of the scan line in the second layer, so as to reduce the overlap area of the data line wirings and the scan line wirings for reducing the parasitic capacitance between wirings of different layers.

In an embodiment, a pixel unit PU shown in FIG. 2 can be, for example, a packaged light-emitting element and the packaged light-emitting element may include at least one micro light-emitting chip, a carrier substrate, a transmissive layer covering the chip and a packaged body. In this embodiment, packaged light-emitting elements are individually fixed on a circuit substrate to form a display panel (Panel) as shown in FIG. 1, therefore the number of packaged light-emitting elements, the pitch between every two packaged light-emitting elements on the circuit substrate, etc. can be selectively adjusted according to the specification requirements of the display panel (for example, panel size, resolution requirements, etc.), and the subsequent display panel assembly process can be simplified. Furthermore, before display panel assembly process, each packaged light-emitting element can be tested and verified for improving the yield rate of the display panel (Panel) assembly.

For small-size display applications or near-eye display applications, such as smart phones, smart watches, vehicle displays, wearable displays, interactive displays, etc., at a viewing distance of about 25 cm generally, the pitch between adjacent pixel units PU needs to be reduced to less than about 70 microns for maintaining good display quality, referring to descriptions of FIG. 68, in the case of such a small pitch, the way of firstly packaging each light-emitting element and then assembling the packaged light-emitting elements as a single pixel unit PU module for assembling the display panel will become more difficult. In another embodiment, multiple micro light-emitting chips can be directly formed (or fixed) on the substrate in the form of an array, and then electrical wirings, light transmissive layers, insulating protective layers, sealing layers, molding layers and other follow-up processes can be performed to form the display panel as shown in FIG. 1.

FIG. 3 is a schematic diagram of a control circuit of a pixel unit PU according to an embodiment of the invention. The pixel unit PU may include at least one light-emitting unit EU and a driving circuit unit DU electrically connected to the light-emitting unit EU. The driving circuit unit DU may include a plurality of transistors Tr1, Tr2 and a capacitor unit CU. As the embodiment shown in FIG. 1, the display panel includes m×n pixels, referring to the embodiment of FIG. 3, a first power source VDDx and a second power source VSSx can supply the operating voltages required by the light emitting unit EUs in the pixel unit PU, where x, y, n, m are integers, x is less than or equal to m, and y is less than or equal to n.

Referring to the embodiments of FIG. 1 and FIG. 3, the display controller DCT receives the image data to be displayed, and then converts the image data into data signal of each pixel and control signal of each pixel for displaying the image data on the corresponding display panel. Moreover, the display controller DCT can receive the control signal CS provided from the outside. The control signal CS can include a vertical synchronization signal, a horizontal synchronization signal, a clock signal, and a data enable signal and so on.

Referring to the embodiments of FIG. 1 and FIG. 3, the display controller DCT provides a first control signal CT1 to a data-lines driver DLD and provides a second control signal CT2 to a scan-lines driver SLD. The first control signal CT1 can be used to control the data-lines driver DLD, and the second control signal CT2 can be used to control the scan-lines driver SLD. The data-lines driver DLD and the scan-lines driver SLD can be implemented as a single integrated circuit chip or multiple integrated circuit chips.

Referring to the embodiments of FIG. 1 and FIG. 3, the data-lines driver DLD receives the first control signal CT1 from the display controller DCT and provides electrical signals to the corresponding data lines dl to dm. The scan-lines driver SLD receives the second control signal CT2 from the display controller DCT and provides electrical signals to the corresponding scan lines s1 to sn.

Referring to the embodiments of FIG. 1 and FIG. 3, the scan-lines driver SLD can be integrated into the display panel, for example, the scan-lines driver SLD can be a plurality of transistors formed through a low temperature polysilicon (LTPS) manufacturing process or a low temperature polyoxide (LTPO) manufacturing process.

Referring to the embodiments of FIG. 1 and FIG. 3, when the gate-on voltage is applied to one of the scan lines S1 to Sn, the switching transistor Tr1 of each pixel unit PU arranged in a row and connected to the scan line Sy can be turned on. At this time, the data driving signals provided by the data-lines driver DLD to the data lines d1 to dm are applied to each corresponding pixel unit PU through the turned-on switching transistor Tr1.

FIG. 4 is an exemplary block diagram of a display according to an embodiment of the invention. The display 100 includes a display panel 200, a panel driving unit 220, and a control unit 250.

Referring to the embodiment of FIG. 4, the panel driving unit 220 can drive the display panel 200, and the control unit 250 can control the panel driving unit 220. The panel driving unit 220, controlled by the control unit 250, can be configured to independently enable or disable each sub-pixel of the plural RGB sub-pixels (red lighting sub-pixel, green lighting sub-pixel and blue lighting sub-pixel). For example, the panel driving unit 220 can provide a clock signal with a driving frequency to each sub-pixel of the plural RGB sub-pixels, so that each sub-pixel of the plural RGB sub-pixels can be enabled or disabled. The control unit 250 can control the driving unit 220 so that the plural RGB sub-pixels can correspondingly display an input image on the display panel 200 according to the input image signal.

Referring to the embodiment of FIG. 4, the panel driving unit 220 and/or the control unit 250 can include memory and processor. The memory can be non-volatile memory, such as flash memory, phase-change random-access memory (PRAM), magnetoresistive random-access memory (MRAM), resistive random-access memory (ReRAM) or ferroelectric random-access memory (FRAM), or volatile memory, such as static random-access memory (SRAM), dynamic random-access memory (DRAM), or synchronous DRAM (SDRAM). The processor can be a central processing unit (CPU), a graphics processing unit (GPU), a controller or an application-specific integrated circuit (ASIC), etc., which can access instructions or data stored in the memory to execute operational functions of the panel driving unit 220 or the control unit 250.

Figure 5A:
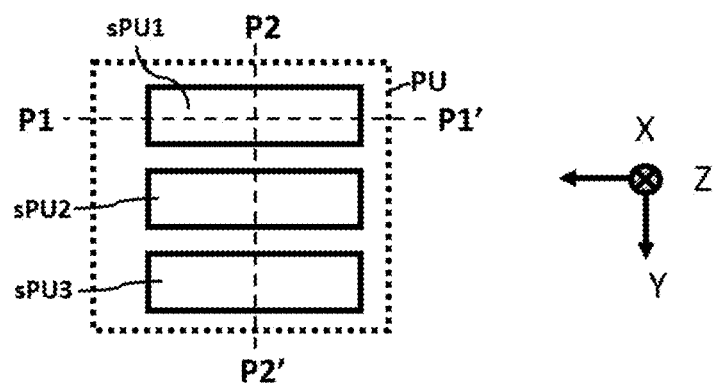
FIGS. 5A to 5C are schematic diagrams of a pixel unit PU in a display device according to an embodiment.
Figure 5B:
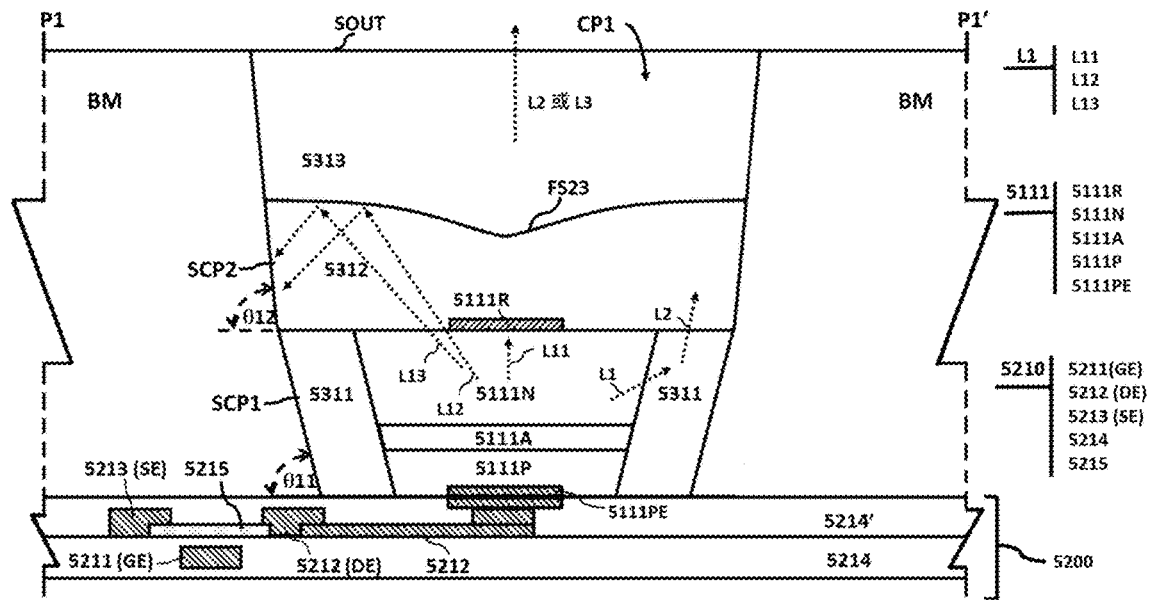
Figure 5B:
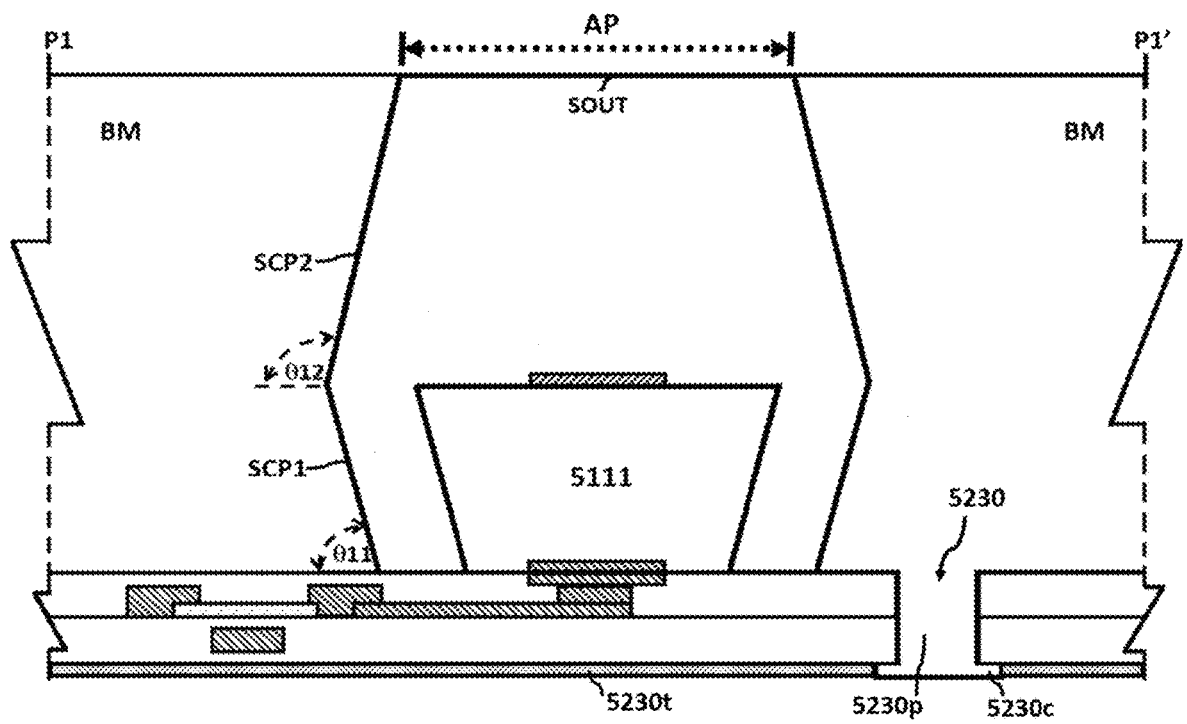
Figure 5C:
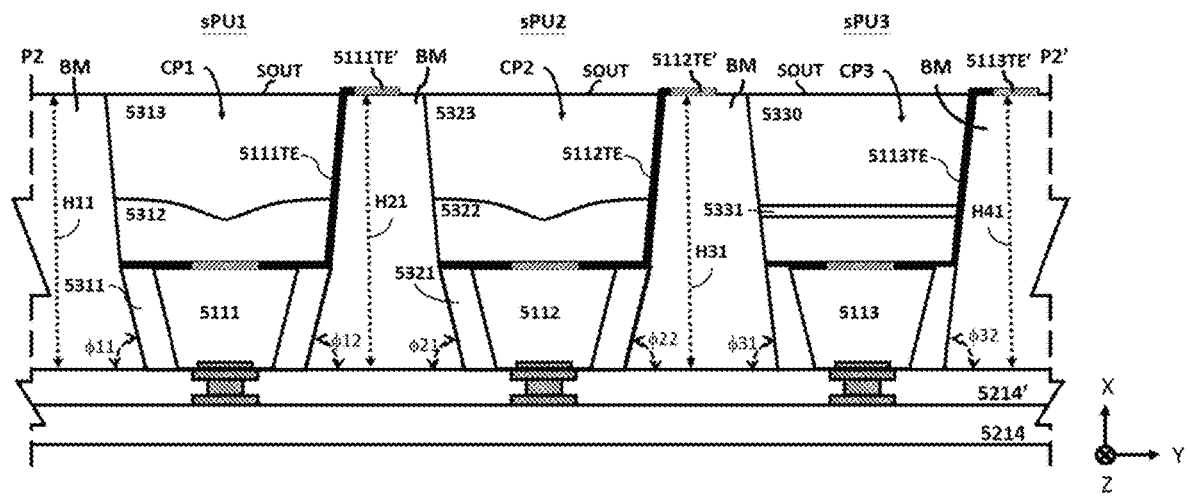

FIGS. 5A to 5C are schematic diagrams of a pixel unit PU in a display device according to an embodiment of the invention. Referring to the embodiment of FIGS. 5A to 5C, the light-emitting element 5111, the light-emitting element 5112, and the light-emitting element 5113 can be, for example, vertical-electrode light-emitting diode chips, but the invention is not limited thereto.

FIG. 5A is a schematic top view of a pixel unit PU according to an embodiment of the invention, the pixel unit PU can be composed of, for example, a red light emitting (R) sub-pixel unit sPU1, a green light emitting (G) sub-pixel unit sPU2, and a blue light emitting (B) sub-pixel unit sPU3, but the invention is not limited thereto. Among them, the red light emitting (R) sub-pixel unit sPU1, the green light emitting (G) sub-pixel unit sPU2, and the blue light emitting (B) sub-pixel unit sPU3 can be surrounded by a sealing frame BM (for example, black matrix layer), and the sealing frame BM can be a structural layer surrounding the pixel units in the display panel, the sealing frame BM may absorb light or not transmit light, but the invention is not limited thereto. In an embodiment, the sealing frame BM may further include thermal conductive particles, such as metal particles or ceramic particles.

FIG. 5B is a schematic cross-sectional view of the pixel unit PU in FIG. 5A along a line P1 to P1', the red light emitting (R) sub-pixel unit sPU1 includes the light emitting element 5111 located on a driving circuit substrate 5200 and electrically connected to the driving circuit substrate 5200. The light emitting element 5111 is located in a recess CP1 surrounded by the sealing frame BM. The light transmissive layer 5310 is located in the area between the light emitting element 5111, the sealing frame BM and the driving circuit substrate 5200, that is, the light transmissive layer 5310 can be located in areas which are illuminated by light directly or indirectly emitted from the light emitting element 5111. The driving circuit substrate 5200, the sealing frame BM and/or the light transmissive layer 5310 can be a single-layered or multi-layered structure. The material of the light transmissive layer 5310 may include at least one of epoxy resin, silicone resin, polystyrene resin, and acrylate resin, but the invention is not limited thereto.

In the embodiment, the sealing frame BM is a structural layer that laterally extends to enclose all the pixel units of the display panel, but the invention is not limited thereto. In an embodiment, as aforementioned, the sealing frame BM can be a package body integrated with one or more light emitting elements (for example, light-emitting diodes) to form a packaged component reed as a sub-pixel unit or a pixel unit, but the invention is not limited thereto.

In the embodiment, along a direction parallel to the line P1 to P1', the green light emitting (G) sub-pixel unit sPU2 and the blue light emitting (B) sub-pixel unit sPU3 may have same or similar cross-sectional structure as the red light emitting (R) sub-pixel unit sPU1, but the invention is not limited thereto.

In the embodiment of FIG. 5B, the light emitting element 5111 includes a first type semiconductor layer 5111P, a second type semiconductor layer 5111N, an active layer 5111A located between the first type semiconductor layer 5111P and the second type semiconductor layer 5111N, and electrode layers 5111R and 5111PE, wherein the first type semiconductor layer 5111P is for example a P-type semiconductor layer, the second type semiconductor layer 5111N is for example a N-type semiconductor layer, and the active layer 5111A includes a light emitting layer. The light emitting element can be, for example, a blue light emitting diode chip or an ultraviolet light emitting diode chip (UV LED chip), but the invention is not limited thereto. In an embodiment, the light emitting element can be a red light emitting diode chip.

In the embodiment of FIG. 5B, the driving circuit substrate 5200 may include plural transistor units 5210 for driving lighting units of each pixel unit PU, the driving circuit substrate 5200 includes a first circuit layer 5211, an active layer 5215, a second circuit layer 5212, a third circuit layer 5213 and insulating layers 5214, 5214', wherein the first circuit layer 5211 includes gate electrodes GE of the transistor units 5210, the active layer 5215 includes source regions, channel regions and drain regions of the transistor units 5210, the active layer 5215 includes semiconductor materials, the second circuit layer 5212 includes drain electrodes DE of the transistor units 5210, the third circuit layer 5213 includes source electrode SE of the transistor units 5210, the insulating layer 5214 includes gate insulation films between gate electrodes GE and channel regions CH, the insulating layers 5214, 5214' can be a single layered structure or a multi-layered structure. In the embodiment, gate electrodes GE, source electrodes SE and/or drain electrodes DE of the transistor units 5210 can be located under the sealing frame BM, the light shielding area under the sealing frame BM can be used as the locating area of the circuit layers to effectively use the wiring area/space of the driving circuit substrate 5200, but the invention is not limited thereto. In an embodiment, the insulating layers 5214, 5214' and the sealing frame BM may be made of same material(s), but the invention is not limited thereto.

In the embodiment of FIG. 5B, the light transmissive layer 5310 includes, for example, at least a first light transmissive layer 5311, a second light transmissive layer 5312, and a third light transmissive layer 5313; wherein, the first light transmissive layer 5311 is located between the light-emitting element 5111 and the side-surfaces of the cavity CP1 surrounded by the frame layer BM, the first light transmissive layer 5311 may include a wavelength conversion material, but the invention is not limited thereto, the wavelength conversion material is radiated by the light-emitting element 5111 with a first light L1 with peak wavelength λ1 and emits a second light L2 with second peak wavelength A2, wherein the first peak wavelength λ1 is not equal to the second peak wavelength A2. In the embodiment of FIG. 5B, the second light transmissive layer 5312 is located above the light-emitting element 5111 and inside the cavity CP1 surrounded by the sidewall surfaces of the framing layer BM, and the third light transmissive layer 5313 is located above the second light transmissive layer 5312 and inside the cavity CP1 surrounded by the sidewall surface of the framing layer BM. In an embodiment, the second light transmissive layer 5312 and the first light transmissive layer 5311 may have the same material or different materials. In an embodiment, the second light transmissive layer 5312 may include a wavelength conversion material, but the invention is not limited thereto. The wavelength conversion material is radiated by the light-emitting element 5111 with the first light L1 with peak wavelength λ1 and emits a third light L3 with a third peak wavelength λ3, wherein the first peak wavelength λ1 is not equal to the third peak wavelength λ3. In one embodiment, the second light transmissive layer 5312 may have a multilayer structure, which includes multiple optical filter films, the multilayer structure can be a high transmittance filter for the second light L2 of wavelength λ2 and/or the third light L3 of wavelength λ3 and can be a high reflectance filter for the first light L1 of the wavelength λ1, but the invention is not limited thereto. In an embodiment, for the first light L1 of the wavelength λ1, the refractive index N20 of the second light transmissive layer 5312 adjacent to the third transparent layer 5313 can be greater than the refractive index N30 of the third light transmissive layer 5313, so that the first light L1 of the wavelength λ1 can be totally reflected at the interface between the second light transmissive layer 5312 and the third light transmissive layer 5313, so as to reflect the first light L1 of the wavelength λ1 downward to the cavity CP1.

In an embodiment, the interface FS23 between the adjacent second light transmissive layer 5312 and third light transmissive layer 5313 may not be flat. For example, in the embodiment of FIG. 5B, the interface FS23 is a curved surface protruding toward the light emitting element 5111, but the invention is not limited thereto. In other embodiments, the interface FS23 can be a flat surface, a curved surface, a stepped surface, a sawtooth surface, or a surface having a concave-convex structure, etc., and it can be an interface with microstructures, and the microstructures can be distributed regularly, periodically, or non-periodically. The structure of the interface FS23 can be formed to have functions for improving luminous efficiency, controlling the light propagating direction, controlling the light radiating range, or controlling the light intensity distribution.

In an embodiment, the interface FS23 between the adjacent second light transmissive layer 5312 and third light transmissive layer 5313 may have a plurality of convex or concave microstructures and the microstructures can be distributed regularly along the interface FS23 for controlling the light propagating direction or the light radiating range of the second light L2 of the wavelength λ2.

In an embodiment, the surface of the third light transmissive layer 5313 (for example, the light-outing surface SOUT) may have a plurality of convex or concave microstructures, and the microstructures can be distributed regularly along the surface of the third light transmissive layer 5313 for limiting or controlling the light-outing range or light propagating direction of the second light L2 of the wavelength λ2 and/or the third light L3 of the wavelength λ3.

In an embodiment, the convex or concave microstructures arranged on the interface FS23 or the light-outing surface SOUT can be more densely distributed in the area directly above the light emitting element 5111 than the periphery of the area directly above the light emitting element 5111, that is, the distribution density of the microstructures in the area directly above the light-emitting element 5111 is denser, and the farther away from the area directly above the light-emitting element 5111, the looser the distribution density of the microstructures, but the invention is not limited thereto.

In the embodiment of FIG. 5B, view from the light-emitting element 5111 toward the light-emitting surface SOUT, a reflective layer 5111R can be provided directly above the light-emitting element 5111 to reflect the light L1 with the wavelength λ1 emitted upwardly from the light-emitting element 5111. A width of the reflective layer 5111R is smaller than a width of the active layer 5111A of the light-emitting element 5111, in the embodiment of FIG. 5B, the reflective layer 5111R can be metal layer(s), the reflective layer 5111R can be an upper electrode layer of the light-emitting element 5111, but the invention is not limited thereto. In an embodiment, the reflective layer 5111R can be optical reflective film(s). In an embodiment, the reflective layer 5111R may contact the upper surface of the light-emitting element 5111 or can be located directly above the light-emitting element 5111 but not in contact with the light-emitting element 5111, for example, the reflective layer 5111R can be at least one or more structural layers of the second light transmissive layer 5312.

In the embodiment of FIG. 5B, the upwardly emitted light 1_11 of the light emitting element 5111 is reflected downwardly by the reflective layer 5111R, and the refractive index N20 of the second light transmissive layer 5312 can be greater than the refractive index N30 of the third light transmissive layer 5313 so that at least portion of the oblique-upwardly emitted light L12 or L13 of the light-emitting element 5111 will be reflected toward the cavity CP1 due to total reflection at the interface of the second light transmissive layer 5312 and the third light transmissive layer 5313, and so that the lights L1, L11, L12, and L13 of the wavelength λ1 emitted by the light-emitting element 5111 can be fully interact with the wavelength conversion material inside the first light transmissive layer 5311 or inside the second light transmissive layer 5312. In an embodiment, the reflective layer 5111R can be located in the third light transmissive layer 5313 and directly above the light-emitting element 5111, and this makes the light intensity distribution of the upwardly emitted light L2 with a wavelength of λ2 more uniform.

In the embodiment of FIG. 5B, a side-wall surface of the cavity CP1 surrounded by the sealing frame layer BM may have multiple inclination angles θ11, θ12. Please refer to the embodiment of FIG. 5B, a first inclination angle of the first lower side-wall surface SCP1 of the cavity CP1 is θ11 and a second inclination angle of the first upper sidewall surface SCP2 of the cavity CP1 is θ12, wherein θ12 can be greater than θ11, that is, the slope of the first upper sidewall surface SCP2 can be greater than the slope of the first lower side-wall surface SCP1, so that the light emitted from the light emitting element 5111 near the bottom of the cavity CP1 can be reflected by the first lower side-wall surface of the cavity CP1 back to areas between the light emitting element 5111 and the side-wall surface of the cavity CP1 so as to make the light of the light emitting element 5111 fully react with the wavelength conversion material or scattering particles inside the first light transmissive layer 5311, and the first upper sidewall surface SCP2 near the top of the cavity CP1 can limit the light-emitting direction or the light-emitting range of each pixel unit to avoid or reduce light crosstalk between adjacent pixel units.

In one embodiment, the inclination angle of the side-wall surface of the cavity CP1 can be greater than 90°, for example, as shown in the embodiment of FIG. 5B', the inclination angle θ12 of the first upper sidewall surface SCP2 can be greater than 90° so as to reduce the light-outing aperture AP at the surface SOUT and to increase the ratio of the upper area of the frame BM to the surface SOUT, because the frame BM is an opaque structure or a light-absorbing structure, the black surface ratio of the pixel unit PU can be increased.

Furthermore, referring to the embodiment shown in FIG. 5B', the substrate 5200 can include a through-hole 5230, the through-hole 5230 is located under the frame BM. During forming process of the frame BM, the through-hole 5230 of the substrate 5200 can be a communicating hole for mold sealants, on the one hand, the communicating hole can be used for releasing residual gas during molding process. The frame BM can be formed by injecting a fluidic molding compound into the molding mould and then heating or pressurizing or a combination of methods. On the other hand, a molded pillar can be formed in the through-hole

5230, since the molded pillar 5230p and the frame BM are integrally formed, the molded pillar 5230p can be like a rivet to strengthen the connection between the molded fame BM and the substrate 5200. Furthermore, the molded pillar 5230p can have a cap structure 5230c which protruding from the bottom of the substrate and having a projecting rim extending laterally along the bottom of the substrate.

Furthermore, referring to the embodiment shown in FIG. 5B', the pillar 5230p can be a thermal-conductive pillar, for example, the mold material can include thermal-conductive particles, to transfer the heat produced at the top side of the substrate 5200 to the bottom side of the substrate 5200. In addition, a thermal-conductive layer 5230t can be provided at the bottom side of the substrate 5200 and connected to the pillar 5230p, then heat transferred from the pillar 5230p can be diffuse laterally by the thermal-conductive layer 5230t to reducing local hot-spot, the thermal-conductive layer 5230t may be a thermal conductive metal layer, a thermal conductive ceramic layer, a thermal conductive silicone composition layer or thermal graphite layer, but the invention is not limited thereto. Heat produced at the top side of the substrate 5200 may come from the heat produced by the light-emitting elements or any other components on the top of the substrate 5200, or by the circuits/components inside the substrate 5200. In an embodiment, the thermal-conductive layer 5230t can be located at intervals between the plural cap structures 5230c, the thickness of the thermal-conductive layer 5230t can be not greater than the thickness of the cap structure 5230c, so that the total thickness of the panel can be kept thin for meeting the limitations of thin display, flexible display or miniature display applications, but the invention is not limited thereto.

FIG. 5C is a schematic cross-sectional view of a pixel unit PU shown in FIG. 5A along the line P2 to P2'. The pixel unit PU includes a sub-pixel unit sPU1 for emitting red light (R), a sub-pixel unit sPU2 for emitting green light (G), and a sub-pixel unit sPU3 for emitting blue light (B), in which the light-emitting element 5111, the light-emitting element 5112, and the light-emitting element 5113 are, for example, a blue light-emitting diode die/chip or a UV light-emitting diode die/chip, but the invention is not limited thereto. In this embodiment, referring to FIG. 5B, the light-emitting element 5111, the light-emitting element 5112, and the light-emitting element 5113 may respectively include a first-type semiconductor layer, a second-type semiconductor layer, and an active layer between the first-type semiconductor layer and the second-type semiconductor layer. In one embodiment, the light-emitting element 5111 may be a red light-emitting diode die/chip, the light-emitting element 5112 may be a green light-emitting diode die/chip, and the light-emitting element 5113 may be a blue light-emitting diode die/chip.

In the embodiment of FIG. 5C, along direction of the line P2 to P2', the light emitting element 5111, the light emitting element 5112, and the light emitting element 5113 are respectively located in the cavities CP1, CP2, and CP3 surrounded by the frame layer BM, wherein the light emitting element 5111 is covered by the light transmissive layer 5310, the light-emitting element 5112 is covered by the light transmissive layer 5320, and the light-emitting element 5113 is covered by the light transmissive layer 5330. In the embodiment of FIG. 5C, the light transmissive layers 5310, 5320, and 5330 may include wavelength conversion materials and/or light-scattering particles, but the invention is not limited thereto. In an embodiment, the light transmissive layers 5310, 5320, and 5330 may have a single-layer or multi-layer structure. In an embodiment, at least two or all of the light transmissive layers 5310, 5320, and 5330 may have the same material or different materials, but the invention is not limited thereto.

Referring to the embodiment of FIGS. 5B and 5C, the light transmissive layer 5310 of the red (R) sub-pixel unit sPU1 may at least include a first light transmissive layer 5311, a second light transmissive layer 5312, and a third light transmissive layer 5313, wherein the first light transmissive layer 5311 and/or the second light transmissive layer 5312 may include a wavelength conversion material, such as the aforementioned red phosphors or red light quantum dot fluorescent materials, etc., to receive the blue light or ultraviolet light emitted from the light-emitting element 5111 and emit red light. In an embodiment, the second light transmissive layer 5312 and the first light transmissive layer 5311 may have the same material or different materials.

Referring to the embodiment of FIG. 5C, the light transmissive layer 5320 of the green (G) sub-pixel unit sPU2 may at least include a first light transmissive layer 5321, a second light transmissive layer 5322, and a third light transmissive layer 5323, wherein the first light transmissive layer 5321 and/or the second light transmissive layer 5322 may include a wavelength conversion material, such as the aforementioned green phosphors or green light quantum dot fluorescent materials, etc., to receive the blue light or ultraviolet light emitted from the light-emitting element 5112 and emit green light. In an embodiment, the second light transmissive layer 5322 and the first light transmissive layer 5321 may have the same material or different materials.

Referring to the embodiment of FIG. 5C, the light transmissive layer 5330 of the blue (B) sub-pixel unit sPU3 may include scattering particles for scattering lights from the light-emitting element 5113 to achieve more uniform light intensity at the light-outing surface SOUT. Similarly, in an embodiment, the light transmissive layer 5310 and/or the light transmissive layer 5320 may also include light-scattering particles to achieve more uniform light intensity of each sub-pixel unit, but the invention is not limited thereto.

In the embodiment of FIG. 5C, the light transmissive layer 5330 of the blue (B) sub-pixel unit sPU3 may also include a filter layer 5331, wherein the filter layer 5331 has high light transmittance according to the light emitted by the light-emitting element 5113 (for example, the wavelength of the light is located in the blue light wavelength band) and the filter layer 5331 has high reflection or high absorption to visible light in the non-blue light wavelength band, but the invention is not limited thereto. In an embodiment, the filter layer 5331 may be a multilayer optical film (optical filter films), such as a dichroic mirror. Similarly, the red (R) sub-pixel unit sPU1 and the green (G) sub-pixel unit sPU2 can also be provided with a structure layer similar to the filter layer 5331 therein and respectively has high light transmittance according to the light emitted by the light-emitting element 5111 and 5112, but the invention is not limited thereto.

In the embodiment of FIG. 5C, along direction of the line P2 to P2', the cavity CP1 has a first incline surface of a first side-wall and a second incline surface of a second side-wall located at opposing sides of the light emitting element 5111 and the first incline surface inclines to the bottom of the cavity CP1 with an incline angle Ø11 and the second incline surface inclines to the bottom of the cavity CP1 with an incline angle Ø12, the cavity CP2 has a third incline surface of the second side-wall and a fourth incline surface of a third side-wall located at opposing sides of the light emitting element 5112 and the third incline surface inclines to the bottom of the cavity CP2 with an incline angle Ø21 and the fourth incline surface inclines to the bottom of the cavity CP2 with an incline angle Ø22, the cavity CP3 has a fifth incline surface of the third side-wall and a sixth incline surface of a fourth side-wall located at opposing sides of the light emitting element 5113 and the fifth incline surface inclines to the bottom of the cavity CP3 with an incline angle Ø31 and the sixth incline surface inclines to the bottom of the cavity CP3 with an incline angle Ø32, wherein the second side-wall is located between the sub-pixel units sPU1 and sPU2, the third side wall is located between the sub-pixel units sPU2 and sPU3. Referring to FIGS. 5A and 5C, along direction of the line P2 to P2', the first side wall and the fourth side wall are peripheral side walls of the pixel unit PU, respectively. In the embodiment, the inclination angle Ø11 can be greater than the inclination angle Ø12 and the inclination angle Ø32 can be greater than the inclination angle Ø32 to avoid optical crosstalk between adjacent pixel units, but the invention is not limited thereto. In other embodiments, at least two or all of the inclination angles ø11, ø12, ø21, ø22, ø31, and ø32 can be the same or different according to the specifications of various display systems. In the embodiment of FIG. 5C, at least one or all of the sidewall surfaces of the cavities CP1, CP2, and CP3 may be a multi-section surface with plural slopes or a curve surface. As shown in FIG. 5C, the slopes of the upper sidewall surfaces of the cavities CP1 and CP2 may be greater than the slope of the lower side wall surface of the cavities CP1 and CP2, but the invention is not limited thereto. In an embodiment, the sidewall surfaces of at least one or all of the cavities CP1, CP2, and CP3 may be a sidewall surface with a single slope, but the invention is not limited thereto.

Referring to FIGS. 5A and 5C, the first side wall has a height H11, the second side wall has a height H21, the third side wall has a height H31, and the fourth side wall has a height H41. In one embodiment, the height H11 can be greater than the height H21 or the height H11 can be greater than the height H31, the height H41 can be greater than the height H21 or the height H41 can be greater than the height H31, the purpose is to avoid or reduce optical crosstalk between adjacent pixel units, but the invention is not limited thereto. In an embodiment, the height H11 and the height H41 can be the same or different, and the height H21 and the height H31 can be the same or different.

In the embodiment of FIG. 5C, the conductive wiring layers 5111TE, 5112TE, and 5113TE are respectively electrically connected to the upper electrodes of the light-emitting element 5111, the light-emitting element 5112, and the light-emitting element 5113. The conductive wiring layer 5111TE is distributed on the upper surface of the light-emitting element 5111 and is extended upward along the sidewall surface of the cavity CP1 to the upper surface of the sealing frame layer BM, the conductive wiring layer 5112TE is distributed on the upper surface of the light-emitting element 5112 and is extended upward along the sidewall surface of the cavity CP2 to the upper surface of the sealing frame layer BM, and the conductive wiring layer 5113TE is distributed on the upper surface of the light emitting element 5113 and is extended upward along the sidewall surface of the cavity CP3 to the upper surface of the sealing frame layer BM.

In the embodiment of FIG. 5C, the conductive wiring layers 5111TE, 5112TE, and 5113TE are located on the upper surface of the frame layer BM and may respectively include conductive wiring layers 5111TE', 5112TE', and 5113TE' extending along the upper surface of the frame layer BM in Z-axis. In the embodiment of FIG. 5C, the conductive wiring layers 5111TE', 5112TE', and 5113TE' extend on the upper surface of the encapsulation layer BM and are electrically connected to the power sources VSS, but the invention is not limited thereto.

In the embodiment of FIG. 5C, the conductive wiring layers 5111TE, 5112TE, and 5113TE are distributed on the upper surface of the light-emitting element 5111, the light-emitting element 5112, and the light-emitting element 5113 and can be light-transmittable (or transparent) conductive layer(s), such as light-transmittable conductive oxide layer, the oxide material may include indium tin oxide (ITO), indium zinc oxide (IZO), zinc oxide (ZnO), aluminum zinc oxide (AZO), or indium oxide (In2O3), etc., but the invention is not limited thereto. In an embodiment, the conductive wiring layers 5111TE, 5112TE, and 5113TE can be light-transmittable conductive metal film layers, and the metal film layer may include, for example, One or more metals selected from magnesium (Mg), silver (Ag), gold (Au), calcium (Ca), lithium (Li), chromium (Cr), copper (Cu), and aluminum (Al), the film thickness of the metal layer is not greater than 200 nm or less, but the invention is not limited thereto.

Figure 6A:
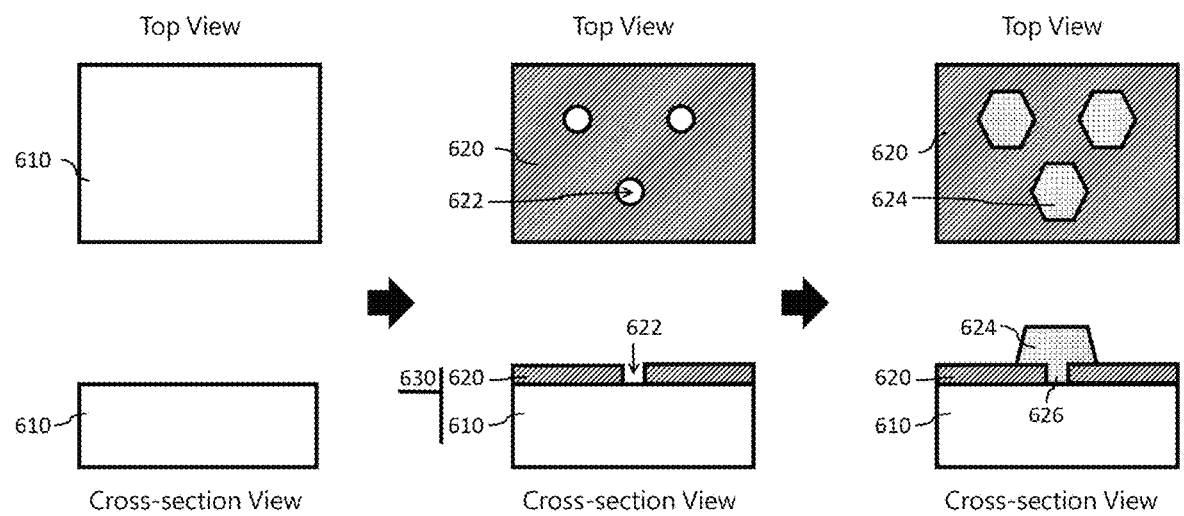
FIGS. 6A to 6B are schematic diagrams of a method for transferring miniature light emitting dies 601 according to an embodiment.
Figure 6B:
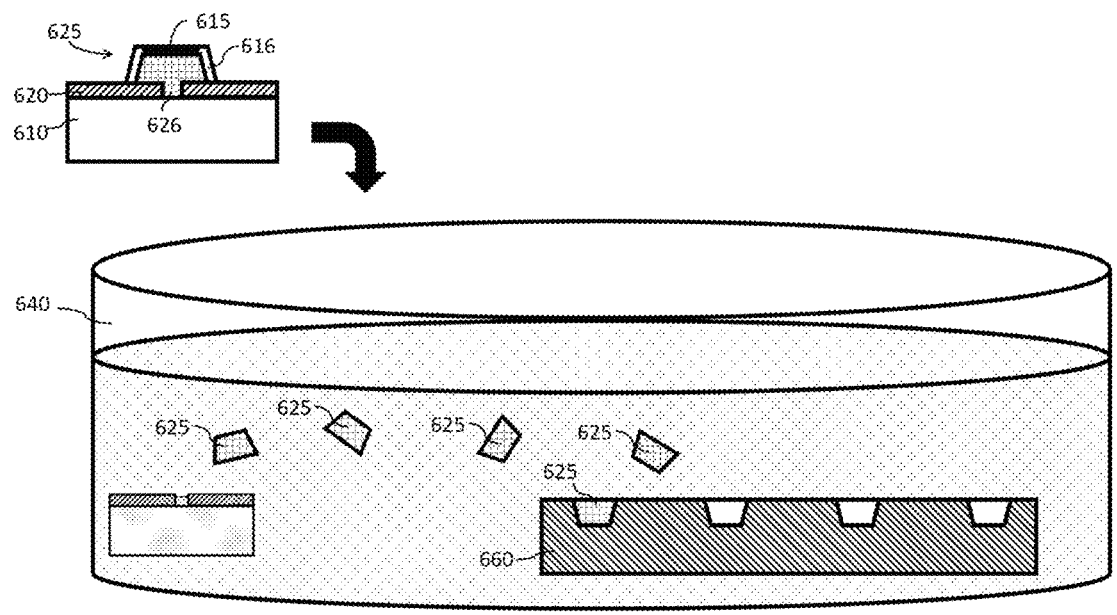

FIGS. 6A to 6B are schematic diagrams of a method for transferring miniature light emitting dies 601 according to an embodiment of the invention. Referring to the embodiment of FIG. 6A, a substrate 610 is provided, a silicon dioxide layer 620 is formed on the substrate 610, and the silicon dioxide layer 620 is patterned to form a patterned growth substrate 630 having a plurality of micro-vias 622; a plurality of miniature light emitting structures 624 are formed on the patterned silicon dioxide layer 620. Due to the micro-vias 622, each of the miniature light emitting structures 624 includes a micro-pillar 626 connecting to the miniature light emitting structures 624. The width of the micro-pillar 626 ranges, for example, from 1 to 100 microns (micrometer, μm); then, an ohmic electrode layer 615 and a protective layer 616 are formed on the miniature light emitting structure by lithography process to form a miniature light emitting die 625, wherein the growth substrate of the miniature light emitting structure can include any material, such as, but not limited to, silicon, sapphire, gallium nitride, silicon carbide, gallium arsenide.

Referring to the embodiment of FIG. 6B, after the lithography process, the formed miniature light emitting dies 625 with the patterned growth substrate 630 are put inside a container 640 filled with fluid, then each miniature light emitting die 625 can be separated from the patterned growth substrate 630 by ultrasound oscillation, heat treatment or laser lift-off, due to the hexagonal column shape of the miniature light emitting die 625 formed with the patterned growth substrate 630, each of the miniature light emitting dies 625 can self-align with each of corresponding positions of a receiving substrate 660 by fluid transfer, then a micro-display panel with plural miniature light emitting dies 625 is formed. In this embodiment, a plurality of miniature light emitting dies can be transferred once by fluid transfer and self-alignment, so as to effectively reducing manufacturing cost and achieving high yield.

Figure 7A:
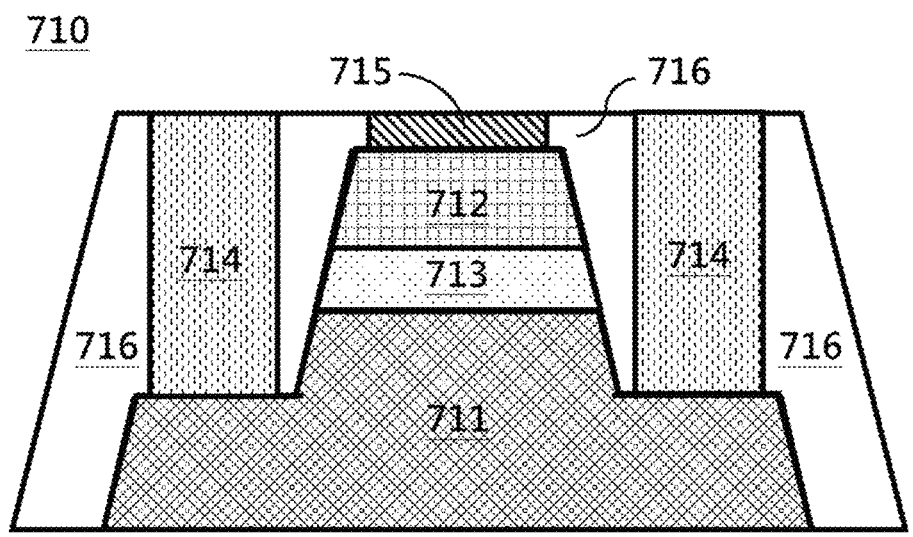
FIGS. 7A to 7D are various schematic structures of a hexagonal miniature light-emitting die according to an embodiment.
Figure 7B:
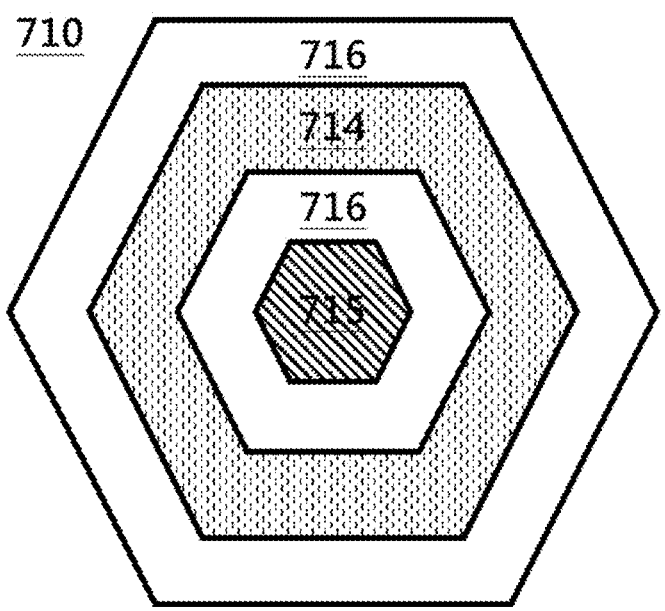

FIGS. 7A to 7D are various schematic structures of a hexagonal miniature light-emitting die according to an embodiment of the invention. FIG. 7A is a schematic cross-sectional view of a hexagonal miniature light-emitting die 710 according to an embodiment of the invention, and FIG. 7B is a schematic top view of the hexagonal miniature light-emitting die 710, and the hexagonal miniature light-emitting die 710 includes a first type semiconductor layer 711, a second type semiconductor layer 712, an active layer 713 located between the first type semiconductor layer 711 and the second type semiconductor layer 712, a first electrode layer 714 electrically contacting the first type semiconductor layer 711, a second electrode layer 715 electrically contacting the second type semiconductor layer 712, and a protective layer 716.

Figure 7C:
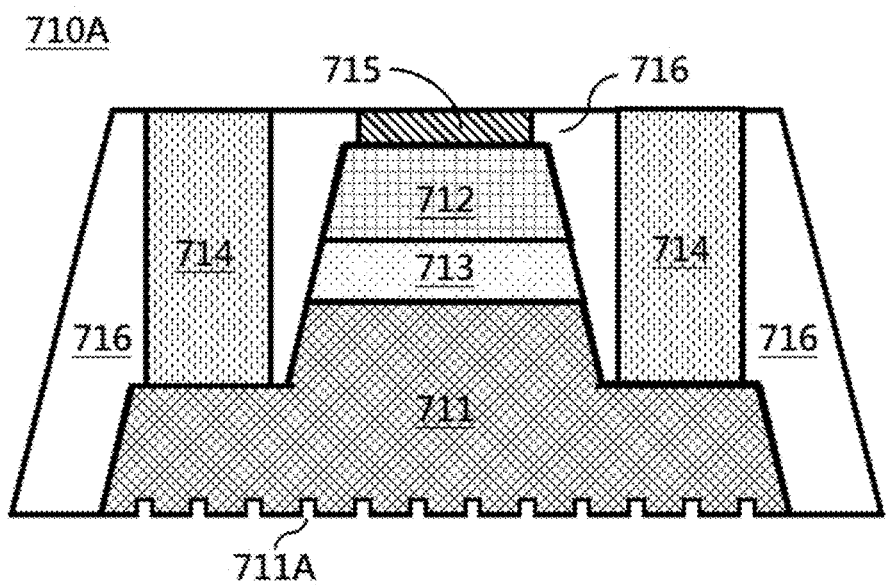

FIG. 7C is a schematic cross-sectional view of a hexagonal miniature light-emitting die 710A according to an embodiment of the invention, in the embodiment, a surface of the hexagonal miniature light emitting die 710A may include surface roughened structures 711A, for example, the surface of the first-type semiconductor layer 711 may have the surface roughened structure 711A.

Figure 7D:
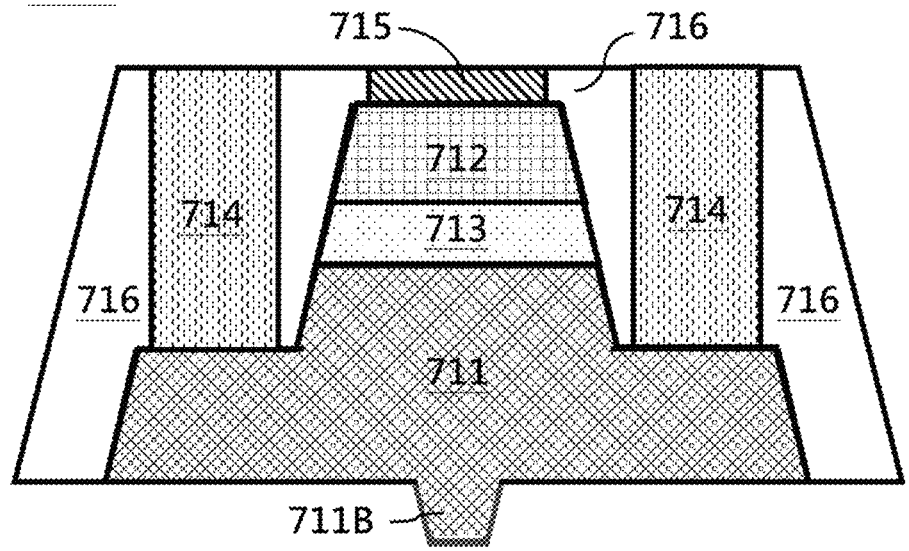

FIG. 7D is a schematic cross-sectional view of a hexagonal miniature light-emitting die 710B according to another embodiment of the invention. In this embodiment, the bottom of the hexagonal miniature light-emitting die 710B has a protrusion 711B with a width ranging from, for example, 1 to 100 microns (micrometer, μm). Please referring back to FIG. 6B, the protrusion 711B at the bottom of the hexagonal miniature light-emitting die 710B can improve the capture rate of the liquid transfer process.

FIG. 8 is a schematic cross-sectional view of a micro light emitting die 810 according to an embodiment of the invention. The micro light emitting die 810 includes a first type semiconductor layer 811, a second type semiconductor layer 812, and an active layer 813 between the first type semiconductor layer 811 and the second type semiconductor layer 812, a first electrode layer 814 electrically connecting the first type semiconductor layer 811, and a second electrode layer 815 electrically connecting the first type semiconductor layer 812 and a protective layer 816. The micro light emitting die 810 is different from the micro light emitting die 710 in the embodiment of FIG. 7A, the first electrode layer 814 and the second electrode layer 815 of the micro light emitting die 810 are disposed on opposite upper and lower sides of the active layer 813. In the embodiment of FIG. 8, a surface of the micro light emitting die 810 may also be provided with a roughened surface structure 811A.

Referring to the embodiment shown in FIG. 7C or FIG. 8, the roughened surface structures 711A, 811A may, for example, include concave microstructures, convex microstructures, or concave-convex microstructures, etc. The roughened surface structures 711A, 811A may distribute regularly or randomly. In an embodiment, the surface structures may distribute regularly and have the function of modulating the lighting direction of the light emitting diode chip, but the invention is not limited thereto.

Referring to the embodiment shown in FIG. 7C or FIG. 8, the protective layers 716 and 816 may, for example, be a passivation layer including one or more dielectric layers. Material of the dielectric layer may include Silicon oxide (SiO2), silicon nitride (Si3N4), aluminum oxide (Al2O3), yttrium oxide (Y2O3), titanium oxide (TiO2), hafnium oxide (HfO2), zirconium oxide (ZrO2), barium zirconate (BaZrO3), Barium titanate (BaTiO3), tantalum pentoxide (Ta2O5), zinc oxide (ZnO), etc., but the invention is not limited thereto.

FIG. 9 is a schematic cross-sectional view of a sub-pixel unit according to an embodiment of the invention, the micro light emitting die 910 can be, for example, a micro light emitting die shown in FIGS. 7A to 7D, but the invention is not limited thereto. In the embodiment, the micro light-emitting die 910 is adhered on the drive circuit substrate 920 by an anisotropic conductive film (ACF) 930, and the ACF 930 contains a plurality of insulated conductive particles, the electrode layer 914 and the electrode layer 915 of the micro light emitting die 910 can respectively be electrical contacted with the conductive wiring layers of the drive circuit substrate 920 by the insulated conductive particles of the ACF 930. Meanwhile, in the embodiment, adjacent electrode layer 914 and electrode layer 915, which are separated by layers 916, can keep laterally electrical insulation by the ACF 930. In this embodiment, the driving circuit substrate 920 can be provided with plural transistors TR9 (for example, a thin film transistor TFT or a metal oxide semiconductor field-effect transistor MOSFET, etc.) for driving the micro light emitting die 910, and the driving circuit substrate 920, for example, may include a multilayered circuit substrate having a redistribution layer (RDL). The RDL may include a plurality of patterned conductive layers, conductive layers and/or conductive pillars connected to the patterned conductive layers, etc. The micro light-emitting die 910 can be electrically connected to the transistor TR9 through the RDL, and further electrically connected to the power supply VDD and/or VSS of the display panel through the RDL.

In the embodiment shown in FIG. 9, an upper surface of the micro light emitting die 910 can be provided with a light reflection layer 910R, an optical filter layer 910F, and a wavelength conversion layer 910C, but the invention is not limited thereto.

In the embodiment shown in FIG. 9, the light transmissive layer 940 covered between the micro light-emitting die 910 and the light-shielding layer BM' may include wavelength conversion materials and/or light-scattering particles, but the invention is not limited thereto.

Figure 11A:
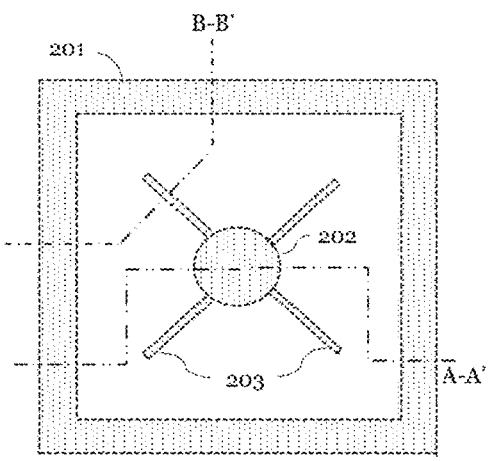
FIG. 11A, FIG. 11Q and FIG. 11T schematically illustrate a top view according to an embodiment of the invention.
Figure 11B:
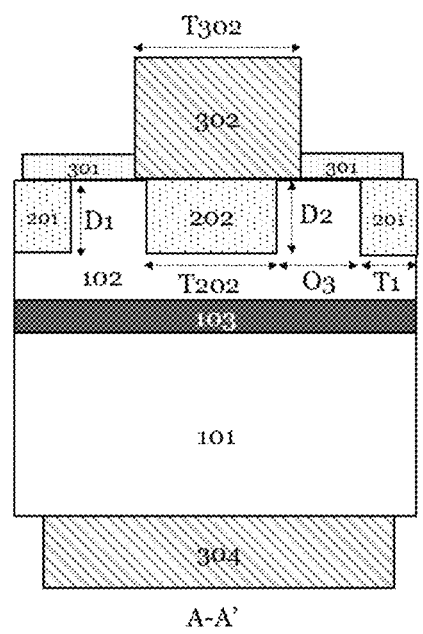
FIG. 11B, FIG. 11D, FIG. 11F, FIG. 11H, FIG. 11J, FIG. 11L, FIG. 11N, FIG. 11R and FIG. 11U schematically illustrate a cross-sectional view along line A-A' according to an embodiment of the invention.
Figure 11C:
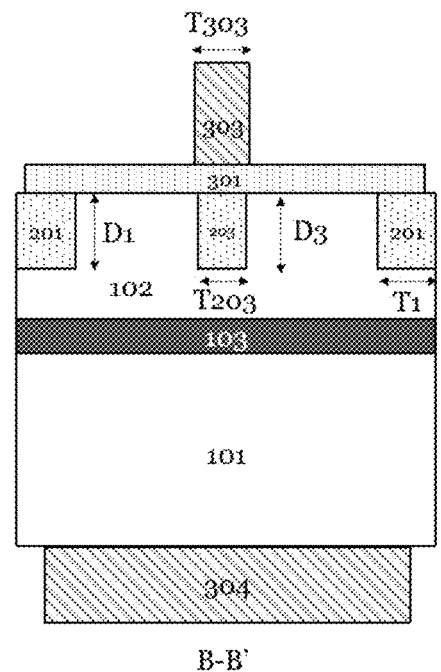
FIG. 11C, FIG. 11E, FIG. 11G, FIG. 11I, FIG. 11K, FIG. 11M, FIG. 11O and FIG. 11V schematically illustrate a cross-sectional view along line B-B' according to an embodiment of the invention.
Figure 11D:
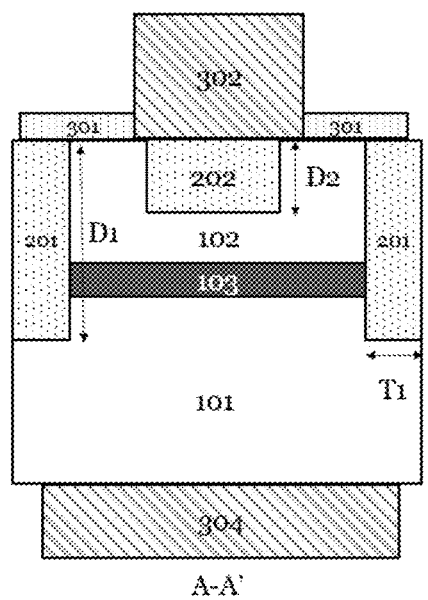
Figure 11E:
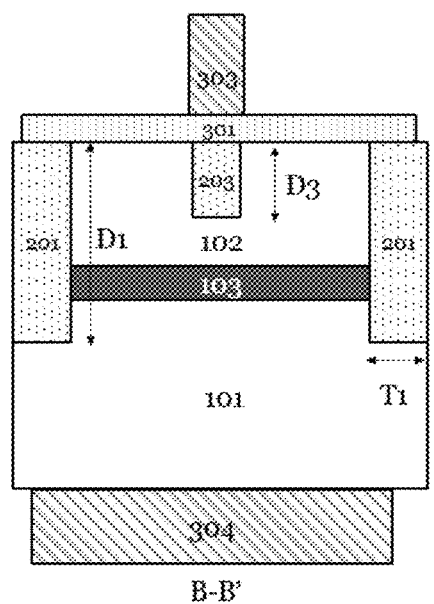
Figure 11F:
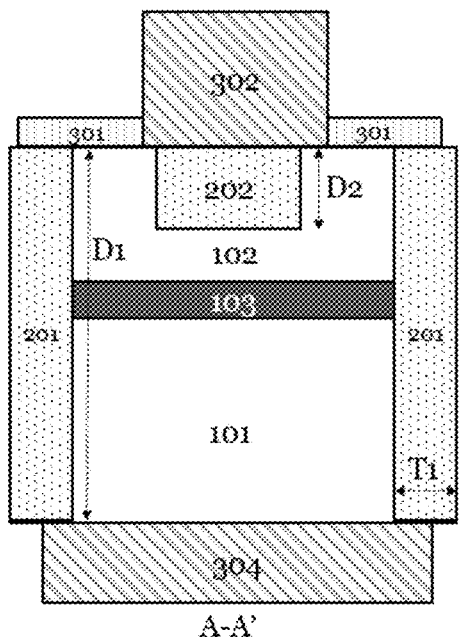
Figure 11G:
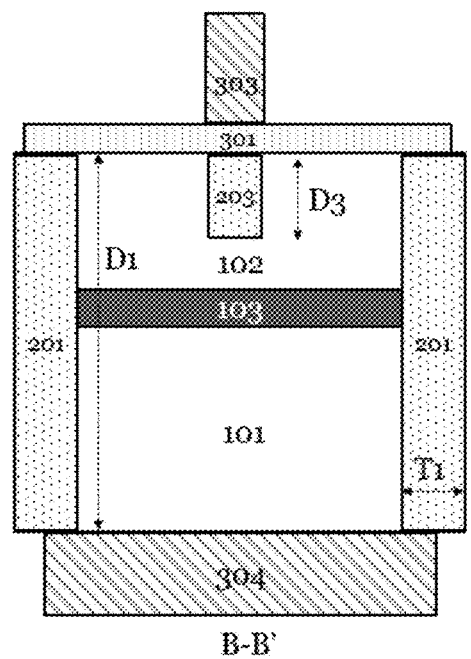
Figure 11H:
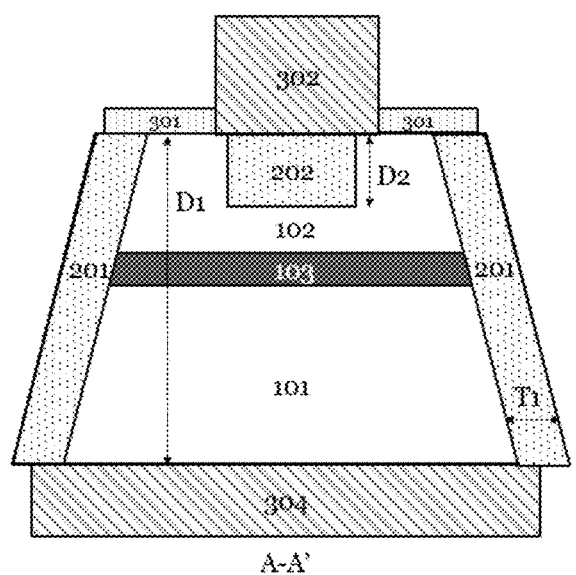
Figure 11I:
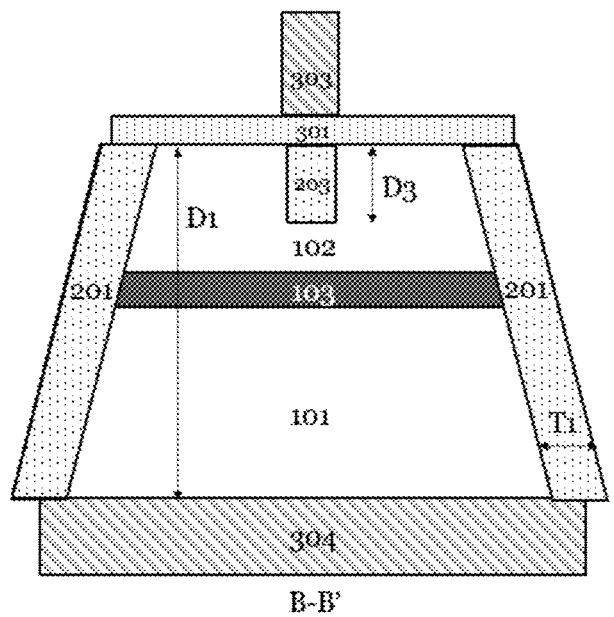
Figure 11J:
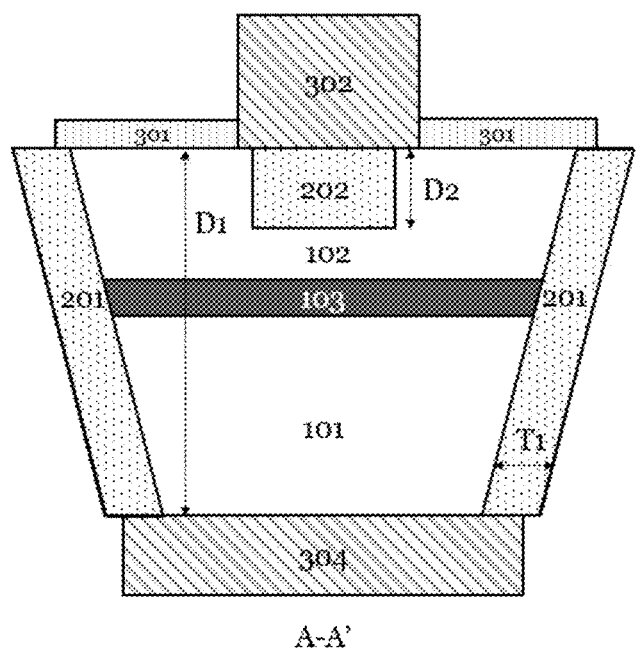
Figure 11K:
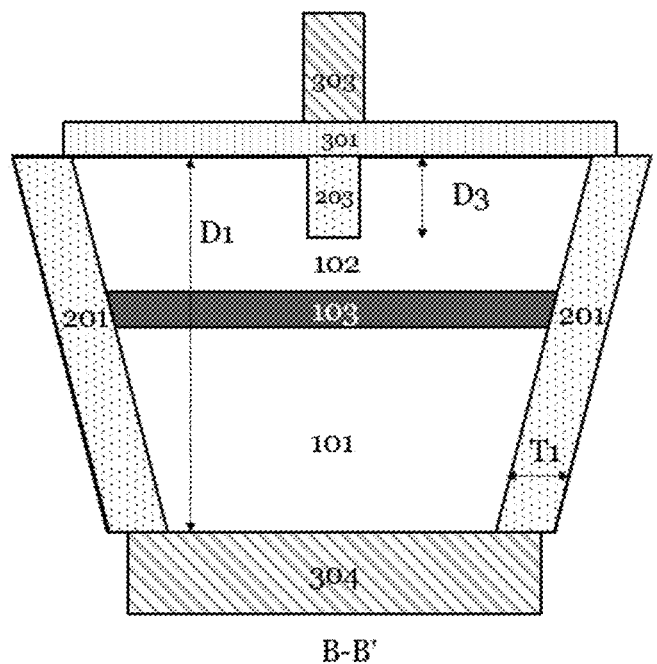
Figure 11L:
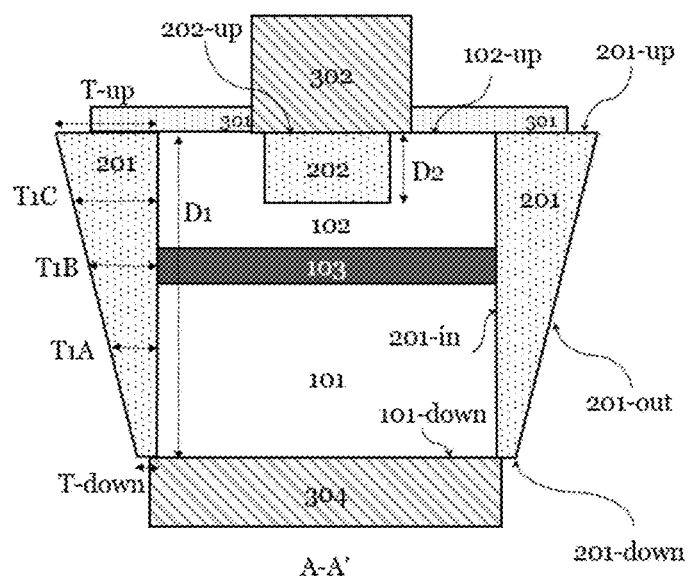
Figure 11M:
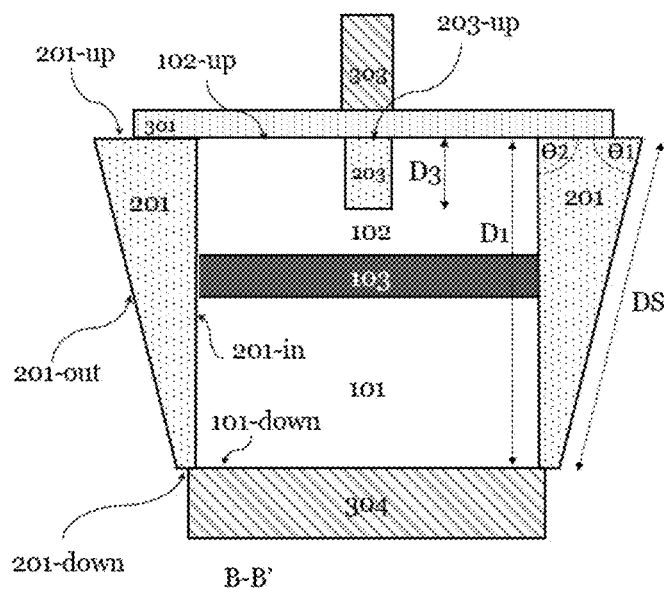
Figure 11N:
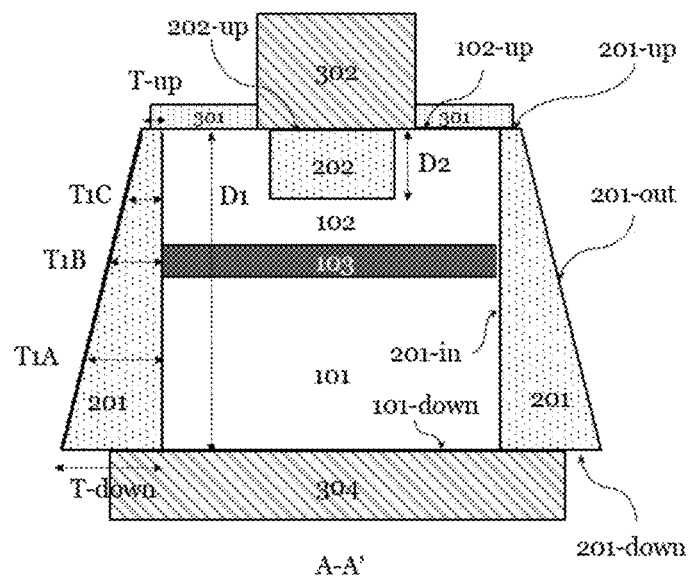
Figure 11O:
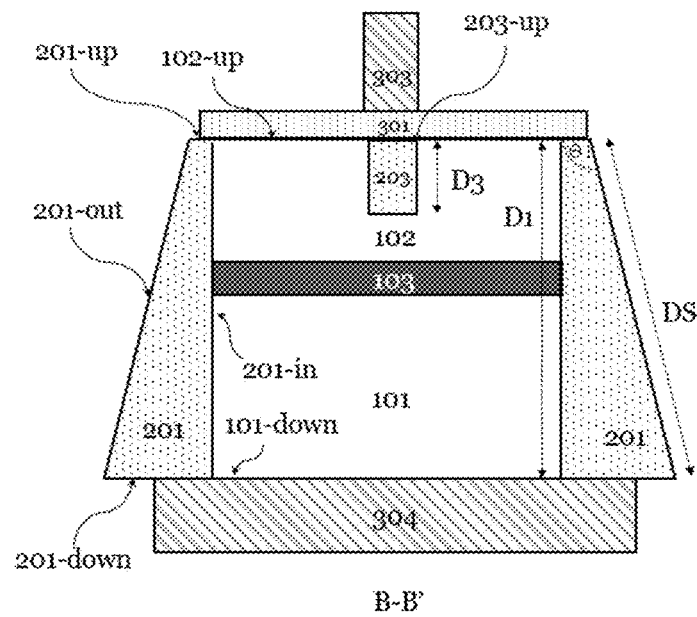
Figure 11P:
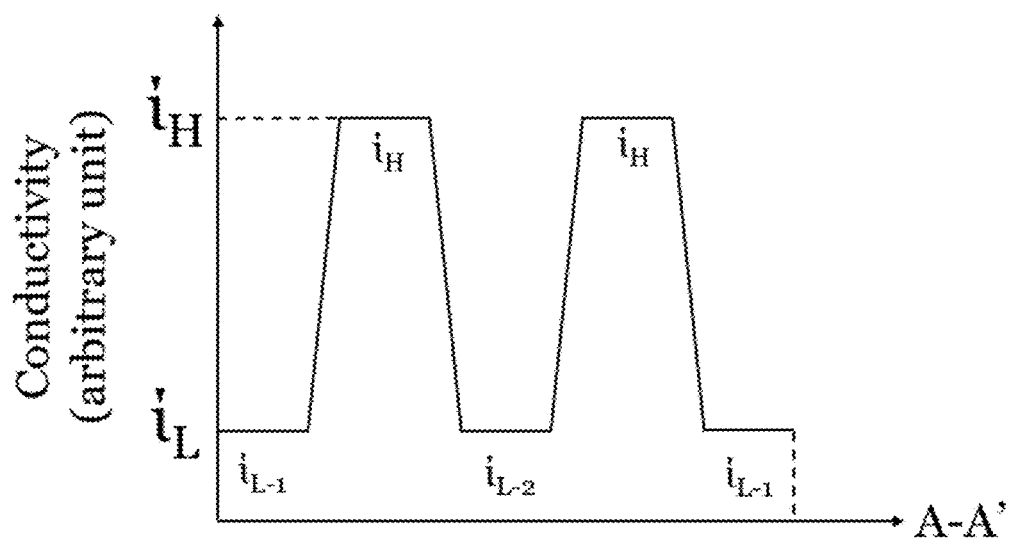
Figure 11Q:
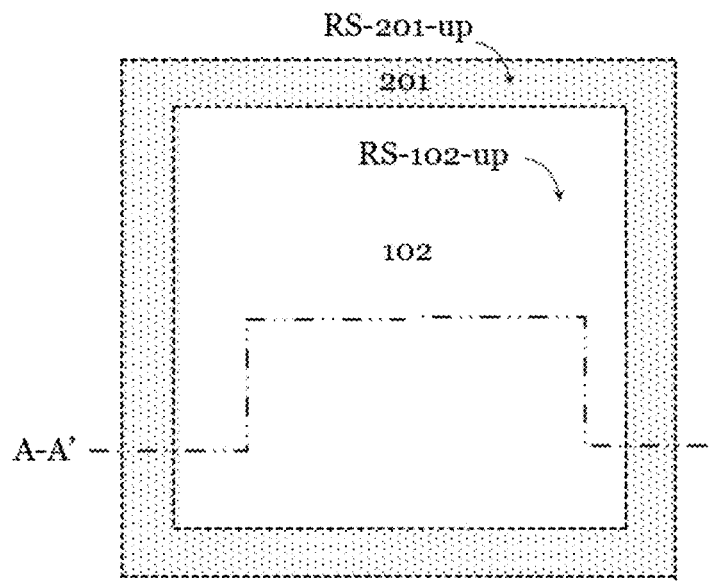
Figure 11R:
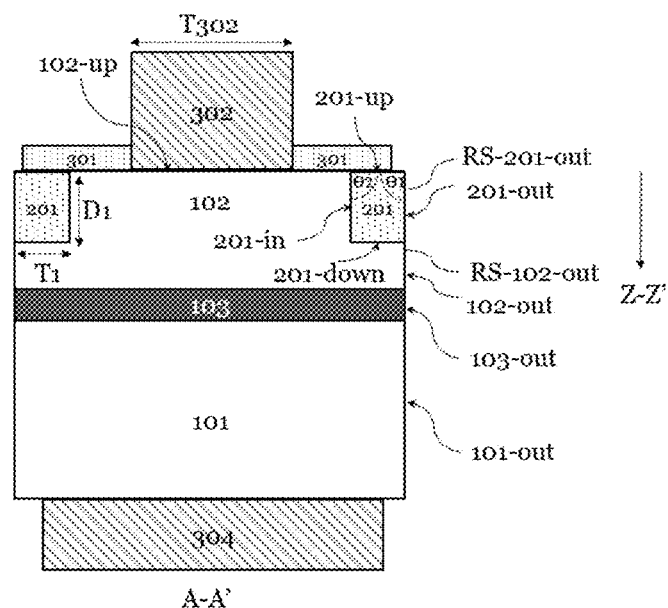
Figures 1, 11S:
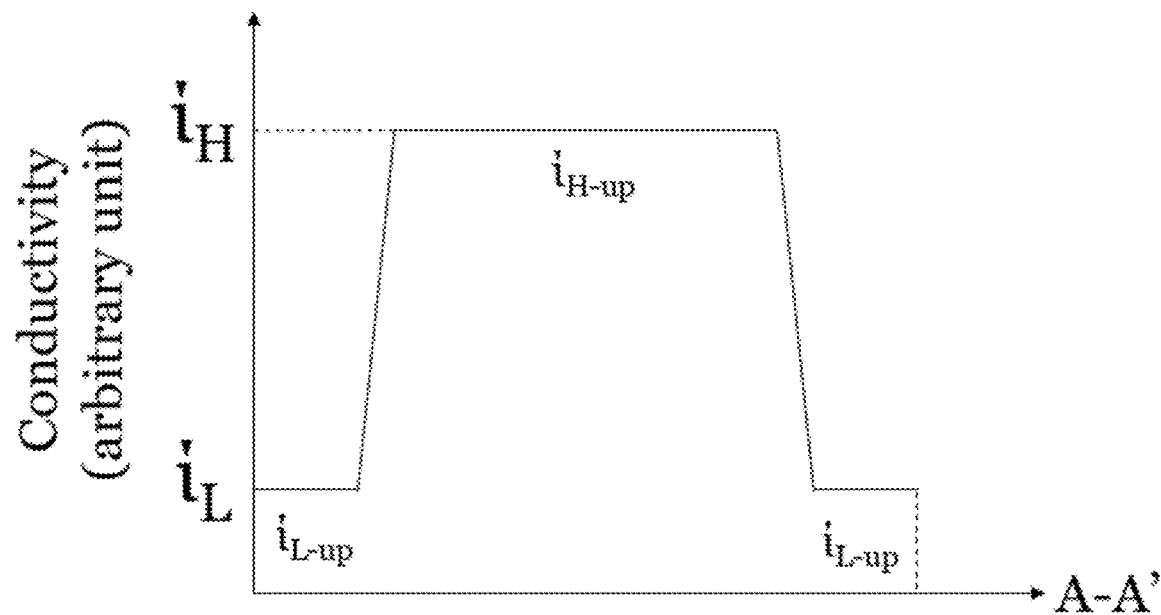
Figures 2, 11S:
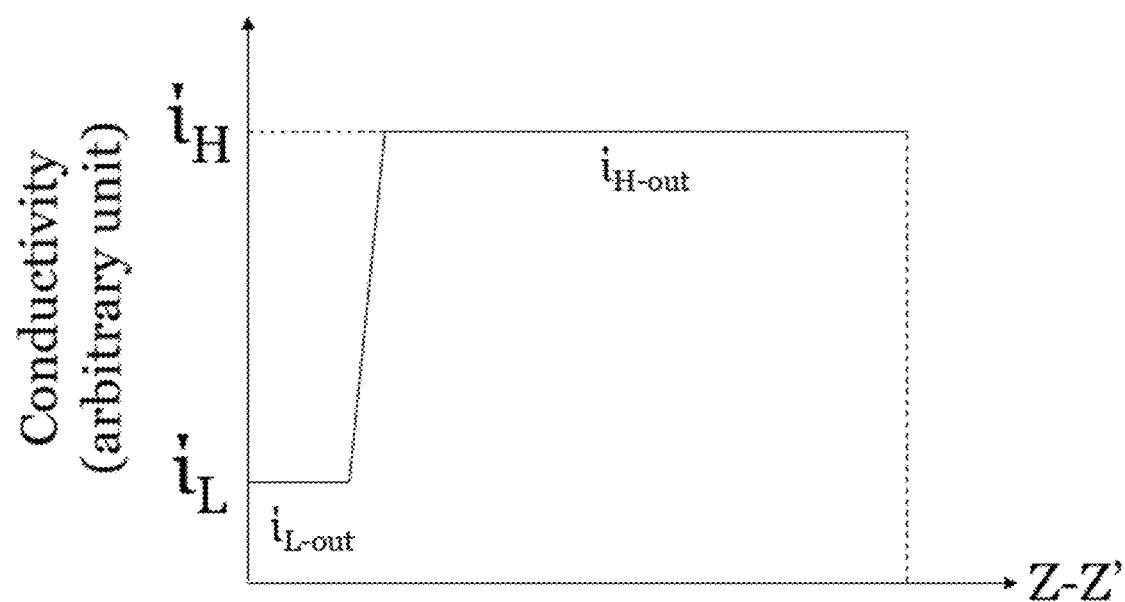
Figure 11T:
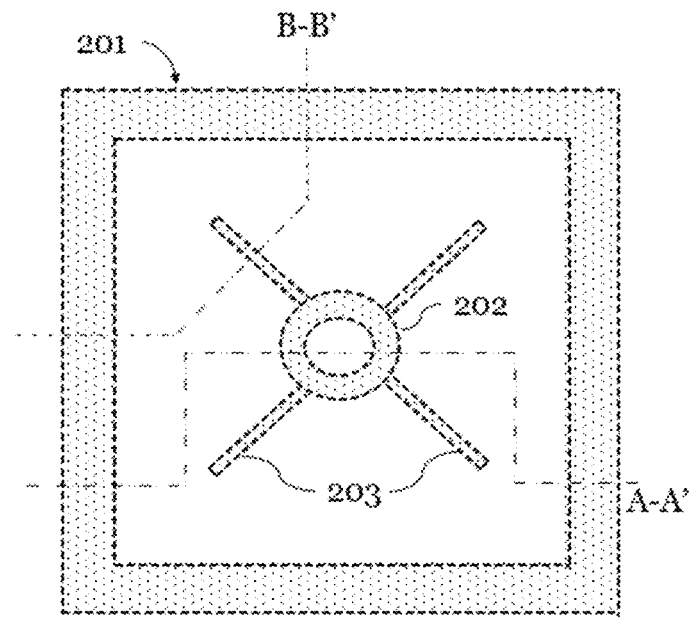
Figure 11U:
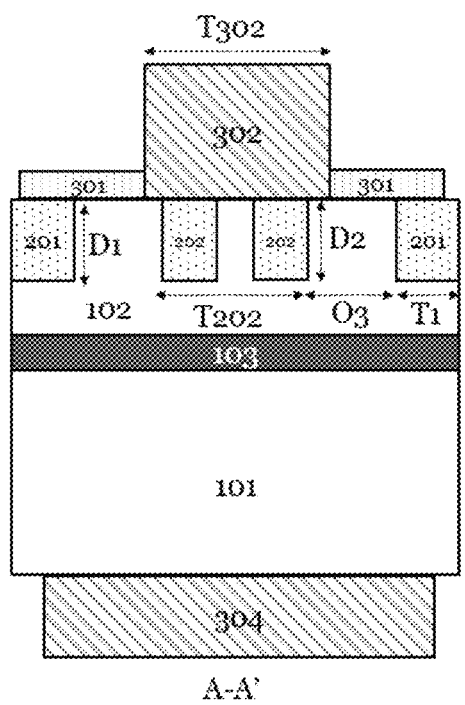
Figure 11V:
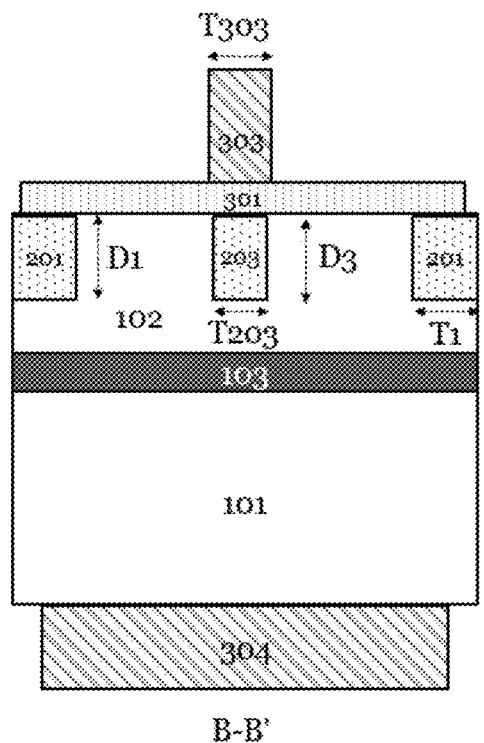
Figure 11W:
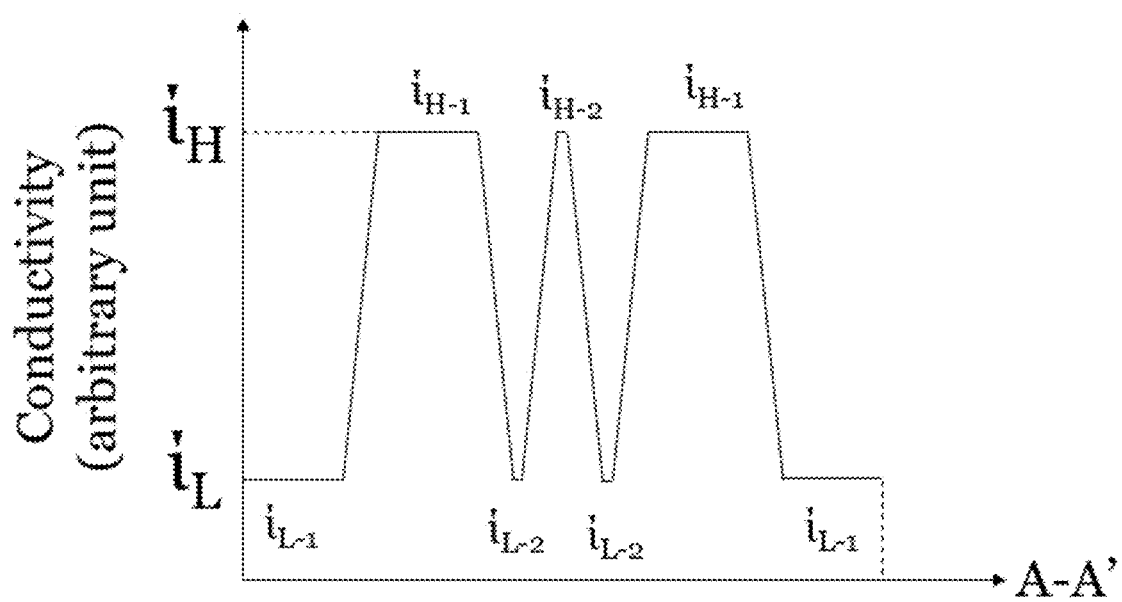
Figure 12A:
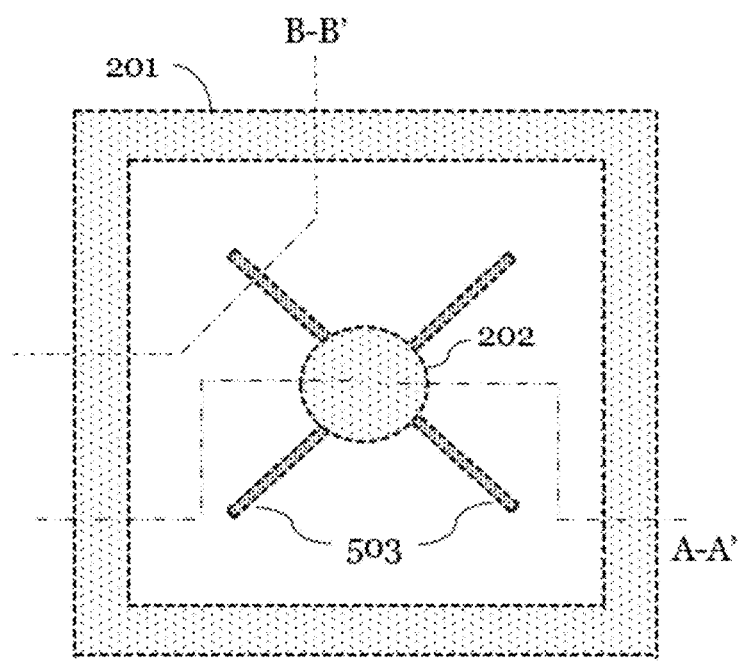
FIG. 12A schematically illustrates a top view according to an embodiment of the invention.
Figure 12B:
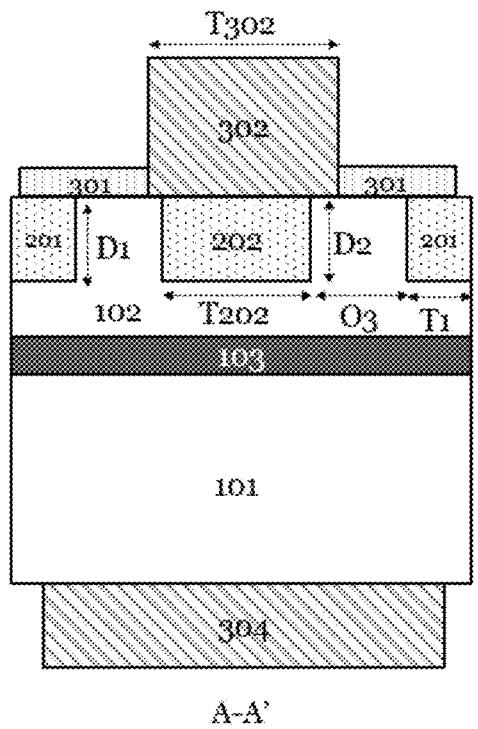
FIG. 12B and FIG. 12D schematically illustrate a cross-sectional view along line A-A' according to an embodiment of the invention.
Figure 12C:
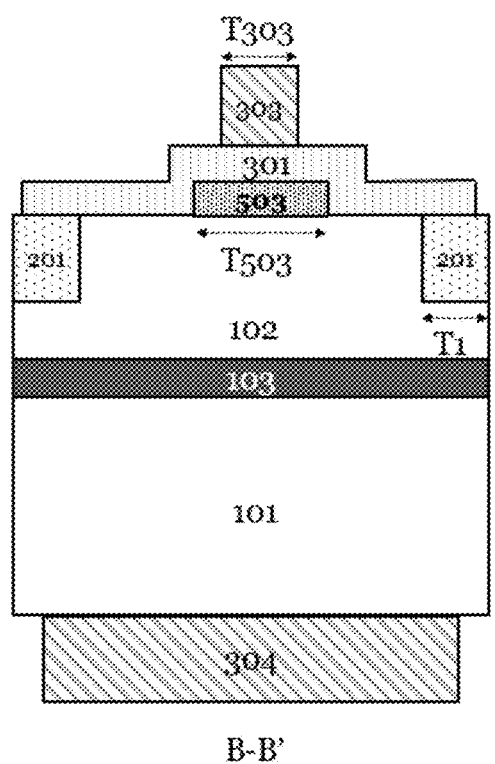
FIG. 12C and FIG. 12E schematically illustrate a cross-sectional view along line B-B' according to an embodiment of the invention.
Figure 12D:
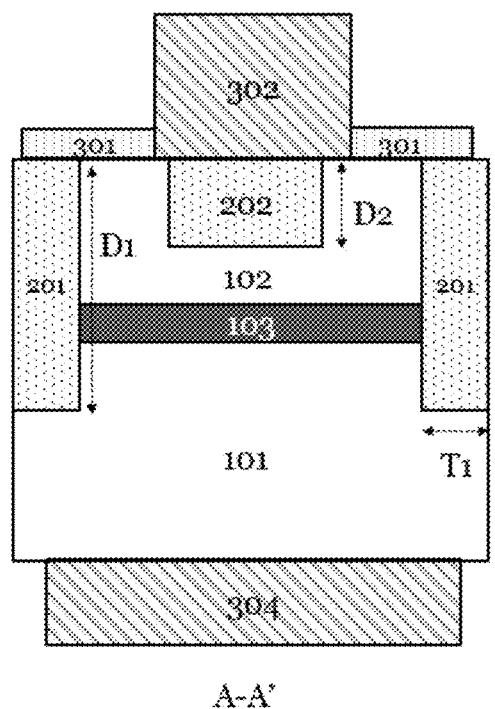
Figure 12E:
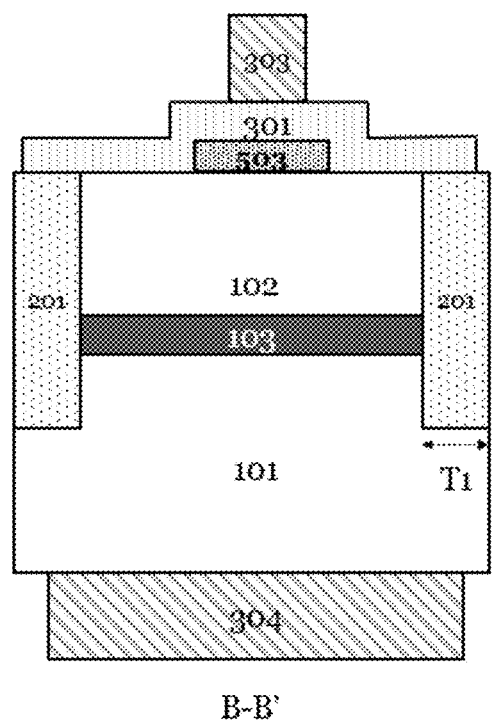
Figure 13A:
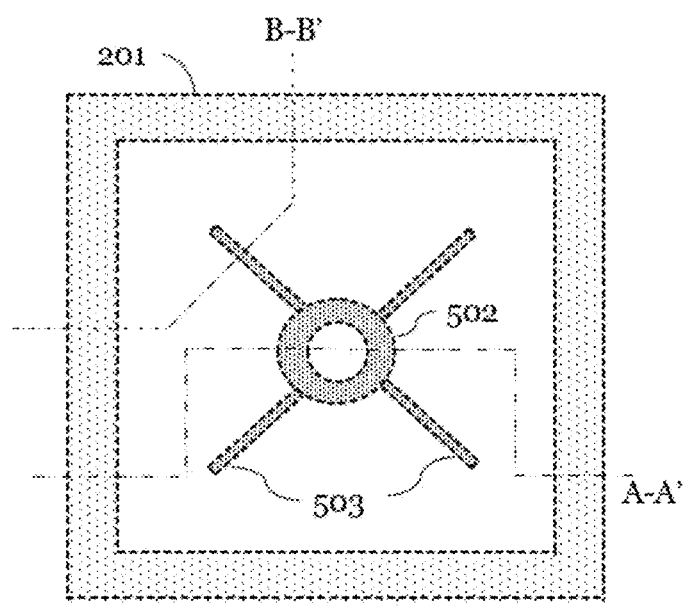
FIG. 13A schematically illustrates a top view according to an embodiment of the invention.
Figure 13B:
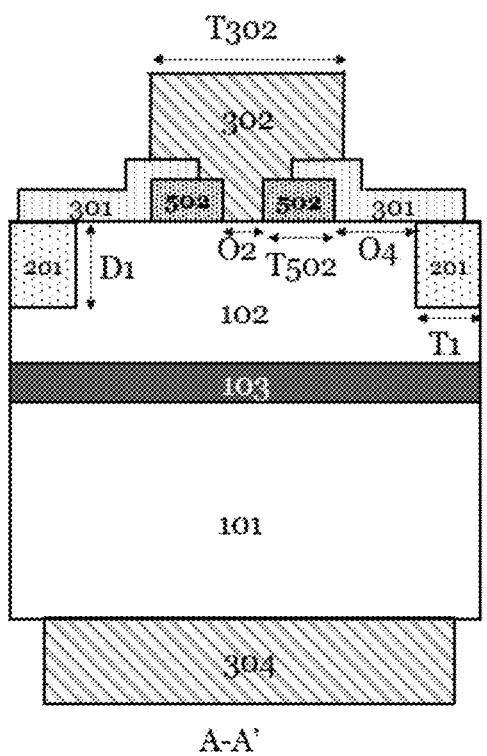
FIG. 13B and FIG. 13D schematically illustrate cross-sectional views along line A-A' according to an embodiment of the invention.
Figure 13C:
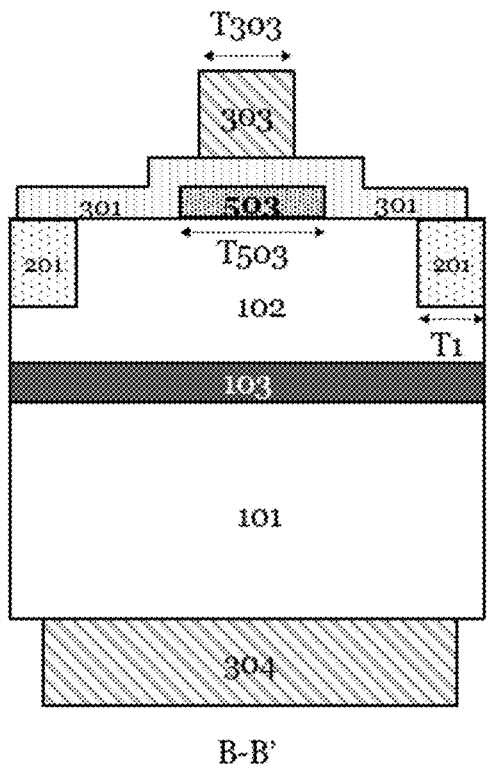
FIG. 13C and FIG. 13E schematically illustrate a cross-sectional view along line B-B' according to an embodiment of the invention.
Figure 13D:
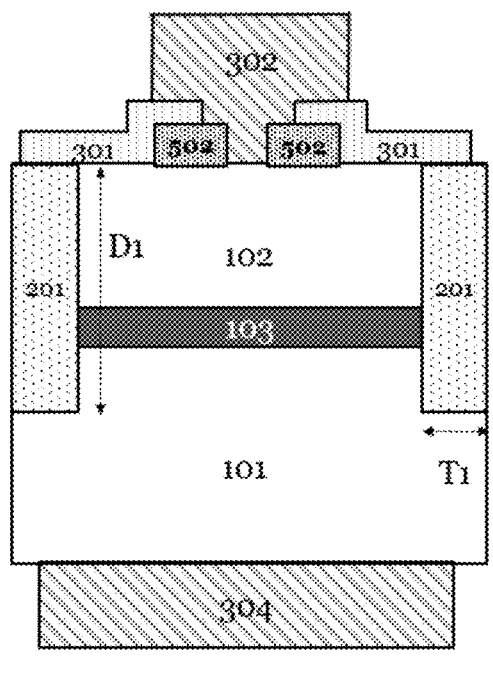
Figure 13E:
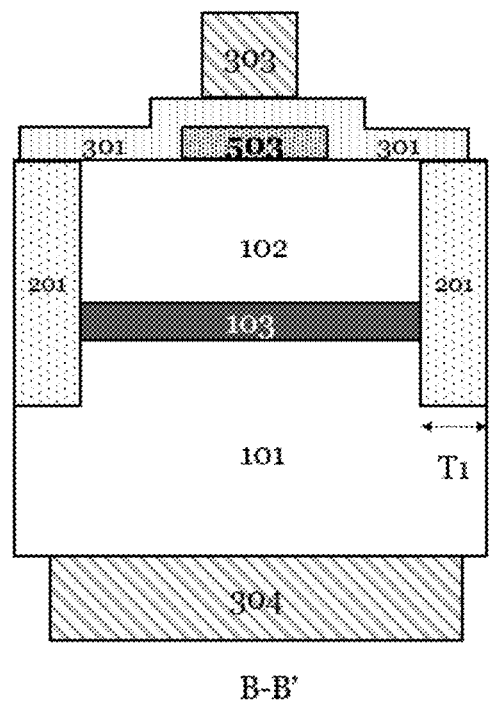
Figure 14A:
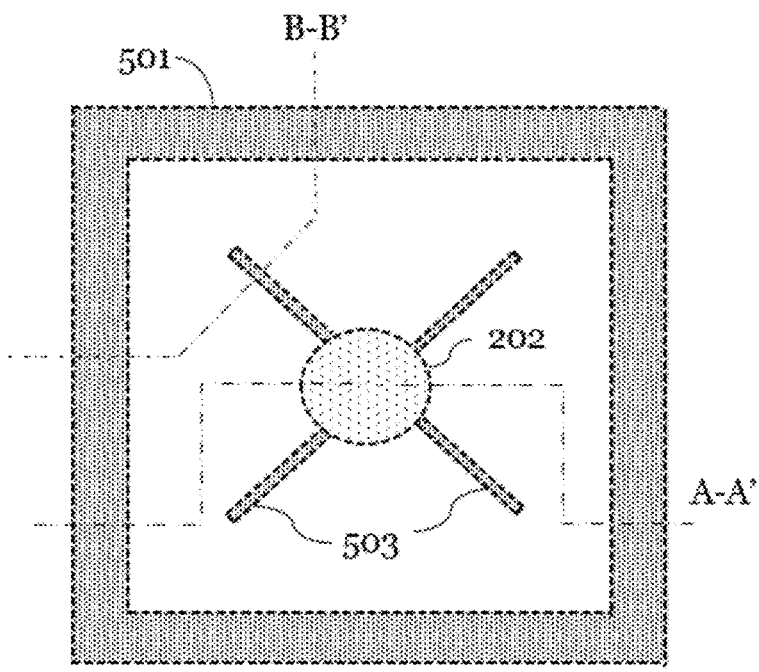
FIG. 14A schematically illustrates a top view according to an embodiment of the invention.
Figure 14B:
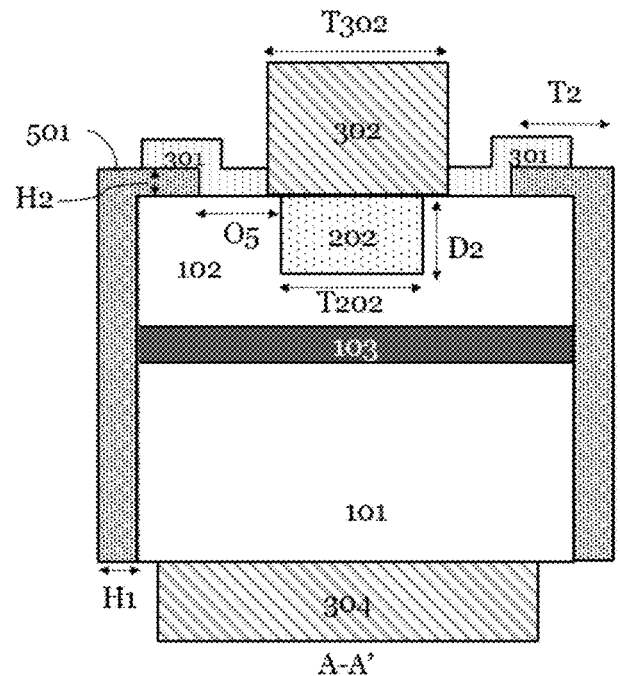
FIG. 14B schematically illustrates a cross-sectional view along line A-A' according to an embodiment of the invention.
Figure 14C:
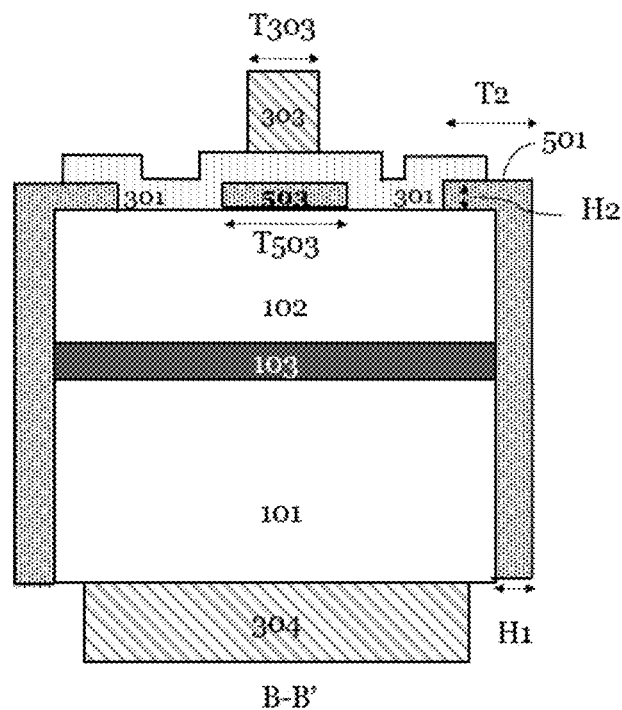
FIG. 14C schematically illustrates a cross-sectional view along line B-B' according to an embodiment of the invention.
Figure 15A:
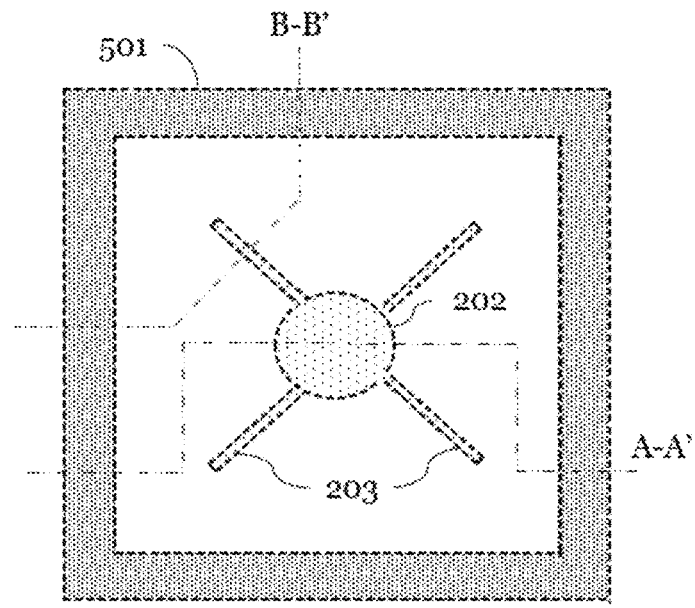
FIG. 15A schematically illustrates a top view according to an embodiment of the invention.
Figure 15B:
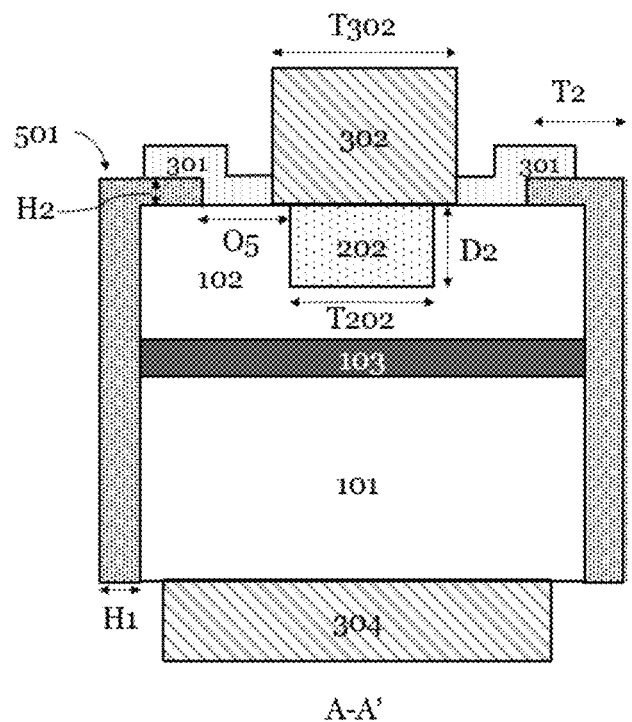
FIG. 15B schematically illustrates a cross-sectional view along line A-A' according to an embodiment of the invention.
Figure 15C:
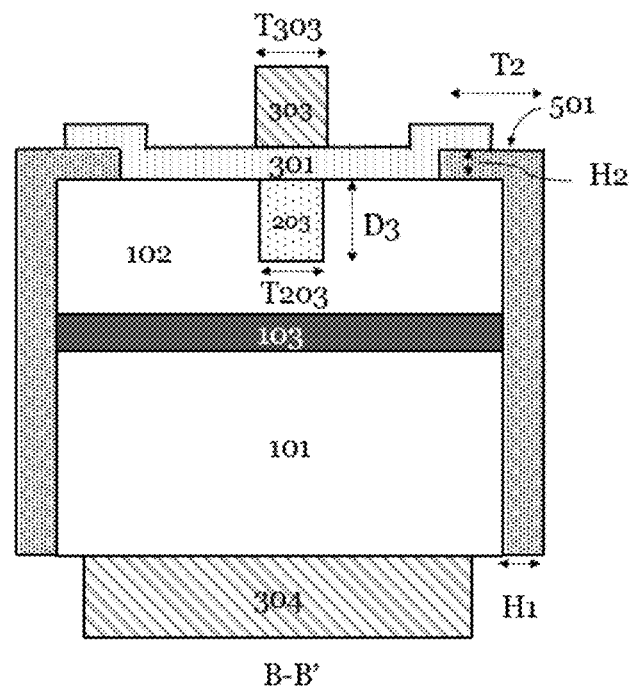
FIG. 15C schematically illustrates a cross-sectional view along line B-B' according to an embodiment of the invention.
Figure 16A:
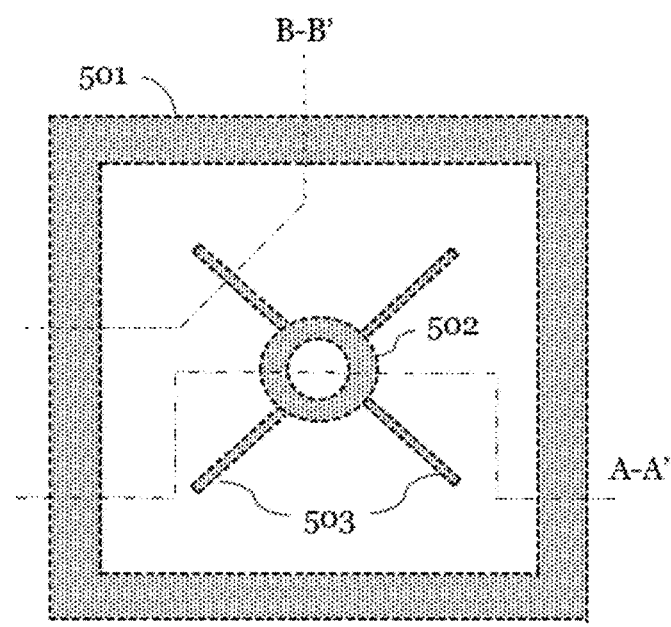
FIG. 16A and FIG. 16J schematically illustrate a top view according to an embodiment of the invention.
Figure 16B:
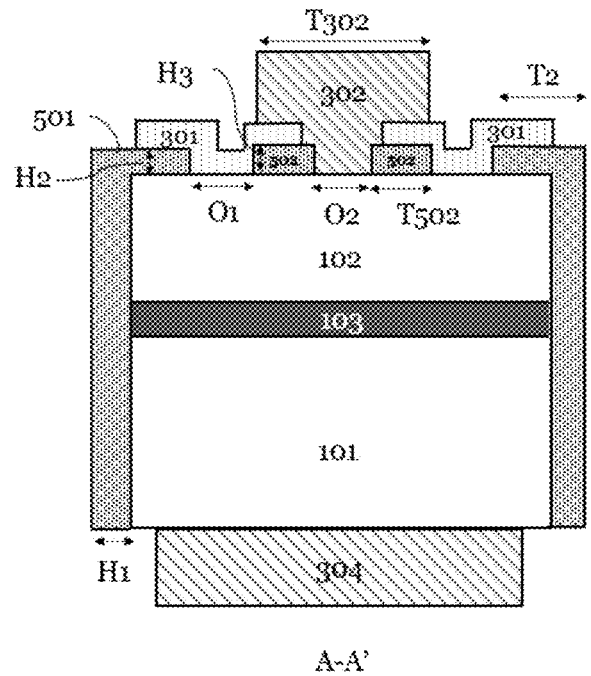
FIG. 16B, FIG. 16D, FIG. 16F, FIG. 16H and FIG. 16K schematically illustrate a cross-sectional view along line A-A according to an embodiment of the invention.
Figure 16C:
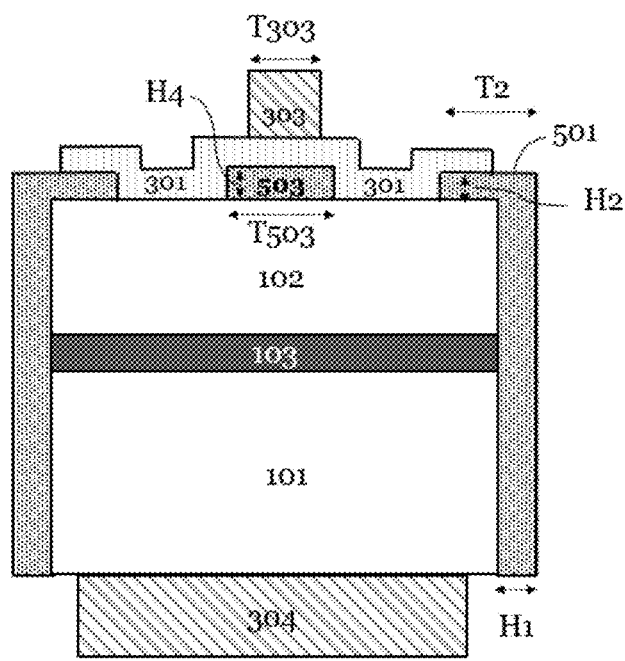
FIG. 16C, FIG. 16E, FIG. 16G and FIG. 16I schematically illustrate a cross-sectional view along line B-B' according to an embodiment of the invention.
Figure 16D:
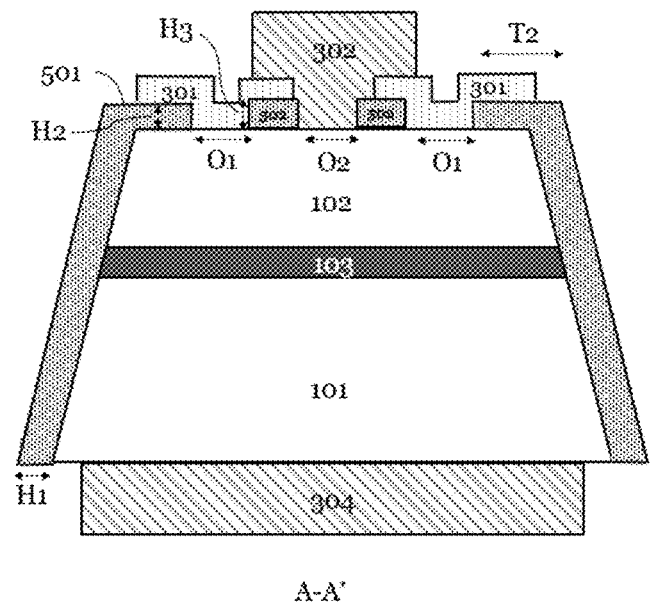
Figure 16E:
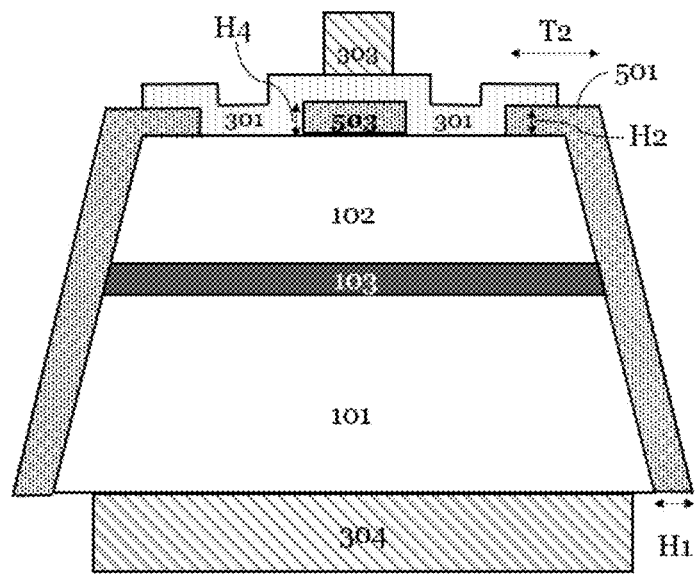
Figure 16F:
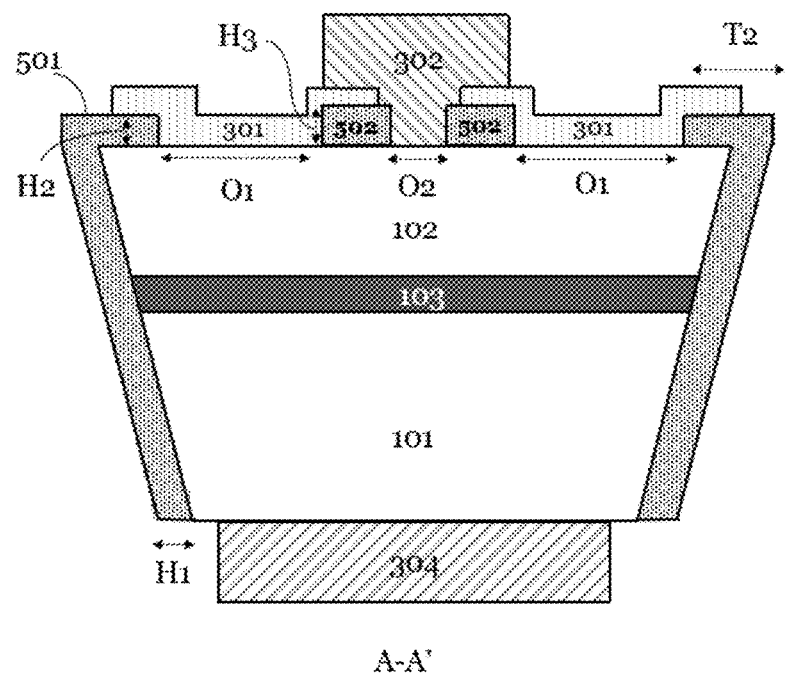
Figure 16G:
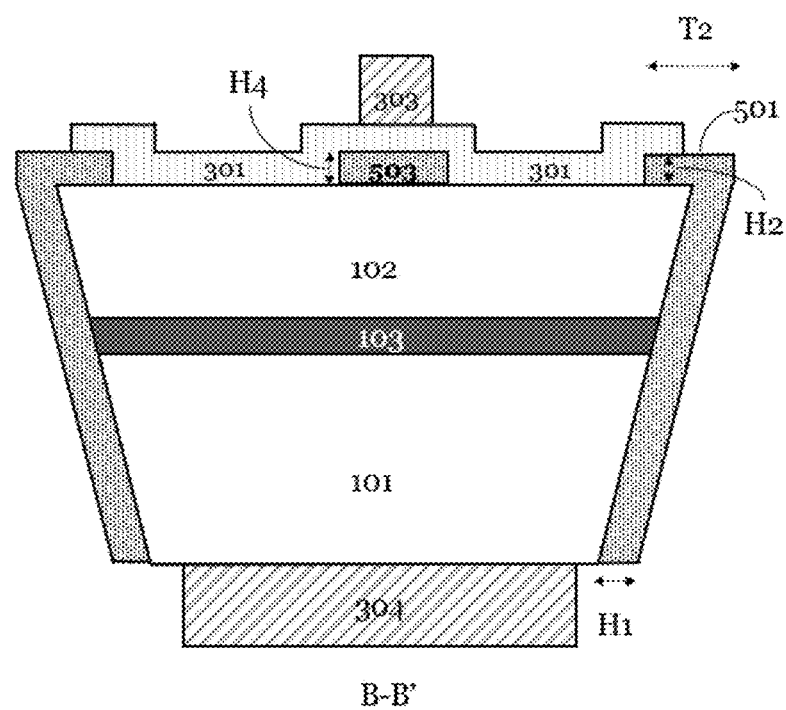
Figure 16H:
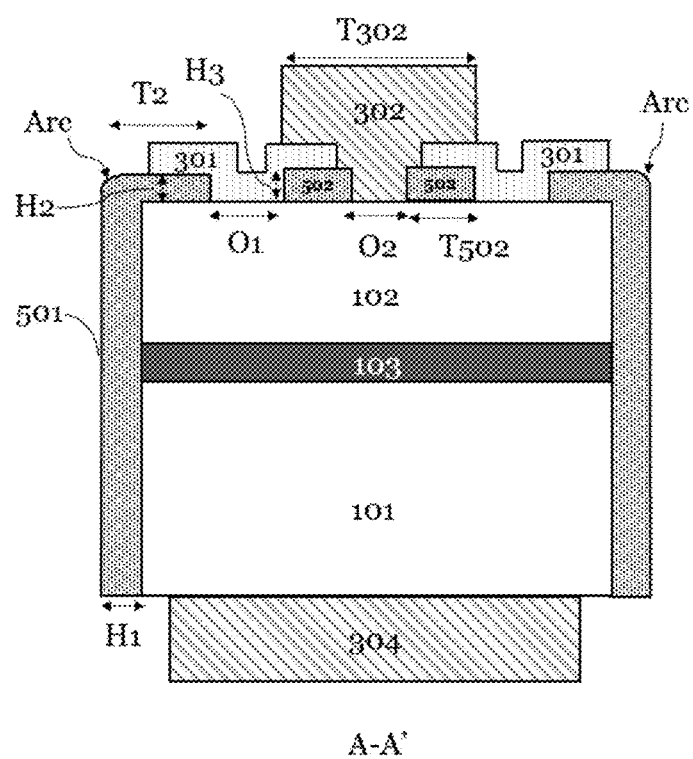
Figure 16I:
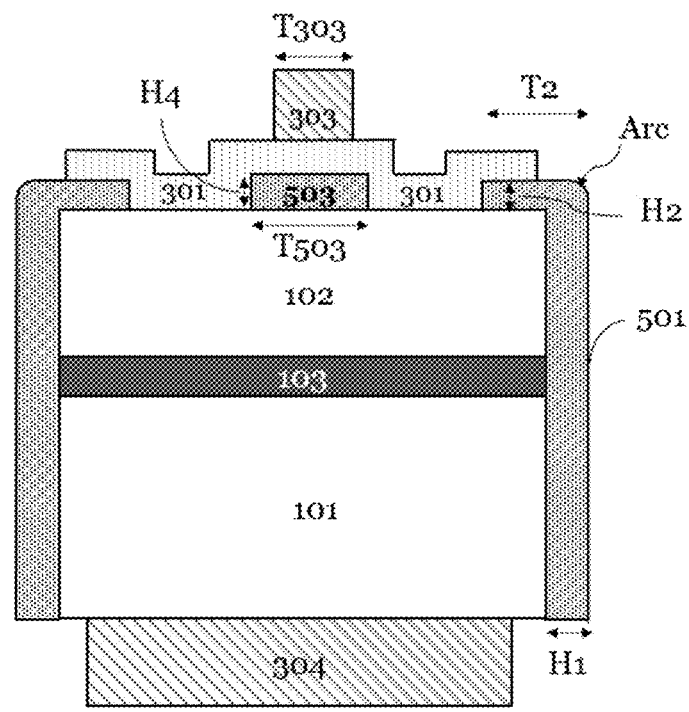
Figure 16J:
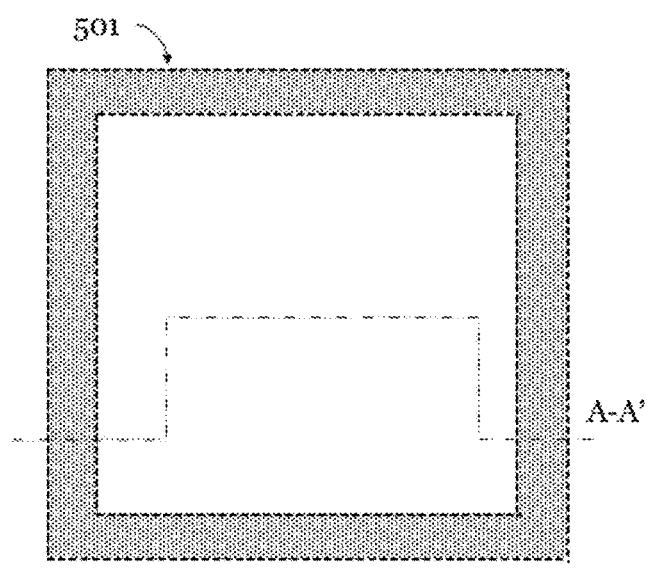
Figure 16K:
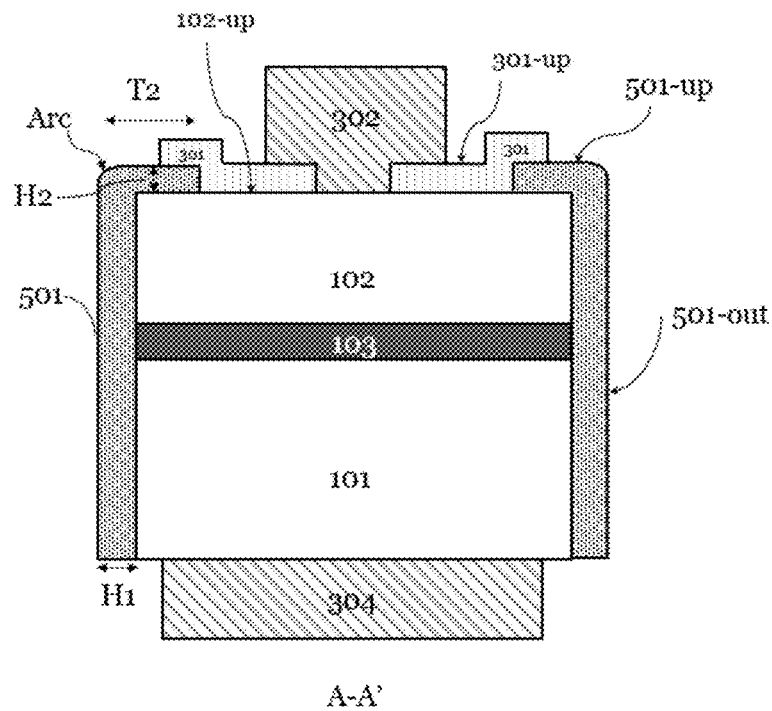
Figure 17A:
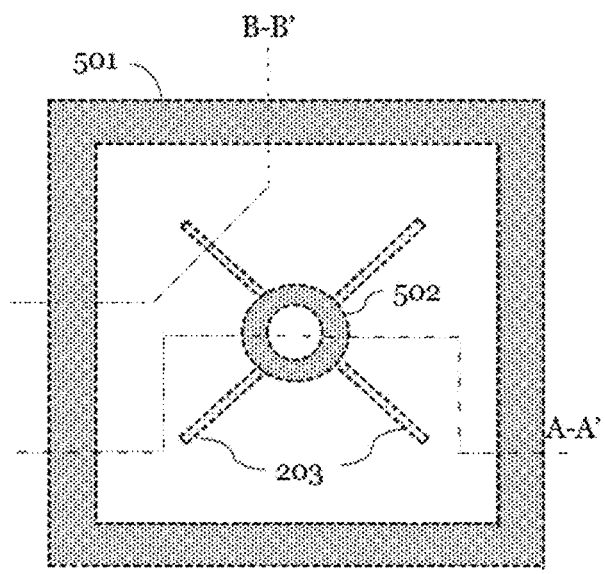
FIG. 17A schematically illustrates a top view according to an embodiment of the invention.
Figure 17B:
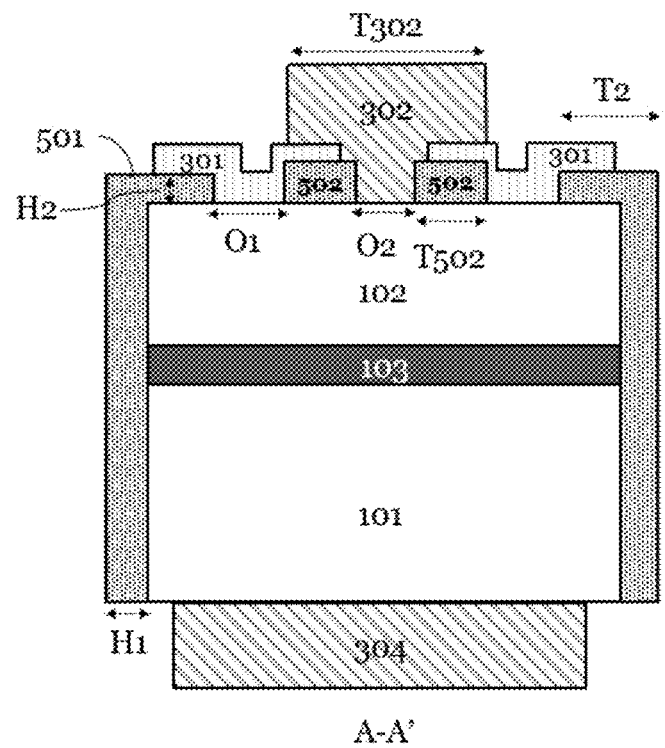
FIG. 17B schematically illustrates a cross-sectional view along line A-A according to an embodiment of the invention.
Figure 17C:
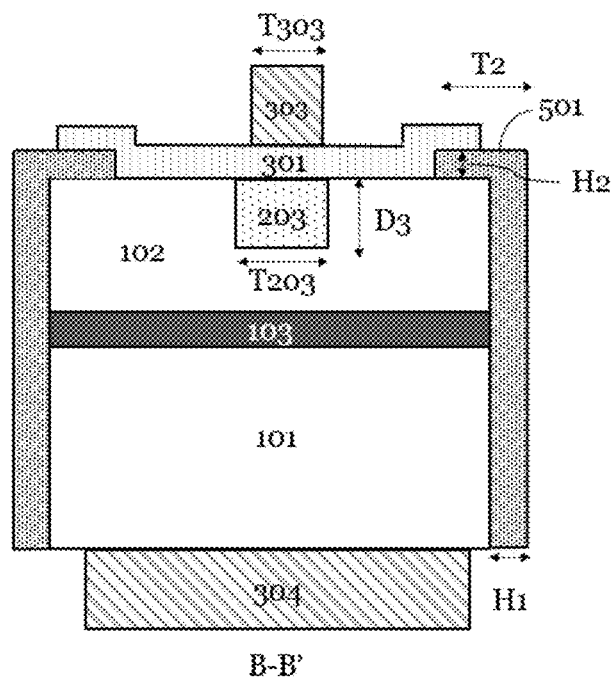
FIG. 17C schematically illustrates a cross-sectional view along line B-B' according to an embodiment of the invention.

FIG. 11A schematically illustrates a top view according to an embodiment. FIG. 11B, FIG. 11D, FIG. 11F, FIG. 11H, FIG. 11J, FIG. 11L, FIG. 11N, FIG. 11R and FIG. 11U respectively illustrate a cross-sectional view along line A-A' in FIG. 11A according to several embodiments. In one embodiment, the diode device includes a first type semiconductor layer 101, a second type semiconductor layer 102, a light emitting layer 103 located between the first type semiconductor layer 101 and the second type semiconductor layer 102, and a sidewall current limiting area 201 in contact with a periphery sidewall region of the second type semiconductor layer 102, wherein a peripheral perimeter of the sidewall current limiting area 201 is equal to or less than 400 micrometers (μm).

Optionally, the diode device may further include a transparent electrode 301 located above the second type semiconductor layer 102 and electrically connected to the second type semiconductor layer 102, and the transparent electrode 301 is partially overlapped with the sidewall current limiting area 201.

A micro light emitting diode (Micro-LED) device according to an embodiment includes a first type semiconductor layer 101, a second type semiconductor layer 102, a light emitting layer 103 located between the first type semiconductor layer 101 and the second type semiconductor layer 102, a first current limiting area 201 located at a periphery of the second type semiconductor layer 102 and on the sidewall region of the second type semiconductor layer 102, and a second current limiting area 202 surrounded by the first current limiting area 201, wherein a shortest distance between the first current limiting area 201 and the second current limiting area 202 is equal to or less than 50 micrometers, and a periphery perimeter of the first current limiting area 201 is equal to or less than 400 micrometers.

An upper surface U6 of the second type semiconductor layer 102, an upper surface U1 of the first current limiting area 201, and an upper surface U2 of the second current limiting area 202 are coplanar, which gives the beneficial effects such as increasing surface flatness, improving stability of the products, and reducing non-radiative recombination, thereby improving the efficiency of micro light emitting diodes.

The first current limiting area 201 has a first depth D1, the second current limiting area 202 has a second depth D2, and the first depth D1 may be equal to, greater than or less than the second depth D2.

The Micro-LED device may further include a third current limiting area 203 located between the first current limiting area 201 and the second current limiting area 202, and the third current limiting area 203 is in contact with the second current limiting area 202. In such condition, an upper surface U3 of the third current limiting area 203 and the upper surface U1 of the first current limiting area 201 are coplanar, which helps increasing surface flatness, improving stability of products, and reducing non-radiative recombination, thereby improving the efficiency of micro light emitting diodes.

The first current limiting area 201 has a first depth D1, the second current limiting area 202 has a second depth D2, the third current limiting area 203 has a third depth D3, and the first depth D1 is equal to the second depth D2 and equal to the third depth D3. Since these depths are the same, they may be formed in the same ion implantation process, thereby simplifying the process.

Alternatively, the first current limiting area 201 has a first depth D1, the second current limiting area 202 has a second depth D2, the third current limiting area 203 has a third depth D3, and the first depth D1 is greater than the second depth D2 and greater than the third depth D3. By increasing the first depth D1 according to different epitaxial structures, a preferable effect of reducing sidewall leakage current can be achieved, and the light emitting efficiency (also called light emitting efficiency) of the micro light emitting diode can be improved.

The Micro-LED device may further include a transparent electrode 301 located above the second type semiconductor layer 102 and electrically connected to the second type semiconductor layer 102, and the transparent electrode 301 covers the first current limiting area 201 and the third current limiting area 203, wherein the third current limiting area 203 is formed through ion implantation technique. Ion implantation can increase surface flatness and stability of the products. The first current limiting area 201 has a first width T1, the second current limiting area 202 has a second width T202, and the third current limiting area 203 has a third width T203. The second width T202 is greater than or equal to the first width T1, and the first width T1 is greater than or equal to the third width T203.

The Micro-LED device may further include a transparent electrode 301 located above the second type semiconductor layer 102 and electrically connected to the second type semiconductor layer 102, and the transparent electrode 301 covers the first current limiting area 201. The transparent electrode has high light transmittance ratio, and therefore the light emitting efficiency of the micro light emitting diode can be improved.

The Micro-LED device may further include an electrode 302 located above the second type semiconductor layer 102 and electrically connected to the transparent electrode 301, and the electrode 302 is directly in contact with the second current limiting area 202. Direct contact between the electrode and the semiconductor can prevent electrode from peeling, and therefore stability of products can be improved. In such condition, an electrode extension part 303 located above the transparent electrode 301 can be further included, wherein the electrode extension part 303 is electrically connected to the electrode 302, which helps improving the uniformity of current distribution and improving light emitting efficiency of the micro light emitting diode. The Micro-LED may further include a back electrode 304 located below the first type semiconductor layer. The back electrode 304 is electrically connected to the first type semiconductor layer. The back electrode 304 may include a multi-layer structure, which includes an ohm contact layer, a diffusion blocking layer, a connecting layer and a reflective mirror layer.

The first current limiting area 201 and the second current limiting area 202 can be formed through ion implantation technique. Ion implantation can increase sidewall flatness and stability of products; meanwhile, ion implantation can further increase surface flatness, which can also improve stability of products.

The first current limiting area 201 has a first width T1 greater than or equal to 1 micrometer.

The second current limiting area 202 may be located in the middle of the second type semiconductor layer 102.

Regarding the depth of the first current limiting area 201, the following are some optional embodiments:

The first current limiting area 201 has a first depth D1, and the first depth D1 may be not greater than the depth of the second type semiconductor layer.

Optionally, the first current limiting area 201 has a first depth D1, the first depth D1 further includes the periphery of the light emitting layer and the first type semiconductor layer, and the first depth D1 is greater than the summation of the depth of the second type semiconductor and the depth of the light emitting layer.

Optionally, the first current limiting area 201 has a first depth D1, the first depth D1 further includes the sidewall regions of the light emitting layer and the first type semiconductor layer, and the first depth D1 is greater than the summation of the depth of the second type semiconductor and the depth of the light emitting layer.

Optionally, the first current limiting area 201 has a first depth D1, the first depth D1 further includes the sidewall regions of the light emitting layer and the first type semiconductor layer, and the first depth D1 is equal to the summation of the depth of the second type semiconductor, the depth of the light emitting layer and the depth of the first type semiconductor.

Optionally, the first current limiting area 201 has a first depth D1, the first depth D1 further includes the sidewall regions of the light emitting layer and the first type semiconductor layer, the first current limiting area 201 located at the sidewall region of the first type semiconductor layer has a first lateral width T1A, the first current limiting area 201 located at the sidewall region of the light emitting layer has a second lateral width T1B, and the first current limiting area 201 located at the sidewall region of the second type semiconductor layer has a third lateral width T1C. Wherein the first lateral width T1A is greater than the second lateral width T1B and greater than the third lateral width T1C, or the third lateral width T1C is greater than the second lateral width T1B and greater than the first lateral width T1A.

Besides, the surface of the first current limiting area may have a first low conductivity region iL-1, and the following are some optional embodiments:

The surface of the first current limiting area has a first low conductivity region iL-1, and the surface of the second type semiconductor layer has a high conductivity region iH, wherein a conductivity distribution is gradually increased from the first low conductivity region iL-1 toward the high conductivity region iH.

Optionally, the surface of the first current limiting area has a first low conductivity region iL-1, the surface of the second current limiting area has a second low conductivity region iL-2, and the surface of the second type semiconductor layer has a high conductivity region iH, wherein a conductivity distribution is gradually increased from both the first low conductivity region iL-1 and the second low conductivity region iL-2 toward the high conductivity region iH.

Adopting the above-mentioned embodiments may facilitate reducing surface leakage current and sidewall leakage current and improving light emitting efficiency of the micro light emitting diode.

Regarding the width of the first current limiting area 201, the following are some optional embodiments:

The first current limiting area 201 has a first width T1, the second current limiting area 202 has a second width T202, and the second width T202 is greater than or equal to the first width T1.

Optionally, the first current limiting area 201 has a first width T1, the second current limiting area 202 has a second width T202, and the first current limiting area 201 and the second current limiting area 202 have a distance O3, wherein the second width T202 is greater than or equal to the first width T1, and the distance O3 is greater than the second width T202.

By adopting the above-mentioned embodiments, the first current limiting area 201 can reduce the sidewall leakage current and improve the light emitting efficiency of the micro light emitting diode; the second current limiting area 202 can improve the uniformity of current distribution and improve the light emitting efficiency of the micro light emitting diode; and the third current limiting area 203 can improve the uniformity of current distribution and improve the light emitting efficiency of the micro light emitting diode, wherein the peripheral perimeter of the first current limiting area 201 is equal to or less than 400 micrometers, thereby providing various advantages of the micro light emitting diode.

Another Micro-LED device according to an embodiment of the invention includes a first type semiconductor layer 101, a second type semiconductor layer 102, a light emitting layer 103 located between the first type semiconductor layer 101 and the second type semiconductor layer 102, a first current limiting area 201 located at a periphery of the second type semiconductor layer 102 and on the sidewall region of the second type semiconductor 102, a second current limiting area 202 surrounded by the first current limiting area 201, and a third current limiting area 203 surrounded by the first current limiting area 201 and in contact with the second current limiting area 202, wherein a shortest distance between the first current limiting area 201 and the second current limiting area 202 is equal to or less than 50 micrometers, and a periphery perimeter of the first current limiting area 201 is equal to or less than 400 micrometers.

According to the above-mentioned structure, the Micro-LED has the followings advantages:

(1) The first current limiting area 201 can reduce sidewall leakage current and improve the light emitting efficiency of the micro light emitting diode.

(2) The second current limiting area 202 can improve the uniformity of current distribution and improve the light emitting efficiency of the micro light emitting diode.

(3) The third current limiting area 203 can improve the uniformity of current distribution and improve the light emitting efficiency of the micro light emitting diode.

(4) The peripheral perimeter is small enough to have various advantages of the micro light emitting diode.

An upper surface U6 of the second type semiconductor layer 102, the upper surface U6 of the first current limiting area 201, an upper surface U2 of the second current limiting area 202 and an upper surface U3 of the third current limiting area 203 are coplanar, which helps increasing surface flatness, improving stability of products and reducing non-radiative recombination, thereby improving the efficiency of the micro light emitting diode.

The first current limiting area 201 has a first depth D1, the second current limiting area 202 has a second depth D2, and the third current limiting area 203 has a third depth D3, wherein the first depth D1 is equal to the second depth D2 and equal to the third depth D3. Since these depths are equal to each other in this embodiment, they can be formed by the same fabrication process, thereby simplifying the process.

Alternatively, the structure may be designed as that the first current limiting area 201 has a first depth D1, the second current limiting area 202 has a second depth D2, and the third current limiting area 203 has a third depth D3, wherein the first depth D1 is greater than the second depth D2 and greater than the third depth D3. By increasing the first depth D1 according to different epitaxial structures, a preferable effect of reducing sidewall leakage current can be achieved, and the light emitting efficiency of the micro light emitting diode can be improved.

The Micro-LED device may further include a transparent electrode 301 located above the second type semiconductor layer 102 and electrically connected to the second type semiconductor layer 102, and the transparent electrode 301 covers the first current limiting area 201 and the third current limiting area 203. The transparent electrode has high light transmittance ratio, thereby improving the light emitting efficiency of the micro light emitting diode. In such condition, the Micro-LED device may further include an electrode 302 located above the second type semiconductor layer 102 and electrically connected to the transparent electrode 301, and the electrode 302 is directly in contact with the second current limiting area 202, thereby preventing the electrode from peeling and improving stability of the products. The Micro-LED device may further include an electrode extension part 303 located above the transparent electrode 301 and electrically connected to the electrode 302.

The first current limiting area 201, the second current limiting area 202 and the third current limiting area 203 may be formed through ion implantation technique. Ion implantation can increase sidewall flatness and improve stability of the products; meanwhile, ion implantation can further increase surface flatness, which can also improve stability of the products.

The width of the first current limiting area 201 is greater than or equal to 1 micrometer.

Besides, the second current limiting area 202 can be located in the middle of the second type semiconductor layer 102.

Another Micro-LED device according to an embodiment of the invention includes a first type semiconductor layer 101, a second type semiconductor layer 102, a light emitting layer 103 located between the first type semiconductor layer 101 and the second type semiconductor layer 102, a first current limiting area 201 located at a periphery of the second type semiconductor layer 102 and on the sidewall region of the second type semiconductor layer 102, a second current limiting area 202 surrounded by the first current limiting area 201, and a third current blocking area 503 surrounded by the first current limiting area 201 and in contact with the second current limiting area 202, wherein a shortest distance between the first current limiting area 201 and the second current limiting area 202 is equal to or less than 50 micrometers, and a periphery perimeter of the first current limiting area 201 is equal to or less than 400 micrometers.

According to the above-mentioned structure, the Micro-LED has the followings advantages:

(1) The first current limiting area 201 can reduce sidewall leakage current and improve the light emitting efficiency of the micro light emitting diode.

(2) The second current limiting area 202 can improve the uniformity of current distribution and improve the light emitting efficiency of the micro light emitting diode.

(3) The third current blocking area 503 can improve the uniformity of current distribution and improve the light emitting efficiency of the micro light emitting diode.

(4) The peripheral perimeter is less than 400 micrometers, thereby having various advantages of the micro light emitting diode.

The upper surface U6 of the second type semiconductor layer 102, the upper surface U1 of the first current limiting area 201 and the upper surface U2 of the second current limiting area 202 are coplanar, which can increase surface flatness, improve stability of the products and reduce non-radiative recombination, thereby improving the efficiency of the micro light emitting diode.

The first current limiting area 201 has a first depth D1, the second current limiting area 201 has a second depth D2, and the first depth D1 is equal to the second depth D2. Since these depths are equal to each other, they can be formed through the same fabrication process, thereby simplifying the process.

Optionally, the first current limiting area 201 has a first depth D1, the second current limiting area 201 has a second depth D2, and the first depth D1 is greater than the second depth D2.

Optionally, the first current limiting area 201 has a first depth D1, the second current limiting area 201 has a second depth D2, and the first depth D1 is less than the second depth D2.

By increasing or decreasing the first depth D1 according to different epitaxial structures, a preferable effect of reducing sidewall leakage current can be achieved, and the light emitting efficiency of the micro light emitting diode can be improved.

The Micro-LED device may further include a transparent electrode 301 located above the second type semiconductor layer 102 and electrically connected to the second type semiconductor layer 102, and the transparent electrode 301 covers the first current limiting area 201 and the third current blocking area 503. The transparent electrode has high light transmittance ratio, thereby improving the light emitting efficiency of the micro light emitting diode. In such condition, the Micro-LED device may further include an electrode 302 located above the second type semiconductor layer 102 and electrically connected to the transparent electrode 301, and the electrode 302 is directly in contact with the second current limiting area 202, thereby preventing the electrode from peeling and improving stability of the products. The Micro-LED device may further include an electrode extension part 303 located above the transparent electrode 301 and electrically connected to the electrode 302.

The first current limiting area 201 and the second current limiting area 202 are formed through ion implantation technique. Ion implantation can increase sidewall flatness and stability of products; meanwhile, ion implantation can further increase surface flatness, which can also improve stability of products.

The third current blocking area 203 may be composed of dielectric material.

The width of the first current limiting area 201 may be greater than or equal to 1 micrometer.

The second current limiting area 202 may be located in the middle of the second type semiconductor layer 102.

Yet another Micro-LED device according to an embodiment of the invention includes a first type semiconductor layer 101, a second type semiconductor layer 102, a light emitting layer 103 disposed between the first type semiconductor layer 101 and the second type semiconductor layer 102, a first current limiting area 201 located at a periphery of the second type semiconductor layer 102 and on the sidewall region of the second type semiconductor layer 102, a second current blocking area 502 surrounded by the first current limiting area 201, and a third current blocking area 503 surrounded by the first current limiting area 201 and in contact with the second current blocking area 502, wherein a shortest distance between the first current limiting area 201 and the second current blocking area 202 is equal to or less than 50 micrometers, and a periphery perimeter of the first current limiting area 201 is equal to or less than 400 micrometers.

The structure of the Micro-LED device has the following beneficial effects:

(1) The first current limiting area 201 can reduce sidewall leakage current and improve the light emitting efficiency of the micro light emitting diode.

(2) The second current blocking area 502 can improve the uniformity of current distribution and improve the light emitting efficiency of the micro light emitting diode.

(3) The third current blocking area 503 can improve the uniformity of current distribution and improve the light emitting efficiency of the micro light emitting diode.

(4) The peripheral perimeter is less than 400 micrometers and therefore the size scale of the micro light emitting diode can be met, thereby having various advantages of the micro light emitting diode.

The upper surface U6 of the second type semiconductor layer 102 and the upper surface U1 of the first current limiting area 201 are coplanar, which helps to increase surface flatness, improve stability of the products and reduce non-radiative recombination, thereby improving the efficiency of the micro light emitting diode.

The Micro-LED device may further include a transparent electrode 301 located above the second type semiconductor layer 102 and electrically connected to the second type semiconductor layer 102, and the transparent electrode 301 covers the first current limiting area 201, the second current blocking area 502 and the third current blocking area 503. In such condition, the Micro-LED device further includes an electrode 302 located above the second type semiconductor layer 102 and electrically connected to the transparent electrode 301, and the electrode 302 is directly in contact with the second type semiconductor layer 102, thereby preventing the electrode from peeling and improving stability of the products. The transparent electrode has high light transmittance ratio, which can improve the light emitting efficiency of the micro light emitting diode. The Micro-LED device further includes an electrode extension part 303 located above the transparent electrode 301 and electrically connected to the electrode 302.

The first current limiting area 201 is formed through ion implantation technique. Ion implantation can increase sidewall flatness and improve stability of the products.

The second current blocking area 502 and the third current blocking area 503 may be composed of dielectric material.

The width of the electrode extension part 303 may be less than the width of the third current blocking area 503.

The width of the first current limiting area 201 may be greater than or equal to 1 micrometer.

The second current blocking area 502 may have a hollow ring shape and a hollow width O2, wherein the hollow width O2 is greater than or equal to 1 micrometer.

The second current blocking area 502 may be located in the middle of the second type semiconductor layer 102.

Yet another Micro-LED device according to an embodiment of the invention includes a first type semiconductor layer 101, a second type semiconductor layer 102, a light emitting layer 103 located between the first type semiconductor layer 101 and the second type semiconductor layer 102, a first current blocking area 501 located at a periphery of the second type semiconductor layer 102 and on the sidewall region of the second type semiconductor layer 102, a second current limiting area 202 surrounded by the first current blocking area 501, and a third current blocking area 503 surrounded by the first current blocking area 501 and in contact with the second current limiting area 202, wherein a shortest distance between the first current blocking area 501 and the second current limiting area 202 is equal to or less than 50 micrometers, and a periphery perimeter of the first current blocking area 501 is equal to or less than 400 micrometers.

According to the structure of the Micro-LED device, the beneficial effects can be as following:

(1) The first current blocking area 501 can reduce sidewall leakage current and improve the light emitting efficiency of the micro light emitting diode.

(2) The second current limiting area 202 can improve the uniformity of current distribution and improve the light emitting efficiency of the micro light emitting diode.

(3) The third current blocking area 503 can improve the uniformity of current distribution and improve the light emitting efficiency of the micro light emitting diode.

(4) The peripheral perimeter is less than 400 micrometers and therefore the size scale of the micro light emitting diode can be met, thereby having various advantages of the micro light emitting diode.

The first current blocking area 501 may at least cover the sidewall of the first type semiconductor layer 101, the sidewall of the second type semiconductor layer 102, and the sidewall of the light emitting layer 103.

The Micro-LED device may further include a transparent electrode 301 located above the second type semiconductor layer 102 and electrically connected to the second type semiconductor layer 102, and the transparent electrode 301 covers the first current blocking area 501, the second current limiting area 202 and the third current blocking area 503. The transparent electrode has high light transmittance ratio, thereby improving the light emitting efficiency of the micro light emitting diode. In such condition, the Micro-LED device further includes an electrode 302 located above the second type semiconductor layer 102 and electrically connected to the transparent electrode 301, and the electrode 302 is directly in contact with the second current limiting area 202, thereby preventing the electrode from peeling and improving stability of the products. The Micro-LED device further includes an electrode extension part 303 located above the transparent electrode 301 and electrically connected to the electrode 302.

The second current limiting area 202 may be formed through ion implantation technique. Ion implantation can increase surface flatness, thereby improving stability of the products.

The first current blocking area 501 and the third current blocking area 503 may be composed of dielectric material.

The width of the electrode extension part 303 may be less than the width of the third current blocking area 503.

The width of the first current blocking area 501 may be greater than or equal to 1 micrometer.

The second current limiting area 202 may be located in the middle of the second type semiconductor layer 102.

Yet another Micro-LED device according to an embodiment of the invention includes a first type semiconductor layer 101, a second type semiconductor layer 102, a light emitting layer 103 located between the first type semiconductor layer 101 and the second type semiconductor layer 102, a first current blocking area 501 located at a periphery of the second type semiconductor layer 102 and on the sidewall region of the second type semiconductor layer 102, a second current limiting area 202 surrounded by the first current blocking area 501, and a third current limiting area 203 surrounded by the first current blocking area 501 and in contact with the second current limiting area 202, wherein a shortest distance between the first current blocking area 501 and the second current limiting area 202 is equal to or less than 50 micrometers, and a peripheral perimeter of the first current blocking area 501 is equal to or less than 400 micrometers.

According to the structure of the Micro-LED device, the beneficial effects can be as following:

(1) The first current blocking area 501 can reduce sidewall leakage current and improve the light emitting efficiency of the micro light emitting diode.

(2) The second current limiting area 202 can improve the uniformity of current distribution and improve the light emitting efficiency of the micro light emitting diode.

(3) The third current limiting area 203 can improve the uniformity of current distribution and improve the light emitting efficiency of the micro light emitting diode.

(4) The peripheral perimeter is less than 400 micrometers and therefore the size scale of the micro light emitting diode can be met, thereby having various advantages of the micro light emitting diode.

The first current blocking area 501 at least covers the sidewall of the first type semiconductor layer 101, the sidewall of the second type semiconductor layer 102 and the sidewall of the light emitting layer 103.

The Micro-LED device may further include a transparent electrode 301 located above the second type semiconductor layer 102 and electrically connected to the second type semiconductor layer 102, and the transparent electrode 301 covers the first current blocking area 501 and the third current limiting area 203. In such condition, the Micro-LED device may further include an electrode 302 located above the second type semiconductor layer 102 and electrically connected to the transparent electrode 301, and the electrode 302 is directly in contact with the second current limiting area 202, thereby preventing the electrode from peeling and improving stability of the products. The transparent electrode has high light transmittance ratio, and therefore the light emitting efficiency of the micro light emitting diode can be improved. The Micro-LED device may further include an electrode extension part 303 located above the transparent electrode 301 and electrically connected to the electrode 302.

The second current limiting area 202 and the third current limiting area 203 are formed through ion implantation technique. Ion implantation can increase sidewall flatness and stability of products. Ion implantation can further increase surface flatness, which can also improve stability of products.

The first current blocking area 501 may be composed of dielectric material.

The width of the first current blocking area 501 is greater than or equal to 1 micrometer.

The second current limiting area 202 may be located in the middle of the second type semiconductor layer 102.

The second current limiting area 202 has a second depth D2, the third current limiting area 203 has a third depth D3, and the second depth D2 may be equal to the third depth D3.

The second current limiting area 202 may be located in the middle of the second type semiconductor layer 102.

The first current blocking area 501 covering the sidewall region has a thickness H1, and the first current blocking area 501 covering the upper surface region has a thickness H2, wherein the thickness H1 may be greater than, less than or equal to the thickness H2. The first current blocking area 501 may expose a transparent electrode that is positioned above the second type semiconductor layer 102 and electrically connected to the second type semiconductor layer 102.

Yet another Micro-LED device according to an embodiment of the invention includes a first type semiconductor layer 101, a second type semiconductor layer 102, a light emitting layer 103 located between the first type semiconductor layer 101 and the second type semiconductor layer 102, a first current blocking area 501 located at a periphery of the second type semiconductor layer 102 and on the sidewall region of the second type semiconductor layer 102, a second current blocking area 502 surrounded by the first current blocking area 501, and a third current blocking area 503 surrounded by the first current blocking area 501 and in contact with the second current blocking area 502, wherein a shortest distance between the first current blocking area 501 and the second current blocking area 502 is equal to or less than 50 micrometers, and a peripheral perimeter of the first current blocking area 501 is equal to or less than 400 micrometers.

According to the above-mentioned structure of the Micro-LED device, the beneficial effects can be as following:

(1) The first current blocking area 501 can reduce sidewall leakage current and improve the light emitting efficiency of the micro light emitting diode.

(2) The second current blocking area 502 can improve the uniformity of current distribution and improve the light emitting efficiency of the micro light emitting diode.

(3) The third current blocking area 503 can improve the uniformity of current distribution and improve the light emitting efficiency of the micro light emitting diode.

(4) The peripheral perimeter is less than 400 micrometers and therefore the size scale of the micro light emitting diode cab be met, thereby having various advantages of the micro light emitting diode.

The first current blocking area 501 may at least cover the sidewall of the first type semiconductor layer 101, the sidewall of the second type semiconductor layer 102 and the sidewall of the light emitting layer 103.

The Micro-LED device may further include a transparent electrode 301 located above the second type semiconductor layer 102 and electrically connected to the second type semiconductor layer 102, and the transparent electrode 301 covers the first current blocking area 501, the second current blocking area 502 and the third current blocking area 503. In such condition, an electrode 302 may be further included. The electrode 302 is located above the second type semiconductor layer 102 and electrically connected to the transparent electrode 301, and the electrode 302 is directly in contact with the second type semiconductor layer 102, thereby preventing the electrode from peeling and improving stability of the products. The transparent electrode has high light transmittance ratio, thereby improving the light emitting efficiency of the micro light emitting diode. An electrode extension part 303 may be further included. The electrode extension part 303 is located above the transparent electrode 301 and electrically connected to the electrode 302, wherein the width of the electrode extension part 303 is less than the width of the third current blocking area 503.

The first current blocking area 501, the second current blocking area 502 and the third current blocking area 503 may be composed of dielectric material.

The width of the first current blocking area 501 is greater than or equal to 1 micrometer.

The second current blocking area 502 may have a hollow ring shape and a hollow width O2, wherein the hollow width O2 is greater than or equal to 1 micrometer.

The second current blocking area 502 may be located in the middle of the second type semiconductor layer 102.

Yet another Micro-LED device according to an embodiment of the invention includes a first type semiconductor layer 101, a second type semiconductor layer 102, a light emitting layer 103 located between the first type semiconductor layer 101 and the second type semiconductor layer 102, a first current blocking area 501 located at a periphery of the second type semiconductor layer 102 and on the sidewall region of the second type semiconductor layer 102, a second current blocking area 502 surrounded by the first current blocking area 501, and a third current limiting area 203 surrounded by the first current blocking area 501 and in contact with the second current blocking area 502, wherein a shortest distance between the first current blocking area 501 and the second current blocking area 502 is equal to or less than 50 micrometers, and a peripheral perimeter of the first current blocking area 501 is equal to or less than 400 micrometers.

The structure of the Micro-LED device has the following beneficial effects:

(1) The first current blocking area 501 can reduce sidewall leakage current and improve the light emitting efficiency of the micro light emitting diode.

(2) The second current blocking area 502 can improve the uniformity of current distribution and improve the light emitting efficiency of the micro light emitting diode.

(3) The third current limiting area 203 can improve the uniformity of current distribution and improve the light emitting efficiency of the micro light emitting diode.

(4) The peripheral perimeter is less than 400 micrometers, thereby having various advantages of the micro light emitting diode.

The first current blocking area 501 at least covers the sidewall of the first type semiconductor layer 101, the sidewall of the second type semiconductor layer 102 and the sidewall of the light emitting layer 103.

The Micro-LED device further includes a transparent electrode 301 located above the second type semiconductor layer 102 and electrically connected to the second type semiconductor layer 102, and the transparent electrode 301 covers the first current blocking area 501, the second current blocking area 502 and the third current limiting area 203. In such condition, an electrode 302 is further included, which is located above the second type semiconductor layer 102 and electrically connected to the transparent electrode 301, and the electrode 302 is directly in contact with the second type semiconductor layer 102, thereby preventing the electrode from peeling and improving stability of the products. The transparent electrode has high light transmittance ratio, thereby improving the light emitting efficiency of the micro light emitting diode. An electrode extension part 303 is further included, which is located above the transparent electrode 301 and electrically connected to the electrode 302. The first current blocking area 501, the second current blocking area 502 and the third current blocking area 503 are composed of dielectric material such as silicon oxide (SiO2), silicon nitride (Si3N4), aluminum oxide (Al2O3), yttrium oxide (Y2O3), titanium oxide (TiO2), hafnium oxide (HfO2), zirconium oxide (ZrO2), barium zirconate (BaZrO3), barium titanate (BaTiO3), tantalum pentoxide (Ta2O5) and Silica.

The first current blocking area 501 and the third current blocking area 503 are composed of dielectric material.

The third current limiting area 203 is formed through ion implantation technique. Ion implantation can increase surface flatness and improve stability of the products.

The width of the first current blocking area 501 is greater than or equal to 1 micrometer.

The second current blocking area 502 may have a hollow ring shape and a hollow width O2, wherein the hollow width O2 is greater than or equal to 1 micrometer.

The second current blocking area 502 is located in the middle of the second type semiconductor layer 102.

A Micro-LED device includes a first type semiconductor layer 101, a second type semiconductor layer 102, a light emitting layer 103 located between the first type semiconductor layer 101 and the second type semiconductor layer 102, a first current blocking area 501 located at a periphery of the second type semiconductor layer 102 and on the sidewall region of the second type semiconductor layer 102, and a second current blocking area 502 surrounded by the first current blocking area 501, wherein a shortest distance between the first current blocking area 501 and the second current blocking area 502 is equal to or less than 50 micrometers, and a peripheral perimeter of the first current blocking area 501 is equal to or less than 400 micrometers.

The beneficial effects are:

(1) The first current blocking area 501 can reduce sidewall leakage current and improve the light emitting efficiency of the micro light emitting diode.

(2) The second current blocking area 502 can improve the uniformity of current distribution and improve the light emitting efficiency of the micro light emitting diode.

(3) The peripheral perimeter is less than 400 micrometers and therefore the size scale of the micro light emitting diode can be met, thereby having various advantages of the micro light emitting diode.

The first current blocking area 501 at least covers the sidewall of the first type semiconductor layer 101, the sidewall of the second type semiconductor layer 102 and the sidewall of the light emitting layer 103.

The Micro-LED device may further include a transparent electrode 301 located above the second type semiconductor layer 102 and electrically connected to the second type semiconductor layer 102, and the transparent electrode 301 covers the first current blocking area 501 and the second current blocking area 502. In such condition, an electrode 302 may be further included, which is located above the second type semiconductor layer 102 and electrically connected to the transparent electrode 301, and the electrode 302 is directly in contact with the second type semiconductor layer 102, thereby preventing the electrode from peeling and improving the stability of the products. The transparent electrode has high light transmittance ratio, thereby improving the light emitting efficiency of the micro light emitting diode. An electrode extension part 303 may be further included, which is located above the transparent electrode 301 and electrically connected to the electrode 302. The first current blocking area 501 covering the sidewall region has a first thickness H1, the first current blocking area 501 covering the upper surface region has a second thickness H2, the second current blocking area 502 has a third thickness H3, and the third current blocking area 503 has a fourth thickness H4, wherein the first thickness H1 is greater than or equal to the second thickness H2, greater than or equal to the third thickness H3, and greater than or equal to the fourth thickness H4. Alternatively, the first current blocking area 501 covering the sidewall region has a first thickness H1, the first current blocking area 501 covering the upper surface region has a second thickness H2, the second current blocking area 502 has a third thickness H3, and the third current blocking area 503 has a fourth thickness H4, wherein the first thickness H1 is less than or equal to the second thickness H2, less than or equal to the third thickness H3, and less than or equal to the fourth thickness H4.

The Micro-LED device may further include a third current blocking area 503 surrounded by the first current blocking area 501 and in contact with the second current blocking area 502. The third current blocking area 503 can improve the uniformity of current distribution, thereby improving the light emitting efficiency of the micro light emitting diode. In such condition, the micro light emitting diode may further include a transparent electrode 301 located above the second type semiconductor layer 102 and electrically connected to the second type semiconductor layer 102, and the transparent electrode 301 covers the first current blocking area 501, the second current blocking area 502 and the third current blocking area 503. An electrode 302 may further be included, which is located above the second type semiconductor layer 102 and electrically connected to the transparent electrode 301, and the electrode 302 is directly in contact with the second type semiconductor layer 102. An electrode extension part 303 may be further included, which is located above the transparent electrode 301 and electrically connected to the electrode 302, wherein the width of the electrode extension part 303 is less than the width of the third current blocking area 503.

The first current blocking area 501, the second current blocking area 502 and the third current blocking area 503 may be composed of dielectric material.

The width of the first current blocking area 501 may be greater than or equal to 1 micrometer.

The second current blocking area 502 may have a hollow ring shape and a hollow width O2, wherein the hollow width O2 is greater than or equal to 1 micrometer.

The second current blocking area 502 may be located in the middle of the second type semiconductor layer 102.

The first current blocking area 501 covering the sidewall region has a first thickness H1, and the first current blocking area 501 covering the upper surface region has a second thickness H2, wherein the first thickness H1 is greater than or equal to the second thickness H2. Optionally, the first current blocking area 501 covering the sidewall region has a first thickness H1, and the first current blocking area 501 covering the upper surface region has a second thickness H2, wherein the first thickness H1 is less than the second thickness H2.

The first current blocking area 501 covering the sidewall region has a first thickness H1, the first current blocking area 501 covering the upper surface region has a second thickness H2, and the second current blocking area 502 has a third thickness H3, wherein the first thickness H1 is greater than or equal to the second thickness H2 and greater than or equal to the third thickness H3. Alternatively, the first current blocking area 501 covering the sidewall region has a first thickness H1, the first current blocking area 501 covering the upper surface region has a second thickness H2, and the second current blocking area 502 has a third thickness H3, wherein the first thickness H1 is less than the second thickness H2 and less than the third thickness H3.

The first current blocking area 501 exposes a transparent electrode 301 which is located above the second type semiconductor layer 102 and electrically connected to the second type semiconductor layer 102. The second current blocking area 502 exposes an electrode 302 which is located above the second type semiconductor layer 102 and electrically connected to the transparent electrode 301, and the electrode 302 is directly in contact with the second current limiting area 202. Alternatively, the second current blocking area 502 exposes an electrode 302 which is located above the second type semiconductor layer 102 and electrically connected to the second type semiconductor layer 102.

The light emitting efficiency of the above-mentioned micro light emitting diode is greater than 250 lumens per watt (lm/W).

The reveal ability to red, R9, of the color rendering index (CRI) of the above-mentioned micro light emitting diode is greater than 90.

The CRI of the above-mentioned micro light emitting diode is greater than 90.

The general CRI Ra of the above-mentioned micro light emitting diode is greater than 90.

A further Micro-LED device according to an embodiment of the invention includes a first type semiconductor layer 101, a second type semiconductor layer 102, a light emitting layer 103 located between the first type semiconductor layer 101 and the second type semiconductor layer 102, and a sidewall current limiting area 201 directly in contact with the periphery sidewall regions of the second type semiconductor layer 102, the light emitting layer 103 and the first type semiconductor layer 102, wherein the sidewall current limiting area 201 further includes an upper surface 201-up, a bottom surface 101-down, an outer surface 201-out, and an inner surface 201-in. The upper surface 201-up of the sidewall current limiting area 201 and the upper surface 102-up of the second type semiconductor layer 102 are coplanar, and the outmost periphery perimeter of the vertical projection of the first current limiting area 201 is equal to or less than 400 micrometers.

The beneficial effects of the Micro-LED device is as following:

(1) The sidewall current limiting area 201 can reduce sidewall leakage current and improve the light emitting efficiency of the micro light emitting diode.

(2) The peripheral perimeter is less than 400 micrometers, which meets the size scale of the micro light emitting diode, thereby having various advantages of the micro light emitting diode.

The bottom surface 201-down of the sidewall current limiting area 201 and the bottom surface 101-down of the first type semiconductor layer 101 are coplanar.

The vertical projection of the upper surface 201-up of the sidewall current limiting area 201 has an upper surface width T-up, the vertical projection of the bottom surface 201-down of the sidewall current limiting area 201 has a bottom surface width T-down, and the upper surface width T-up is greater than the bottom surface width T-down. Alternatively, the vertical projection of the upper surface 201-up of the sidewall current limiting area 201 has an upper surface width T-up, the vertical projection of the bottom surface 201-down of the sidewall current limiting area 201 has a bottom surface width T-down, and the upper surface width T-up is less than the bottom surface width T-down.

The vertical projection of the upper surface 201-up of the sidewall current limiting area 201 may be partially overlapped with the vertical projection of the bottom surface 201-down of the sidewall current limiting area 201.

The outer surface 201-out of the sidewall current limiting area 201 has a sidewall length DS, the inner surface 201-in of the sidewall current limiting area 201 has a first depth D1, wherein the sidewall length DS is equal to the first depth D1. Alternatively, the outer surface 201-out of the sidewall current limiting area 201 has a sidewall length DS, the inner surface 201-in of the sidewall current limiting area 201 has a first depth D1, wherein the sidewall length DS is greater than the first depth D1.

The upper surface 201-up of the sidewall current limiting area 201 and the outer surface 201-out of the sidewall current limiting area 201 have a first included angle Θ1, the upper surface 201-up of the sidewall current limiting area 201 and the inner surface 201-in of the sidewall current limiting area 201 have a second included angle Θ2, wherein the first included angle Θ1 and the second included angle Θ2 are right angle (90°) or close to right angle, obtuse angle (greater than 90°), or acute angle (less than 90°) respectively.

The sidewall current limiting area 201 located at the sidewall region of the first type semiconductor layer has a first lateral width T1A, the sidewall current limiting area 201 located at the sidewall region of the light emitting layer has a second lateral width T1B, and the sidewall current limiting area 201 located at the sidewall region of the second type semiconductor layer has a third lateral width T1C. In this case, the vertical projection of the first lateral width T1A is partially overlapped with the vertical projections of the second lateral width T1B and the third lateral width T1C, wherein the width of the vertical projection of the first lateral width T1A is greater than the width of the vertical projection of the third lateral width T1C. Alternatively, the width of the vertical projection of the first lateral width T1A is less than the width of the vertical projection of the third lateral width T1C. Alternatively, the width of the vertical projection of the first lateral width T1A is equal to the width of the vertical projection of the third lateral width T1C.

In the above-mentioned displays, a preferable effect of reducing sidewall leakage current can be achieved by controlling the depth of the sidewall current limiting area, and therefore the light emitting efficiency of the micro light emitting diode can be improved.

The Micro-LED device may further include a second current limiting area 202 which is surrounded by the sidewall current limiting area, wherein the shortest distance between the sidewall current limiting area 201 and the second current limiting area 202 is equal to or less than 50 micrometers. The second current limiting area 202 can improve the uniformity of current distribution, and the light emitting efficiency of the micro light emitting diode can be improved. The upper surface 102-up of the second type semiconductor layer 102, the upper surface 201-up of the sidewall current limiting area 201 and the upper surface 202-up of the second current limiting area 202 are coplanar.

In this case, the Micro-LED device may further include a third current limiting area 203 which is located between the sidewall current limiting area 201 and the second current limiting area 202 and in contact with the second current limiting area 202. The upper surface 203-up of the third current limiting area 203 and the upper surface 201-up of the sidewall current limiting area 201 are coplanar. The second current limiting area 202 has a second depth D2, the third current limiting area 203 has a third depth D3, and the second depth D2 is equal to the third depth D3. The Micro-LED device may further include a transparent electrode 301 which is located above the second type semiconductor layer 102 and electrically connected to the second type semiconductor layer 102, and the transparent electrode 301 covers the upper surface 201-up of the sidewall current limiting area 201 and the upper surface 203-up of the third current limiting area 203. In such case, the Micro-LED device may further include an electrode 302 which is located above the second type semiconductor layer 102 and electrically connected to the transparent electrode 301, and the electrode 302 is directly in contact with the second current limiting area 202. The Micro-LED device may further include an electrode extension part 303 located above the transparent electrode 301 and electrically connected to the electrode 302. The second current limiting area 202 may be located in the middle of the second type semiconductor layer 102.

The Micro-LED device may further include a transparent electrode 301 which is located above the second type semiconductor layer 102 and electrically connected to the second type semiconductor layer 102, and the transparent electrode 301 covers the upper surface 201-up of the sidewall current limiting area 201. In such case, the Micro-LED device may further include an electrode 302 located above the second type semiconductor layer 102 and electrically connected to the transparent electrode 301, and the electrode 302 is directly in contact with the second current limiting area 202, so as to prevent the electrode from peeling and improve stability of the products. Transparent electrode has high light transmittance ratio, thus the light emitting efficiency of the micro light emitting diode can be improved. The Micro-LED device may further include an electrode extension part 303 located above the transparent electrode 301 and electrically connected to the electrode 302.

The sidewall current limiting area 201, the second current limiting area 202 and the third current limiting area 203 may be formed through ion implantation technique. Ion implantation technique can increase surface flatness and improve stability of the products.

Besides, the sidewall current limiting area 201, the second current limiting area 202 and the third current limiting area 203 may be formed through diffusion technique or thin film deposition technique.

The upper surface of the sidewall current limiting area has a first width T-up greater than or equal to 1 micrometer.

The light emitting layer includes single-layer quantum well structure or multi-layer quantum well structure.

Optionally, the light emitting layer includes single-layer quantum wire structure or multi-layer quantum wire structure.

Optionally, the light emitting layer includes single layer quantum dot structure or multi-layer quantum dot structure.

The Micro-LED device may further include a back electrode 304 located below the first type semiconductor layer and electrically connected to the first type semiconductor layer.

The sidewall current limiting area 201, the second current limiting area 202 and/or the third current limiting area 203 may be formed through metal organic chemical vapor phase deposition (MOCVD) epitaxy regrowth technique.

Optionally, the sidewall current limiting area 201, the second current limiting area 202 and/or the third current limiting area 203 may be formed through molecular beam epitaxy (MBE) of epitaxy regrowth technique.

Optionally, the sidewall current limiting area 201, the second current limiting area 202 and/or the third current limiting area 203 may be formed through atomic layer chemical vapor deposition system (ALD) technique.

Optionally, the sidewall current limiting area 201, the second current limiting area 202 and/or the third current limiting area 203 may be formed through laser surface modification technique.

The upper surface 201-up of the sidewall current limiting area 201 and the outer surface 201-out of the sidewall current limiting area 201 have a first included angle $\Theta 1$, the upper surface 201-up of the sidewall current limiting area 201 and the inner surface 201-in of the sidewall current limiting area 201 have a second included angle $\Theta 2$, the first included angle $\Theta 1$ is an acute angle which is less than 90 degrees, and the second included angle $\Theta 2$ is an obtuse angle which is greater than 90 degrees.

Alternatively, the upper surface 201-up of the sidewall current limiting area 201 and the outer surface 201-out of the sidewall current limiting area 201 have a first included angle $\Theta 1$, the upper surface 201-up of the sidewall current limiting area 201 and the inner surface 201-in of the sidewall current limiting area 201 have a second included angle $\Theta 2$, the first included angle $\Theta 1$ is an obtuse angle which is greater than 90 degrees, and the second included angle $\Theta 2$ is an acute angle which is less than 90 degrees.

The sidewall current limiting area 201, the second current limiting area 202 and/or the third current limiting area 203 may be formed through selective oxidation technique.

Optionally, the sidewall current limiting area 201, the second current limiting area 202 and/or the third current limiting area 203 may be formed through thermal oxidation technique.

Optionally, the sidewall current limiting area 201, the second current limiting area 202 and/or the third current limiting area 203 may be formed through wet thermal oxidation technique.

The fabrication method of a Micro-LED device according to an embodiment of the invention includes forming the above-mentioned micro light emitting diodes on a growth substrate 100, wherein the steps of forming the micro light emitting diodes includes: forming an electrode electrically connected to the second type semiconductor layers; bonding the micro light emitting diodes to a test substrate; removing the growth substrate;

forming another electrode electrically connected to the first type semiconductor layers; providing a voltage source to perform electroluminescence (EL) test to each of the micro light emitting diodes, and recording the positions of the abnormal micro light emitting diodes; performing a first selectively removing process to selectively remove the abnormal micro light emitting diodes and leaving the micro light emitting diodes passing the test on the test substrate; performing a first transferring process to transfer the micro light emitting diodes passing the test to a permanent substrate and remain the vacancy of the removed abnormal micro light emitting diodes on the permanent substrate; and performing a second transferring process to transfer micro light emitting diodes to fill the vacancy on the permanent substrate.

The abnormal micro light emitting diodes can be removed by performing a massive test in advance before massive transfer, thereby improving the yields of massive transfer, such that extra cost of repairing after massive transfer can be saved.

A sacrificing layer (700) shown in FIG. 18-6, FIG. 19-6 or FIG. 37-6 may be further included. The micro light emitting diodes can be bonded to the test substrate through the sacrificing layer. The first selectively removing process to remove the abnormal micro light emitting diodes can be carried out by introducing a laser to adjust the adhesiveness of the sacrificing layer, so as to remove the abnormal micro light emitting diodes from the test substrate. The first transferring process may be carried out by introducing a laser to adjust the adhesiveness of the sacrificing layer, so as to transfer the micro light emitting diodes from the test substrate to the permanent substrate. The second transferring process can be carried out by introducing a laser to adjust the adhesiveness of the sacrificing layer, so as to transfer the micro light emitting diodes from the test substrate to the permanent substrate. By adopting the laser to adjust the adhesiveness of the sacrificing layer, the rate of massive transfer can be improved, production cost can be reduced, and the yields can be improved.

The micro light emitting diodes transferred in the first transferring process and the micro light emitting diodes transferred in the second transferring process may come from the same growth substrate or from different growth substrates.

The advantages of the above-mentioned fabrication method include:

(1) The chips from the same epitaxial wafer has similar wavelengths, which can increase the rate of massive transfer.

(2) Waste of the chip materials can be reduced, utility rate of the source chips can be increased, and production cost can be reduced.

The fabrication method of the above-mentioned Micro-LED device may include adopting a magnetic bonding layer to temporarily bond the micro light emitting diodes to the test substrate. In such condition, the first selectively removing process to the abnormal micro light emitting diodes may be carried out by adjusting the magnetic force of the magnetic bonding layer, so as to remove the abnormal micro light emitting diodes from the test substrate. The first transferring process may be carried out by adjusting the magnetic force of the magnetic bonding layer, so as to transfer the micro light emitting diodes from the test substrate to the permanent substrate. The second transferring process may be carried out by adjusting the magnetic force of the magnetic bonding layer, so as to transfer the micro light emitting diodes from the test substrate to the permanent substrate. By adopting the magnetic bonding layer, the rate and yields of testing and transferring can be improved, and production cost can be reduced.

Optionally, the fabrication method of the Micro-LED device may include adopting a vacuum adsorption layer to bond the micro light emitting diodes to the test substrate. In such case, the first selectively removing process for selectively removing the abnormal micro light emitting diodes can be carried out by adjusting the suction of the vacuum adsorption layer, such that the abnormal micro light emitting diodes can be removed from the test substrate. The first transferring process can be carried out by adjusting the suction of the vacuum adsorption layer, such that the micro light emitting diodes can be transferred from the test substrate to the permanent substrate. The second transferring process can be carried out by adjusting the suction of the vacuum adsorption layer, such that the micro light emitting diodes can be transferred from the test substrate to the permanent substrate. By adopting the vacuum adsorption layer, the rate and yields of testing and transferring can be improved, and production cost can be reduced.

Optionally, the fabrication method of the Micro-LED device may include adopting an electrostatic adsorption layer to bond the micro light emitting diodes to the test substrate. In such case, the first selectively removing process for selectively removing the abnormal micro light emitting diodes can be carried out by adjusting the electrostatic force of the electrostatic adsorption layer, such that the abnormal micro light emitting diodes can be removed from the test substrate. The first transferring process can be carried out by adjusting the electrostatic force of the electrostatic adsorption layer, such that the micro light emitting diodes can be transferred from the test substrate to the permanent substrate. The second transferring process can be carried out by adjusting the electrostatic force of the electrostatic adsorption layer, such that the micro light emitting diodes can be transferred from the test substrate to the permanent substrate. By adopting the electrostatic adsorption layer, the rate and yields of testing and transferring can be improved, and production cost can be reduced.

Optionally, the fabrication method of the Micro-LED device may include adopting an adhesion layer to bond the micro light emitting diodes to the test substrate. In such case, the first selectively removing process for removing the abnormal micro light emitting diodes can be carried out by adjusting the adhesion of the adhesion layer, such that the abnormal micro light emitting diodes can be removed from the test substrate. The first transferring process can be achieved by adjusting the adhesion of the adhesion layer, such that the micro light emitting diodes can be transferred from the test substrate to the permanent substrate. The second transferring process of can be carried out by adjusting the adhesion of the adhesion layer, such that the micro light emitting diodes can be transferred from the test substrate to the permanent substrate. By adopting the adhesion layer, the rate and yields of testing and transferring can be improved, and production cost can be reduced.

The above-mentioned fabrication method of the Micro-LED device includes the following features: the first selectively removing process to the abnormal micro light emitting diodes has a first removal rate; the first transferring process for transferring the micro light emitting diodes passing the test to the permanent substrate has a first transfer rate; and the second transferring process for filling the vacancy on the permanent substrate has a second transfer rate; wherein the first transfer rate is greater than the second transfer rate, and the first removal rate is greater than or equal to the second transfer rate.

The above-mentioned fabrication method of the Micro-LED device may further adopt the following methods: the first transferring process for transferring the micro light emitting diodes passing the test to the permanent substrate has a first transfer rate; and the second transferring process for filling the vacancy on the permanent substrate has a second transfer rate; wherein the first transfer rate is greater than the second transfer rate. By controlling the transfer rate and the removal rate, the yields of massive transfer can be improved, and production cost can be reduced.

According to the fabrication method of Micro-LED device, the micro light emitting diodes on the growth substrate 100 have a first pitch P1; the micro light emitting diodes on the permanent substrate 820 have a second pitch P2; and the second pitch P2 is greater than or equal to the first pitch P1.

Subsequent production cost can be reduced by controlling the transfer pitch.

In the above-mentioned fabrication method of Micro-LED device, the micro light emitting diodes at least include an array structure composed of red LEDs, green LEDs and blue LEDs. In such case, the fabrication method further includes: forming a wall structure 850 located between adjacent micro light emitting diodes; and forming a light-transmissive adhesive F covering the micro light emitting diodes. The wall structure 850 can improve the display contrast of the micro-LED display.

The micro light emitting diodes at least include an array structure composed of ultraviolet LEDs.

The above-mentioned fabrication method of the Micro-LED device further includes:

forming a wall structure 850 located between the adjacent micro light emitting diodes; forming a first phosphor with adhesive F1 covering one or more of the micro light emitting diodes, wherein the first phosphor with adhesive F1 is excited by the micro light emitting diodes to emit red light; forming a second phosphor with adhesive F2 covering one or more of the micro light emitting diodes, wherein the second phosphor with adhesive F2 is excited by the micro light emitting diodes to emit blue light; and forming a third phosphor with adhesive F3 covering one or more of the micro light emitting diodes, wherein the third phosphor with adhesive F3 is excited by the micro light emitting diodes to emit green light.

The micro light emitting diodes at least include an array structure composed of blue LEDs.

Optionally, the above-mentioned fabrication method of the Micro-LED device further includes: forming a wall structure 850 located between the adjacent micro light emitting diodes; forming a first light-transmissive adhesive F covering one or more of the micro light emitting diodes, wherein blue light is emitted from the micro light emitting diodes which penetrates the first light-transmissive adhesive F; forming a first phosphor with adhesive F1 covering one or more of the micro light emitting diodes, wherein the first phosphor with adhesive F1 is excited by the micro light emitting diodes to emit red light; and forming a third phosphor with adhesive F3 covering one or more of the micro light emitting diodes, wherein the third phosphor with adhesive F3 is excited by the micro light emitting diodes to emit green light.

The light emitting efficiency of the micro light emitting diodes is greater than 250 lm/W.

The reveal ability to red, R9, of the color rendering index (CRI) of the micro light emitting diode is greater than 90.

The CRI of the micro light emitting diodes is greater than 90.

The general CRI Ra of the micro light emitting diodes is greater than 90.

The permanent substrate 820 is a flexible substrate, wherein the material of the flexible substrate may include ultra-thin glass, metal foil, fiber-reinforced composite material, plastic film, ceramic substrate or a combination of any two or more of the above-mentioned materials. The flexible substrate can be applied in flexible display. Preferably, the coefficient of thermal expansion (CTE) of the metal foil is similar to CTE of the thin glass. The light transmittance of the plastic film is greater than 90% under a wavelength of 550 nanometers. The material of the plastic film may for example include polyethylene terephthalate (PET), polyethylene naphthalate (PEN) or polyethersulfone (PES). The fiber-reinforced composite material may for example include carbon fibers, silicon carbide fibers or boron filament.

The preferred thickness of the flexible substrate is less than 200 micrometers, the more preferred thickness of the flexible substrate is less than 50 micrometers, and the best thickness of the flexible substrate is in a range from 25 micrometers to 50 micrometers.

The metal foil may for example include stainless steel, aluminum, nickel, titanium, zirconium, copper, iron, cobalt, palladium or a combination of any two or more of the above-mentioned materials.

The surface roughness Ra of the metal foil is less than 10 nanometers.

The permanent substrate 820 may be a transparent substrate, and the transparent substrate may for example be formed of normal glass, hard glass, quartz, ceramic or plastic.

The fabrication method of another Micro-LED device according to an embodiment of the invention includes forming the above-mentioned micro light emitting diodes on a growth substrate, wherein the steps of forming the micro light emitting diodes includes: forming an electrode electrically connected to the second type semiconductor layer; bonding the micro light emitting diodes to a test substrate; removing the growth substrate; forming another electrode electrically connected to the first type semiconductor layer; providing a voltage source to perform electroluminescence (EL) test to each of the micro light emitting diodes, and recording the positions of the abnormal micro light emitting diodes; performing a first selectively removing process to remove the abnormal micro light emitting diodes and leave the micro light emitting diodes passing the test on the test substrate; performing a first transferring process to transfer the micro light emitting diodes passing the test to a first container; the first container includes a first liquid covering the micro light emitting diodes; and performing a second transferring process to transfer the micro light emitting diodes to a receiving substrate.

The beneficial effects of the fabrication method are as following:

(1) Repairing cost after transferring process can be saved by performing electroluminescence test to each of the micro light emitting diodes before transferring.

(2) Fluid transfer has advantages such as low cost and high transfer rate.

The second transferring process can be carried out by adjusting the flow rate of the first liquid so as to transfer the micro light emitting diodes to the receiving substrate.

The second transferring process can also be carried out by adjusting the viscosity of the first liquid so as to transfer the micro light emitting diodes to the receiving substrate.

The second transferring process can also be carried out by adjusting substrate capturing rate so as to transfer the micro light emitting diodes to the receiving substrate. Massive transfer can be achieved by controlling the flow rate and viscosity of the liquid and adjusting the substrate capturing rate.

The fabrication method of the Micro-LED device further includes providing a sacrificing layer 700 as shown in FIG. 18-6, FIG. 19-6 or FIG. 37-6 for bonding the micro light emitting diodes to the test substrate through the sacrificing layer. In such case, the first selectively removing process to remove the abnormal micro light emitting diodes can be carried out by introducing a laser to adjust the adhesiveness of the sacrificing layer, so as to remove the abnormal micro light emitting diodes from the test substrate. The first transferring process can be carried out by introducing a laser to adjust the adhesiveness of the sacrificing layer, so as to transfer the micro light emitting diodes from the test substrate to the first container. By adopting the sacrificing layer and laser, the rate and yields of testing and transferring can be improved, and production cost can be reduced.

The micro light emitting diodes transferred in the first transferring process and the micro light emitting diodes transferred in the second transferring process come from the same growth substrate. Alternatively, the micro light emitting diodes transferred in the first transferring process and the micro light emitting diodes transferred in the second transferring process come from different growth substrates.

The advantages of the above-mentioned method are as following:

(1) The chips from the same epitaxial wafer has a similar wavelength, which can increase the rate of massive transfer.

(2) Waste of the chip materials can be reduced, utility rate of the source chip can be increased, and production cost can be reduced.

The fabrication method of the Micro-LED device may further include adopting a magnetic bonding layer to bond the micro light emitting diodes to a test substrate. In such case, the first selectively removing process for removing the abnormal micro light emitting diodes can be carried out by adjusting the magnetic force of the magnetic bonding layer, so as to remove the abnormal micro light emitting diodes from the test substrate. The first transferring process can be carried out by adjusting the magnetic force of the magnetic bonding layer, so as to transfer the micro light emitting diodes from the test substrate to the first container. By adopting the magnetic bonding layer, the rate and yields of testing and transferring can be improved, and production cost can be reduced.

Optionally, the fabrication method of the Micro-LED device may include adopting a vacuum adsorption layer to bond the micro light emitting diodes to the test substrate. In such case, the first selectively removing process for removing the abnormal micro light emitting diodes can be carried out by adjusting the suction of the vacuum adsorption layer, so as to remove the abnormal micro light emitting diodes from the test substrate. The first transferring process can be carried out by adjusting the suction of the vacuum adsorption layer, so as to transfer the micro light emitting diodes from the test substrate to the first container. By adopting the vacuum adsorption layer, the rate and yields of testing and transferring can be improved, and production cost can be reduced.

Optionally, the fabrication method of the Micro-LED device may include adopting an electrostatic adsorption layer to bond the micro light emitting diodes to the test substrate. In such case, the first selectively removing process for removing the abnormal micro light emitting diodes can be carried out by adjusting the electrostatic force of the electrostatic adsorption layer, so as to remove the abnormal micro light emitting diodes from the test substrate. The first transferring process can be carried out by adjusting the electrostatic force of the electrostatic adsorption layer, so as to transfer the micro light emitting diodes from the test substrate to the first container. By adopting the electrostatic adsorption layer, the rate and yields of testing and transferring can be improved, and production cost can be reduced.

Optionally, the fabrication method of the Micro-LED device may include adopting an adhesion layer to bond the micro light emitting diodes to the test substrate. In such case, the first selectively removing process for removing the abnormal micro light emitting diodes can be carried out by adjusting the adhesion of the adhesion layer, so as to remove the abnormal micro light emitting diodes from the test substrate. The first transferring process can be carried out by adjusting the adhesion of the adhesion layer, so as to transfer the micro light emitting diodes from the test substrate to the first container. By adopting the adhesion layer, the rate and yields of testing and transferring can be improved, and production cost can be reduced.

According to the fabrication method of the Micro-LED device, the first selectively removing process for the abnormal micro light emitting diodes has a first removal rate;

the first transferring process for transferring the micro light emitting diodes passing the test to the first container has a first transfer rate; and the second transferring process for transferring the micro light emitting diodes to a receiving substrate has a second transfer rate; wherein the first transfer rate is greater than the second transfer rate, and the first removal rate is greater than or equal to the second transfer rate.

By controlling the transfer rate and removal rate, the yields of massive transfer can be improved, and production cost can be reduced.

Optionally, according to the fabrication method of the Micro-LED device, the first transferring process for transferring the micro light emitting diodes passing the test to the first container has a first transfer rate; and the second transferring process for transferring the micro light emitting diodes to a receiving substrate has a second transfer rate; wherein the first transfer rate is greater than the second transfer rate.

According to the fabrication method of the Micro-LED device, the micro light emitting diodes on the growth substrate 100 have a first pitch P1; and the micro light emitting diodes on the receiving substrate 830 have a second pitch P2; wherein the second pitch P2 is greater than or equal to the first pitch P1.

Optionally, in the fabrication method of the Micro-LED device, the micro light emitting diodes on the growth substrate 100 have a first pitch P1; and the micro light emitting diodes on the receiving substrate 830 have a second pitch P2; wherein the second pitch P2 is greater than the first pitch P1. Subsequent production cost can be reduced by controlling the transfer pitch.

In the fabrication method of the Micro-LED device, the micro light emitting diodes at least include an array structure composed of red LEDs, green LEDs and blue LEDs. In such case, the fabrication method further includes: forming a wall structure 850 located between adjacent micro light emitting diodes; and forming a light-transmissive adhesive F covering the micro light emitting diodes. The wall structure 850 can improve display contrast of the micro-LED display.

The micro light emitting diodes at least include an array structure composed of ultraviolet LEDs. In such case, the fabrication method further includes: forming a wall structure 850 located between adjacent micro light emitting diodes; forming a first phosphor with adhesive F1 covering one or more of the micro light emitting diodes, wherein the first phosphor with adhesive F1 emits red light when it is excited by the micro light emitting diodes; forming a second phosphor with adhesive F2 covering one or more of the micro light emitting diodes, wherein the second phosphor with adhesive F2 emits blue light when it is excited by the micro light emitting diodes; and forming a third phosphor with adhesive F3 covering one or more of the micro light emitting diodes, wherein the third phosphor with adhesive F3 emits green light when it is excited by the micro light emitting diodes.

The micro light emitting diodes at least includes an array structure composed of blue LEDs. In such case, the fabrication method further includes: forming a wall structure 850 located between adjacent micro light emitting diodes; forming a first light-transmissive adhesive F covering one or more of the micro light emitting diodes, wherein blue light is emitted from the micro light emitting diodes which penetrates the first light-transmissive adhesive F; forming a first phosphor with adhesive F1 covering one or more of the micro light emitting diodes, wherein the first phosphor with adhesive F1 emits red light when it is excited by the micro light emitting diodes; and forming a third phosphor with adhesive F3 covering one or more of the micro light emitting diodes, wherein the third phosphor with adhesive F3 emits green light when it is excited by the micro light emitting diodes.

Light emitting efficiency of the micro light emitting diodes is greater than 250 lm/W.

The reveal ability to red, R9, of the color rendering index (CRI) of the micro light emitting diodes is greater than 90.

The CRI of the micro light emitting diodes is greater than 90.

The general CRI Ra of the micro light emitting diodes is greater than 90.

The fabrication method of another Micro-LED device includes forming the above-mentioned micro light emitting diodes on a growth substrate, wherein the steps of forming the micro light emitting diodes includes: forming an electrode electrically connected to the second type semiconductor layer; bonding the micro light emitting diodes to a test substrate; removing the growth substrate;

forming another electrode electrically connected to the first type semiconductor layer; providing a voltage source to perform electroluminescence (EL) test to each of the micro light emitting diodes, and record the positions of the abnormal micro light emitting diodes; selectively removing the abnormal micro light emitting diodes, and leaving the micro light emitting diodes passing the test; the micro light emitting diodes include the micro light emitting diodes with a first color, the micro light emitting diodes with a second color, and the micro light emitting diodes with a third color; transferring the micro light emitting diodes with the first color passing the test to a first container, and putting the first container in a first sub-chamber, wherein the first sub-chamber includes a liquid covering the micro light emitting diodes with the first color; transferring the micro light emitting diodes with the second color passing the test to a second container, and putting the second container in a second sub-chamber, wherein the second sub-chamber includes a liquid covering the micro light emitting diodes with the second color; transferring the micro light emitting diodes with the third color passing the test to a third container, and putting the third container in a third sub-chamber, wherein the third sub-chamber includes a liquid covering the micro light emitting diodes with the third color; and transferring the micro light emitting diodes with the first color, the micro light emitting diodes with the second color and the micro light emitting diodes with the third color to a receiving substrate through a fluid transfer system respectively.

The beneficial effects of the method are as following:

(1) Repairing cost after the transferring process can be saved by performing electroluminescence test to each of the micro light emitting diodes before the transferring process.

(2) Fluid transfer has advantages such as low cost and high transfer rate.

(3) By the design of the first sub-chamber, the second sub-chamber and the third sub-chamber, the micro light emitting diodes with different colors can be respectively transferred in batches, and production rate can be improved.

The receiving substrate has a plurality of recesses thereon, and a plurality of controllable attraction layers are disposed in the receiving substrate. The attraction layer may provide an electrical attraction force, a magnetic attraction force, an electrostatic attraction force, a fluid attraction force, an air attraction force, a van der waals attraction force, a thermal attraction force and an attachment attraction force. The attraction force produced by the attraction layer can capture the micro light emitting diodes in the fluid. In such case, the fluid transfer system includes a first sub-chamber, a second sub-chamber and a third sub-chamber. The first sub-chamber includes a plurality of micro light emitting diodes with the first color, a solution, a first valve and a first input port. When the first valve is opened, the plurality of micro light emitting diodes with the first color are moved downward through the first valve to a main chamber by the solution injected from the first input port, and respectively moved to the corresponding recess above the substrate by the fluid. The micro light emitting diodes with the first color may be attracted by the suction of the attraction layer on the substrate to move to the recesses in a self-alignment way, wherein the shape of the recesses and the shape of the micro light emitting diodes with the first color are the same. Accordingly, transfer of the micro light emitting diodes with the first color to the top of the substrate can be accomplished.

The second sub-chamber includes a plurality of micro light emitting diodes with the second color, a solution, a second valve and a second input port. When the second valve is opened, the plurality of micro light emitting diodes with the second color are moved downward through the second valve to a main chamber by the solution injected from the second input port, and respectively moved to the corresponding recess above the substrate by the fluid. The micro light emitting diodes with the second color may be attracted by the suction of the attraction layer on the substrate to move to the recesses in a self-alignment way, wherein the shape of the recesses and the shape of the micro light emitting diodes with the second color are the same. Accordingly, transfer of the micro light emitting diodes with the second color to the top of the substrate can be accomplished.

The beneficial effects of the above-mentioned method are as following:

(1) Repairing cost after the transferring process can be saved by performing electroluminescence test to each of the micro light emitting diodes before the transferring process.

(2) Fluid transfer has advantages such as low cost and high transfer rate.

(3) By the design of the first sub-chamber, the second sub-chamber and the third sub-chamber, the micro light emitting diodes with different colors can be respectively transferred in batches, and production rate can be improved.

(4) The design of self-alignment to the recesses can reduce production cost.

The third sub-chamber includes a plurality of micro light emitting diodes with the third color, a solution, a third valve and a third input port. When the third valve is opened, the plurality of micro light emitting diodes with the third color are moved downward through the third valve to a main chamber by the solution injected from the third input port, and respectively moved to the corresponding recess above the substrate by the fluid. The micro light emitting diodes with the third color may be attracted by the suction of the attraction layer on the substrate to move to the recess in a self-alignment way, wherein the shape of the recess and the shape of the micro light emitting diodes with the third color are the same. Accordingly, transfer of the micro light emitting diodes with the third color to the top of the substrate can be accomplished.

A further Micro-LED device according to an embodiment of the invention includes a first type semiconductor layer 101, a second type semiconductor layer 102, a light emitting layer 103 located between the first type semiconductor layer 101 and the second type semiconductor layer 102 and a first current limiting area 201 located at a periphery of the second type semiconductor layer 102 and the sidewall region of the second type semiconductor layer 102. The first current limiting area 201 can reduce sidewall leakage current, and the light emitting efficiency of the micro light emitting diode can be improved.

The upper surface U6 of the second type semiconductor layer 102 and the upper surface U1 of the first current limiting area 201 are coplanar.

The above-mentioned Micro-LED device may further include a transparent electrode 301 located above the second type semiconductor layer 102 and electrically connected to the second type semiconductor layer 102, and the transparent electrode 301 covers the first current limiting area 201. In such case, the Micro-LED device may further include an electrode 302 located above the second type semiconductor layer 102 and electrically connected to the transparent electrode 301, and the electrode 302 is directly in contact with the second type semiconductor layer 102, thereby preventing the electrode from peeling, and stability of the products can be improved. The Micro-LED device may further include another electrode 304 located above the first type semiconductor layer 101 and the second type semiconductor layer 102 and electrically connected to the first type semiconductor layer 101, and the another electrode 304 is directly in contact with the first type semiconductor layer 102. The transparent electrode 301 has high light transmittance ratio, thereby improving the light emitting efficiency of the micro light emitting diode. The Micro-LED device may further include a fifth current blocking area 505 covering the transparent electrode 301 and isolating the electrode 302 and the another electrode 304. The another electrode 304 has a fourth width T4, the electrode has a fifth width T5, and the fourth width T4 is greater than or equal to the fifth width T5. The contact surface between the another electrode 304 and the first type semiconductor layer 101 has a third width T3, and the third width T3 is less than the fourth width T4.

The first current limiting area 201 can be formed through ion implantation technique. Ion implantation technique can increase sidewall flatness and improve stability of the products.

The first current limiting area 201 has a first width T1 greater than or equal to 1 micrometer.

The Micro-LED device may include an etching cavity 105 formed by removing a portion of the second type semiconductor layer 102 and the light emitting layer 103, and the cavity 105 exposes the first type semiconductor layer 101. The cavity 105 has a seventh depth D7, the first current limiting area has a first depth D1, and the first depth D1 is less than or equal to the seventh depth D7. The Micro-LED device has a feature of flip chip structure. In such case, the Micro-LED device further includes a fifth current blocking area 505 located at the sidewall of the etching cavity 105.

The first type semiconductor layer 101, the second type semiconductor layer 102 and the light emitting layer 103 have an epitaxial thickness E1 less than 10 micrometers.

The Micro-LED device may include a sixth current blocking area 506 covering the sidewall of the second type semiconductor layer 102, the sidewall of the light emitting layer 103 and the sidewall of the first type semiconductor layer 101, and the sixth current blocking area 506 surrounds the first current limiting area 201.

The Micro-LED device may include a fourth current limiting area 204 surrounded by the first current limiting area 201, wherein the first current limiting area 201 has a first depth D1, the fourth current limiting area 204 has a fourth depth D4, and the first depth D1 is equal to the fourth depth D4. In such case, the fourth current limiting area 204 can be formed through ion implantation technique. The upper surface U4 of the fourth current limiting area 204 and the upper surface U6 of the second type semiconductor layer 102 are coplanar. The fifth current limiting area 205 can be formed through ion implantation technique. The upper surface U5 of the fifth current limiting area 205 and the upper surface U6 of the second type semiconductor layer 102 are coplanar.

The Micro-LED device may include a fifth current limiting area 205 surrounded by the first current limiting area 201, wherein the first current limiting area 201 has a first depth D1, the fifth current limiting area 205 has a fifth depth D5, the first depth D1 is equal to the fifth depth D5, and the fifth current limiting area 205 surrounds the etching cavity 105.

The Micro-LED device may include a fourth current blocking area 504 surrounded by the first current limiting area 201 and directly in contact with the second type semiconductor layer 102.

The periphery of the first current limiting area 201 has a first length S1, a second length S2, a third length S3 and a fourth length S4, wherein the first length S1, the second length S2, the third length S3 and the fourth length S4 are less than or equal to 100 micrometers respectively.

The periphery of the first current limiting area 201 has a first length S1, a second length S2, a third length S3 and a fourth length S4, wherein the summation of the first length S1, the second length S2, the third length S3 and the fourth length S4 is less than or equal to 400 micrometers.

The light emitting efficiency of the micro light emitting diodes is greater than 250 lm/W.

The reveal ability to red, R9, of the color rendering index (CRI) of the micro light emitting diodes is greater than 90.

The CRI of the micro light emitting diodes is greater than 90.

The general CRI Ra of the micro light emitting diodes is greater than 90.

The periphery perimeter of the first current limiting area 201 is less than or equal to 400 micrometers. Optionally, the periphery perimeter of the first current limiting area 201 is less than or equal to 200 micrometers. Optionally, the periphery perimeter of the first current limiting area 201 is less than or equal to 100 micrometers. Optionally, the periphery perimeter of the first current limiting area 201 is less than or equal to 50 micrometers. Optionally, the periphery perimeter of the first current limiting area 201 is less than or equal to 20 micrometers.

For example, the materials used in the above-mentioned ion implantation technique may include ions H+, He+, N+, F+, Mg+, Ar+, Zn+, O+, Si+, P+, Be+, C+, B+, P+, As+, Sb+, Te+, Fe+, Co+, Sn+, Zr+, Ag+, Au+, Ti+, Al+ or the combination thereof, but not limited thereto. In the ion implantation technique, the ions are passed through the mass analyzer to remove unwanted ions by using a magnetic field at first, and then, after the selected doping ions enter the accelerator, the ions are accelerated to have high energy by the electric field. Sequentially, after the high-energy ion-beam passes through the longitudinal and lateral scanners, the ion-beam is driven into the semiconductor to perform the pre-set of the doping ions. When performing the pre-set of the doping ions, the doping concentration of the pre-set can be controlled by the current intensity of the ion beam and implantation time. The distribution of the dopants in the semiconductor can be adjusted by the energy obtained by the ions through acceleration. Accordingly, the concentration and distribution of the doping ions in the semiconductor can be precisely controlled. After the ion implantation process, annealing activation may be performed by adopting rapid thermal annealing (RTA) or high-temperature furnace to repair the destruction and disorder of the lattice caused by collision, and the implanted ions and the atoms of the semiconductor can be recrystallized, such that the implanted ions can be located at the positions of the main atoms in new lattice.

The first type semiconductor layer 101, the second type semiconductor layer 102 and the light emitting layer 103 of the above-mentioned micro light emitting diodes may include any materials, for example including gallium nitride (GaN), aluminum nitride (AlN), indium nitride (InN), indium gallium nitride (InGaN), aluminum gallium nitride (AlGaN), aluminum gallium indium nitride (AlGaInN), gallium phosphide (GaP), aluminum phosphide (AlP), aluminum gallium phosphide (AlGaP), aluminum arsenide (AlAs), aluminum gallium arsenide (AlGaAs), aluminum indium gallium phosphide (AlInGaP), aluminum indium gallium arsenide (AlInGaAs), zinc selenide (ZnSe), zinc oxide (ZnO) or the alloy thereof, but not limit thereto.

Each of the micro light emitting diodes in the above-mentioned micro light emitting diodes can be controlled independently.

The fabrication method of a Micro-LED device includes forming the above-mentioned micro light emitting diodes on a growth substrate, wherein the steps of forming the micro light emitting diodes includes: forming an electrode electrically connected to the second type semiconductor layer; forming another electrode electrically connected to the first type semiconductor layer; bonding the micro light emitting diodes to a test substrate; removing the growth substrate; providing a voltage source to perform electroluminescence (EL) test to each of the micro light emitting diodes, and record the positions of the abnormal micro light emitting diodes;

transferring the micro light emitting diodes to a transfer substrate; performing a first selectively removing process to selectively remove the abnormal micro light emitting diodes, and remain the micro light emitting diodes passing the test; performing a first transferring process to transfer the micro light emitting diodes passing the test to a permanent substrate, and remain the vacancy of the removed abnormal micro light emitting diodes on the permanent substrate; and performing a second transferring process to fill the vacancy on the permanent substrate.

The fabrication method of the Micro-LED device further includes adopting a sacrificing layer 700 as shown in FIG. 18-6, FIG. 19-6 or FIG. 37-6. The micro light emitting diodes can be bonded to the test substrate through the sacrificing layer. The first selectively removing process for removing the abnormal micro light emitting diodes can be carried out by introducing a laser to adjust the adhesiveness of the sacrificing layer, so as to remove the abnormal micro light emitting diodes from the test substrate. The first transferring process can be carried out by introducing a laser to adjust the adhesiveness of the sacrificing layer, so as to transfer the micro light emitting diodes from the test substrate to the permanent substrate. The second transferring process can be carried out by introducing a laser to adjust the adhesiveness of the sacrificing layer, so as to transfer the micro light emitting diodes from the test substrate to the permanent substrate. The micro light emitting diodes transferred in the first transferring process and the micro light emitting diodes transferred in the second transferring process come from different growth substrate. The fabrication method of the Micro-LED device further includes adopting a magnetic bonding layer to temporarily bond the micro light emitting diodes to the test substrate. In such case, the first selectively removing process for removing the abnormal micro light emitting diodes can be carried out by adjusting the magnetic force of the magnetic bonding layer, so as to remove the abnormal micro light emitting diodes from the test substrate. The first transferring process can be carried out by adjusting the magnetic force of the magnetic bonding layer, so as to transfer the micro light emitting diodes from the test substrate to the permanent substrate. The second transferring process can be carried out by adjusting the magnetic force of the magnetic bonding layer, so as to transfer the micro light emitting diodes from the test substrate to the permanent substrate.

The fabrication method of the Micro-LED device may further include adopting a vacuum adsorption layer to bond the micro light emitting diodes to the substrate.

The first selectively removing process for removing the abnormal micro light emitting diodes can be carried out by adjusting the suction of the vacuum adsorption layer, so as to remove the abnormal micro light emitting diodes from the test substrate. The first transferring process can be carried out by adjusting the suction of the vacuum adsorption layer, so as to transfer the micro light emitting diodes from the test substrate to the permanent substrate. The second transferring process can be carried out by adjusting the suction of the vacuum adsorption layer, so as to transfer the micro light emitting diodes from the test substrate to the permanent substrate.

The micro light emitting diodes transferred in the first transferring process and the micro light emitting diodes transferred in the second transferring process come from the same growth substrate.

Optionally, the fabrication method of the Micro-LED device may include adopting an electrostatic adsorption layer to bond the micro light emitting diodes to a test substrate. In such case, the first selectively removing process for removing the abnormal micro light emitting diodes can be carried out by adjusting the electrostatic force of the electrostatic adsorption layer, so as to remove the abnormal micro light emitting diodes from the test substrate. The first transferring process can be carried out by adjusting the electrostatic force of the electrostatic adsorption layer, so as to transfer the micro light emitting diodes from the test substrate to the permanent substrate. The second transferring process can be carried out by adjusting the electrostatic force of the electrostatic adsorption layer, so as to transfer the micro light emitting diodes from the test substrate to the permanent substrate.

Optionally, the fabrication method of the Micro-LED device may include adopting an adhesion layer to bond the micro light emitting diodes to a test substrate. In such case, the first selectively removing process for removing the abnormal micro light emitting diodes can be carried out by adjusting the adhesion of the adhesion layer, so as to remove the abnormal micro light emitting diodes from the test substrate. The first transferring process can be carried out by adjusting the adhesion of the adhesion layer, so as to transfer the micro light emitting diodes from the test substrate to the permanent substrate. The second transferring process can be carried out by adjusting the adhesion of the adhesion layer, so as to transfer the micro light emitting diodes from the test substrate to the permanent substrate.

In the fabrication method of the Micro-LED device, the first selectively removing process for removing the abnormal micro light emitting diodes has a first removal rate; the first transferring process for transferring the micro light emitting diodes passing the test to the permanent substrate has a first transfer rate; and the second transferring process for filling the vacancy on the permanent substrate has a second transfer rate; wherein the first transfer rate is greater than the second transfer rate, and the first removal rate is greater than or equal to the second transfer rate.

In the fabrication method of the Micro-LED device, the first transferring process for transferring the micro light emitting diodes passing the test to the permanent substrate has a first transfer rate; and the second transferring process for filling the vacancy on the permanent substrate has a second transfer rate; wherein the first transfer rate is greater than the second transfer rate.

In the fabrication method of the Micro-LED device, the micro light emitting diodes on the growth substrate 100 have a first pitch P1; the micro light emitting diodes on the transfer substrate 801 have a second pitch P2; and the micro light emitting diodes on the permanent substrate 820 have a third pitch P3; wherein the second pitch P2 is greater than or equal to the first pitch P1, and the third pitch P3 is greater than or equal to the second pitch P2.

Optionally, in the fabrication method of the Micro-LED device, the micro light emitting diodes on the growth substrate 100 have a first pitch P1; the micro light emitting diodes on the transfer substrate 801 have a second pitch P2; and the micro light emitting diodes on the permanent substrate 820 have a third pitch P3; wherein the second pitch P2 is greater than the first pitch P1, and the third pitch P3 is greater than the second pitch P2.

The micro light emitting diodes at least include an array composed of red LEDs, green LEDs and blue LEDs. The fabrication method of the Micro-LED device further includes: forming a wall structure 850 located between adjacent micro light emitting diodes; and forming a light-transmissive adhesive F covering the micro light emitting diodes.

Selectively, the micro light emitting diodes at least include an array structure composed of ultraviolet LEDs.

The above-mentioned fabrication method further includes: forming a wall structure 850 located between adjacent micro light emitting diodes; forming a first phosphor with adhesive F1 covering one or more of the micro light emitting diodes, wherein the first phosphor with adhesive F1 emits red light when it is excited by the micro light emitting diodes; forming a second phosphor with adhesive F2 covering one or more of the micro light emitting diodes, wherein the second phosphor with adhesive F2 emits blue light when it is excited by the micro light emitting diodes; and forming a third phosphor with adhesive F3 covering one or more of the micro light emitting diodes, wherein the third phosphor with adhesive F3 emits green light when it is excited by the micro light emitting diodes.

Selectively, the micro light emitting diodes at least include an array composed of blue LEDs. The above-mentioned fabrication method further includes: forming a wall structure 850 located between adjacent micro light emitting diodes; forming a first light-transmissive adhesive F covering one or more of the micro light emitting diodes, wherein blue light emitted by the micro light emitting diodes penetrates the first light-transmissive adhesive; forming a first phosphor with adhesive F1 covering one or more of the micro light emitting diodes, wherein the first phosphor with adhesive F1 emits red light when it is excited by the micro light emitting diodes; and forming a third phosphor with adhesive F3 covering one or more of the micro light emitting diodes, wherein the third phosphor with adhesive F3 emits green light when it is excited by the micro light emitting diodes.

The light emitting efficiency of the micro light emitting diodes is greater than 250 lm/W.

The reveal ability to red, R9, of the color rendering index (CRI) of the micro light emitting diodes is greater than 90.

The CRI of the micro light emitting diode is greater than 90.

The general CRI Ra of the micro light emitting diodes is greater than 90.

The first transferring process for transferring the micro light emitting diodes passing the test to the permanent substrate has a first transfer rate, and the first transfer rate is greater than 1 million micro light emitting diodes per hour (million micro-LEDs/hour).

Optionally, the first transferring process for transferring the micro light emitting diodes passing the test to the permanent substrate has a first transfer rate, and the first transfer rate is greater than 10 million micro-LEDs/hour.

Optionally, the first transferring process for transferring the micro light emitting diodes passing the test to the permanent substrate has a first transfer rate, and the first transfer rate is greater than 20 million micro-LEDs/hour.

Optionally, the first transferring process for transferring the micro light emitting diodes passing the test to the permanent substrate has a first transfer rate, and the first transfer rate is greater than 100 million micro-LEDs/hour.

Optionally, the first transferring process for transferring the micro light emitting diodes passing the test to the permanent substrate has a first transfer rate, and the first transfer rate is greater than 200 million micro-LEDs/hour.

Optionally, the first transferring process for transferring the micro light emitting diodes passing the test to the permanent substrate has a first transfer rate, and the first transfer rate is greater than 500 million micro-LEDs/hour.

The first selectively removing process for removing the abnormal micro light emitting diodes has a first removal rate, and the first removal rate is greater than 1 million micro-LEDs/hour.

Optionally, the first selectively removing process for removing the abnormal micro light emitting diodes has a first removal rate, and the first removal rate is greater than 10 million micro-LEDs/hour.

Optionally, the first selectively removing process for removing the abnormal micro light emitting diodes has a first removal rate, and the first removal rate is greater than 20 million micro-LEDs/hour.

Optionally, the first selectively removing process for removing the abnormal micro light emitting diodes has a first removal rate, and the first removal rate is greater than 100 million micro-LEDs/hour.

Optionally, the first selectively removing process for removing the abnormal micro light emitting diodes has a first removal rate, and the first removal rate is greater than 200 million micro-LEDs/hour.

Optionally, the first selectively removing process for removing the abnormal micro light emitting diodes has a first removal rate, and the first removal rate is greater than 500 million micro-LEDs/hour.

The second transferring process for filling the vacancy on the permanent substrate has a second transfer rate, and the second transfer rate is greater than 1 million micro-LEDs/hour.

Optionally, the second transferring process for filling the vacancy on the permanent substrate has a second transfer rate, and the second transfer rate is greater than 10 million micro-LEDs/hour.

Optionally, the second transferring process for filling the vacancy on the permanent substrate has a second transfer rate, and the second transfer rate is greater than 20 million micro-LEDs/hour.

Optionally, the second transferring process for filling the vacancy on the permanent substrate has a second transfer rate, and the second transfer rate is greater than 100 million micro-LEDs/hour.

Optionally, the second transferring process for filling the vacancy on the permanent substrate has a second transfer rate, and the second transfer rate is greater than 200 million micro-LEDs/hour.

Optionally, the second transferring process for filling the vacancy on the permanent substrate has a second transfer rate, and the second transfer rate is greater than 500 million micro-LEDs/hour.

In the above-mentioned fabrication method of the Micro-LED device, the growth substrate 100 may for example include materials of silicon, aluminum oxide (Al2O3), gallium nitride (GaN), silicon carbide (SiC) and gallium arsenide (GaAs), but not limited thereto.

In the above-mentioned fabrication method of the Micro-LED device, each of the micro light emitting diodes can be controlled independently.

A further Micro-LED device according to an embodiment of the invention includes a first type semiconductor layer 101, a second type semiconductor layer 102, a light emitting layer 103 located between the first type semiconductor layer 101 and the second type semiconductor layer 102, a magnetic layer located below the first type semiconductor layer 101, and a sidewall current limiting area located at the periphery sidewall regions of the second type semiconductor layer 102 and the light emitting layer 103, wherein the upper surface of the sidewall current limiting area and the upper surface of the second type semiconductor layer are coplanar, and the periphery perimeter of the first current limiting area is less than or equal to 400 micrometers.

The beneficial effects of the above-mentioned Micro-LED device are that the micro light emitting diodes have magnetic feature, the sidewall current limiting area can reduce sidewall leakage current, and the light emitting efficiency of the micro light emitting diode can be improved.

The Micro-LED device may further include a second current limiting area 202 surrounded by the sidewall current limiting area, wherein the shortest distance between the sidewall current limiting area and the second current limiting area 202 is less than or equal to 50 micrometers. The second current limiting area 202 is located in the middle of the second type semiconductor layer 102. The magnetic layer may include a semiconductor, a conductor layer and an oxide layer, and may be formed by epitaxial doping, ion implantation, diffusion or thin film deposition, wherein the magnetic material in epitaxial doping, ion implantation, diffusion or thin film deposition may include Fe, Co, Ni, Tb, Al, Pt, Sm, Cu, Cr or the combinations thereof. The light emitting layer includes single-layer quantum well structure or multi-layer quantum well structure. Optionally, the light emitting layer includes single-layer quantum wire structure or multi-layer quantum wire structure. Optionally, the light emitting layer includes single-layer quantum dot structure or multi-layer quantum dot structure. In such case, the upper surface of the second type semiconductor layer 102, the upper surface of the sidewall current limiting area and the upper surface of the second current limiting area 202 are coplanar. The second current limiting area 202 can be formed by ion implantation technique.

The Micro-LED device may further include a third current limiting area 203 located between the sidewall current limiting area and the second current limiting area 202 and in contact with the second current limiting area 202. The Micro-LED device may further include a transparent electrode 301 located above the second type semiconductor layer 102 and electrically connected to the second type semiconductor layer 102, and the transparent electrode 301 covers the sidewall current limiting area and the third current limiting area 203. The Micro-LED device may further include an electrode 302 located above the second type semiconductor layer 102 and electrically connected to the transparent electrode 301, and the electrode 302 is directly in contact with the second current limiting area 202. The Micro-LED device may further include an electrode extension part 303 located above the transparent electrode 301 and electrically connected to the electrode 302. The upper surface of the third current limiting area 203 and the upper surface of the sidewall current limiting area are coplanar. The third current limiting area 203 is formed by ion implantation technique. The second current limiting area 202 has a second depth D2, the third current limiting area 203 has a third depth D3, and the second depth D2 is equal to the third depth D3. The Micro-LED device may further include a transparent electrode 301 located above the second type semiconductor layer 102 and electrically connected to the second type semiconductor layer 102, and the transparent electrode 301 covers the sidewall current limiting area. The transparent electrode has high light transmittance ratio, thereby improving the light emitting efficiency of the micro light emitting diode. The Micro-LED device may further include an electrode 302 located above the second type semiconductor layer 102 and electrically connected to the transparent electrode 301, and the electrode 302 is directly in contact with the second current limiting area 202, thereby preventing the electrode from peeling and improving stability of the products. The Micro-LED device may further include an electrode extension part 303 located above the transparent electrode 301 and electrically connected to the electrode 302.

The sidewall current limiting area can be formed through ion implantation technique, wherein:

(1) The sidewall current limiting area can reduce sidewall leakage current, and the light emitting efficiency of the micro light emitting diode can be improved.

(2) The second current limiting area 202 can improve the uniformity of current distribution, and the light emitting efficiency of the micro light emitting diode can be improved.

(3) The third current limiting area 203 can improve the uniformity of current distribution, and the light emitting efficiency of the micro light emitting diode can be improved.

(4) Ion implantation technique can increase sidewall flatness, and the stability of the products can be improved.

(5) Ion implantation technique can increase surface flatness, and the stability of the products can be improved.

The sidewall current limiting area has a first width T1 greater than or equal to 1 micrometer.

A further Micro-LED device according to an embodiment of the invention includes a first type semiconductor layer 101, a second type semiconductor layer 102, a light emitting layer 103 located between the first type semiconductor layer 101 and the second type semiconductor layer 102, a magnetic layer located below the first type semiconductor layer 101 and a first current blocking area 501 located at periphery sidewall regions of the second type semiconductor layer 102 and the light emitting layer 103, wherein the periphery perimeter of the first current blocking area 501 is less than or equal to 400 micrometers.

By adopting the above-mentioned structure, the beneficial effects are as following. The micro light emitting diodes have magnetic feature, and the first current blocking area 501 can reduce sidewall leakage current, thereby improving the light emitting efficiency of the micro light emitting diode. The periphery perimeter of the first current blocking area 501 is less than or equal to 400 micrometers, which meets the size scale of the micro light emitting diode, thereby having various advantages of the micro light emitting diode.

The Micro-LED device may further include a second current blocking area 502 surrounded by the first current blocking area 501, wherein the shortest distance between the first current blocking area 501 and the second current blocking area 502 is less than or equal to 50 micrometers. In such case, the Micro-LED device may further include a third current blocking area 503 surrounded by the first current blocking area 501 and in contact with the second current blocking area 502. The Micro-LED device may further include a transparent electrode 301 located above the second type semiconductor layer 102 and electrically connected to the second type semiconductor layer 102, and the transparent electrode 301 covers the first current blocking area 501, the second current blocking area 502 and the third current blocking area 503. The second current blocking area 502 has a hollow ring shape and a hollow width O2, wherein the hollow width O2 is greater than or equal to 1 micrometer. The second current blocking area 502 is located in the middle of the second type semiconductor 102. The Micro-LED device may further include an electrode 302 located above the second type semiconductor layer 102 and electrically connected to the transparent electrode 301, and the electrode 302 is directly in contact with the second type semiconductor layer 102. The Micro-LED device may further include an electrode extension part 303 located above the transparent electrode 301 and electrically connected to the electrode 302. The width of the electrode extension part 303 is less than the width of the third current blocking area 503. The Micro-LED device further includes a transparent electrode 301 located above the second type semiconductor layer 102 and electrically connected to the second type semiconductor layer 102, and the transparent electrode 301 covers the first current blocking area 501 and the second current blocking area 502. The Micro-LED device may further include an electrode 302 located above the second type semiconductor layer 102 and electrically connected to the transparent electrode 301, and the electrode 302 is directly in contact with the second type semiconductor layer 102, thereby preventing the electrode from peeling and improving the stability of the products. The transparent electrode has high light transmittance ratio, thereby improving the light emitting efficiency of the micro light emitting diode. The Micro-LED device may further include an electrode extension part 303 located above the transparent electrode 301 and electrically connected to the electrode 302.

The width T2 of the first current blocking area 501 is greater than or equal to 1 micrometer.

A further Micro-LED device according to an embodiment of the invention includes a first type semiconductor layer 101, a second type semiconductor layer 102, a light emitting layer 103 located between the first type semiconductor layer 101 and the second type semiconductor layer 102, and a sidewall current limiting area 201 directly in contact with the periphery sidewall region of the second type semiconductor layer 102, wherein the sidewall current limiting area 201 further includes an upper surface 201-up, a bottom surface 101-down, an outer surface 201-out and an inner surface 201-in. The second type semiconductor layer 102 further includes an upper surface 102-up and an outer surface 102-out, and the periphery perimeter of the sidewall current limiting area 201 is less than or equal to 400 micrometers.

By adopting the above-mentioned structure, the beneficial effects are as following:

(1) The sidewall current limiting area 201 can reduce sidewall leakage current, and the light emitting efficiency of the micro light emitting diode can be improved.

(2) The peripheral perimeter is equal to or less than 400 micrometers and reach the size of micro light emitting diodes, thereby having various advantages of micro light emitting diodes.

The upper surface 102-up of the second type semiconductor layer 102 and the upper surface 201-up of the sidewall current limiting area 201 are coplanar.

The Micro-LED device may further include a transparent electrode 301 located above the second type semiconductor layer 102 and electrically connected to the second type semiconductor layer 102, and the transparent electrode 301 covers the sidewall current limiting area 201. The Micro-LED device may further include an electrode 302 located above the second type semiconductor layer 102 and electrically connected to the transparent electrode 301, and the electrode 302 is directly in contact with the second type semiconductor layer 102, thereby preventing the electrode from peeling and improving the stability of the products. The transparent electrode has high light transmittance ratio, thereby improving the light emitting efficiency of the micro light emitting diode.

The sidewall current limiting area 201 can be formed through ion implantation technique. Ion implantation technique can increase sidewall flatness, thereby improving the stability of the products.

The sidewall current limiting area 201 has a first width T1 greater than or equal to 1 micrometer.

The Micro-LED device may further include a back electrode 304 located below the first type semiconductor layer and electrically connected to the first type semiconductor layer.

The upper surface 201-up of the sidewall current limiting area has a surface low conductivity region iL-up, the upper surface 102-up of the second type semiconductor layer has a surface high conductivity region iH-up, and a conductivity distribution is gradually increased from the surface low conductivity region iL-up toward the surface high conductivity region iH-up, which helps reduce surface leakage current and sidewall leakage current, and the light emitting efficiency of the micro light emitting diode can be improved.

The outer surface 201-out of the sidewall current limiting area has a sidewall low conductivity region iL-out, the outer surface 102-out of the second type semiconductor layer has a sidewall high conductivity region iH-out, and a conductivity distribution is gradually increased from the sidewall low conductivity region iL-out toward the high conductive region iH-out.

The upper surface 201-up of the sidewall current limiting area has a first surface roughness RS-201-up not greater than 10 nanometers.

The upper surface 102-up of the second type semiconductor layer has a second surface roughness RS-102-up not greater than 10 nanometers.

Alternatively, the upper surface 201-up of the sidewall current limiting area has a first surface roughness RS-201-up, the upper surface 102-up of the second type semiconductor layer has a second surface roughness RS-102-up, and the first surface roughness RS-201-up is greater than or equal to the second surface roughness RS-102-up.

The outer surface 201-out of the sidewall current limiting area has a third surface roughness RS-201-out greater than 10 nanometers.

The outer surface 102-out of the second type semiconductor layer has a fourth surface roughness RS-102-out greater than 10 nanometers.

Optionally, the outer surface 201-out of the sidewall current limiting area has a third surface roughness RS-201-out, the outer surface 102-out of the second type semiconductor layer has a fourth surface roughness RS-102-out, and the third surface roughness RS-201-out is greater than or equal to the fourth surface roughness RS-102-out.

Optionally, the upper surface 201-up of the sidewall current limiting area has a first surface roughness RS-201-up, the outer surface 201-out of the sidewall current limiting area has a third surface roughness RS-201-out, and the first surface roughness RS-201-up is greater than or equal to the third surface roughness RS-201-out.

Optionally, the upper surface 102-up of the second type semiconductor layer has a second surface roughness RS-102-up, the outer surface 102-out of the second type semiconductor layer has a fourth surface roughness RS-102-out, and the second surface roughness RS-102-up is greater than or equal to the fourth surface roughness RS-102-out.

The advantage of the above-mentioned optional embodiments includes that the leakage current can be reduced by controlling surface roughness and sidewall roughness, thereby improving the light emitting efficiency of the micro light emitting diode.

The sidewall current limiting area 201 has a first depth D1 less than 1 micrometer. Alternatively, the sidewall current limiting area 201 has a first depth D1 greater than or equal to 1 micrometer.

The sidewall current limiting area 201 further includes the sidewall region 103-out of the light emitting layer 103.

The sidewall current limiting area 201 further includes the sidewall region outside the light emitting layer 103.

The sidewall current limiting area 201 further includes the sidewall region 103-out of the light emitting layer 103 and the sidewall region 101-out of the first type semiconductor layer 101.

The advantage of the above-mentioned optional embodiments includes that a preferable effect of reducing sidewall leakage current can be achieved by controlling the depth of the sidewall current limiting area, thereby improving the light emitting efficiency of the micro light emitting diode.

Optionally, the upper surface 201-up of the sidewall current limiting area and the outer surface 201-out of the sidewall current limiting area have a first included angle $\Theta 1$, and the upper surface 201-up of the sidewall current limiting area and the inner surface 201-in of the sidewall current limiting area have a second included angle $\Theta 2$. The first included angle $\Theta 1$ is an acute angle which is less than 90 degrees, and the second included angle $\Theta 2$ is an obtuse angle which is greater than 90 degrees.

Optionally, the upper surface 201-up of the sidewall current limiting area and the outer surface 201-out of the sidewall current limiting area have a first included angle $\Theta 1$, and the upper surface 201-up of the sidewall current limiting area and the inner surface 201-in of the sidewall current limiting area have a second included angle $\Theta 2$. The first included angle $\Theta 1$ is an obtuse angle which is greater than 90 degrees, and the second included angle $\Theta 2$ is an acute angle which is less than 90 degrees.

Optionally, the upper surface 201-up of the sidewall current limiting area and the outer surface 201-out of the sidewall current limiting area have a first included angle $\Theta 1$, the upper surface 201-up of the sidewall current limiting area and the inner surface 201-in of the sidewall current limiting area have a second included angle $\Theta 2$, and the first included angle $\Theta 1$ and the second included angle $\Theta 2$ are close to right angle (90°).

Optionally, the upper surface 201-up of the sidewall current limiting area and the outer surface 201-out of the sidewall current limiting area have a first included angle $\Theta 1$, the upper surface 201-up of the sidewall current limiting area and the inner surface 201-in of the sidewall current limiting area have a second included angle $\Theta 2$, and the first included angle $\Theta 1$ and the second included angle $\Theta 2$ are right angles (90°).

Optionally, the upper surface 201-up of the sidewall current limiting area and the outer surface 201-out of the sidewall current limiting area have a first included angle $\Theta 1$, the upper surface 201-up of the sidewall current limiting area and the inner surface 201-in of the sidewall current limiting area have a second included angle $\Theta 2$, and the first included angle $\Theta 1$ and the second included angle $\Theta 2$ are obtuse angles which are greater than 90 degrees.

Optionally, the upper surface 201-up of the sidewall current limiting area and the outer surface 201-out of the sidewall current limiting area have a first included angle $\Theta 1$, the upper surface 201-up of the sidewall current limiting area and the inner surface 201-in of the sidewall current limiting area have a second included angle $\Theta 2$, and the first included angle $\Theta 1$ and the second included angle $\Theta 2$ are acute angles which are less than 90 degrees.

A further Micro-LED device according to an embodiment of the invention includes a first type semiconductor layer 101, a second type semiconductor layer 102, a light emitting layer 103 located between the first type semiconductor layer 101 and the second type semiconductor layer 102 and a first current blocking area 501 located at a periphery of the second type semiconductor layer 102 and on the sidewall region of the second type semiconductor layer 102, wherein a peripheral perimeter of the first current blocking area 501 is less than or equal to 400 micrometers.

By adopting the above-mentioned structure, the beneficial effects can be as following:

(1) The first current blocking region 501 can reduce sidewall leakage current and improve the light emitting efficiency of the micro light emitting diode.

(2) The distance of the peripheral perimeter is less than or equal to 400 μm, which reaches the size scale of micro light emitting diode, thus having various advantages thereof.

The first current blocking region 501 at least covers the sidewall of the first type semiconductor layer 101, the sidewall of the second type semiconductor layer 102, and the sidewall of the light emitting layer 103. Other options are as following:

The first current blocking region 501 only covers the sidewall of the second type semiconductor layer 102 and the sidewall of the light emitting layer 103.

The first current blocking region 501 only completely covers the sidewall of the second type semiconductor layer 102.

The first current blocking region 501 partially covers the sidewall of the second type semiconductor layer 102.

The first current blocking region 501 completely covers the sidewall of the light emitting layer 103.

The first current blocking region 501 partially covers the sidewall of the light emitting layer 103.

The first current blocking region 501 completely covers the sidewall of the first type semiconductor layer 101.

The first current blocking region 501 partially covers the sidewall of the first type semiconductor layer 101.

In the above-mentioned device(s), by controlling the depth and range of the first current blocking region 501, a preferable effect of reducing sidewall leakage current can be achieved and the light emitting efficiency of the micro light emitting diode can be improved.

The Micro-LED device may further include a transparent electrode 301 located above the second type semiconductor layer 102 and electrically connected to the second type semiconductor layer 102, and the transparent electrode 301 covers the first current blocking region 501. In such case, the upper surface 301-up of the transparent electrode 301 has an upper-surface high conductivity region iH-up, wherein the upper surface 501-up of the first current blocking region 501 has an upper-surface low conductivity region iL-up, and a conductivity distribution is gradually increased from the upper-surface low conductivity region iL-up toward the upper-surface high conductivity region iH-up.

The Micro-LED device may further include an electrode 302 located above the second type semiconductor layer 102 and electrically connected to the transparent electrode 301, and the electrode 302 is in direct contact with the second limiting region 202, which can prevent the electrode from falling off and improve product stability. The transparent electrode has high light transmittance ratio, which can improve the light emitting efficiency of the micro light emitting diode.

The first current blocking area 501 is composed of dielectric material.

The width of the first current blocking area 501 is greater than or equal to 1 micrometer.

The sidewall-covering region of the first current blocking region 501 has a thickness H1, and the upper-surface-covering region of the first current blocking region 501 has a thickness H2, wherein the thickness H1 is greater than, less than, or equal to the thickness H2. The sidewall-covering region of the first current blocking region 501 has an arc corner. By controlling the geometric shape of the first current blocking region 501, a preferred effect of reducing sidewall leakage current can be achieved and the light emitting efficiency of the micro light emitting diode can be improved.

Regarding the upper surface 501-up and the outer surface 501-out of the first current blocking area 501, the options can be as following: the upper surface 501-up of the first current blocking area 501 has a first surface roughness RS-501-up not greater than 10 nanometers; the outer surface 501-out of the first current blocking area 501 has a second surface roughness RS-501-out not greater than 10 nanometers; the upper surface 501-up of the first current blocking area 501 has a first surface roughness RS-501-up, and the outer surface 501-out of the first current blocking area 501 has a second surface roughness RS-501-out, wherein the first surface roughness is greater than the second surface roughness; the upper surface 501-up of the first current blocking area 501 has a first surface roughness RS-501-up, and the outer surface 501-out of the first current blocking area 501 has a second surface roughness RS-501-out, wherein the first surface roughness is equal to the second surface roughness; and the upper surface 501-up of the first current blocking area 501 has a first surface roughness RS-501-up, and the outer surface 501-out of the first current blocking area 501 has a second surface roughness RS-501-out, wherein the first surface roughness is less than the second surface roughness.

In the above-mentioned device(s), leakage current can be reduced by controlling the surface roughness and sidewall roughness of the current blocking area 501, and the light emitting efficiency of the micro light emitting diode can be improved.

Optionally, the upper surface 501-up of the first current blocking area 501 has a surface low conductivity region iL-up, the upper surface 102-up of the second type semiconductor layer has a surface high conductivity region iH-up, and a conductivity distribution is gradually increased from the surface low conductivity region iL-1 toward the surface high conductivity region iH-up.

Optionally, the outer surface 501-out of the first current blocking area 501 has an outer surface low conductivity region iL-out, the upper surface 501-up of the first current blocking area 501 has an upper surface low conductivity region iL-up, and the conductivity of the outer surface low conductivity region iL-out is equal to the conductivity of the upper surface low conductivity region iL-up.

Optionally, the outer surface 501-out of the first current blocking area 501 has an outer surface low conductivity region iL-out, the upper surface 501-up of the first current blocking area 501 has an upper surface low conductivity region iL-up, and the conductivity of the outer surface low conductivity region iL-out is greater than the conductivity of the upper surface low conductivity region iL-up.

Optionally, the outer surface 501-out of the first current blocking area 501 has an outer surface low conductivity region iL-out, the upper surface 501-up of the first current blocking area 501 has an upper surface low conductivity region iL-up, and the conductivity of the outer surface low conductivity region iL-out is less than the conductivity of the upper surface low conductivity region iL-up.

In the above-mentioned device(s), surface leakage current and sidewall leakage current can be reduced, and the light emitting efficiency of the micro light emitting diode can be improved.

An embodiment of the invention further includes a display panel. The display panel includes a display substrate, and the display substrate includes an array of the Micro-LED devices, wherein a portion of the Micro-LED devices have sidewall current blocking areas 501, and a portion of the Micro-LED devices have sidewall current limiting areas 201.

Regarding the formation of the sidewall current blocking area, the options can be as following:

The sidewall current blocking area 501 can be formed through atomic layer chemical vapor deposition system (ALD) technique.

The sidewall current blocking area 501 can be formed through metal organic chemical vapor phase deposition (MOCVD) epitaxial regrowth technique.

The sidewall current blocking area 501 can be formed through molecular beam epitaxy (MBE) of epitaxial regrowth technique.

The sidewall current blocking area 501 can be formed through plasma enhanced chemical vapor deposition (PECVD) technique.

The sidewall current limiting area 201 can be formed through selective oxidation technique.

The sidewall current limiting area 201 can be formed through thermal oxidation technique.

The sidewall current limiting area 201 can be formed through wet thermal oxidation technique.

The sidewall current limiting area can be formed through ion implantation technique.

The maximum width of each of the Micro-LED devices is in a range from 1 micrometer to 100 micrometers.

Each of the Micro-LED devices includes a semiconductor material.

Each of the Micro-LED devices includes a first type semiconductor layer 101, a second type semiconductor layer 102 and a light emitting layer 103 located between the first type semiconductor layer 101 and the second type semiconductor layer 102.

The above-mentioned display panel further includes a circuit used to switch and drive the array of the Micro-LED devices and an array of microcontroller chips. In addition, each of the microcontroller chips is connected to a scan driving circuit and a data driving circuit.

An embodiment of the invention further provides a flexible display including a flexible substrate 1010, and the flexible substrate further includes an array of the Micro-LED devices, wherein a portion of the Micro-LED devices have sidewall current blocking areas 501, and a portion of the Micro-LED devices have sidewall current limiting areas 201.

Optionally, the sidewall current blocking area 501 is composed of dielectric material.

Optionally, the sidewall current limiting area is formed by ion implantation technique.

The maximum width of each of the Micro-LED devices is in a range from 1 micrometer to 100 micrometers.

Each of the Micro-LED devices includes a semiconductor material.

Each of the Micro-LED devices includes a first type semiconductor layer 101, a second type semiconductor layer 102 and a light emitting layer 103 located between the first type semiconductor layer 101 and the second type semiconductor layer 102.

The flexible display may further include a circuit used to switch and drive the array of the Micro-LED devices and an array of microcontroller chips. Each of the microcontroller chips is connected to a scan driving circuit and a data driving circuit. The flexible substrate 1010 may further include a plurality of data lines 1015, wherein each of the micro-LED devices 1011 is electrically connected to a corresponding scan line 1014 and a corresponding data line 1015; a driving circuit used for driving the array of the micro-LED devices, wherein the driving circuit includes a gate driver 1012 and a source driver 1013.

Material of the flexible substrate may include ultra-thin glass, metal foil, fiber-reinforced composite material, plastic film, ceramic substrate or the combinations of any two or more of the above-mentioned materials. The thickness of the flexible substrate is preferable less than 200 micrometers, more preferable less than 50 micrometers, and even more preferable in a range from 25 micrometers to 50 micrometers. Metal foil may for example include stainless steel, aluminum, nickel, titanium, zirconium, copper, iron, cobalt, palladium or the combinations of any two or more of the above-mentioned materials. Wherein, the coefficient of thermal expansion of the metal foil is similar to the coefficient of thermal expansion of ultra-thin glass. The surface roughness Ra of the metal foil is less than 10 nanometers. The light transmittance of the plastic film is greater than 90% under a wavelength of 550 nanometer. The material of the plastic film may for example include polyethylene terephthalate (PET), polyethylene naphthalate (PEN) or polyethersulfone (PES). The fiber-reinforced composite material may for example include carbon fibers, silicon carbide fibers or boron filament.

According to even further aspect of the invention, a flexible display including an array composed of the diode devices of the invention is provided.

An embodiment of the invention further provides a fabrication method of the flexible display, the fabrication method includes: providing a flexible substrate; disposing a plurality of scan lines, wherein the scan lines are disposed on the flexible substrate parallel to a first direction; disposing a plurality of data lines, wherein the data lines are disposed on the flexible substrate parallel to a second direction, wherein the first direction is perpendicular to the second direction; and disposing a plurality of micro light emitting diode arrays, wherein each of the micro light emitting diodes is electrically connected to a corresponding data line, and each of the micro light emitting diodes is electrically connected to a corresponding scan line.

A portion of the Micro-LED devices have sidewall current blocking area 501s, and a portion of the Micro-LED devices have sidewall current limiting areas 201.

The Micro-LED device achieved by 3D stacking of arrays of RGB pixels is provided by another embodiment of the invention, and yields of massive transfer can be improved by ion implantation planarization technique. The spare LEDs can be disposed in the sub-pixel according to the technique of 3D stacking of arrays of RGB pixels, thus the production cost for exchanging the broken spot can be prevented. Besides, by shrinking the distance of the sub-pixels, the broken spot may not be easily detected by human eyes because the distance of the sub-pixels is less than the minimum resolution of human eyes, that is, technique of exchanging the broken spot is not needed. Furthermore, the micro-LED can be achieved through transmissive epitaxial substrate combined with 3D stacking of arrays of RGB pixels, and the technique of directly forming the epitaxial chip in the micro-LED display can be achieved, in which massive transfer technique is not needed.

Figure 38:
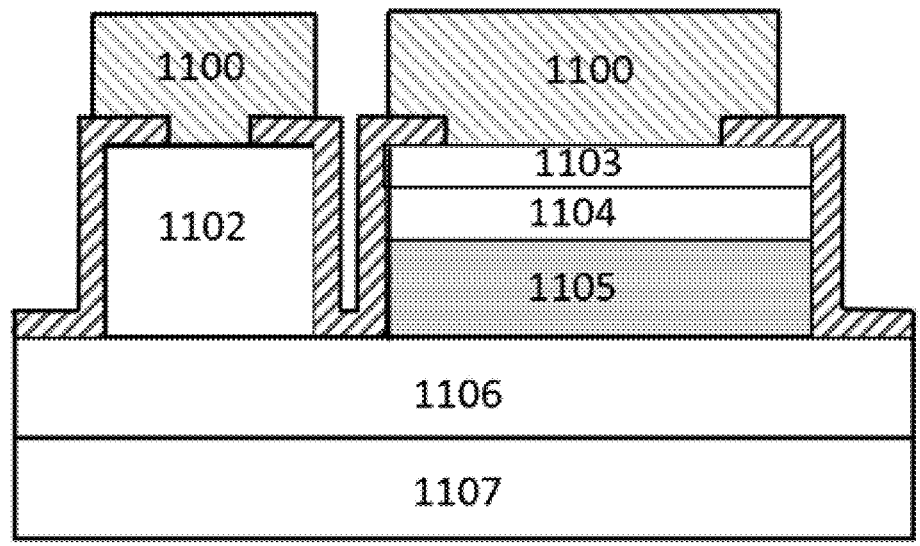
FIG. 38 schematically illustrates the structure of traditional flip chip micro light emitting diode.

Conventionally, a flip-chip micro LED structure is shown in FIG. 38, the size of the micro LED is that the side length of the micro LED is less than 100 micrometers. The side length ranged from 10 micrometers to 100 micrometers can be achieved by conventional manufacturing manners.

Figure 39:
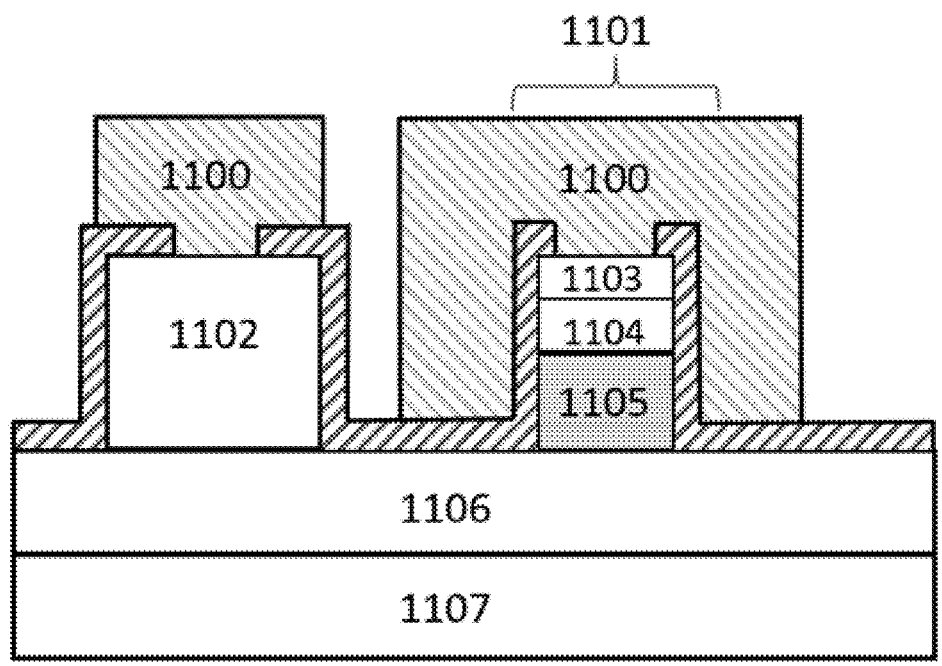
FIG. 39 schematically illustrates the structure of micro light emitting diode which the side length is reduced to lower than 10 micrometers.

When the size is shrunk to be less than 10 micrometers, as shown in FIG. 39, the micro-LED components with smaller pitch can be defined by etching (such as dry etching or wet etching) or cutting, however, the dangling bond (that is, the electrons not bonded) may be easily formed on the surface and sidewall of the components. The dangling bond contains extremely high activity, which can form trap centers easily and cause re-bonding of electron-hole pairs, thereby reducing lifespan of the carrier and reducing transfer efficiency, thereby increasing the ratio of leakage current to total current in the micro-LED, and the light emitting efficiency of the micro-LED may be reduced. The surface roughness and sidewall roughness of the components can be reduced by ion implantation technique in the invention, thereby reducing the non-radiative recombination of the micro-LED, and the efficiency of the micro-LED can be improved.

As shown in FIG. 39, when the size is shrunk to be less than 10 micrometers, the ridge area is easily broken during etching, especially during flip chip process or massive transfer. Besides, because the metal bump is not flat, it would be broken during massive transfer, and production yields would be reduced.

Figure 40:
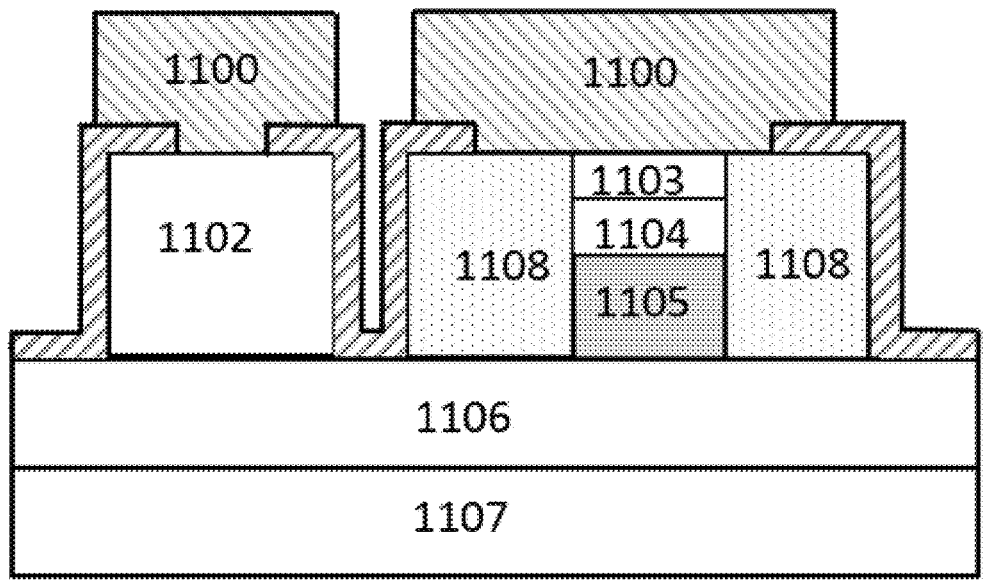
FIG. 40 schematically illustrates the structure of flip chip micro light emitting diode which the side length is reduced to lower than 10 micrometers by ion implantation.

As shown in FIG. 40, the size of the flip chip micro LED is shrunk by ion implantation technique, and because the surface flatness is increased, problems like broken of the etched ridge area or unflat of metal bump can be solved, and production yields can be improved.

Figure 41:
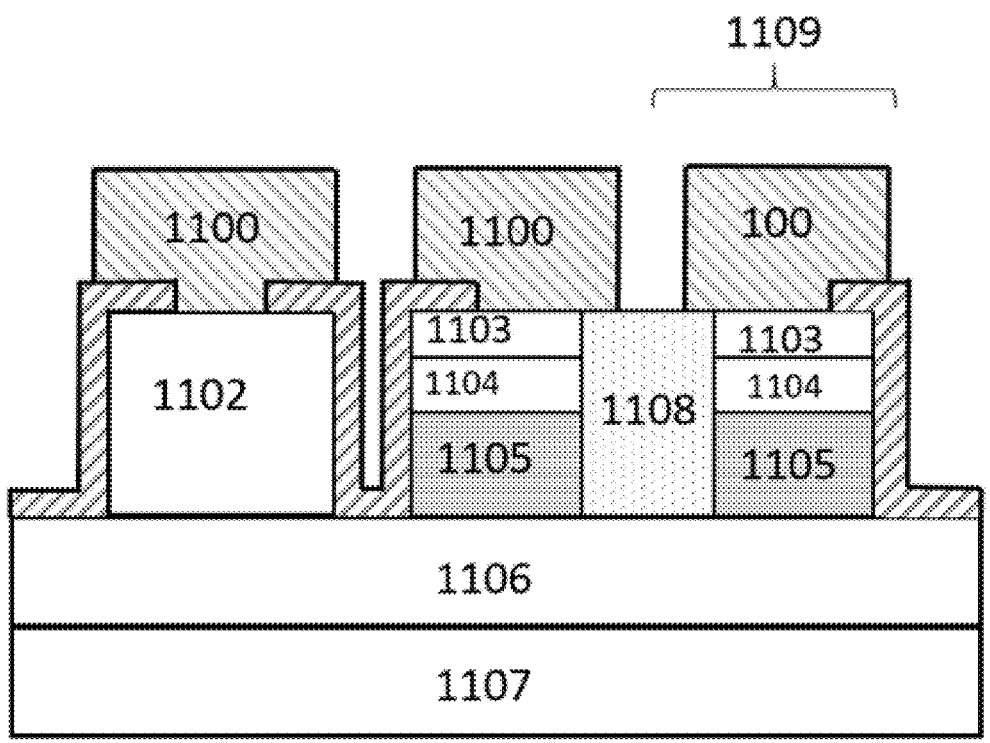
FIG. 41 schematically illustrates the structure including at least one redundancy micro light emitting diode formed through ion implantation technique.

As shown in FIG. 41, at least one spare LED is disposed in the structure by ion implantation technique to prevent extra cost for exchanging the broken spot.

AS shown in FIG. 42-1, a first epitaxial layer structure (Epi layer-1) is formed on the first epitaxial substrate S1, and a first micro-LED M1 with the pitch P1 is formed by photolithography and etching process. FIG. 42-2 schematically illustrates a horizontal cross-sectional view along line A-A' in the top view of FIG. 42-3.

As shown in FIG. 43-1 and FIG. 43-2, the first ion implantation area Ion-1 and the first sub-pixel area R1 can be defined on the first micro-LEDs M1 by ion implantation technique.

As shown in FIG. 44-1, FIG. 44-2 and FIG. 44-3, a conductive layer ML is formed above the first sub-pixel area R1. FIG. 44-1 and FIG. 44-2 schematically illustrates a horizontal cross-sectional view along line A-A' and line A"-A'" in FIG. 44-3 respectively.

AS shown in FIG. 45-1, the first sub-pixels R1 including the conductive layer ML are electrically connected to the first transparent substrate T1 through a bonding pad respectively, and the first epitaxial substrate S1 is removed by etching or laser, as shown in FIG. 45-2. Then, a first light-transmissive intermediate layer B1 is filled between the first transparent substrate T1 and the first sub-pixels R1 to strengthen the mechanical structure, wherein the first micro-LEDs M1 located on the first transparent substrate T1 has a pitch P2, and the pitch P1 is equal to pitch P2. FIG. 45-2 schematically illustrates a first sub-pixel array structure.

As shown in FIG. 46-1, a second epitaxial layer structure (Epi layer-2) is formed on the second epitaxial substrate S2, and second micro-LEDs M2 with a pitch P3 are formed by photolithography and etching process. FIG. 46-2 schematically illustrates a horizontal cross-sectional view along line C-C' in the top view of FIG. 46-3.

As shown in FIG. 47-1 and FIG. 47-2, a first region Ion-2$a$ of the second ion implantation area, a second region Ion-2$b$ of the second ion implantation area and a second sub-pixel area G1 can be defined on each of the second micro-LEDs M2 by ion implantation technique.

As shown in FIG. 48-1, FIG. 48-2 and FIG. 48-3, a conductive layer ML is formed above the second sub-pixel area G1. FIG. 48-1 and FIG. 48-2 schematically illustrate a horizontal cross-sectional view along line C-C' and line C"-C'" in FIG. 48-3 respectively.

As shown in FIG. 49-1, the second sub-pixel area G1 including conductive layer ML is electrically connected to a second transparent substrate T2 through a bonding pad respectively, and the second epitaxial substrate S2 is removed by etching or laser, as shown in FIG. 49-2. Then, a second light-transmissive intermediate layer B2 is filled between the second transparent substrate T2 and the second sub-pixels G1 to strengthen the mechanical structure, wherein the second micro light emitting diodes M2 located in the second transparent substrate T2 has a second pitch P4, and the pitch P3 is equal to the second pitch P4. FIG. 49-2 schematically illustrates a second sub-pixel array structure.

As shown in FIG. 50-1, a third epitaxial layer structure (Epi layer-3) is formed on the third epitaxial substrate S3, and third micro-LEDs M3 with a pitch P5 are formed by photolithography and etching process. FIG. 50-2 schematically illustrates a horizontal cross-sectional view along line C-C' in the top view shown in FIG. 50-3.

As shown in FIG. 51-1 and FIG. 51-2, the third ion implantation area Ion-3 and the third sub-pixel area B1 can be defined on the third micro-LEDs M3 by ion implantation technique.

As shown in FIG. 52-1, FIG. 52-2 and FIG. 52-3, a conductive layer ML is formed above the third sub-pixel area B1. FIG. 52-1 and FIG. 52-2 schematically illustrate a horizontal cross-sectional view along line E-E' and line E"-E'" in the top view of FIG. 52-3 respectively.

As shown in FIG. 53-1, the third sub-pixel area B1 including conductive layer ML is electrically connected to a third transparent substrate T3 through a bonding pad, and the third epitaxial substrate S3 is removed by etching or laser, as shown in FIG. 53-2. Then, a third light-transmissive intermediate layer B3 is filled between the third transparent substrate T3 and the third sub-pixel B1 to strengthen the mechanical structure, wherein the third micro-LEDs M3 located in the third transparent substrate T3 have a pitch P6, and the pitch P5 is equal to the pitch P6. FIG. 53-2 schematically illustrates a third sub-pixel array structure, wherein the pitch P2 is equal to the pitch P4 and equal to the pitch P6.

FIG. 54-1 and FIG. 54-2 schematically illustrates stacking a first sub-pixel structure, a second sub-pixel structure, and a third sub-pixel structure by light-transmissive adhesive layers (A-1 and A-2) to form a three-dimensional (3-D) stack of RGB pixels array, thereby achieving the micro LED, wherein FIG. 54-2 schematically illustrates an enlargement view of the first pixel (pixel 1) and a horizontal cross-sectional view along line G-G' in FIG. 54-3. The first sub-pixel area R1 is equal to the first region Ion-2$a$ of the second ion implantation area, the third sub-pixel area B1 is equal to the second region Ion-2$b$ of the second ion implantation area, and the second sub-pixel area G1 plus the third sub-pixel area B1 are equal to the first ion implantation area Ion-1. The Micro-LED achieved by 3D stacking of RGB pixels arrays according to the invention has a thickness D-1, wherein the thickness D-1 is less than 500 micrometers in an embodiment, the thickness D-1 is less than 200 micrometers in a preferable embodiment, the thickness D-1 is less than 100 micrometers in a more preferable embodiment, and the thickness D-1 is less than 50 micrometers in an even more preferable embodiment. In an embodiment, the sub-pixel with the longest wavelength is located at the bottom, and the sub-pixel with the shortest wavelength is located at the top, thereby preventing the sub-pixel with short wavelength from exciting the sub-pixel with a long wavelength, but the wavelength range of the light of the sub-pixels is not limited thereto. The Micro-LED is achieved by 3D stacking of RGB pixels arrays, wherein the light transmittance of the Micro-LED is greater than 60% in an embodiment, the light transmittance of the Micro-LED is greater than 70% in a preferable embodiment, the light transmittance of the Micro-LED is greater than 80% in a more preferable embodiment, and the light transmittance of the Micro-LED is greater than 90% in an even more preferable embodiment.

The transparent substrate T1, T2 and T3 of the invention may be a flexible substrate, wherein the material of the flexible substrate may include ultra-thin glass, metal foil, fiber-reinforced composite material, plastic film, ceramic substrate or the combinations thereof, wherein a preferable thickness of the flexible substrate is less than 200 micrometers, a more preferable thickness of the flexible substrate is less than 50 micrometers, and an even more preferable thickness of the flexible substrate is in a range from 25 micrometers to 50 micrometers.

The coefficient of thermal expansion of the metal foil is similar to the coefficient of thermal expansion of the ultra-thin glass. The surface roughness Ra of the transparent metal foil is less than 10 nanometers. The light transmittance of the plastic film is greater than 90% under a wavelength of 550 nanometer. The material of the plastic film may for example include polyethylene terephthalate (PET), polyethylene naphthalate (PEN) or polyethersulfone (PES). The fiber-reinforced composite material may for example include carbon fibers, silicon carbide fibers or boron filament.

In another embodiment of the invention shown in FIG. 55-1 and FIG. 55-2, R1-1 is the first sub-pixel, R1-2 is the first spare sub-pixel, G1-1 is the second sub-pixel, G1-2 is the second spare sub-pixel, B1-1 is the third sub-pixel, and B1-2 is the third spare sub-pixel. By controlling the sub-pixels through the circuit, only one of the sub-pixels R1-1 and R1-2 can emit light, only one of the sub-pixels G1-1 and G1-2 can emit light, and only one of the sub-pixels B1-1 and B1-2 can emit light. Besides, the first sub-pixel (R1-1) area plus the first spare sub-pixel (R1-2) area are equal to the first region Ion-2a of the second ion implantation area, the third sub-pixel (B1-1) area plus the third spare sub-pixel (B1-2) area are equal to the second region Ion-2b of the second ion implantation area, and the second sub-pixel (G1-1) area plus the second spare sub-pixel area (G1-2), the third sub-pixel (B1-1) area and the third spare sub-pixel (B1-2) area are equal to the first ion implantation area Ion-1.

$$(R1-1) + (R1-2) = \text{Ion}-2a$$
$$(B1-1) + (B1-2) = \text{Ion}-2b$$
$$(G1-1) + (G1-2) + (B1-1) + (B1-2) = \text{Ion}-1$$

In another embodiment of the invention shown in FIG. 56-1 and FIG. 56-2, R1-1 is the first sub-pixel, R1-2, R1-3, R1-4, R1-5 and R1-6 are the first spare sub-pixels, G1-1 is the second sub-pixel, G1-2, G1-3 and G1-4 are the second spare sub-pixels, B1-1 is the third sub-pixel, and B1-2 is the third spare sub-pixel. By controlling the sub-pixels by the circuit, only one of the sub-pixels R1-1, R1-2, R1-3, R1-4, R1-5 and R1-6 can emit light, only one of the sub-pixels G1-1, G1-2, G1-3 and G1-4 can emit light, and only one of the sub-pixels B1-1 and B1-2 can emit light. The advantages of the design include that the usage of the spare sub-pixels is more flexible.

The first sub-pixel (R1-1) area plus the first spare sub-pixel (R1-2) area is equal to the second ion implantation area Ion-2.

$$(R1-1) + (R1-2) = \text{Ion}-2$$
$$(R1-3) + (R1-4) = (G1-1) + (G1-2)$$
$$(R1-5) + (R1-6) = (G1-3) + (G1-4) = (B1-1) + (B1-2)$$
$$(R1-1) + (R1-2) + (R1-3) + (R1-4) = \text{Ion}-3$$

In another embodiment of the invention shown in FIG. 57-1 and FIG. 57-2, R1-1 is the first sub-pixel, R1-2, R1-3, R1-4, R1-5 and R1-6 are first spare sub-pixels, G1-1 is the second sub-pixel, G1-2, G1-3, G1-4, G1-5 and G1-6 are second spare sub-pixels, B1-1 is the third sub-pixel, B1-2, B1-3, B1-4, B1-5 and B1-6 are third spare sub-pixels. By controlling the sub-pixels by the circuit, only one of the sub-pixels R1-1, R1-2, R1-3, R1-4, R1-5 and R1-6 can emit light, only one of the sub-pixels G1-1, G1-2, G1-3, G1-4, G1-5 and G1-6 can emit light, and only one of the sub-pixels B1-1, B1-2, B1-3, B1-4, B1-5 and B1-6 can emit light. The advantages of the design include that the usage of the spare sub-pixels is more flexible. The relations between different sub-pixel areas are shown below:

$$(R1-1) = (G1-5) = (B1-3)$$
$$(R1-2) = (G1-6) = (B1-4)$$
$$(R1-3) = (G1-1) = (B1-5)$$
$$(R1-4) = (G1-2) = (B1-6)$$
$$(R1-5) = (G1-3) = (B1-1)$$
$$(R1-6) = (G1-4) = (B1-2)$$

In another embodiment of the invention shown in FIG. 58-1 and FIG. 58-2, R1-1A, R1-2A, R1-3A, R1-4A, R1-5A and R1-6A are the first sub-pixels, G1-1A, G1-2A, G1-3A, G1-4A, G1-5A and G1-6A are the second sub-pixels, B1-1A, B1-2A, B1-3A, B1-4A, B1-5A and B1-6A are the third sub-pixels.

Pixel 1 is composed of pixel 1A to pixel 1F, because the width of any one of the pixel 1A to pixel 1F is less than the resolution of human eyes, spare pixel is not necessary. Because human eyes cannot recognize the broken dots when one of the pixel 1A to pixel 1F is broken, exchange of the broken dot is not necessary. According to an embodiment of the invention, the resolution of the monitor may for example be 1440×960 (pixels), the pixel number per inch is 494.48 ppi (pixels per inch), and the dot pitch of the sub-pixels is less than 0.0514 micrometers, which is enough to make it impossible for human eyes to recognize the broken dots of a single pixel at normal viewing distance, such that the spare pixel is not necessary. In a preferable embodiment of the invention, the resolution of the monitor is 1920×1280 (pixels), the pixel number per inch is 659.3 ppi, and the dot pitch of the sub-pixels is less than 0.0385 micrometers, which is enough to make it impossible for human eyes to recognize the broken dots of a single pixel at normal viewing distance, such that the spare pixel is not necessary even if any adjacent one of the micro light emitting diodes is out of order. In a better embodiment of the invention, the resolution of the monitor is 3840×2560 (pixels), the pixel number per inch is 1318.6 ppi, and the dot pitch of the sub-pixels is less than 0.0193 micrometers, which is enough to make it impossible for human eyes to recognize the broken dots of a single pixel at normal viewing distance, such that the spare pixel is not necessary even if any adjacent two of the micro light emitting diodes are out of order.

According to another embodiment of the invention shown in FIG. 59, the epitaxial substrate S1, S2 and S3 are transparent substrates, that is, the micro LED can be formed through 3D stacking of RGB pixels without transfer to a transparent substrate, thereby simplifying the process.

According to an embodiment of the invention shown in FIG. 60, a black matrix layer BM is further included to increase the contrast of the pixels.

According to another embodiment of the invention shown in FIG. 61, each of the micro light emitting diodes further includes a magnetic layer ML to improve the precision of 3D stacking, wherein the magnetic layer can be formed through doping, ion implantation, diffusion or thin film deposition, and the magnetic material may for example include Fe, Co, Ni, Tb, Al, Pt, Sm, Cu, Cr or the combinations thereof.

According to another embodiment of the invention shown in FIG. 62, each of the micro light emitting diodes further includes a current blocking area located on the surface and at the sidewall region of the micro light emitting diodes, the current blocking area can reduce the non-radiative recombination of the micro light emitting diodes, thereby improving the efficiency of the micro light emitting diodes. The current blocking area is composed of dielectric material such as silicon nitride, silicon dioxide or aluminum oxide (Al2O3), and the sidewall-covering region of the current blocking area of the invention has an arc.

According to another embodiment of the invention shown in FIG. 63, each of the micro light emitting diodes further includes a current limiting area located on the surface and at the sidewall region of the micro light emitting diodes, the current limiting area can reduce the non-radiative recombination of the micro light emitting diodes, thereby improving the efficiency of the micro light emitting diodes. The current limiting area can be formed through formed through ion implantation technique.

According to another embodiment of the invention shown in FIG. 64-1, light emitting of the micro light emitting diodes can be controlled by electrically connecting an integrated control system to the micro-LED display, and the image displayed by the micro-LED display can be projected to an optical component through a lens system and reflected to human eyes. Human eyes can see an augmented reality (AR) formed by actual scene and the images produced by the micro-LED display through the optical component, wherein the optical component can be a transmissive windshield glass, a transparent resin glass, a transmissive eyeglasses lens or a foldable display which has light transmission and reflection function. The Micro-LED in the micro-LED display can be achieved by 3D stacking of RGB pixels arrays combined with ion implantation planarization technique. The preferable side length of the Micro-LED is less than 4 micrometers in the invention.

FIG. 64-2 illustrates another embodiment of the invention, one of the difference between this embodiment and the embodiment shown in FIG. 64-1 is that the RGB micro-LED display can be controlled independently by respectively electrically connecting the integrated control system and the RGB micro-LED display. Since the RGB micro-LED display can be controlled independently to display images by projection, massive transfer is not necessary, and the RGB micro-LED display can be formed in a single epitaxial chip. The Micro-LED in the micro-LED display can be achieved by 3D stacking of RGB pixels arrays combined with ion implantation planarization technique. The preferable side length of the Micro-LED is less than 4 micrometers in the invention.

According to another embodiment of the invention shown in FIG. 64-3, the micro-LED display and the lens system are integrated into an optical component, the images of the micro-LED display is projected to the lens system and reflected to human eyes by electrically connecting an integrated control system and the micro-LED display. Human eyes can see an augmented reality (AR) formed by actual scene and the images produced by the micro-LED display through the optical component, wherein the optical component can be a transmissive windshield glass, a transparent resin glass, a transmissive eyeglasses lens or a foldable display. The integrated control system can be disposed inside or outside the optical component. The Micro-LED in the micro-LED display can be achieved by 3D stacking of RGB pixels arrays combined with ion implantation planarization technique. The preferable side length of the Micro-LED is less than 4 micrometers in the invention.

According to another embodiment of the invention shown in FIG. 64-4, one of the difference between this embodiment and the embodiment shown in FIG. 64-3 is that the RGB micro-LED display can be controlled independently by respectively electrically connecting the integrated control system and the RGB micro-LED display, and the RGB micro-LED display can controlled independently and display image by projection, thus massive transfer is not necessary and the RGB micro-LED display can be achieved in a single epitaxial chip. The integrated control system can be disposed inside or outside the optical component. The Micro-LED in the micro-LED display can be achieved by 3D stacking of RGB pixels arrays combined with ion implantation planarization technique. The preferable side length of the Micro-LED is less than 4 micrometers in the invention.

As shown in FIG. 64-5, the above-mentioned integrated control system further includes a multi-function sensor, microchip processors, a network interface to make the user capable of controlling the micro-LED display and provide an appropriate augmented reality, wherein the multi-function sensor may for example include ultrasonic sensor, thermal sensor, humidity sensor, gas sensor, pressure sensor, acceleration sensor, ultraviolet light sensor, magnetic-sensitive sensor, magnetic-resistive sensor, image sensor, electricity sensor, displacement sensor, touch sensor, infrared proximity/distance sensor, global positioning system module, gyroscope, accelerometer, fingerprint sensor, iris sensor, button, knob, switch, microphone, camera or RFID reader module. User can adjust or zoom in/zoom out the position and size of the augmented reality by the multi-function sensor, and the appropriate information of the augmented reality can be provided. In an embodiment, the position of the projection of the augmented reality can be adjusted by sensing the position and status of the pupil through the multi-function sensor cooperating with the microchip processors to make sure the actual scene perceived by human eyes through the optical component can fit the augmented reality, thereby preventing distortion of the augmented reality, and precise display can be achieved. Besides, data can be transferred to another network by cooperating with the network interface to provide appropriate information of the augmented reality.

A smart glass structure is shown in FIG. 65-1. An integrated control system and a display are disposed on a frame. An image is projected to an optical component by the display and reflected to human eyes. Human eyes can see an augmented reality formed by actual scene and the images produced by the micro-LED display through the optical component. The smart glass structure is limited to the size of light source, so it can't achieve the advantages such as thinness and shortness. The techniques of the display may be substantially divided into digital light processing (DLP), microelectromechanical system (MEMS) laser, liquid crystal on silicon (LCOS), etc., wherein the DLP technique is a digital micro-mirror device (DMD) based on a microelectromechanical system component. The volume of the complex periphery circuit of the DMD is greater, and switching of the MEMS component in high frequency also causes the problem of excessive power consumption. Besides, the disadvantages of LCOS technique include low light emitting efficiency and large volume. The invention replaces the normal display with the micro-LED display, which not only improves the resolution, but also shrinks the size of the device to fit the size of wearable device(s). Therefore, competitiveness in the market can be improved because of the advantages like low power consumption and smaller size. Besides, the normal smart glass is limited to the size of the light source of the display and the design of reflective mirror, so the provided range of the augmented reality is also limited. Because the size of the display is shrunk in the invention, the design of light path of the projection is more flexible, a wider range of the augmented reality can be provided, and a more comfortable environment when using the device can be provided. The Micro-LED in the micro-LED display can be achieved by 3D stacking of RGB pixels arrays combined with ion implantation planarization technique. The preferable side length of the Micro-LED is less than 4 micrometers in the invention.

An embodiment of the invention is shown in FIG. 65-2. An integrated control system combined with the display is disposed on a frame, an image is projected to an optical component by the display and reflected to human eyes. Human eyes can see an augmented reality formed by actual scene and the images produced by the micro-LED display through the optical component.

An embodiment of the invention is shown in FIG. 65-3. An integrated control system combined with the micro-LED display is disposed at the top of the rims, and an image is projected to an optical component by the display and reflected to human eyes. Human eyes can see an augmented reality formed by actual scene and the images produced by the micro-LED display through the optical component.

An embodiment of the invention is shown in FIG. 65-4. An integrated control system combined with the micro-LED display is disposed at any periphery position of the rims or disposed in the bridge connecting the rims which makes the combined structure not limited to the shape of the rims, and an image is projected to an optical component by the display and reflected to human eyes. Human eyes can see an augmented reality formed by actual scene and the images produced by the micro-LED display through the optical component.

An embodiment of the invention is shown in FIG. 65-5. An integrated control system is disposed at the top of the rims, and the micro-LED display and the lens system are integrated into an optical component. The image of the micro-LED display can be projected to the lens system by electrically connecting the integrated control system and the micro-LED display and reflected to human eyes. Human eyes can see an augmented reality formed by actual scene and the images produced by the micro-LED display through the optical component.

Another embodiment of the invention is shown in FIG. 66-1, wherein the micro LED structure in this embodiment has a magnetic layer. First, an epitaxial substrate is provided, and then, the magnetic layer ML is formed above the epitaxial substrate, wherein the material of the magnetic layer may include a semiconductor layer, a conductive layer and an oxide layer, and the magnetic layer can be formed through doping, ion implantation, diffusion, thin film deposition. The magnetic material formed by doping, ion implantation, diffusion or thin film deposition may include Fe, Co, Ni, Tb, Al, Pt, Sm, Cu, Cr or the combinations thereof. After that, a first type semiconductor layer, a light emitting layer and a second type semiconductor layer are sequentially formed on the magnetic layer.

A lateral magnetic micro LED structure is shown in FIG. 66-2. The lateral magnetic micro LED structure is formed by removing a portion of the second type semiconductor layer and the light emitting layer through etching, exposing a portion of the first type semiconductor layer, forming a metal layer ohm contacted with the first type semiconductor layer, forming another metal later ohm contacted with the second type semiconductor layer, and removing the epitaxial substrate.

A vertical magnetic micro LED structure is shown in FIG. 66-3. The vertical magnetic micro LED structure is formed by forming a metal layer ohm contacted with the second type semiconductor layer, exposing the magnetic layer by removing the epitaxial substrate, and forming another metal layer ohm contacted with the magnetic layer.

Another vertical magnetic micro-LED structure is shown in FIG. 66-4. The vertical magnetic micro-LED structure is formed by forming a metal layer ohm contacted with the second type semiconductor layer, exposing the first type semiconductor layer by removing the epitaxial substrate and a portion of the magnetic layer, and forming another metal layer ohm contacted with the first type semiconductor layer.

The magnetic micro-LED shown in FIG. 66-5, FIG. 66-6 and FIG. 66-7 further includes a first current blocking layer located at the surface and sidewall region of the magnetic micro-LED. The first current blocking layer can reduce the non-radiative recombination of the magnetic micro-LED, thereby improving the efficiency of the micro-LED. The first current blocking layer is composed of dielectric material such as silicon nitride, silicon dioxide or aluminum oxide (Al2O3).

The magnetic micro-LED shown in FIG. 66-8, FIG. 66-9 and FIG. 66-10 further includes a first current limiting layer located at the surface and sidewall region of the magnetic micro-LED. The first current limiting layer can reduce the non-radiative recombination of the magnetic micro-LED, thereby improving the efficiency of the micro-LED. The first current limiting layer is formed through ion implantation technique.

A lateral magnetic micro-LED structure is shown in FIG. 66-11. The lateral magnetic micro-LED structure is formed by removing a portion of the second type semiconductor layer and the light emitting layer through etching, exposing a portion of the first type semiconductor layer, forming a metal layer ohm contacted with the first type semiconductor layer, forming a second current blocking layer above the second type semiconductor layer, forming a transparent conductive layer above the second type semiconductor layer and in ohm contact with the second type semiconductor layer, wherein the transparent conductive layer covers the second current blocking layer, removing a portion of the transparent conductive layer and the second current blocking layer, exposing a portion of the second type semiconductor layer, forming another metal layer directly in contact with the second type semiconductor layer and electrically connected to the transparent conductive layer, forming a first current blocking layer covering the sidewall region and the transparent conductive layer and removing the epitaxial substrate.

The first current blocking layer can reduce the non-radiative recombination of the magnetic micro-LED, thereby improving the efficiency of the micro-LED, wherein the first current blocking layer is composed of dielectric material. The second current blocking layer can prevent the current crowding effect and improve the effect of current spreading, thereby increasing the probability of electron-hole recombination, and light emitting efficiency can be improved, wherein the second current blocking layer is composed of dielectric material. The another metal layer is directly in contact with the second type semiconductor layer, which gives the effect of stable bonding, and the stability of the structure can be improved.

A lateral magnetic micro-LED structure is shown in FIG. 66-12. The lateral magnetic micro-LED structure is formed by removing a portion of the second type semiconductor layer and the light emitting layer through etching, exposing a portion of the first type semiconductor layer, forming a metal layer ohm contacted with the first type semiconductor layer, forming a second current limiting layer at the top region inside the second type semiconductor layer, forming a transparent conductive layer above the second type semiconductor layer and in ohm contact with the second type semiconductor layer, wherein the transparent conductive layer covers the second current limiting layer, removing a portion of the transparent conductive layer, exposing a portion of the second type semiconductor layer, forming another metal layer directly in contact with the second type semiconductor layer and electrically connected to the transparent conductive layer, forming a first current limiting layer at the sidewall region and removing the epitaxial substrate. The first current limiting layer is located at the surface and sidewall region of the magnetic micro-LED. The first current limiting layer can reduce the non-radiative recombination of the magnetic micro-LED, thereby improving the efficiency of the magnetic micro-LED, wherein the first current limiting layer can be formed through ion implantation technique. The second current limiting layer can prevent the current crowding effect and improve the effect of current spreading, thereby increasing the probability of electron-hole recombination, and light emitting efficiency can be improved, wherein the second current limiting layer is formed by ion implantation technique. The another metal layer is directly in contact with the second type semiconductor layer, which gives the effect of stable bonding, and the stability of the structure can be improved.

A lateral magnetic micro-LED structure is shown in FIG. 66-13. The lateral magnetic micro-LED structure is formed by removing a portion of the second type semiconductor layer and the light emitting layer through etching, exposing a portion of the first type semiconductor layer, forming a metal layer ohm contacted with the first type semiconductor layer, forming a second current limiting layer at the top region inside the second type semiconductor layer, forming a transparent conductive layer above the second type semiconductor layer and in ohm contact with the second type semiconductor layer, wherein the transparent conductive layer covers the second current limiting layer, removing a portion of the transparent conductive layer, exposing a portion of the second type semiconductor layer, forming another metal layer directly in contact with the second type semiconductor layer and electrically connected to the transparent conductive layer, forming a first current blocking layer covering the sidewall region and the transparent conductive layer and removing the epitaxial substrate. The first current blocking layer can reduce the non-radiative recombination of the magnetic micro-LED, thereby improving the efficiency of the magnetic micro-LED, wherein the first current blocking layer is composed of dielectric material. The second current limiting layer can prevent the current crowding effect and improve the effect of current spreading, thereby increasing the probability of electron-hole recombination, and light emitting efficiency can be improved, wherein the second current limiting layer is formed by ion implantation technique. The another metal layer is directly in contact with the second type semiconductor layer, which gives the effect of stable bonding, and the stability of the structure can be improved.

A lateral magnetic micro-LED structure is shown in FIG. 66-14. The lateral magnetic micro-LED structure is formed by removing a portion of the second type semiconductor layer and the light emitting layer through etching, exposing a portion of the first type semiconductor layer, forming a metal layer ohm contacted with the first type semiconductor layer, forming a second current blocking layer above the second type semiconductor layer, forming a transparent conductive layer above the second type semiconductor layer and in ohm contact with the second type semiconductor layer, wherein the transparent conductive layer covers the second current blocking layer, removing a portion of the transparent conductive layer and the second current blocking layer, exposing a portion of the second type semiconductor layer, forming another metal layer directly in contact with the second type semiconductor layer and electrically connected to the transparent conductive layer, forming a first current limiting layer at the sidewall region and removing the epitaxial substrate. The first current limiting layer is located at the surface and sidewall region of the magnetic micro-LED. The first current limiting layer can reduce the non-radiative recombination of the magnetic micro-LED, thereby improving the efficiency of the magnetic micro-LED, wherein the first current limiting layer is formed through ion implantation technique. The second current blocking layer can prevent the current crowding effect and improve the effect of current spreading, thereby increasing the probability of electron-hole recombination, and light emitting efficiency can be improved, wherein the second current blocking layer is composed of dielectric material. The another metal layer is directly in contact with the second type semiconductor layer, which gives the effect of stable bonding, and the stability of the structure can be improved.

A vertical magnetic micro-LED structure is shown in FIG. 66-15, the vertical magnetic micro-LED structure is formed by forming a second current blocking layer above the second type semiconductor layer, forming a transparent conductive layer above the second type semiconductor layer and in ohm contact with the second type semiconductor layer, wherein the transparent conductive layer covers the second current blocking layer, removing a portion of the transparent conductive layer and the second current blocking layer, exposing a portion of the second type semiconductor layer, forming a metal layer directly in contact with the second type semiconductor layer and electrically connected to the transparent conductive layer, exposing the first type semiconductor layer by removing the epitaxial substrate and a portion of the magnetic layer, forming another metal layer ohm contacted with the first type semiconductor layer and forming a first current blocking layer covering the sidewall region and the transparent conductive layer. The first current blocking layer can reduce the non-radiative recombination of the magnetic micro-LED, thereby improving the efficiency of the magnetic micro-LED, wherein the first current blocking layer is formed through ion implantation technique. The second current blocking layer can prevent the current crowding effect and improve the effect of current spreading, thereby increasing the probability of electron-hole recombination, and light emitting efficiency can be improved, wherein the second current blocking layer is composed of dielectric material. The another metal layer is directly in contact with the second type semiconductor layer, which gives the effect of stable bonding, and the stability of the structure can be improved.

A vertical magnetic micro-LED structure is shown in FIG. 66-16, the vertical magnetic micro-LED structure is formed by forming a first current limiting layer at the sidewall region, forming a second current limiting layer at the top region inside the second type semiconductor layer, forming a transparent conductive layer located above the second type semiconductor layer and in ohm contact with the second type semiconductor layer, wherein the transparent conductive layer covers the second current limiting layer, removing a portion of the transparent conductive layer, exposing a portion of the second type semiconductor layer, forming a metal layer directly in contact with the second type semiconductor layer and electrically connected to the transparent conductive layer, forming a first current limiting layer at the sidewall region, exposing the first type semiconductor layer by removing the epitaxial substrate and a portion of the magnetic layer and forming another metal layer in ohm contact with the first type semiconductor layer. The first current limiting layer is located at the surface and sidewall region of the magnetic micro-LED. The first current limiting layer can reduce the non-radiative recombination of the magnetic micro-LED, thereby improving the efficiency of the magnetic micro-LED, wherein the first current limiting layer is formed through ion implantation technique. The second current limiting layer can prevent the current crowding effect and improve the effect of current spreading, thereby increasing the probability of electron-hole recombination, and light emitting efficiency can be improved, wherein the second current limiting layer is formed through ion implantation technique. The another metal layer is directly in contact with the second type semiconductor layer, which gives the effect of stable bonding, and the stability of the structure can be improved.

A vertical magnetic micro-LED structure is shown in FIG. 66-17, the vertical magnetic micro-LED structure is formed by forming a second current limiting layer at the top region inside the second type semiconductor layer, forming a transparent conductive layer above the second type semiconductor layer and in ohm contact with the second type semiconductor layer, wherein the transparent conductive layer covers the second current limiting layer, removing a portion of the transparent conductive layer, exposing a portion of the second type semiconductor layer, forming a metal layer directly in contact with the second type semiconductor layer and electrically connected to the transparent conductive layer, forming a first current blocking layer covering the sidewall region and the transparent conductive layer, exposing the first type semiconductor layer by removing the epitaxial substrate and a portion of the magnetic layer and forming another metal layer in ohm contact with the first type semiconductor layer.

The first current blocking layer can reduce the non-radiative recombination of the magnetic micro-LED, thereby improving the efficiency of the magnetic micro-LED, wherein the first current blocking layer is composed of dielectric material. The second current limiting layer can prevent the current crowding effect and improve the effect of current spreading, thereby increasing the probability of electron-hole recombination, and light emitting efficiency can be improved, wherein the second current limiting layer is formed through ion implantation technique. The another metal layer is directly in contact with the second type semiconductor layer, which gives the effect of stable bonding, and the stability of the structure can be improved.

A vertical magnetic micro-LED structure is shown in FIG. 66-18, the vertical magnetic micro-LED structure is formed by forming a first current limiting layer at the sidewall region, forming a second current blocking layer above the second type semiconductor layer, forming a transparent conductive layer located above the second type semiconductor layer and in ohm contact with the second type semiconductor layer, wherein the transparent conductive layer covers the second current blocking layer, removing a portion of the transparent conductive layer and the second current blocking layer, exposing a portion of the second type semiconductor layer, forming a metal layer directly in contact with the second type semiconductor layer and electrically connected to the transparent conductive layer, exposing the first type semiconductor layer by removing the epitaxial substrate and a portion of the magnetic layer and forming another metal layer in ohm contact with the first type semiconductor layer. The first current limiting layer is located at the surface and sidewall region of the magnetic micro-LED. The first current limiting layer can reduce the non-radiative recombination of the magnetic micro-LED, thereby improving the efficiency of the magnetic micro-LED, wherein the first current limiting layer is formed through ion implantation technique. The second current blocking layer can prevent the current crowding effect and improve the effect of current spreading, thereby increasing the probability of electron-hole recombination, and light emitting efficiency can be improved, wherein the second current blocking layer is composed of dielectric material. The another metal layer is directly in contact with the second type semiconductor layer, which gives the effect of stable bonding, and the stability of the structure can be improved.

As shown in FIG. 66-19, because the magnetic micro-LED has a magnetic layer, the micro-LED with the magnetic layer can be massively transferred to a target substrate by controlling a transferring head which is magnetically attractive and controllable. Because the magnetic force of the magnetic layer shows good attraction to the transferring head, yields of massive transfer can be improved.

As shown in FIG. 66-20, the magnetic micro-LED structure of the invention is more suitable for fluid massive transfer. When the magnetic micro-LED is located in the fluid transfer system, because the magnetic micro-LED has a magnetic layer structure, the magnetic micro-LED can provide self-alignment function through the magnetic layer, and the probability of misalignment (for example, opposite polarity or wrong position) happened during the fluid transfer can be reduced, thereby improving the yields of massive transfer and reducing the cost.

A fluid transfer system including a main chamber is shown in FIG. 66-20. The main chamber includes a solution. A substrate is disposed in the main chamber, wherein the substrate has a plurality of recesses, the central of the recesses have a plurality of corresponding magnetic layers, the magnetic layer is located in the substrate, and a portion of the magnetic layer is exposed. The main chamber further includes an input end, an input valve, an output end and an output valve. By controlling the aperture ratio of the input valve and the output valve, the solution can form a fluid with a flow rate F. The fluid transfer system includes a first sub-chamber, a second sub-chamber and a third sub-chamber, the first sub-chamber has a plurality of magnetic micro-LEDs with a first color, the solution, a first valve and a first input port. When the first valve is opened, the plurality of magnetic micro-LEDs with the first color can be moved downward through the first valve to a main chamber by the solution injected from the first input port, and the magnetic micro-LEDs with the first color are respectively moved to the corresponding recess above the substrate by the fluid. The magnetic micro-LEDs with the first color may be attracted by the magnetic force of the magnetic layer on the substrate and to move to the recess in a perform self-alignment manner, wherein the shape of the recess and the shape of the magnetic micro-LEDs with the first color are the same. Accordingly, transfer of the magnetic micro-LEDs with the first color to the top of the substrate can be achieved.

The second sub-chamber has a plurality of magnetic micro-LEDs with a second color, the solution, a second valve and a second input port. When the second valve is opened, the plurality of magnetic micro-LEDs with the second color can be moved downward through the second valve to a main chamber by the solution injected from the second input port, and the magnetic micro-LEDs with the second color are respectively moved to the corresponding recess above the substrate by the fluid. The magnetic micro-LEDs with the second color may be attracted by the magnetic force of the magnetic layer on the substrate and move to the recess in a self-alignment manner, wherein the shape of the recess and the shape of the magnetic micro-LEDs with the second color are the same. Accordingly, transfer of the magnetic micro-LEDs with the second color to the top of the substrate can be achieved.

The third sub-chamber includes a plurality of magnetic micro-LEDs with the third color, a solution, a third valve and a third input port. When the third valve is opened, the plurality of magnetic micro-LEDs with the third color can be moved downward through the third valve to a main chamber by the solution injected from the third input port, and the magnetic micro-LEDs with the third color are respectively moved to the corresponding recess above the substrate by the fluid. The magnetic micro-LEDs with the third color may be attracted by the magnetic force of the magnetic layer on the substrate and to move to the recess in a self-alignment manner, wherein the shape of the recess and the shape of the magnetic micro-LEDs with the third color are the same. Accordingly, transfer of the magnetic micro-LEDs with the third color to the top of the substrate can be achieved.

FIG. 66-21-1 schematically illustrates a top view of the substrate of the fluid transfer system including a first recess with a first shape, a second recess with a second shape and a third recess with a third shape, wherein each of the recesses has a magnetic layer, the shape of the first recess is the same as the shape of the magnetic micro-LEDs with the first color, the shape of the second recess is the same as the shape of the magnetic micro-LEDs with the second color, and the shape of the third recess is the same as the shape of the magnetic micro-LEDs with the third color.

When the first valve is opened, the plurality of magnetic micro-LEDs with the first color can be moved downward through the first valve to a main chamber by the solution injected from the first input port, and the magnetic micro-LEDs with the first color are respectively moved to the corresponding recess above the substrate by the fluid. The magnetic micro-LEDs with the first color may be attracted by the magnetic force of the magnetic layer on the substrate and move to the recess in a self-alignment manner, wherein the shape of the recess and the shape of the magnetic micro-LEDs with the first color are the same. Accordingly, transfer of the magnetic micro-LEDs with the first color to the top of the substrate can be achieved. The magnetic micro-LEDs with the first color are located in the first recess above the substrate, and a first sub-pixel area is thereby formed.

When the second valve is opened, the plurality of magnetic micro-LEDs with the second color can be moved downward through the second valve to a main chamber by the solution injected from the second input port, and the magnetic micro-LEDs with the second color are respectively moved to the corresponding recess above the substrate by the fluid. The magnetic micro-LEDs with the second color may be attracted by the magnetic force of the magnetic layer on the substrate and move to the recess in a self-alignment manner, wherein the shape of the recess and the shape of the magnetic micro-LEDs with the second color are the same. Accordingly, transfer of the magnetic micro-LEDs with the second color to the top of the substrate can be achieved. The magnetic micro light emitting diodes with the second color are located in the second recess above the substrate, and a second sub-pixel area is thereby formed.

When the third valve is opened, the plurality of magnetic micro-LEDs with the third color can be moved downward through the third valve to a main chamber by the solution injected from the third input port, and the magnetic micro-LEDs with the third color are respectively moved to the corresponding recess above the substrate by the fluid. The magnetic micro-LED with the third color may be attracted by the magnetic force of the magnetic layer on the substrate and move to the recess in a self-alignment manner, wherein the shape of the recess and the shape of the magnetic micro-LEDs with the third color are the same. Accordingly, transfer of the magnetic micro-LEDs with the third color to the top of the substrate can be achieved. The magnetic micro-LEDs with the third color are located in the third recess above the substrate, and a third sub-pixel area is thereby formed.

The first sub-pixel area, the second sub-pixel area and the third sub-pixel area form a pixel area.

FIG. 66-21-2 schematically illustrates a top view of the substrate of the fluid transfer system including a first recess, a second recess and a third recess, wherein each of the recesses has a magnetic layer, and the magnetic layer can be programmatic controlled. For example, the magnetic layer can be controlled to have magnetic attraction or have no magnetic attraction by an electromagnetic force.

Before the first valve is opened, the magnetic layer in the first recess can be controlled to have magnetic attraction, and the second valve and the third valve are controlled to have no magnetic attraction. When the first valve is opened, the plurality of magnetic micro-LEDs with the first color can be moved downward through the first valve to a main chamber by the solution injected from the first input port, and the magnetic micro-LEDs with the first color are respectively moved to the corresponding recess above the substrate by the fluid. The magnetic micro-LEDs with the first color may be attracted by the magnetic force of the magnetic layer on the substrate and move to the recess in a self-alignment manner. When the magnetic micro-LEDs are dropped into the second recess or the third recess, because the magnetic layers in the second recess and the third recess are controlled to have no magnetic attraction, the magnetic micro-LEDs with the first color can be moved out from the second recess or the third recess until it is dropped into the first recess by controlling the flow rate such that the thrust of the flow rate is greater than the capturing force of the second recess and the third recess. Accordingly, transfer of the magnetic micro-LEDs with the first color to the top of the substrate can be achieved, wherein the magnetic micro-LEDs with the first color are located in the first recess above the substrate, and a first sub-pixel area is thereby formed.

Before the second valve is opened, the magnetic layer in the first recess and the second recess can be controlled to have magnetic attraction, and the third valve is controlled to have no magnetic attraction. When the second valve is opened, the plurality of magnetic micro-LEDs with the second color can be moved downward through the second valve to a main chamber by the solution injected from the second input port, and the magnetic micro-LEDs with the second color are respectively moved to the corresponding recess above the substrate by the fluid. The magnetic micro-LEDs with the second color may be attracted by the magnetic force of the magnetic layer on the substrate and move to the recess in a self-alignment manner. When the magnetic micro-LEDs are dropped into the third recess, because the magnetic layers in the third recess are controlled to have no magnetic attraction, the magnetic micro-LED with the second color can be moved out from the third recess until it is dropped into the second recess by controlling the flow rate such that the thrust of the flow rate is greater than the capturing force of the third recess. Accordingly, transfer of the magnetic micro-LEDs with the second color to the top of the substrate can be achieved, wherein the magnetic micro-LEDs with the second color is located in the second recess above the substrate, and a second sub-pixel area is thereby formed.

Before the third valve is opened, the magnetic layers of the first recess, the second recess and the third recess can be controlled to have magnetic attraction. When the third valve is opened, the plurality of magnetic micro-LEDs with the third color can be moved downward through the third valve to a main chamber by the solution injected from the third input port, and the magnetic micro-LEDs with the third color are respectively moved to the corresponding recess above the substrate by the fluid. The magnetic micro-LEDs with the third color may be attracted by the magnetic force of the magnetic layer on the substrate and move to the recess in a self-alignment manner, thereby achieving the transfer of the magnetic micro-LEDs with the third color to the top of the substrate, wherein the magnetic micro-LEDs with the third color is located in the third recess above the substrate, and a third sub-pixel area is thereby formed.

The first sub-pixel area, the second sub-pixel area and the third sub-pixel area form a pixel area.

FIG. 66-22-1 and FIG. 66-22-2 schematically illustrates a top view of the substrate of the fluid transfer system including the first recess, the second recess and the third recess, wherein the substrate of the fluid transfer system further includes a first spare recess, a second spare recess and a third spare recess, each of the recesses has a magnetic layer, each of the spare recesses has a spare magnetic layer, and the magnetic layer and the spare magnetic layer can be programmatic controlled. For example, the magnetic layer can be controlled to have magnetic attraction or have no magnetic attraction by an electromagnetic force. When a test is performed after the magnetic micro-LEDs are transferred, the position of the broken dot which is out of order is recorded, and a massive repair is performed by the spare recesses. The magnetic micro-LEDs are transferred to the corresponding spare recess to replace the abnormal broken dot, and the repair can be completed. Because a large amount of the broken dots can be repaired at the same time, time and cost for repairing can be drastically reduced.

The shape of each of the spare recesses can be similar to or different from the shape of the first recess, the second recess and the third recess. The first recess and the first spare recess form a first sub-pixel area, the second recess and the second spare recess form a second sub-pixel area, the third recess and the third spare recess form a third sub-pixel area, wherein the first sub-pixel area, the second sub-pixel area and the third sub-pixel area form a pixel area.

FIG. 66-23 schematically illustrates a fluid transfer system, wherein the substrate of the fluid transfer system further includes a first valve of the substrate, a second valve of the substrate and a third valve of the substrate. The valves of the substrate can be programmatic controlled. When the valve of the substrate is opened, the recess of the substrate is exposed, such that the substrate can capture the micro-LEDs which are not limited to the magnetic micro-LEDs. The recess of the substrate further includes an attraction layer, wherein the attraction layer can provide an electrical attraction force, a magnetic attraction force, an electrostatic attraction force, a fluid attraction force, an air attraction force, a van der waals attraction force, a thermal attraction force and an attachment attraction force, and the produced attraction force can be used to capture the micro-LEDs in the fluid.

Before the first valve is opened, the first valve of the substrate is controlled to be opened, and the second valve of the substrate and the third valve of the substrate are controlled to be closed. When the first valve is opened, the plurality of micro-LEDs with the first color can be moved downward through the first valve to a main chamber by the solution injected from the first input port, and the micro-LEDs with the first color are respectively moved to the corresponding recess above the substrate by the fluid. The micro-LEDs with the first color may be attracted by the attraction of the attraction layer on the substrate and move to the recess in a self-alignment manner. Accordingly, transfer of the micro-LEDs with the first color to the top of the substrate can be achieved.

Before the second valve is opened, the second valve of the substrate is controlled to be opened, and the third valve of the substrate is controlled to be closed. When the second valve is opened, the plurality of micro-LEDs with the second color can be moved downward through the second valve to a main chamber by the solution injected from the second input port, and the micro-LEDs with the second color are respectively moved to the corresponding recess above the substrate by the fluid. The micro-LEDs with the second color may be attracted by the attraction of the attraction layer on the substrate and move to the recess in a self-alignment manner. Accordingly, transfer of the micro-LEDs with the second color to the top of the substrate can be achieved.

FIG. 66-24 schematically illustrates a fluid transfer system, wherein the substrate of the fluid transfer system further includes an attraction layer which can be programmatic controlled. The attraction layer can provide an electrical attraction force, a magnetic attraction force, an electrostatic attraction force, a fluid attraction force, an air attraction force, a van der waals attraction force, a thermal attraction force and an attachment attraction force, and the produced attraction force can be used to capture the micro-LEDs in the fluid.

Before the first valve is opened, the first attraction layer of the substrate can be controlled to have attraction, and the second attraction layer of the substrate and the third attraction layer of the substrate can be controlled to have no attraction. When the first valve is opened, the plurality of micro-LEDs with the first color can be moved downward through the first valve to a main chamber by the solution injected from the first input port, and the micro-LEDs with the first color are respectively moved to the corresponding recess above the substrate by the fluid. The micro-LEDs with the first color may be attracted by the attraction of the attraction layer on the substrate and move to the recess in a self-alignment manner. When the micro-LEDs with the first color is dropped into the second recess or the third recess, because the attraction layers in the second recess and the third recess are controlled to have no attraction, the micro-LEDs with the first color can be moved out from the second recess or the third recess until it is dropped into the first recess by controlling the flow rate such that the thrust of the flow rate is greater than the capturing force of the second recess and the third recess. Accordingly, transfer of the micro-LEDs with the first color to the top of the substrate can be achieved.

Before the second valve is opened, the first attraction layer of the substrate and the second attraction layer of the substrate can be controlled to have attraction, and the third attraction layer of the substrate can be controlled to have no attraction. When the second valve is opened, the plurality of micro-LEDs with the second color can be moved downward through the second valve to a main chamber by the solution injected from the second input port, and the micro-LEDs with the second color are respectively moved to the corresponding recess above the substrate by the fluid. The micro-LEDs with the second color may be attracted by the attraction of the attraction layer on the substrate and move to the recess in a self-alignment manner. When the micro-LEDs with the second color are dropped into the third recess, because the attraction layers in the third recess are controlled to have no attraction, the micro-LEDs with the second color can be moved out from the third recess until it is dropped into the second recess by controlling the flow rate such that the thrust of the flow rate is greater than the capturing force of the third recess. Accordingly, transfer of the micro-LEDs with the second color to the top of the substrate can be achieved.

Before the third valve is opened, the first attraction layer of the substrate, the second attraction layer of the substrate and the third attraction layer of the substrate can be controlled to have attraction. When the third valve is opened, the plurality of micro-LEDs with the third color can be moved downward through the third valve to a main chamber by the solution injected from the third input port, and the micro-LEDs with the third color are respectively moved to the corresponding recess above the substrate by the fluid. The micro-LEDs with the third color may be attracted by the attraction of the attraction layer on the substrate and move to the recess in a self-alignment manner. Accordingly, transfer of the micro-LEDs with the third color to the top of the substrate can be achieved.

FIG. 66-25 schematically illustrates a fluid transfer system, wherein the substrate of the fluid transfer system further includes a filling layer, and the filling layer may be a photoresist, a dielectric layer which is heat dissolved or a solid which can be dissolved by the liquid in the chamber. When the filling layer is irradiated by a laser source or a UV light source, it would be dissolved and brought by the fluid, that is, the filling layer can be removed by irradiation or liquid flow by controlling the first valve of the substrate, the second valve of the substrate and the third valve of the substrate to be opened or closed, such that the programmatically controllable attraction layer below the recess can be exposed. The programmatically controllable attraction layer and the attraction layer can provide an electrical attraction force, a magnetic attraction force, an electrostatic attraction force, a fluid attraction force, an air attraction force, a van der waals attraction force, a thermal attraction force and an attachment attraction force, and the produced attraction force can be used to capture the micro-LEDs in the fluid.

The substrate of the invention may be a flexible substrate, wherein the material of the flexible substrate may include ultra-thin glass, metal foil, fiber-reinforced composite material, plastic film, ceramic substrate or the combinations thereof. A preferable thickness of the flexible substrate is less than 200 micrometers, a more preferable thickness of the flexible substrate is less than 50 micrometers, and the even more preferable thickness of the flexible substrate is in a range from 25 micrometers to 50 micrometers. Metal foil may for example include stainless steel, nickel, titanium, zirconium, copper, iron, cobalt, palladium or the combinations thereof, wherein the coefficient of thermal expansion of metal foil is similar to the coefficient of thermal expansion of ultra-thin glass. The surface roughness Ra of the metal foil is less than 10 nanometers. The light transmittance of the plastic film is greater than 90% under a wavelength of 550 nanometer. The material of the plastic film may for example include polyethylene terephthalate (PET), polyethylene naphthalate (PEN) or polyethersulfone (PES).

Fiber-reinforced composite material may for example include carbon fibers, silicon carbide fibers or boron filament.

A Micro-LED device is provided by the invention, and in particular a Micro-LED device without spare design is provided. FIG. 58-1A, FIG. 67-2A and FIG. 67-3A schematically illustrates a traditional display, wherein the horizontal resolution of the display is 960 pixels, the vertical resolution of the display is 640 pixels, the diagonal distance of the display is 3.5 inches (8.89 centimeters (cm)), the size of the display is 2.91"×1.94" which equals to 5.65 in$^2$ (7.4 cm×4.93 cm=36.48 cm$^2$) at 329.65 PPI, the dot pitch of the display is 0.0771 mm, and the resolution of the screen of the display is 960×640 (329.65 PPD. The resolution is sufficient to make it impossible for human eyes to distinguish single pixel, such as the Retina display which the light emitting unit is for example a display equipment composed of three micro-LEDs R, G and B. However, in the traditional device, when one of the micro-LEDs is out of order, it cannot be displayed and perceived by human eyes. The traditional method to solve this problem may for example include spare circuit design or spare micro-LEDs, but the cost can be thereby increased.

The invention provides a Micro-LED device without spare design. FIG. 67-1B, FIG. 58-2B and FIG. 67-3B schematically illustrate an embodiment of the invention, the horizontal resolution of the display in this embodiment is 1920 pixels, the vertical resolution of the display is 1280 pixels, the diagonal distance of the display is 3.5 inches (8.89 cm), the size of the display is 2.91"×1.94" which equals to 5.65 in$^2$ (7.4 cm×4.93 cm=36.48 cm$^2$) at 659.3 PPI, the dot pitch of the display is 0.0385 mm, and the resolution of the screen is 1920×1280(659.3 PPD. An abnormal micro-LED between the two micro-LEDs with the same color is acceptable because that the abnormal micro-LED is not easily perceived by human eyes, that is, the spare circuit design or the spare micro-LED is not necessary. An abnormal pixel between the two pixels is acceptable because that the abnormal pixel is not easily perceived by human eyes, that is, the spare circuit design or the spare micro-LED is not necessary. An abnormal sub-pixel between the two sub-pixels with the same color is acceptable because that the abnormal sub-pixel is not easily perceived by human eyes, that is, the spare circuit design or the spare micro-LED is not necessary.

The invention provides a Micro-LED device without spare device. FIG. 67-1C, FIG. 67-2C and FIG. 67-3C schematically illustrate another embodiment of the invention. The horizontal resolution of the display in this embodiment is 3840 pixels, the vertical resolution of the display is 2560 pixels, the diagonal distance of the screen is 3.5 inches (8.89 cm), the size of the display is 2.91"×1.94" which equals to 5.65 in² (7.4 cm×4.93 cm=36.48 cm²) at 1318.6 PPI, the dot pitch of the display is 0.0193 mm, and the resolution of the screen of the display is 3840×2560(1318.6 PPD. Two abnormal micro-LEDs between the two micro-LEDs with the same color are acceptable because that the abnormal micro-LEDs are not easily perceived by human eyes, that is, the spare circuit design or the spare micro-LED is not necessary. Two abnormal pixels between the two pixels are acceptable because that the abnormal pixels are not easily perceived by human eyes, that is, the spare circuit design or the spare micro-LED is not necessary. Two abnormal sub-pixels between the two sub-pixels with the same color are acceptable because that the abnormal sub-pixels are not easily perceived by human eyes, that is, the spare circuit design or the spare micro-LED is not necessary.

The invention provides a Micro-LED device without spare design. In an embodiment, the horizontal resolution of the display in the embodiment is 1440 pixels, the vertical resolution of the display is 960 pixels, the diagonal distance of the display is 3.5 inches (8.89 cm), the size of the display is 2.91"×1.94" which equals to 5.65 in² (7.4 cm×4.93 cm=36.48 cm²) at 494.48 PPI, the dot pitch of the display is 0.0514 mm, and the resolution of the screen is 1440×960 (494.48 PPD. An abnormal micro-LED between the two micro-LEDs with the same color is acceptable because that the abnormal micro-LED is not easily perceived by human eyes, that is, the spare circuit design or the spare micro-LED is not necessary. An abnormal sub-pixel between the two sub-pixels is acceptable because that the abnormal sub-pixel is not easily perceived by human eyes, that is, the spare circuit design or the spare micro-LED is not necessary.

As shown in FIG. 67-1B, FIG. 67-1C, FIG. 67-2B, FIG. 67-2C, FIG. 67-3B and FIG. 67-3C, the micro-LEDs surrounded by the dotted line region are abnormal.

As shown in FIG. 67-1B, FIG. 67-1C, FIG. 67-2B, FIG. 67-2C, FIG. 67-3B and FIG. 67-3C, the sub-pixels surrounded by the dotted line region are abnormal.

The pixel of the invention is composed of micro-LEDs with three different colors (red, green and blue).

The pixel of the invention is composed of sub-pixels with three different colors (red, green and blue).

The dot pitch which describes the distance between the sub-pixels can also be called as line pitch, stripe pitch, phosphor pitch or pixel pitch.

$$PPI = \frac{\sqrt{([\text{Horizontal resolution(pixel)}]^2 + [\text{Vertical resolution(pixel)}]^2)}}{\text{Diagonal(inch)}}$$

The normal formula for designing a Retina display is as follows:

$$a = 2 \arctan(h/2d)$$

As shown in FIG. 68, "a" is the viewing angle of human eyes, "h" is the dot pitch, and "d" is the distance between human eyes and screen. The screen fits the following requirements can make it impossible for human eyes to see a single pixel, and can be called as Retina display.

$$h/2 = d \times \tan(a/2)$$

$$a = 1/53.53 \text{ degree}$$

$$d = \text{viewing distance} = 10 \text{ inches}$$

$$h = \text{recognition limit}$$

$$h = 2 \times d \times \tan(1/53.53/2) \times \pi/180$$

if $d = 10$ inch $$h = 2 \times 10 \times \tan(1/53.53/2) \times \pi/180$$

$$= 0.003258911 \text{ inch}$$

$$1/h = 306.85 \ PPI$$

if $d = 15$ inch $$h = 2 \times 15 \times \tan(1/53.53/2) \times \pi/180 = 0.004888366831 \text{ inch}$$

$$1/h = 204.57 \ PPI$$

if $d = 20$ inch $$h = 2 \times 15 \times \tan(1/53.53/2) \times \pi/180 = 0.006517882244166 \text{ inch}$$

$$1/h = 153.42 \ PPI$$

| screen size (inch) | distance between eyes and screen (inch) | pixels per inch of retina display (PPI) | dot pitch (×1)(mm) | dot pitch (×1.5)(mm) | dot pitch (×2)(mm) | dot pitch (×4)(mm) |
|---|---|---|---|---|---|---|
| 1-7 | 10 | 306.85 | 0.082776601 | 0.055184401 | 0.0413883 | 0.02069415 |
| 7-12 | 15 | 204.57 | 0.124162878 | 0.082775252 | 0.062081439 | 0.03104072 |
| 12-30 | 20 | 153.42 | 0.165558597 | 0.110372398 | 0.082779299 | 0.041389649 |

The resolution is increased and the distance between the sub-pixels is reduced to make it impossible for human eyes to perceive the abnormal sub-pixel in the invention, that is, the Micro-LED device with spare design is not necessary. Take an embodiment of the invention shown in the table above for example, the table shown above lists different screen size and the suitable distance between human eyes and screen for each case. That is, PPI and dot pitch of the Retina display which makes it impossible for human eyes to see a single pixel can be calculated. The human eyes cannot easily perceive the abnormal sub-pixel by shrinking the dot pitch to 1/1.5, ½ and ¼ of the original dot pitch, such that the Micro-LED device with spare design is not necessary.

The resolution is increased and the distance between the sub-pixels is reduced to make it impossible for human eyes to perceive the abnormal sub-pixel in an embodiment of the invention, and the device can combined with the Micro-LED device with spare design to adapt to the application with greater resolution.

FIG. 69A is a schematic cross-section view of a light emitting diode structure 4000 according to an embodiment. Referring to FIG. 69A, the light emitting diode structure 4000 includes a stack of layers which at least having a first type semiconductor layer 4001, a second type semiconductor layer 4002, an light emitting layer 4003 interposed between the first type semiconductor layer 4001 and the second type semiconductor layer 4002, a first electrode layer 4000n disposed on a surface of the first type semiconductor layer 4001, a second electrode layer 4000p disposed on a surface of the second type semiconductor layer 4002, and structural regions 4000sr covering at least a portion of the first type semiconductor layer 4001, the light emitting layer 4003 and the second type semiconductor layer 4002.

As the embodiment shown in the FIG. 69A, the light emitting diode structure 4000 is a lateral LED structure of which the first electrode layer 4000n and the second electrode layer 4000p are disposed at the same side of the first type semiconductor layer 4001, but the invention is not limited thereto.

In the embodiment of the FIG. 69A, the structural regions 4000sr may include current blocking regions, but not limited thereto. In one embodiment, the structural regions 4000sr. In one embodiment, the structural regions 4000sr may include current limiting regions.

In an embodiment, the structural regions 4000sr may include dielectric layer or layers. Material of the dielectric layer or layers may be, but not limited thereto, silicon oxide (SiO2), silicon nitride (Si3N4), aluminum oxide (Al2O3), yttrium oxide (Y2O3), titanium oxide (TiO2), hafnium oxide (HfO2), zirconium oxide (ZrO2), barium zirconate (BaZrO3), barium titanate (BaTiO3), tantalum pentoxide (Ta2O5) and Silica, etc. In an embodiment, the dielectric layer or layers may be passivation layer(s). In an embodiment, the dielectric layers may be optical multilayer thin films which are interlaced higher dielectric index films and lower dielectric index films. In an embodiment, the optical multilayer thin films may perform as a reflecting mirror according to the wavelength of the light emitting diode.

In an embodiment, the first type semiconductor layer 4001, the second type semiconductor layer 4002 and/or the light emitting layer 4003 may be multi-layered, but the invention is not limited thereto.

Further referring to the embodiment of FIG. 60A, a length L of the light emitting diode structure 4000 may not be greater than 100 micrometers. In the embodiment of the FIG. 69A, the light emitting diode structure 4000 includes a light outputting surface 4000s1 and a bonding surface 4000sb. The surface 4000sb of the light emitting diode structure 4000 may be a planar surface with roughness not greater than 10 nanometers (nm). The surface 4000sb may be composited with surfaces of the dielectric layer 4000sr, the first electrode layer 4000n and/or the second electrode layer 4000p. In the embodiment of FIG. 60A, the surface 4000sb of the light emitting diode structure 4000 may be applied as a boning surface for attaching to a circuit substrate.

FIG. 69B is a schematic cross-section view of a light emitting diode structure 4000' according to another embodiment which is similar to FIG. 60A. Referring to the embodiment of FIG. 60B, the structural regions 4000sr may cover the side surface of the light emitting diode structure 4000' and extend from the surface 4000sb to the light outputting surface 4000s1.

FIG. 69C is a schematic cross-section view of a light emitting diode structure 4000" according to an embodiment. Referring to the embodiment of FIG. 60C, a width w42 of the first electrode layer 4000n near the surface 4000sb may be wider than a width w41 of the first electrode layer 4000n near the first type semiconductor layer 4001. In the embodiment, the wider portion w42 of the first electrode layer 4000n may perform as a reflecting mirror to reflect the light emitted from the light emitting layer 4003, and then the outputting intensity of the light from the light outputting surface 4000s1 may be enhanced. In another embodiment, the second electrode layer 4000p may also have a wider portion near the surface 4000sb and the wider portion of the second electrode layer 4000p may perform as a reflecting mirror.

FIG. 69D is a schematic cross-section view of a light emitting device 4000D according to an embodiment. Referring to the embodiment of FIG. 60D, the light emitting device 4000D includes a plurality of light emitting diode elements 4000 arranged in an array and the arrayed light emitting diode elements 4000 are sandwiched between a first substrate 4000w1 and a second substrate 4000w2.

In the embodiment of FIG. 60D, the first substrate 4000w1 may be a carrier substrate and the second substrate 4000w2 may be a circuit substrate, but the invention is not limited thereto. The second substrate (circuit substrate) 4000w2 may include driver circuits, such as thin-film transistor (TFT) drivers. The plurality of light emitting diode elements 4000 may be transferred and array placed to the first substrate 4000w1, and then electrode pads of the arrayed light emitting diode elements 4000 are respectively bonded to contact pads of the driver circuits through the bonding surface 4000sb of the arrayed light emitting diode elements 4000 and a bonding surface 4000sb' of the second substrate 4000w2.

In the embodiment of FIG. 69D, the surface 4000sb of each light emitting diode element 4000 may be a planar surface with roughness not greater than 10 nm. Referring back to the embodiment of FIG. 69A, the surface 4000sb may be composited with surfaces of the dielectric layer 4000sr, the first electrode layer 4000n and/or the second electrode layer 4000p. In other words, at least portion surfaces of the dielectric layer 4000sr, the first electrode layer 4000n and/or the second electrode layer 4000p are coplanar. Accordingly, the bonding surface 4000sb' of the second substrate (circuit substrate) 4000w2 may be a planar surface including surfaces of contact pads of the driver circuits. In the embodiment of FIG. 69D, bonding interfaces of the surfaces 4000sb and 4000sb' may include dielectric layer, such as silicon oxide layer, and copper layer, but the invention is not limited thereto. The bonding surface 4000sb can be directly bonded to the bonding surface 4000sb at a lower temperature which may be not greater than 150° C., therefore thermal stress induced by coefficient of thermal expansion (CTE) mismatch can be decreased and open contacts between the electrodes of the light emitting diode elements 4000 and the contact pads of the driver circuits can be prevented.

The structural description of the word "coplanar" should be understood to allow for typical variations that occur during the semiconductor manufacturing, such as from dishing from planarization, from subsequent cleaning processes, etc.

In one embodiment, the first substrate 4000w1 may be an epitaxy substrate or a growing substrate of the arrayed light emitting diode elements 4000. The first substrate 4000w1 may be light-transmittable according to the wavelength of the light emitted from the light emitting layer 4003. In one embodiment, the first substrate 4000w1 may be removed or thinned after the bonding process.

In another embodiment, the second substrate 4000w2 may be a circuit substrate and also perform as a carrier substrate, each light emitting diode element 4000 is transferred to the second substrate 4000w1 and then electrode pads of each light emitting diode element 4000 are bonded to contact pads of the driver circuits through the bonding surface 4000sb of the light emitting diode element 4000 and the bonding surface 4000sb' of the second substrate 4000w2.

In the embodiment of FIG. 60D, gaps between the light emitting diode elements 4000 may be filled with sealing materials 4000f. In one embodiment, the sealing materials 4000f may include light-absorber materials to prevent light crosstalk between adjacent light emitting diode elements, and the light-absorber materials may be polymer filled with black or dark particles, but the invention is not limited thereto. In one embodiment, the sealing materials 4000f may include inorganic insulting materials such as silicon oxide, silicon nitride. In another embodiment, the structural regions 4000sr at side surfaces of each light emitting diode elements 4000 may perform as passivation layer(s), therefore the sealing materials 4000f may include heat conducting particles, such as metal particles, ceramic particles, and the passivation layer(s) can prevent short circuits induced by the metal particles between adjacent light emitting diode elements.

FIG. 69E-1 is a top view of a light emitting device 4000E' according to an embodiment and FIG. 69E-2 is a schematic cross-section view of the light emitting device 4000E. Referring to the embodiment of FIG. 60E-1, the wavelength conversion layer 4000ps includes windows F, F1, F2 and F3 in matrix form and a matrix frame FM surrounding the windows F, F1, F2 and F3. The matrix frame FM may be not light transmissive or may absorb light, but the invention is not limited thereto.

In the embodiment of FIG. 69E-1, the windows F, F1, F2 and F3 is light transmissive and phosphors included in the windows F, F1, F2 and F3 may be different from each other, so that colors of light radiated from the windows F, F1, F2 and F3 may be different from each other. For example, phosphors included in the windows F1 may be excited by light of the underneath light emitting diode elements 4000 and radiate red light, phosphors included in the windows F2 may be excited by light of the underneath light emitting diode elements 4000 and radiate yellow light, phosphors included in the windows F3 may be excited by light of the underneath light emitting diode elements 4000 and radiate green light, but the invention is not limited thereto. In one embodiment, one or more types of phosphors may be included in one window.

The amount of the light emitting diode elements 4000 below each one of the window F, F1, F2 and F3 may be one or more, and the amount of the light emitting diode elements 4000 below at least two of the window F, F1, F2 and F3 may be different from each other.

When the amount of the light emitting diode elements 4000, below one common window, is more than one and each of the light emitting diode elements 4000 can be individually controlled, the brightness of the light radiated from the common window can be tuned by switching an amount of the light emitting diode elements 4000 which is turned on. For example, referring to the window region F1 shown in FIG. 69E-1, brightest red light is radiated from the window F1 when all the six underneath light emitting diode elements 4000 are turned on and darkest red light is radiated from the window F1 when only one underneath light emitting diode element 4000 is turned on.

Referring to the embodiment of FIG. 60E-2, there are plural of light emitting diode elements 4000 arranged in an array under the window F3 of the light emitting device 4000E' and a wavelength conversion layer 4000ps that covers the light emitting element array. In the embodiment of FIG. 69E-2, the wavelength conversion layer 4000ps, for example, contains a light transmissive resin and phosphors, but the invention is not limited thereto. The matrix frame FM, which surrounds the window F3, may be a light non-transmissive wall structure for preventing light crosstalk to adjacent regions such as the adjacent windows F and F2.

In an embodiment, the wavelength conversion layer 4000ps may include light scattering particles therein. The light, entering the wavelength conversion layer 4000ps, can be scattered by the light scattering particles for many times so as to fully interact with the phosphors inside the wavelength conversion layer 4000ps and uniformly radiate out from the wavelength conversion layer 4000ps.

Referring to the embodiment of FIG. 69E-2, under the common window F3, the filling material 4000f filled between adjacent light emitting diode elements 4000, for example, may further include the aforementioned light transmissive resin, phosphors and/or light scattering particles, but the invention is not limited thereto.

The phosphors may include cerium-activated yttrium aluminum garnet-based phosphors (YAG:Ce); cerium-activated lutetium aluminum garnet-based phosphors (LAG:Ce); europium—activated and/or chromium-activated nitrogen-containing calcium aluminosilicate-based phosphors (for example, CaO-Al2O3-SiO2:Eu), europium-activated silicate-based phosphors ((Sr,Ba)2SiO4:Eu), nitride-based phosphors, such as β-SiAlON phosphors, CASN-based phosphors (CaAlSiN3:Eu), SCASN-based phosphors ((Sr,Ca)AlSiN3:Eu), KSF-based phosphors (K2SiF6:Mn), sulfide-base phosphors, and/or quantum dot phosphors, but the invention is not limited thereto. In an embodiment, through combining these phosphors with a blue or ultraviolet light emitting element, various colors of light (e.g., a white light emitting device) can be produced by the light emitting device.

The phosphors, for example, may include a blue phosphor, a green phosphor, a yellow phosphor, a red phosphor, or quantum dots(QDs). For example, blue phosphors may include BAM-based, halo-phosphate-based, or aluminate-based phosphors, and may include, for example, BaMgAl10O17:Mn2+,BaMgAl12O19:Mn2+ or (Sr,Ca,Ba)PO4Cl:Eu2+.

Green or yellow phosphors may include LuAG(Lu3(Al,Gd)5O12:Ce3+), YAG(Y3(Al,Gd)5O12:Ce3+), Ga-LuAG (Lu,Ga)3(Al,Gd)5O12:Ce3+), Ga-YAG((Ga,Y)3(Al,Gd)5O12:Ce3+), LuYAG(Lu,Y)3(Al,Gd)5O12:Ce3+), ((Sr,Ba,Ca,Mg)2SiO4:Eu2+), ((Ba,Sr,Ca)Si2O2N2:Eu2+) or thio-gallate (SrGa2S4:Eu2+).

Red phosphors may include nitride, sulfide, fluoride, or oxynitride, and more specifically, CASN(CaAlSiN3:Eu2+), (Ba,Sr,Ca)2Si5N8:Eu2+, (Ca,Sr)S2:Eu2+) or (Sr,Ca)2SiS4:Eu2+.

Quantum dots(QDs) may include Si, Ge, GaN, GaP, GaAs, GaSb, AlN, AlP, AlAs, AlSb, InN, InP, InAs, InSb, SnS, SnSe, SnTe, PbS, PbSe, PbTe, CdO, CdS, CdSe, CdTe, ZnO, ZnS, ZnSe, ZnTe, HgS, HgSe, HgTe, MgSe, MgS, SiC, SiGe, GaNP, GaNAs, GaNSb, GaPAs, GaPSb, AlNP, AlNAs, AlNSb, AlPAs, AlPSb, InNP, InNAs, InNSb, InPAs, InPSb, SnSeS, SnSeTe, SnSTe, PbSeS, PbSeTe, PbSTe, SnPbS, SnPbSe, SnPbTe, GaAlNP, GaAlNAs, GaAlNSb, GaAlPAs, GaAlPSb, GaInNP, GaInNAs, GaInNSb, GaIn-PAs, GaInPSb, InAlNP, InAlNAs, InAlNSb, InAlPAs, InAlPSb, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, CdZnSeS, CdZnSeTe, CdZnSTe, CdHgSeS, CdHgSeTe, CdHgSTe, HgZnSeS, HgZnSeTe, HgZnSTe, SnPbSSe, SnPbSeTe, SnPbSTe, Graphene quantum dots (GQDs) and/or mixtures thereof. For example, a spectrum distribution of a light transferred from the quantum dots may having a full width at half maximum (FWHM) from 10 nm to 60 nm in a wavelength band of green light. For example, a spectrum distribution of a light transferred from the quantum dots may having a full width at half maximum (FWHM) from 30 nm to 80 nm in a wavelength band of red light. For example, a spectrum distribution of a light transferred from the quantum dots may having a full width at half maximum (FWHM) lower than 60 nm for wide color gamut application.

The wavelength conversion member may comprise at least one of epoxy resin, silicones, polystyrene resin and acrylate.

FIG. 69E-3 is an enlarged top view of a window region F' of a light emitting device according to an embodiment. Referring to the embodiment of FIG. 60E-3, the six light emitting diode elements 4000 can be categorized into two groups Ua and Ub, and the three light emitting diode elements Ub are provided as backups for the three light emitting diode elements Ua. In a normal operation, light from the window region F' is mainly provided by the three light emitting diode elements Ua and the three light emitting diode elements Ub are kept in off status or disabled. When a light emitting diode element Ua is broken, a controller or a switch circuit, coupled to the broken light emitting diode element Ua, disables the broken light emitting diode element Ua and enables an adjacent light emitting diode element Ub for replacing the broken light emitting diode element Ua.

In the embodiments of FIGS. 60F-60K, the structural regions 4000sr may have an arc corner. By controlling the geometric shape of the structural regions 4000sr, a preferred effect of reducing sidewall leakage current can be achieved and the light emitting efficiency of the micro light emitting diode can be improved. When the pitch of light emitting diode elements is reduced, the arc corner can effectively avoid Electrostatic Discharge (ESD) caused by the point discharge, corona discharge or electrical breakdown of the light emitting diode elements, and then improve the production yield rate.

In addition, the production yield of mass transfer can be improved by shaping the corner of the Micro-LEDs in arc shape. In one embodiment, for the electrostatic transfer process, crack or damages induced by collisions between the sharp corner of the Micro-LEDs and the electronic components on the transferred circuit substrate can be effectively avoid. In one embodiment, for the micro transfer printing process, the arc corner shape of the Micro-LED can effectively solve the tolerance issue of the mounting surfaces. In one embodiment, for the fluid transfer process, crack induced by collisions between the Micro-LEDs can be effectively avoid.

Further referring to the embodiment shown in FIG. 69K, the production yield of the redistribution layers 4000RDL can be improved by controlling the geometric shape of the structural regions 4000sr. In the embodiment, the arc corner at the structural region 4000sr of the Micro-LED can effectively prevent disconnect redistribution layers 4000RDL, and the arc corner at the structural region 4000sr also can improve the flexibility of arranging the redistribution layers 4000RDL.

FIGS. 70A to 70B are schematic diagrams of an embodiment in which a micro light emitting diode array is disposed on a fabric substrate 7010. In this embodiment, the flexible substrate on which the micro light emitting diode 7000 is disposed may be, for example, a fabric substrate 7010 interwoven by a plurality of conductive wires 7010a and 7010b, and the P-type and N-type electrode pads 7000p and 7000n of each micro-light emitting diode 7000 can be connected to different conductive wires 7010a and 7010b, respectively. Referring to the embodiment of FIG. 70B, each of the conductive wires 7010a and 7010b includes a conductive core wire 7010c and an insulating clad layer 7010m cladding the periphery of the conductive core wire 7010c. There are micro vias in the insulating clad layer 7010m, and the P-type and N-type electrode pads of each micro-light-emitting diode 7000 are electrically connected to the corresponding conductive core wire 7010c by the conductive micro-pillars 7010r in the micro-vias and are electrically connected to an external power source or an external circuit through the conductive core wire 7010c.

Referring to the embodiment of FIG. 70B again, an underfill 7010u can be provided around the connecting conductions between the electrode pads 7000p or 7000n of the micro light emitting diode 7000 and the conductive micro-pillars 7010r, but the invention is not limited to this. In this embodiment, alight transmissive layer 7010q can be provided in light propagating path of the light from the micro-light-emitting diode 7000, the light transmissive layer 7010q can be used as an optical mirror layer, or the light transmissive layer 7010q can have a microstructure. Direction of the light from the micro-light-emitting diode 7000 or light intensity distribution of the light from the micro-light-emitting diode 7000 can be changed by the light transmission layer 7010q. The light transmission layer 7010q can have an optical filter layer, and the optical filter layer can serves as a protective layer to cover the micro light emitting diode 7000, but the invention is not limited to this.

The above-disclosed embodiments of the micro-light-emitting diode array can also be used in lighting applications (such as automotive lighting), signal communication applications using array light, phototherapy applications (such as phototherapy biomedical patches, phototherapy wearable fabrics, etc.), wearable installations or wearable fabrics or textiles, etc.

The above-mentioned embodiments are not intended to limit the scope of the invention. Those skilled in the art should realize the contents of the invention can be modified, combined or displaced according to the demands of design and other factors. Any modification, replacement and improvement according to the spirit and principle of the invention should be included in the scope of the invention.

What is claimed is:
1. A display device includes a plurality of pixels arranged in a matrix, wherein at least one of the pixels comprising:
   a circuit substrate including at least one transistor;
   at least one light emitting element on the circuit substrate and electrical connects to the at least one transistor, the at least one light emitting element is provided to emit a first light with a first wavelength;
   a frame layer on the circuit substrate and includes a wall structure and at least one cavity surrounded by the wall structure, wherein the at least one light emitting element is in the at least one cavity; and a wavelength conversion layer in the at least one cavity and over the least one light emitting element to convert the first light to a second light;

wherein a lower side-surface of the at least one cavity having a first inclination angle and an upper side-surface of the at least one cavity having a second inclination angle, and the second inclination angle is greater than the first inclination angle.

2. The display device of claim 1, wherein the wavelength conversion layer includes phosphors, fluorescent materials, or light-scattering particles.

3. The display device of claim 1, wherein the wavelength conversion layer is a multi-layer structure and includes a first light transmissive layer and a second light transmissive layer, the first light transmissive layer is between the at least one light emitting element and the wall structure, and the second light transmissive layer covers the first light transmissive layer and the at least one light emitting element.

4. The display device of claim 1, wherein the light transmissive layer is a multi-layer structure and includes a second light transmissive layer and a third light transmissive layer, the second light transmissive layer covers the at least one light emitting element and the third light transmissive layer covers the second light transmissive layer.

5. The display device of claim 4, wherein a refractive index of the second light transmissive layer is greater than a refractive index of the third light transmissive layer.

6. The display device of claim 1, wherein the at least one light emitting element is a light emitting die and a die-width of the light emitting die is less than 100 micrometers ($\mu$m).

7. The display device of claim 6, wherein the die width is not greater than 5 $\mu$m.

8. The display device of claim 6, wherein the light emitting die has an arc corner.

9. The display device of claim 1, wherein the circuit substrate is flexible.

10. The display device of claim 9, wherein a thickness of the circuit substrate is less than 200 micrometers.

* * * * *